United States Patent
Shibazaki

(10) Patent No.: US 8,792,084 B2
(45) Date of Patent: Jul. 29, 2014

(54) EXPOSURE APPARATUS, EXPOSURE METHOD, AND DEVICE MANUFACTURING METHOD

(75) Inventor: Yuichi Shibazaki, Kumagaya (JP)

(73) Assignee: Nikon Corporation, Tokyo (JP)

( * ) Notice: Subject to any disclaimer, the term of this patent is extended or adjusted under 35 U.S.C. 154(b) by 495 days.

(21) Appl. No.: 12/782,308

(22) Filed: May 18, 2010

(65) Prior Publication Data

US 2010/0296070 A1 Nov. 25, 2010

Related U.S. Application Data

(60) Provisional application No. 61/179,848, filed on May 20, 2009, provisional application No. 61/179,909, filed on May 20, 2009.

(51) Int. Cl.
G03B 27/58 (2006.01)
G03F 7/20 (2006.01)
G03F 9/00 (2006.01)

(52) U.S. Cl.
CPC .......... *G03F 7/70691* (2013.01); *G03F 7/707* (2013.01); *G03F 7/7075* (2013.01); *G03F 9/7011* (2013.01)
USPC ................................ 355/72; 355/53; 356/616

(58) Field of Classification Search
CPC ....... G03F 7/70775; G03F 7/707; G03F 9/70; G03F 9/7007; G03F 9/7011; G03F 7/70758; G03F 7/70691
USPC ................. 355/53, 72, 75; 356/399–401, 616
See application file for complete search history.

(56) References Cited

U.S. PATENT DOCUMENTS

| | | | |
|---|---|---|---|
| 4,780,617 A | | 10/1988 | Umatate et al. |
| 5,080,549 A | * | 1/1992 | Goodwin et al. ........... 414/744.8 |
| 5,196,745 A | | 3/1993 | Trumper |
| 5,448,332 A | | 9/1995 | Sakakibara et al. |
| 5,610,715 A | | 3/1997 | Yoshii et al. |
| 5,646,413 A | | 7/1997 | Nishi |
| 5,969,441 A | | 10/1999 | Loopstra et al. |

(Continued)

FOREIGN PATENT DOCUMENTS

| | | |
|---|---|---|
| EP | 1 688 988 A1 | 8/2006 |
| WO | WO 01/35168 A1 | 5/2001 |

(Continued)

OTHER PUBLICATIONS

International Search Report for corresponding International Patent Application No. PCT/JP2010/058948, mailed on Dec. 7, 2010.

(Continued)

*Primary Examiner* — Steven H Whitesell Gordon
(74) *Attorney, Agent, or Firm* — Oliff PLC

(57) ABSTRACT

While an exposure processing is performed to a wafer held by a fine movement stage supported by a coarse movement stage in an exposure station, at least a part of a measurement processing to a wafer held by another fine movement stage supported by another coarse movement stage and an exchange of a wafer held by yet another fine movement stage on a center table is concurrently performed. Because of this, exposure with a higher throughput becomes possible, even when compared with a conventional exposure apparatus which concurrently performs an exposure processing to a wafer on a wafer stage, and processing such as wafer exchange and alignment on another stage.

40 Claims, 67 Drawing Sheets

(56) References Cited

U.S. PATENT DOCUMENTS

| | | | |
|---|---|---|---|
| 6,208,407 B1 | 3/2001 | Loopstra | |
| RE37,391 E | 9/2001 | Nishi | |
| 6,590,634 B1 | 7/2003 | Nishi et al. | |
| 6,611,316 B2 | 8/2003 | Sewell | |
| 6,756,751 B2* | 6/2004 | Hunter | 318/135 |
| 6,778,257 B2 | 8/2004 | Bleeker et al. | |
| 7,023,610 B2 | 4/2006 | Ohtsuki et al. | |
| 7,238,931 B2 | 7/2007 | Nabeshima et al. | |
| 7,245,349 B2* | 7/2007 | Sato | 355/53 |
| 7,359,034 B2* | 4/2008 | Ishii | 355/53 |
| 7,561,280 B2 | 7/2009 | Schluchter et al. | |
| 2001/0035168 A1 | 11/2001 | Meyer et al. | |
| 2002/0041377 A1 | 4/2002 | Hagiwara et al. | |
| 2002/0089655 A1 | 7/2002 | Kida et al. | |
| 2003/0025890 A1 | 2/2003 | Nishinaga | |
| 2003/0218730 A1 | 11/2003 | Murakami et al. | |
| 2005/0002005 A1* | 1/2005 | Terada et al. | 355/53 |
| 2005/0036121 A1* | 2/2005 | Hoogendam et al. | 355/30 |
| 2005/0052632 A1* | 3/2005 | Miyajima | 355/53 |
| 2006/0038952 A1 | 2/2006 | Chang et al. | |
| 2006/0114445 A1 | 6/2006 | Ebihara | |
| 2006/0187431 A1 | 8/2006 | Shibazaki | |
| 2006/0215144 A1 | 9/2006 | Shibazaki | |
| 2007/0127006 A1 | 6/2007 | Shibazaki | |
| 2007/0247607 A1 | 10/2007 | Shibazaki | |
| 2007/0263191 A1 | 11/2007 | Shibazaki | |
| 2007/0288121 A1 | 12/2007 | Shibazaki | |
| 2008/0043212 A1 | 2/2008 | Shibazaki | |
| 2008/0056735 A1 | 3/2008 | Sorita et al. | |
| 2008/0088843 A1 | 4/2008 | Shibazaki | |
| 2008/0094592 A1 | 4/2008 | Shibazaki | |
| 2008/0094593 A1 | 4/2008 | Shibazaki | |
| 2008/0094594 A1 | 4/2008 | Shibazaki | |
| 2008/0094604 A1 | 4/2008 | Shibazaki | |
| 2008/0106722 A1 | 5/2008 | Shibazaki | |
| 2008/0218713 A1 | 9/2008 | Shibazaki | |
| 2009/0233234 A1 | 9/2009 | Shibazaki | |
| 2009/0284724 A1 | 11/2009 | Kanaya | |
| 2010/0073661 A1 | 3/2010 | Shibazaki et al. | |

FOREIGN PATENT DOCUMENTS

| | | | |
|---|---|---|---|
| WO | WO 2004/090577 A2 | 10/2004 | |
| WO | WO 2006/038952 A2 | 4/2006 | |
| WO | WO 2008/056735 | 5/2008 | |

OTHER PUBLICATIONS

Written Opinion for corresponding International Patent Application No. PCT/JP2010/058948, mailed on Dec. 7, 2010.

* cited by examiner

EXPOSURE APPARATUS, EXPOSURE METHOD, AND DEVICE MANUFACTURING METHOD

CROSS-REFERENCE TO RELATED APPLICATIONS

This non-provisional application claims the benefit of Provisional Application No. 61/179,848 filed May 20, 2009, and Provisional Application No. 61/179,909 filed May 20, 2009, the disclosures of which are hereby incorporated herein by reference in its entirety.

BACKGROUND OF THE INVENTION

1. Field of the Invention

The present invention relates to exposure apparatuses, exposure methods, and device manufacturing methods, and more particularly to an exposure apparatus and an exposure method which are used in a lithography process to produce electronic devices such as a semiconductor device and the like, and a device manufacturing method which uses the exposure apparatus or the exposure method.

2. Description of the Background Art

Conventionally, in a lithography process for manufacturing electron devices (microdevices) such as semiconductor devices (such as integrated circuits) and liquid crystal display devices, exposure apparatuses such as a projection exposure apparatus by a step-and-repeat method (a so-called stepper) and a projection exposure apparatus by a step-and-scan method (a so-called scanning stepper (which is also called a scanner) are mainly used.

Substrates such as a wafer, a glass plate or the like subject to exposure which are used in these types of exposure apparatuses are gradually (for example, in the case of a wafer, in every ten years) becoming larger. Although a 300-mm wafer which has a diameter of 300 mm is currently the mainstream, the coming of age of a 450 mm wafer which has a diameter of 450 mm looms near. When the transition to 450 mm wafers occurs, the number of dies (chips) output from a single wafer becomes double or more the number of chips from the current 300 mm wafer, which contributes to reducing the cost. In addition, it is expected that through efficient use of energy, water, and other resources, cost of all resource use will be reduced.

Meanwhile, when the size of the wafer becomes as large as 450 mm, while the number of dies (chips) output from a single wafer increases, the probability becomes high of throughput decreasing due to an increase in the time required to perform an exposure process on a single wafer. Therefore, as a method of suppressing the decrease in throughput as much as possible, employing a twin stage method (for example, refer to U.S. Pat. Nos. 6,590,634, 5,969,441, 6,208, 407 and the like) can be considered where an exposure process on a wafer is performed on one wafer stage, and processing such as wafer exchange, alignment or the like is performed concurrently on another wafer stage. However, in the case a 450 mm wafer is subject to processing using an exposure apparatus of the conventional twin stage method without any changes, there was a risk that the throughput would not be improved sufficiently enough.

Semiconductor devices are gradually becoming finer, therefore, high resolution is required in exposure apparatuses. As means for improving the resolution, shortening a wavelength of an exposure light, as well as increasing (a higher NA) a numerical aperture of a projection optical system can be considered. To increase the substantial numerical aperture of the projection optical system as much as possible, liquid immersion exposure in which a wafer is exposed via a projection optical system and a liquid is effective.

As the local liquid immersion type exposure apparatus which employs the twin stage method, the exposure apparatus disclosed in, for example, U.S. Patent Application Publication No. 2008/0088843 is known. According to this exposure apparatus, improvement in resolution and throughput can be expected. However, in the local liquid immersion type exposure apparatus disclosed in U.S. Patent Application Publication No. 2008/0088843, a liquid immersion space formed under the projection optical system has to be constantly maintained so as to maximize the throughput, and in order to do so, a member of some kind has to constantly be placed interchangeably, right under the projection optical system. And, it is desirable for this interchangeable placement of the member to contribute to improving the throughput of the apparatus.

SUMMARY OF THE INVENTION

According to a first aspect of the present invention, there is provided a first exposure apparatus that exposes an object with an energy beam, the apparatus comprising: an exposure station where an exposure processing to irradiate an energy beam on an object is performed; a measurement station which is placed at a position a predetermined distance away on one side of a direction parallel to a first axis, and where a measurement processing with respect to the object is performed; a first movable body which is movable within a first range including the exposure station within a two-dimensional plane including the first axis and a second axis orthogonal to the first axis; a second movable body which is movable within a second range including the measurement station within the two-dimensional plane; a plurality of holding members which hold the object, and are also supported relatively movable at least within a plane parallel to the two-dimensional plane by the first and second movable bodies, respectively; and a support device which can support the holding members, whereby while exposure processing with respect to an object held by the holding member supported by the first movable body in exposure station is performed, at least a part of a measurement processing with respect to an object held by the holding member supported by the second movable body in the measurement station and an exchange of an object held by the holding member supported on the support device is concurrently performed.

According to the apparatus, while exposure processing to an object held by the holding member supported by the first movable body in exposure station is performed, at least a part of a measurement processing to an object held by the holding member supported by the second movable body in the measurement station and an exchange of an object held by the holding member supported on the support device is concurrently performed. Because of this, exposure with a higher throughput becomes possible, even when compared with an exposure apparatus of the conventional twin stage method which concurrently performs an exposure processing to a wafer on one wafer stage, and processing such as wafer exchange and alignment on another stage.

In the description, exposure station, when exposing an object (a wafer) by irradiating an energy beam, refers to a movement range of a holding member which holds the object and a part of an exposure apparatus in the vicinity of the range, and measurement station, refers to a movement range of a holding member which holds an object and a part of an exposure apparatus in the vicinity of the range when a predetermined measurement with respect to the object such as alignment measurement, focus measurement and the like is performed.

According to a second aspect of the present invention, there is provided a second exposure apparatus that exposes an object with an energy beam via an optical system, the apparatus comprising; a first movable body which is movable within an area in a two-dimensional plane including a first position right under the optical system; a second movable body which is movable independent from the first movable body in an area within the two-dimensional plane, including a second position spaced apart from the first position on one side of a direction parallel to the first axis within the two-dimensional plane and the first position; and a plurality of holding members which hold the object and is supported relatively movable with respect to both of the first and second movable bodies at least in a direction parallel to the first axis, and is also supported relatively movable at least within a plane parallel to the two-dimensional plane by the first movable body, whereby a first and second holding member supported by the first and second movable bodies, respectively, of the plurality of holding members move to the other side of the direction parallel to the first axis, and by the first and second movable bodies moving to the one side of the direction parallel to the first axis, transition from a first state in which an object on the first holding member is positioned at the first position to a second state in which an object on the second holding member is positioned at the first position is performed.

According to the apparatus, when transition is performed from a first state in which an object on a first holding member is positioned at a first position right under an optical system to a second state in which an object on a second holding member is positioned at the first position right under the optical system, the first and second holding members move in a direction parallel to a first axis, and a first movable body and a second movable body move in the opposite direction. Therefore, in parallel with the state transition from the first state to the second state described above, it becomes possible to perform at least a part of an operation of mounting the second holding member from the second movable body to the first movable body.

According to a third aspect of the present invention, there is provided a device manufacturing method, including exposing an object using one of the first and second exposure apparatuses; and developing the object which has been exposed.

According to a fourth aspect of the present invention, there is provided a first exposure method in which an object is exposed with an energy beam, the method comprising: preparing at least three holding members which hold an object, respectively; and concurrently performing at least a part of an exposure processing to an object held by a first holding member of the at least three holding members in an exposure station, a measurement processing to an object held by a second holding member of the at least three holding members in a measurement position placed away from the exposure station at a position a predetermined distance away on one side of a direction parallel to a first axis, and an object exchange using a third holding member of the at least three holding members.

According to the method, at least a part of an exposure processing to an object held by a first holding member in an exposure station, a measurement processing to an object held by a second holding member in a measurement position, and an object exchange using a third holding member at a position besides the exposure station and the measurement station is concurrently performed. Because of this, exposure with a higher throughput becomes possible, even when compared with an exposure method performed in an exposure apparatus of the conventional twin stage method which concurrently performs an exposure processing to a wafer on a wafer stage, and processing such as wafer exchange and alignment on another stage.

According to a fifth aspect of the present invention, there is provided a second exposure method in which an object is exposed by an energy beam via an optical system, the method comprising: preparing a plurality of holding members that each hold the object, and are relatively supportable by both a first movable body which is movable in an area within a two-dimensional plane including a first position just under the optical system and a second movable body which is movable independently from the first movable body in an area within the two-dimensional plane including a second position distanced apart from the first position on one side in a direction parallel to a first axis within the two-dimensional plane, at least in a direction parallel to the first axis; and on performing a transition from a first state in which an object on a first holding member of the plurality of holding members is located at the first position to a second state in which an object on a second holding member of the plurality of holding members is located at the first position, the first and second holding members supported by the first and second movable bodies in the first state, respectively, are moved to the other side of a direction parallel to the first axis, and the first and second movable bodies are moved to one side of a direction parallel to the first axis.

According to the method, in parallel with the state transition from the first state to the second state described above, it becomes possible to perform at least a part of an operation of mounting the second holding member from the second movable body to the first movable body.

According to a sixth aspect of the present invention, there is provided a device manufacturing method, including exposing an object using one of the first and second exposure methods of the present invention; and developing the object which has been exposed.

BRIEF DESCRIPTION OF THE DRAWINGS

In the accompanying drawings;

FIG. 4 is a view used to explain a movable blade which the exposure apparatus in FIG. 2 is equipped with;

DESCRIPTION OF THE EMBODIMENTS

A First Embodiment

A first embodiment of the present invention will be described below, with reference to FIGS. 1 to 28.

Figure 1:
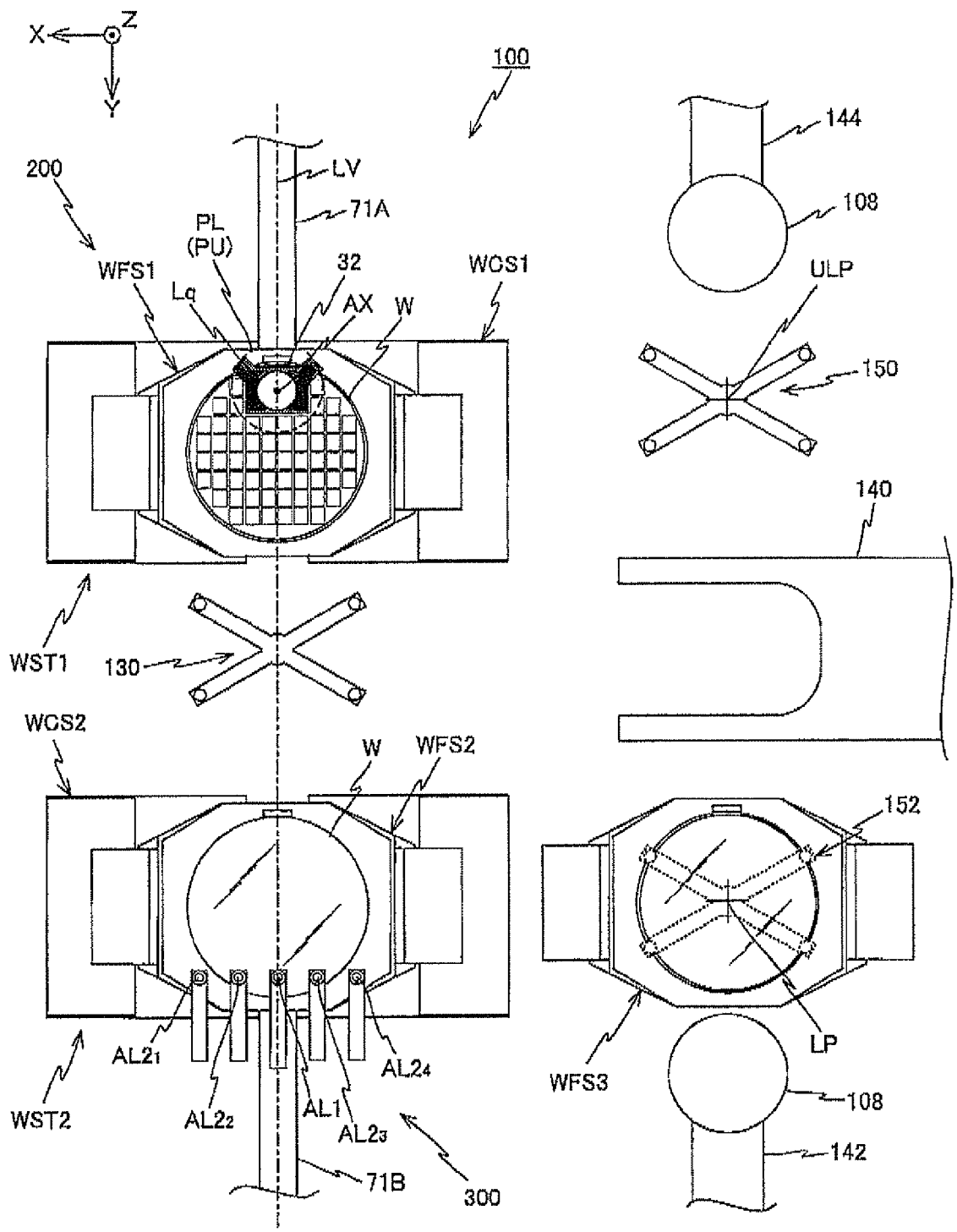
FIG. 1 is a planar view showing a schematic configuration of the exposure apparatus of a first embodiment.

FIG. 1 shows a schematic configuration of an exposure apparatus 100 in the first embodiment in a planar view. Exposure apparatus 100 is a projection exposure apparatus by the step-and-scan method, or a so-called scanner. As it will be described later, a projection optical system PL is arranged in the embodiment, and in the description below, a direction parallel to an optical axis AX of this projection optical system PL will be described as the Z-axis direction, a direction within a plane orthogonal to the Z-axis direction in which a reticle and a wafer are relatively scanned will be described as the Y-axis direction, a direction orthogonal to the Z-axis direction and the Y-axis direction will be described as the X-axis direction, and rotational (inclination) directions around the X-axis, the Y-axis, and the Z-axis will be described as θx, θy, and θz directions, respectively.

As shown in FIG. 1, exposure apparatus 100 is equipped with an exposure station 200 in which exposure to wafer W is performed, a measurement station 300 placed away by a predetermined distance to the +Y side of exposure station 200, a center table 130 placed between measurement station 300 and exposure station 200, two wafer stages WST1 and WST2, an unload table 150 placed away by a predetermined distance to the −X side of exposure station 200, a load table 152 which is located on the +y side of unload table 150 and on the −X side of measurement station 300, a robot arm 140 which is movable within a plane parallel to an XY plane and is also vertically movable (moves in the Z-axis direction), a load arm 142, and an unload arm 144.

Figure 2:
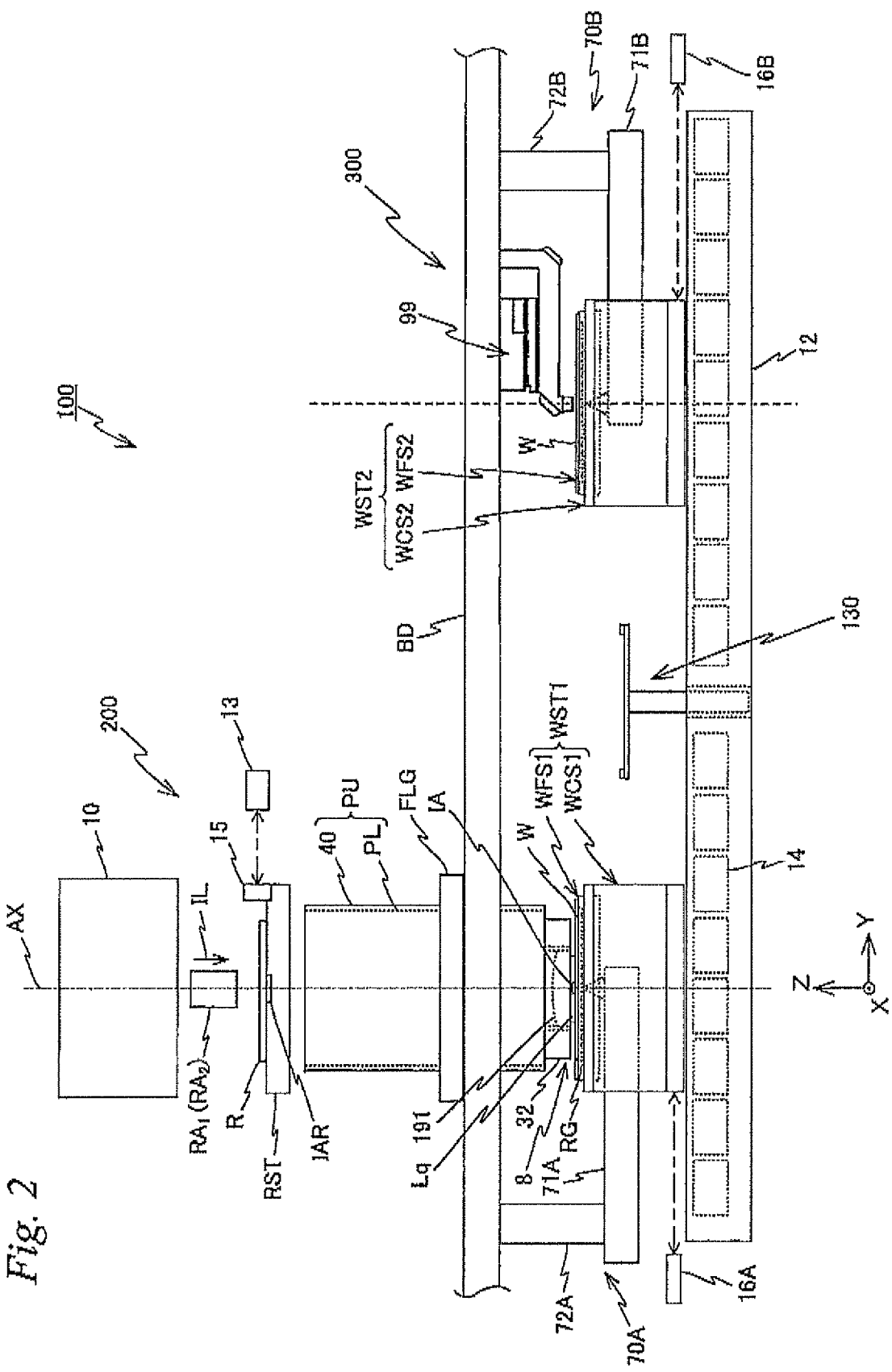
FIG. 2 is a view schematically showing a configuration of an exposure station, a measurement station and the like of the exposure apparatus in FIG. 1.

Exposure station 200 is placed close to an end on the −Y side of a base board 12, and measurement station 300 is placed close to the end on the +Y side of base board 12, as shown in FIG. 2. Further, center table 130 is placed at a position between measurement station 300 and exposure station 200, at an internal area of base board 12. Wafer stages WST1 and WST2 are placed on base board 12.

Now, base board 12 is supported on the floor surface almost horizontally (parallel to the XY plane) by a vibration isolation mechanism (omitted in drawings). Base board 12 is made of a tabular shaped member, and the degree of flatness of the upper surface is extremely high and serves as a guide surface when wafer stages WST1 and WST2 move.

Exposure station 200 comprises an illumination system 10, a reticle stage RST, a projection unit PU, a local liquid immersion device 8 and the like.

Illumination system 10 includes a light source, an illuminance uniformity optical system, which includes an optical integrator and the like, and an illumination optical system that has a reticle blind and the like (none of which are shown), as is disclosed in, for example, U.S. Patent Application Publication No. 2003/0025890 and the like. Illumination system 10 illuminates a slit-shaped illumination area IAR which is set on a reticle R with a reticle blind (also referred to as a masking system) by illumination light (exposure light) IL with a substantially uniform illuminance In this case, as illumination light IL, for example, an ArF excimer laser beam (wavelength 193 nm) is used.

On reticle stage RST, reticle R on which a circuit pattern or the like is formed on its pattern surface (the lower surface in FIG. 2) is fixed, for example, by vacuum chucking. Reticle stage RST is finely drivable within an XY plane, for example, by a reticle stage drive section 11 (not shown in FIG. 2, refer to FIG. 13) that includes a linear motor or the like, and reticle stage RST is also drivable in a scanning direction (in this case, the Y-axis direction, which is the lateral direction of the page surface in FIG. 2) at a predetermined scanning speed.

The positional information (including rotation information in the θz direction) of reticle stage RST in the XY plane is constantly detected, for example, at a resolution of around 0.25 nm by a reticle laser interferometer (hereinafter referred to as a "reticle interferometer") 13, via a movable mirror 15 (the mirrors actually arranged are a Y movable mirror (or a retro reflector) that has a reflection surface which is orthogonal to the Y-axis direction and an X movable mirror that has a reflection surface orthogonal to the X-axis direction) fixed on reticle stage RST. The measurement values of reticle interferometer 13 are sent to a main controller 20 (not shown in FIG. 2, refer to FIG. 13). Incidentally, the positional information of reticle stage RST can be measured by an encoder system as is disclosed in, for example, U.S. Patent Application Publication 2007/0288121 and the like.

Projection unit PU is placed below reticle stage RST (on the −Z side) in FIG. 2. Projection unit PU is supported via a flange portion FLG provided in the outer periphery of the projection unit, by a main frame (also called a metrology frame) BD supported horizontally by a support member (not shown). Projection unit PU includes a barrel 40, and a projection optical system PL consisting of a plurality of optical elements held by barrel 40. As projection optical system PL, for example, a both-side telecentric dioptric system that has a predetermined projection magnification (such as one-quarter, one-fifth, or one-eighth times) is used. Therefore, when illumination system 10 illuminates illumination area TAR, on reticle R with illumination area IL, by illumination light IL which has passed through reticle R placed so that its pattern surface substantially coincides with a first surface (object surface) of projection optical system PL, a reduced image of the circuit pattern of reticle R within illumination area IAR via projection optical system PL (projection unit PU) is formed on a wafer W whose surface is coated with a resist (a sensitive agent) and is placed on a second surface (image plane surface) side of projection optical system PL, on an area (hereinafter also referred to as an exposure area) IA conjugate with illumination area IAR. And by reticle stage RST holding reticle R and a wafer fine movement stage (hereinafter shortly referred to as a fine movement stage) holding wafer W being synchronously driven, reticle R is relatively moved in the scanning direction (the Y-axis direction) with respect to illumination area IAR (illumination light IL) while wafer W is relatively moved in the scanning direction (the Y-axis direction) with respect to exposure area IA (illumination light IL), thus scanning exposure of a shot area (divided area) on wafer W is performed, and the pattern of reticle R is transferred onto the shot area. That is, in the embodiment, the pattern of reticle R is generated on wafer W according to illumination system 10 and projection optical system PL, and then by the exposure of the sensitive layer (resist layer) on wafer W with illumination light IL, the pattern is formed on wafer W. Now, projection unit PU is held by a main frame BD, and in the embodiment, mainframe BD is supported almost horizontally by a plurality of (e.g. three or four) support members which are each placed on an installation surface (floor surface) via a vibration isolation mechanism. Incidentally, the vibration isolation mechanism can be placed between each of the support members and main frame BD. Further, as is disclosed in, for example, PCT International Publication 2006/038952, main frame BD (projection unit PU) can be supported by suspension with respect to a mainframe member (not shown) placed above projection unit PU or with respect to a reticle base. Further, as it can be seen from FIG. 1, in the embodiment, three fine movement stages WFS1, WFS2, and WFS3 which are configured totally the same, are provided as the fine movement stage (also referred to as a table).

Local liquid immersion device 8 includes a liquid supply device 5, a liquid recovery device 6 (both of which are not shown in FIG. 2, refer to FIG. 13), a nozzle unit 32 and the like. As shown in FIG. 2, nozzle unit 32 is supported in a suspended state by a main frame BD supporting projection unit PU and the like via a support member (not shown) so that the periphery of the lower end portion of barrel 40 that holds an optical element closest to the image plane side (the wafer W side) constituting projection optical system PL, in this case, a lens (hereinafter also referred to as a "tip lens") 191, is enclosed. In the embodiment, main controller 20 controls liquid supply device 5 (refer to FIG. 13), and supplies a liquid Lq (refer to FIG. 2) between tip lens 191 and wafer W via nozzle unit 32, as well as control liquid recovery device 6 (refer to FIG. 3), and recovers liquid Lq from between tip lens 191 and wafer W via nozzle unit 32. During the operations, main controller 20 controls liquid supply device 5 and liquid recovery device 6 so that the quantity of liquid supplied constantly equals the quantity of liquid which has been recovered. Accordingly, a constant quantity of liquid Lq (refer to FIG. 2) is held constantly replaced in the space between tip lens 191 and wafer W. In the embodiment, as liquid Lq above, pure water that transmits the ArF excimer laser beam (light with a wavelength of 193 nm) is to be used.

Besides this, in exposure station 200, a fine movement stage position measurement system 70A is provided, including a measurement arm 71A supported almost in a cantilevered state (supported in the vicinity of one end) by main frame BD via a support member 72A. However, fine movement stage position measurement system 70A will be described after describing the fine movement stage, which will be described later, for convenience of the explanation.

Measurement station 300 is equipped with an aligner 99 fixed in a suspended state to main frame BD, and a fine movement stage position measurement system 70B including a measurement arm 71B supported in a cantilevered state (supported in the vicinity of one end) by main frame BD via a support member 72B. Fine movement stage position measurement system 70B faces an opposite direction but has a configuration similar to fine movement stage position measurement system 70A previously described.

Aligner 99 includes five alignment systems AL1, and $AL2_1$ to $AL2_4$ shown in FIG. 1, as is disclosed in, for example, U.S. Patent Application Publication No. 2008/0088843 and the like. To be more specific, as shown in FIG. 1, a primary alignment system AL1 is placed on a straight line (hereinafter, referred to as a reference axis) LV, which passes through the center of projection unit PU (optical axis AX of projection optical system PL, which also coincides with the center of exposure area IA previously described in the embodiment) and is also parallel to the Y-axis, in a state where the detection center is located at a position that is spaced apart from optical axis AX at a predetermined distance on the +Y side. On one side and the other side in the X-axis direction with primary alignment system AL1 in between, secondary alignment systems $AL2_1$ and $AL2_2$, and $AL2_3$ and $AL2_4$ whose detection centers are substantially symmetrically placed with respect to reference axis LV are severally arranged. That is, five alignment systems AL1 and $AL2_1$ to $AL2_4$ are placed so that their detection centers are placed along the X-axis direction. Secondary alignment systems $AL2_1$, $AL2_2$, $AL2_3$, and $AL2_4$ are held within the XY plane by a movable holding device (a slider). As each of alignment systems AL1, and $AL2_1$ to $AL2_4$, an FIA (Field Image Alignment) system by an image processing method is used. The imaging signals from alignment systems AL1, and $AL2_1$ to $AL2_4$ are supplied to main controller 20 (refer to FIG. 13). Incidentally, in FIG. 2, the five alignment systems AL1 and $AL2_1$ to $AL2_4$ are shown as an aligner 99, including the holding device (sliders) which hold these systems. Incidentally, the detailed configuration of aligner 99 is disclosed in, for example, PCT International Publication No. 2008/056735 (and the corresponding U.S. Patent Application Publication No. 2009/0233234) and the like.

Figure 3:
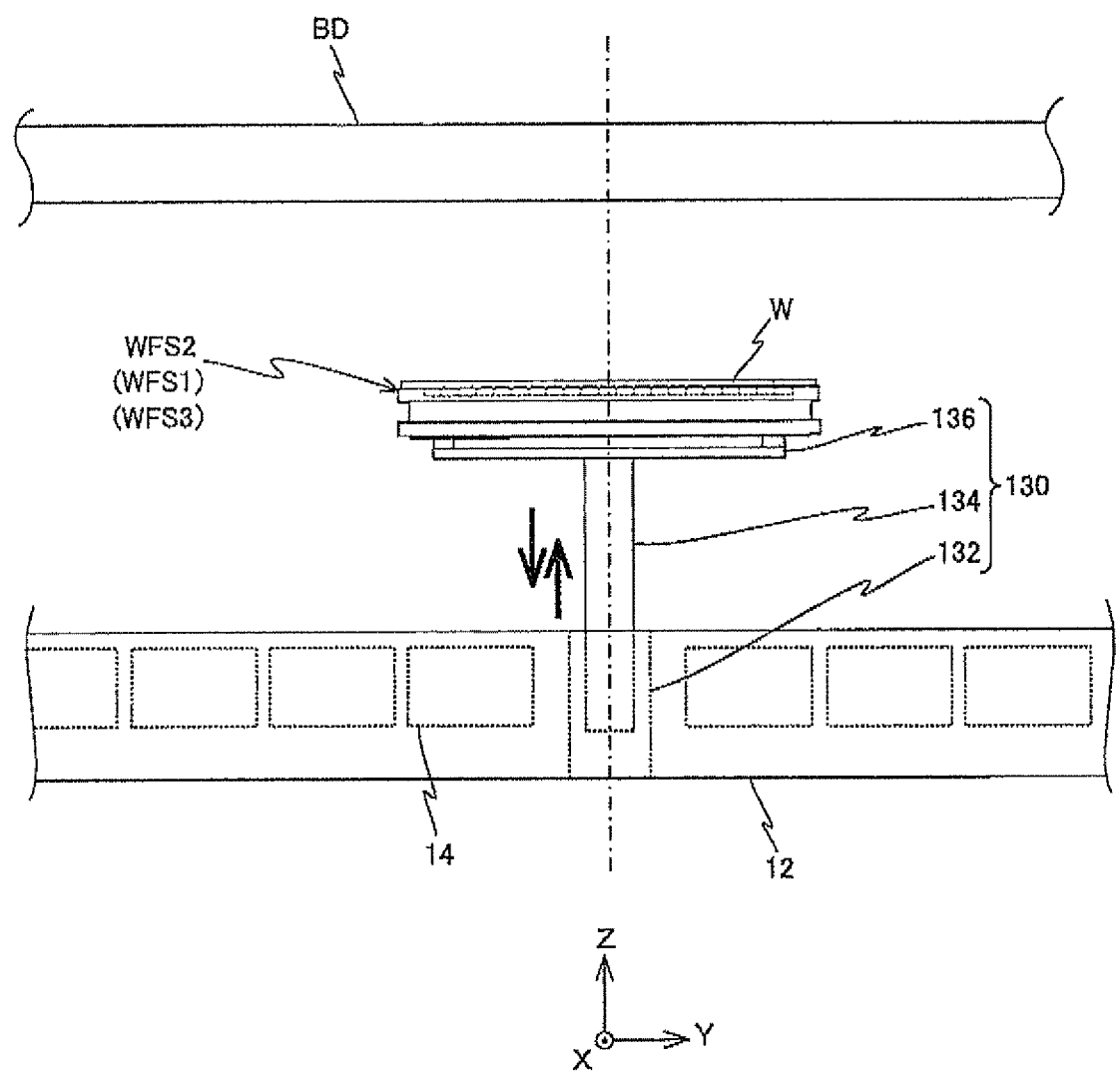
FIG. 3 is an enlarged view showing an area around the center table in FIG. 2.

As shown in FIG. 1, center table 130 is placed at a position between measurement station 300 and exposure station 200, with the center of the table substantially coinciding on reference axis LV previously described. As shown in FIG. 3, center table 130 is equipped with a driver 132 placed inside of base board 12, a shaft 134 which is vertically driven by driver 132, and a table main body 136 which has an K-shape in a planar view and is fixed to the upper end of shaft 134. Driver 132 of center table 130 is controlled by main controller 20 (refer to FIG. 13).

As it can be seen from FIGS. 2, 5A and the like, wafer stage WST1 has a wafer coarse movement stage (hereinafter, shortly referred to as a coarse movement stage) WCS1, which is supported by levitation above base board 12 by a plurality of non-contact bearings, such as, for example, air bearings, provided on its bottom surface and is driven in an XY two-dimensional direction by a coarse movement stage drive system 51A (refer to FIG. 3), and a fine movement stage WFS1, which is supported in a non-contact manner by coarse movement stage WCS1 and is relatively movable with respect to coarse movement stage WCS1. Fine movement stage WFS1 is driven by a fine movement stage drive system 52A (refer to FIG. 13) with respect to coarse movement stage WCS1 in the X-axis direction, the Y-axis direction, the Z-axis direction, the ex direction, the θy direction, and the θz direction (hereinafter expressed as directions of six degrees of freedom, or directions of six degrees of freedom (X, Y, Z, θx, θy, θz)).

Positional information (also including rotation information in the θz direction) in the XY plane of wafer stage WST1 (coarse movement stage WCS1) is measured by a wafer stage position measurement system 16A. Further, positional information in directions of six degrees of freedom (X, Y, Z, θx, θy, and θz) of fine movement stage WFS1 (or fine movement stages WFS2 or WFS3) supported by coarse movement stage WCS1 in exposure station 200 is measured by fine movement stage position measurement system 70A. Measurement results of wafer stage position measurement system 16A and fine movement stage position measurement system 70A are supplied to main controller 20 (refer to FIG. 13) for position control of coarse movement stage WCS1 and fine movement stage WFS1 (or WFS2 or WFS3).

Similar to wafer stage WST1, wafer stage WST2 has a wafer coarse movement stage WCS2, which is supported by levitation above base board 12 by a plurality of non-contact bearings (e.g., air bearings (omitted in drawings)) provided on its bottom surface and is driven in the XY two-dimensional direction by a coarse movement stage drive system 51B (refer to FIG. 13), and a wafer fine movement stage WFS2, which is supported in a non-contact manner by coarse movement stage WCS2 and is relatively movable with respect to coarse movement stage WCS2. Fine movement stage WFS2 is driven by a fine movement stage drive system 52B (refer to FIG. 13) with respect to coarse movement stage WCS2 in directions of six degrees of freedom (X, Y, Z, θx, θy, θz).

Positional information (also including rotation information in the θz direction) in the XY plane of wafer stage WST2 (coarse movement stage WCS2) is measured by a wafer stage position measurement system 16B. Further, positional information in directions of six degrees of freedom (X, Y, Z, θx, θy, and θz) of fine movement stage WFS2 (or WFS1 or WFS3) supported by coarse movement stage WCS2 in measurement station 300 is measured by fine movement stage position measurement system 70B. Measurement results of wafer stage position measurement system 16B and fine movement stage position measurement system 70B are supplied to main controller 20 (refer to FIG. 13) for position control of coarse movement stage WCS2 and fine movement stage WFS2 (or WFS1 or WFS3).

When fine movement stage WFS1 (or WFS2 or WFS3) is supported by coarse movement stage WCS1, relative positional information of fine movement stage WFS1 (or WFS2 or WFS3) and coarse movement stage WCS1 in directions of three degrees of freedom, which are X, Y, and θz, can be measured by a relative position measuring instrument 22A (refer to FIG. 13) provided in between coarse movement stage WCS1 and fine movement stage WFS1 (or WFS2 or WFS3).

Similarly, when fine movement stage WFS2 (or WFS1 or WFS3) is supported by coarse movement stage WCS2, relative positional information of fine movement stage WFS2 (or WFS1 or WFS3) and coarse movement stage WCS2 in directions of three degrees of freedom, which are X, Y, and θz, can be measured by a relative position measuring instrument 22B (refer to FIG. 13) provided in between coarse movement stage WCS2 and fine movement stage WFS2 (or WFS1 or WFS3).

As relative position measuring instruments 22A and 22B, for example, an encoder can be used which includes at least two heads arranged at coarse movement stages WCS1 and WCS2, respectively, whose area subject to measurement are gratings provided on fine movement stages WFS1, WFS2, and WFS3, and measures a position of fine movement stages WFS1, WFS2, and WFS3 in the X-axis direction, the Y-axis direction, and the θz direction, based on an output of the heads. Measurement results of relative position measuring instruments 22A and 22B are supplied to main controller 20 (refer to FIG. 13).

Configuration and the like of each of the parts configuring the stage system including the various measurement systems described above will be explained in detail, later on.

Figure 4:
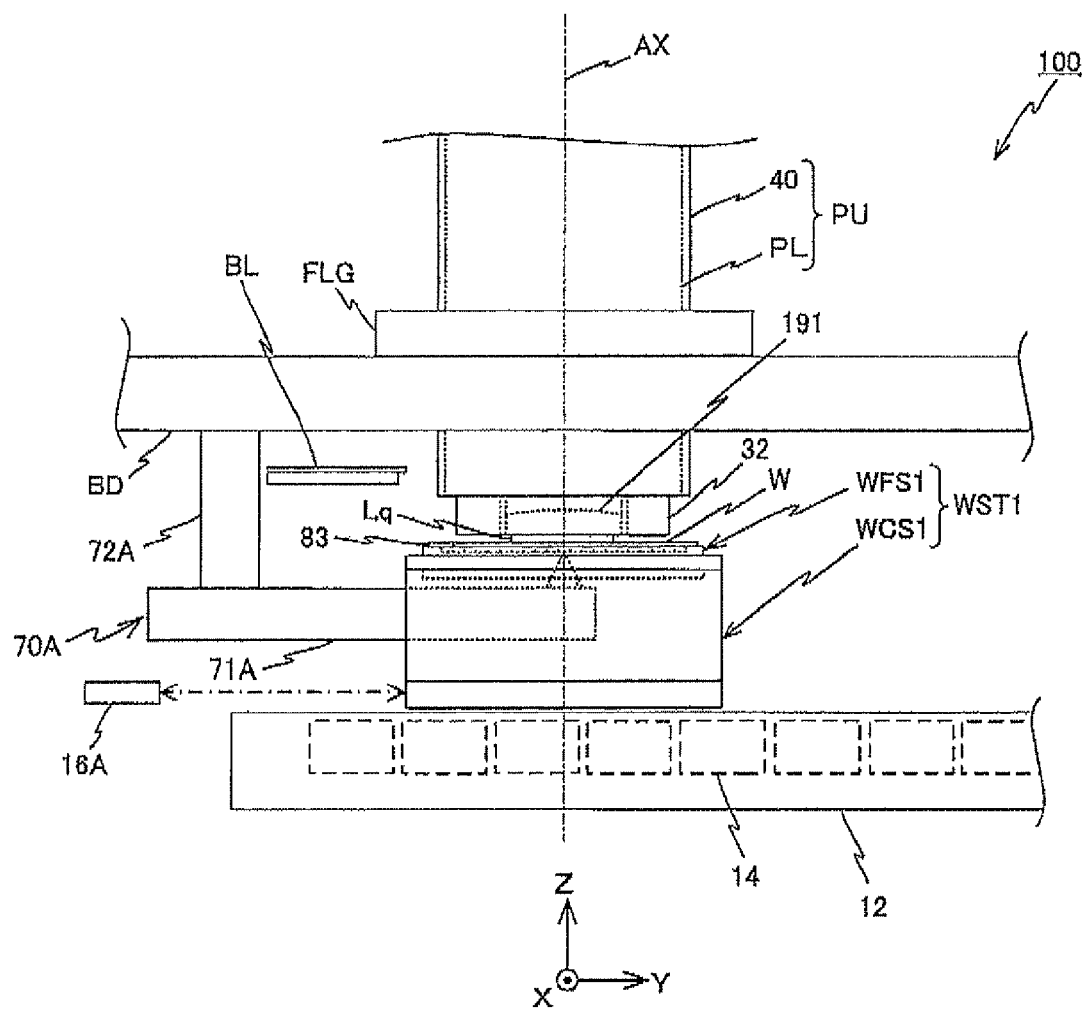

Furthermore, as shown in FIG. 4, in exposure apparatus 100 of the embodiment, a movable blade BL is provided in the vicinity of projection unit PU. Movable blade L can be driven in the Z-axis direction and the Y-axis direction by a blade drive system 58 (not shown in FIG. 4, refer to FIG. 13). Movable blade BL is a moveable member having a flat surface as an upper surface to hold liquid Lq, and in the embodiment, is made of a tabular member, which has a projecting portion formed on the upper end on the +Y side that projects out more than the other portions.

In the embodiment, the upper surface of movable blade BL has liquid repellency to liquid Lq. In the embodiment, movable blade BL includes a metal base material such as stainless steel and the like, and a film of a liquid-repellent material formed on the surface of the base material. The liquid-repellent material includes, for example, PFA (Tetra fluoro ethylene-perfluoro alkylvinyl ether copolymer), PTFE (Poly tetra fluoro ethylene), Teflon (a registered trademark) and the like. Incidentally, the material forming the film can be an acrylic-based resin or a silicone-based resin. Further, the whole movable blade BL can be formed of at least one of the PFA, PTFE, Teflon (a registered trademark), acrylic-based resin, and silicone-based resin. In the embodiment, the contact angle of the upper surface of movable blade BL to liquid Lq is, for example, 90 degrees or more. Incidentally, the upper surface of movable blade BL can be non-liquid repellent (lyophilic), besides being liquid repellent.

Movable blade BL can engage with fine movement stage WFS1 (or WFS2 or WFS3), which is supported by coarse movement stage WCS1, from the −Y side, and a surface appearing to be completely flat (for example, refer to FIG. 17) is formed in the engaged state along with the upper surface of fine movement stage WFS1 (or WFS2). Movable blade BL is driven by main controller 20 via blade drive system 58, and performs delivery of a liquid immersion space (liquid Lq) with fine movement stage WFS1 (or WFS2 or WFS3). Incidentally, the delivery of the liquid immersion space Lq between movable blade BL and fine movement stage WFS1 (or WFS2 or WFS3) will be described further later on.

Besides this, in exposure apparatus 100 of the embodiment, a multiple point focal point position detection system (hereinafter shortly referred to as a multipoint AF system) AF (not shown in FIG. 2, refer to FIG. 13) having a similar configuration as the one disclosed in, for example, U.S. Pat. No. 5,448,332 and the like, is arranged in the vicinity of projection unit PD. Detection signals of multipoint AF system AF are supplied to main controller 20 (refer to FIG. 13) via an AF signal processing system (not shown). Main controller 20 detects positional information (surface position information) of the wafer W surface in the Z-axis direction at a plurality of detection points of the multipoint AF system AF based on detection signals of multipoint AF system AF, and performs a so-called focus leveling control of wafer W during the scanning exposure based on the detection results. Incidentally, positional information (unevenness information) of the wafer W surface can be acquired in advance at the time of wafer alignment (EGA) by arranging the multipoint AF system in the vicinity of wafer alignment system ALG, and the so-called focus leveling control of wafer W can be performed at the time of exposure by using the surface position information and measurement values of a laser interferometer system 75 (refer to FIG. 13) configuring a part of fine movement stage position measurement system 70 which will be described later on. In this case, multipoint AF system does not have to be provided in the vicinity of projection unit PU. Incidentally, measurement values of an encoder system configuring fine movement stage position measurement system 70A can also be used, rather than laser interferometer system 75 in focus leveling control.

Further, as is disclosed in detail in, for example, U.S. Pat. No. 5,646,413 and the like, a pair of reticle alignment systems $RA_1$ and $RA_2$ (reticle alignment system $RA_2$ is hidden behind reticle alignment system $RA_1$ in the depth of the page surface in FIG. 2.) of an image processing method that has an imaging device such as a CCD and the like and uses a light (in the embodiment, illumination light IL) of the exposure wavelength as an illumination light for alignment is placed above reticle stage RST. The pair of reticle alignment systems $RA_1$ and $RA_2$ is used, in a state where a measurement plate to be described later on fine movement stage WFS1 (or WFS2 or WFS3) is positioned directly below projection optical system Pt with main controller 20 detecting a projection image of a pair of reticle alignment marks (omitted in drawings) formed on reticle R and a corresponding pair of first fiducial marks on the measurement plate via projection optical system PL, to detect a detection center of a projection area of a pattern of reticle R and a reference position on the measurement plate using projection optical system PL, namely to detect a positional relation with a center of the pair of first fiducial marks. Detection signals of reticle alignment detection systems $RA_1$ and $RA_2$ are supplied to main controller 20 (refer to FIG. 13) via a signal processing system (not shown). Incidentally, reticle alignment systems $RA_1$ and $RA_2$ do not have to be provided. In this case, it is desirable for fine movement stage WFS to have a detection system in which a light transmitting section (light-receiving section) is installed so as to detect a projection image of the reticle alignment mark, as disclosed in, for example, U.S. Patent Application Publication No. 2002/0041377 and the like.

Referring back to FIG. 1, while unload table 150 and load table 152 are configured similar to center table 130 previously described, with these unload table 150 and load table 152, the table main body does not necessarily have to move vertically.

In the embodiment, to unload wafer W which has already been exposed, the fine movement stage holding the wafer is mounted on unload table 150. In other words, an unloading position ULP is set on unload table 150. To load wafer W to which exposure has not yet been performed, the fine movement stage is mounted on load table 152. In other words, a loading position LP is set on road table 152. In load table 152, a temperature control device 153 (refer to FIG. 13) is provided. Temperature control device 153 performs the temperature control of the fine movement stage (one of WFS1 to WFS3) mounted on load table 152 and wafer W held by the fine movement stage.

Robot arm 140 carries the fine movement stage back and forth, between the three tables 130,150, and 152. Robot arm 140 is controlled by main controller 20 (refer to FIG. 13).

Load arm 142 and unload arm 144 consist of, for example, an arm of a multijoint robot which has a holding section, such as for example, a disc-shaped Bernoulli chuck (also called a float chuck) 108 at the tip.

As is known, the Bernoulli chuck is a chuck that utilizes the Bernoulli effect and fixes (suctions) the object in a non-contact manner by locally increasing the flow velocity of a blown out fluid (e.g., air). The Bernoulli effect, here, refers to an effect that the Bernoulli's theorem (principle) in which an increase in the speed of the fluid occurs simultaneously with a decrease in pressure has on fluid machinery. In the Bernoulli chuck, the holding state (suction/floating state) is decided, according to the weight of the object to be suctioned (fixed), and the flow rate of the fluid which is blown out from the chuck. More specifically, in the case the size of the object is known, the dimension of the gap between the chuck and the object to be held upon holding is decided, depending on the flow rate of the fluid which is blown cut from the chuck. In the embodiment, the Bernoulli chuck is used to suction (fix/hold) wafer W.

Figure 13:
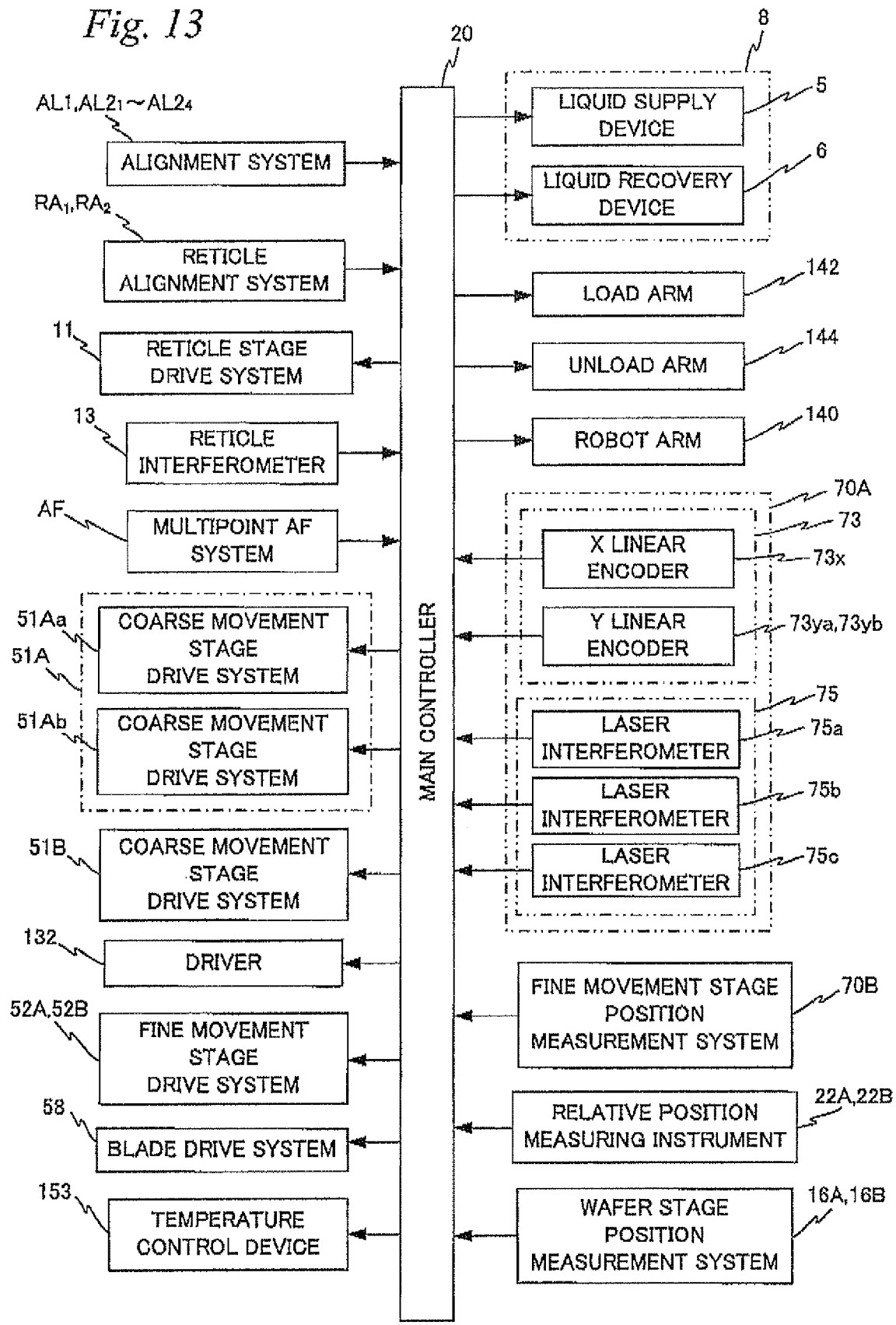
FIG. 13 is a block diagram showing a configuration of a control system of the exposure apparatus in FIG. 1.

Load arm 142 and unload arm 144 include Bernoulli chuck 108, and are controlled by main controller 20 (refer to FIG. 13).

Now, a configuration and the like of each part of the stage systems will be described in detail. First of all, wafer stages WST1 and WST2 will be described. In the embodiment, wafer stage WST1 and wafer stage WST2 are configured identically, including the drive system, the position measurement system and the like. Accordingly, in the following description, wafer stage WST1 will be taken up and described, representatively.

Figure 5A:
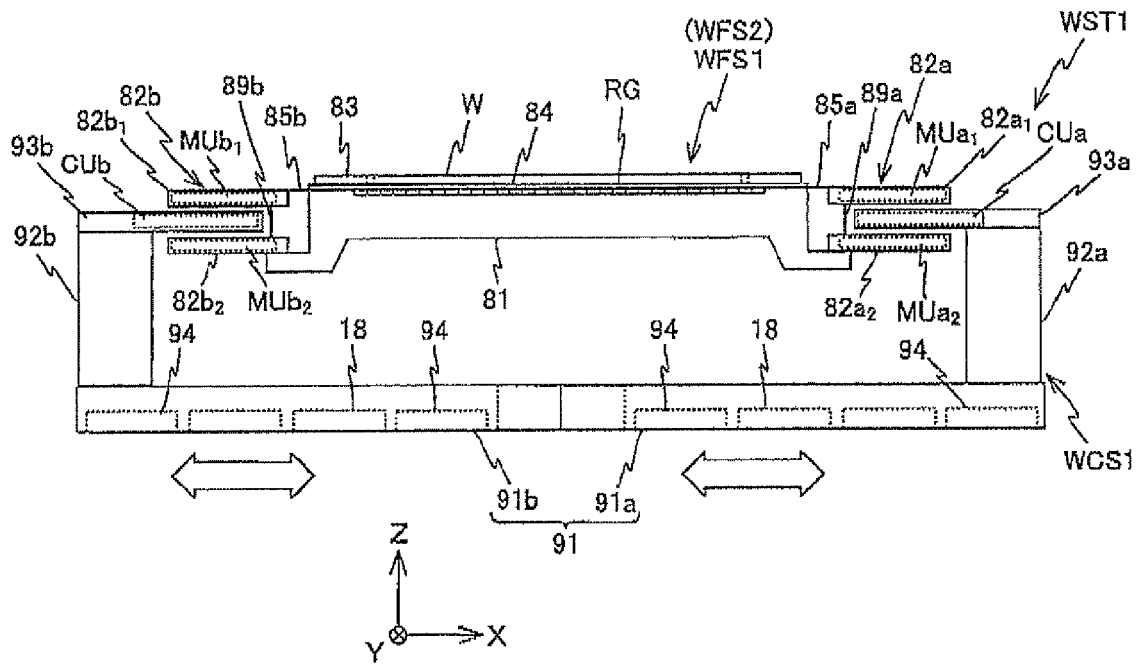
FIG. 5A shows a side view of a wafer stage which the exposure apparatus in FIG. 2 is equipped with when viewed from a −Y direction.
Figure 5B:
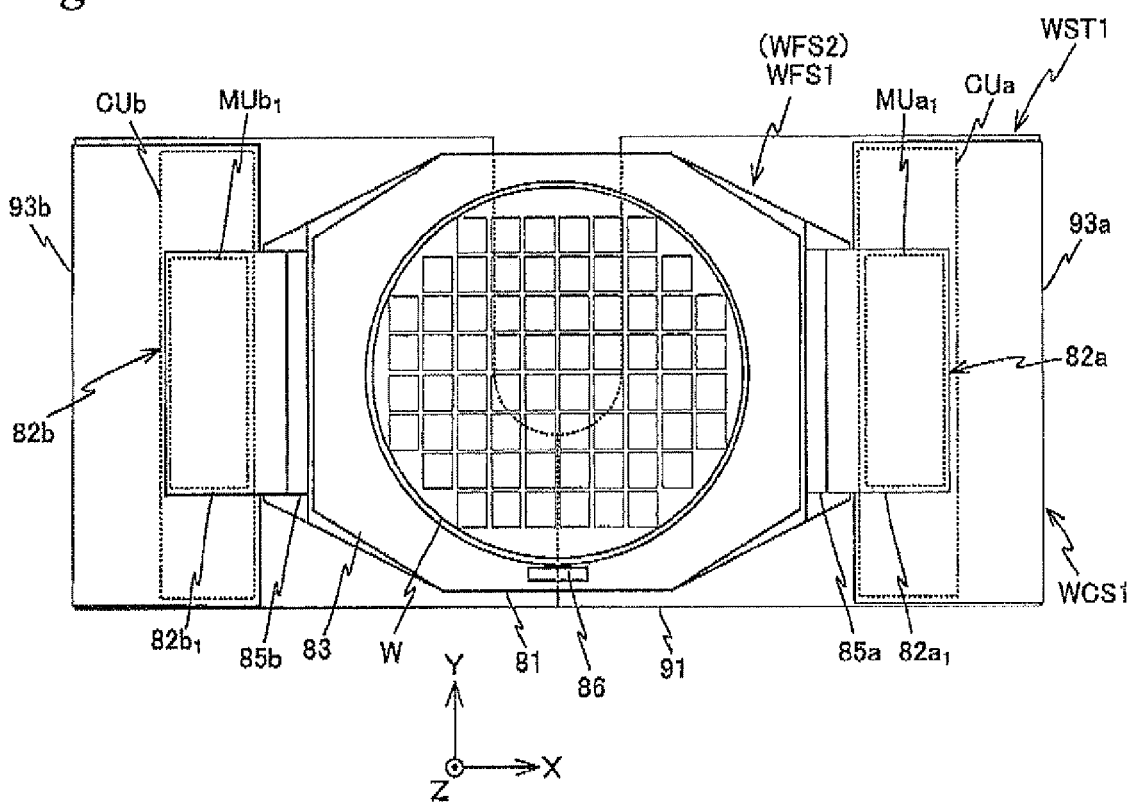
FIG. 5B is the wafer stage shown in a planar view.

As shown in FIGS. 5A and 5B, coarse movement stage WCS1 is equipped with a rectangular plate shaped coarse movement stage slides section 91 whose longitudinal direction is in the X-axis direction in a planar view (when viewing from the +Z direction), a rectangular plate shaped pair of side wall sections 92a and 92b which are each fixed on the upper surface of coarse movement slider section 91 on one end and the other end in the longitudinal direction, with the Y-axis direction serving as the longitudinal direction, and a pair of stator sections 93a and 93b that are each fixed on the upper surface of side wall sections 92a and 92b. As a whole, coarse movement stage WCS1 has a box like shape having a low height whose upper surface in a center in the X-axis direction and surfaces on both sides in the Y-axis direction are open. More specifically, in coarse movement stage WCS1, a space is formed inside penetrating in the Y-axis direction.

Figure 6A:
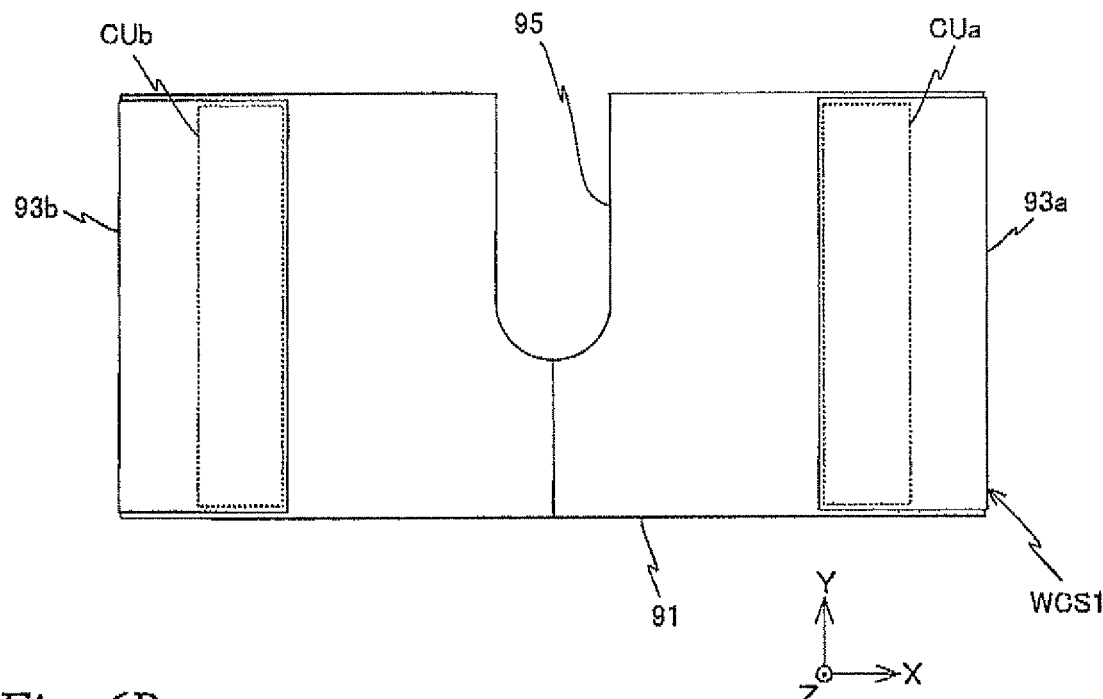
FIG. 6A is an extracted planar view of a coarse movement stage.
Figure 6B:
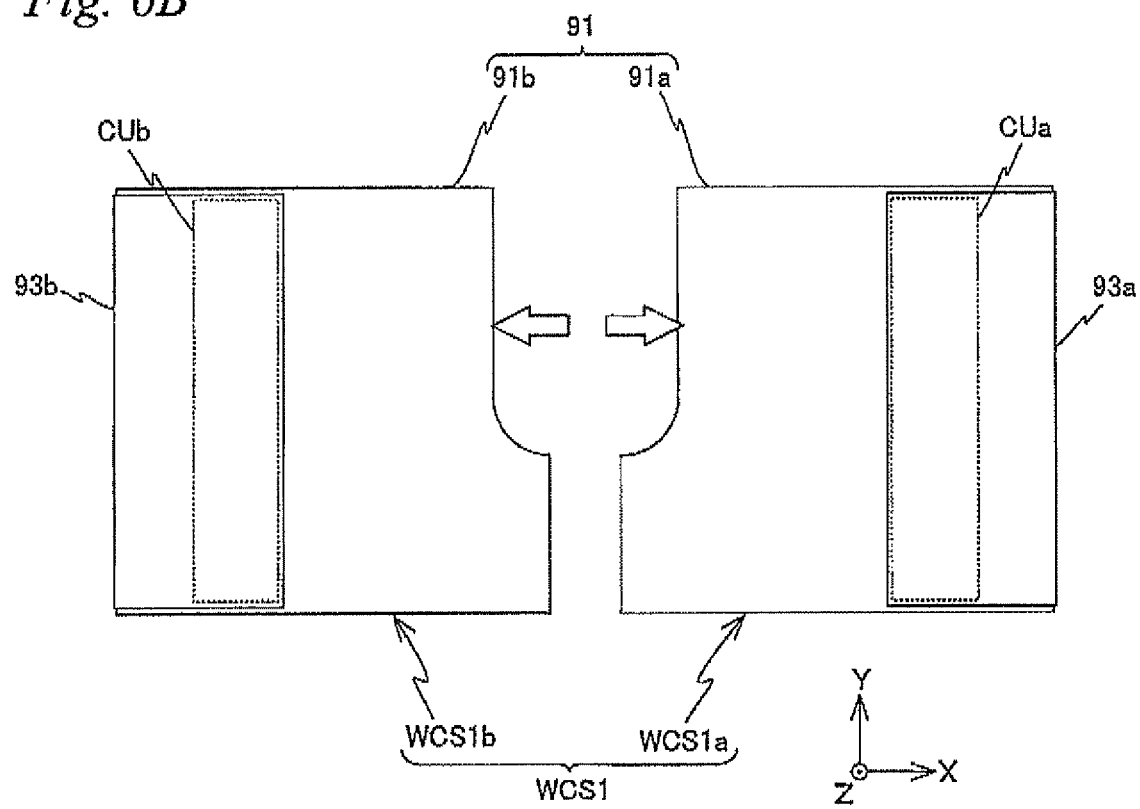
FIG. 6B is a planar view showing a state where the coarse movement stage is separated into two sections.
Figure 7:
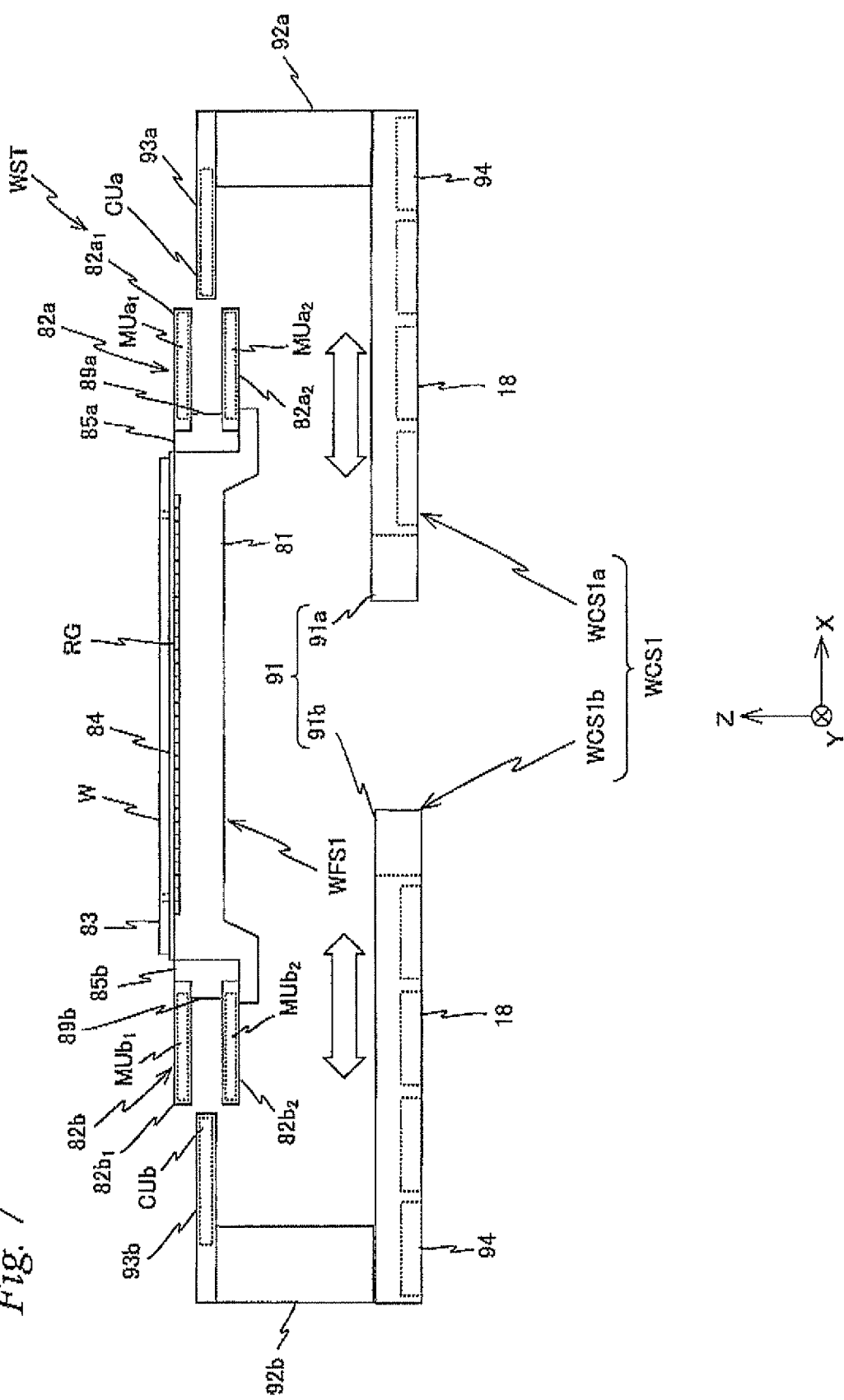
FIG. 7 is a front view of a wafer stage showing a separated state of the coarse movement stage.
Figure 65:
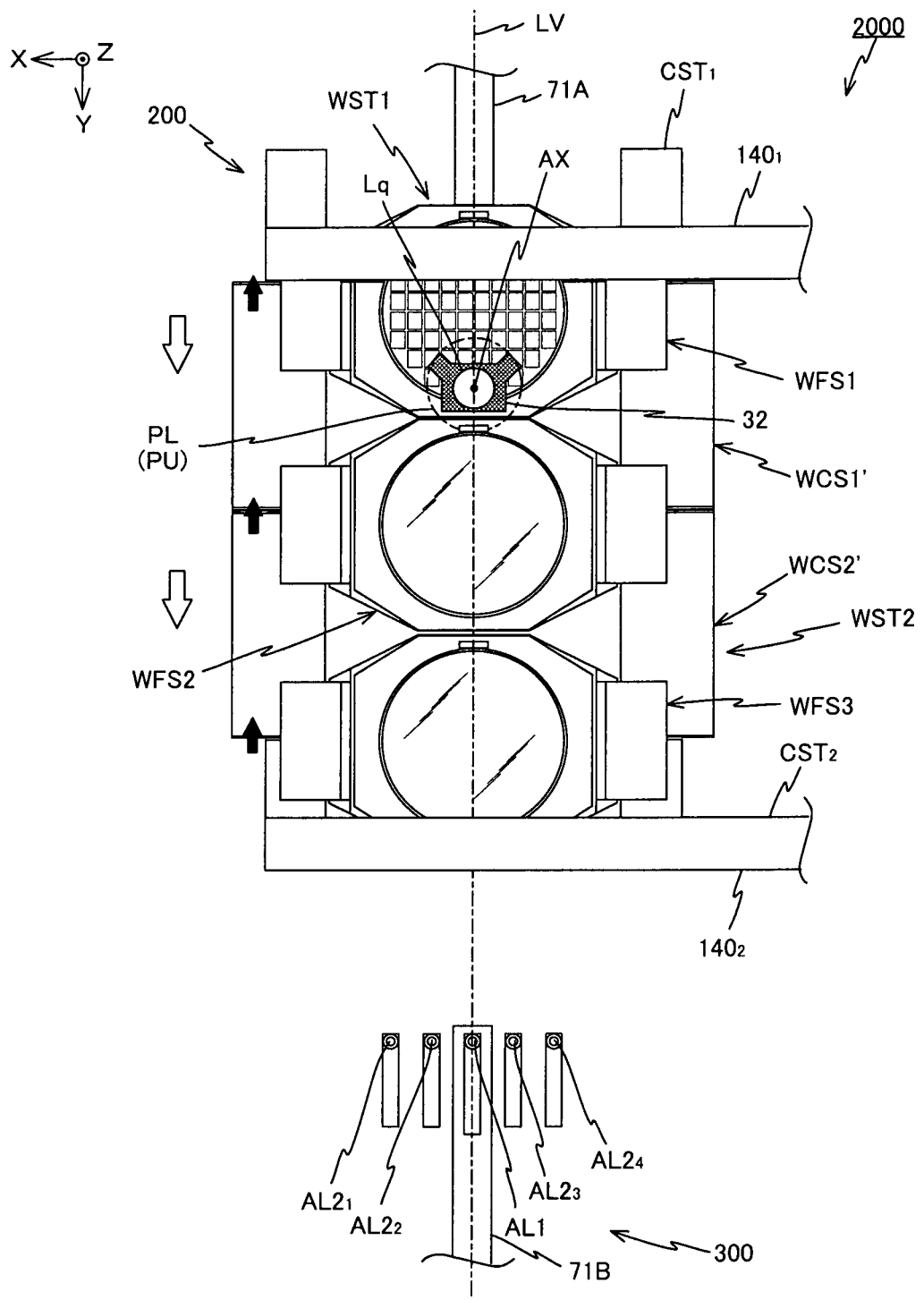
FIG. 65 is a view used to explain a parallel processing performed using the three fine movement stages (No. 3) in the exposure apparatus related to the second modified example.

As is shown in FIG. 6A, coarse movement stages WCS1 has a U-shaped notch 95, which is larger than the diameter of drive shaft 134 previously described, formed on one side (the +Y side) of the Y-axis direction in the center of a longitudinal direction (the X-axis direction) of coarse movement slider section 91. Further, as shown in FIG. 65, coarse movement stage WSC1 is configured separable into two sections (refer to FIG. 7), which are a first section WCS1a and a second section WCS1b, with a separation line in the center in the longitudinal direction serving as a boundary. Accordingly, coarse movement slider section 91 is configured of a first slider section 91a which structures a part of the first section WCS1a, and a second slider section 91b which structures a part of the second section WCS1b.

On the bottom surface of coarse movement stage WCS1, or more specifically, on the bottom surface of the first slider section 91a and the second slider section 91b, a magnet unit is fixed consisting of a plurality of permanent magnets 18 placed in the shape of a matrix, as shown in FIG. 5A. In correspondence with the magnet unit, inside base board 12, a coil unit is housed, including a plurality of coils 14 placed in the shape of a matrix with the XY two-dimensional direction serving as a row direction and a column direction, as shown in FIG. 2. The magnet unit configures coarse movement stage drive systems 51Aa and 51Ab (refer to FIG. 13), consisting of a planar motor employing a Lorentz electromagnetic drive method as is disclosed in, for example, U.S. Pat. No. 5,196,745, along with the coil unit of base board 12. The magnitude and direction of current supplied to each of the coils 14 configuring the coil unit are controlled by main controller 20 (refer to FIG. 13).

On the bottom surface of each of the first slider section 91a and the second slider section 91b, a plurality of air bearings 94 is fixed around the magnet unit described above. The first section WCS1a and the second section WCS1b of coarse movement stage WCS1 are each supported by levitation on base board 12 by a predetermined clearance, such as around several μm, by air bearings 94, and are driven in the X-axis direction, the Y-axis direction, and the θz direction by coarse movement stage drive systems 51Aa and 51Ab.

The first section WCS1a and the second section WCS1b are normally locked integrally, via a lock mechanism (not shown). More specifically, the first section WCS1a and the second section WCS1b normally operate integrally. Therefore, in this description, a drive system consisting of a planar motor that drives coarse movement stage WCS1, which is made so that the first section WCS1a and the second section WCS1b are integrally formed, will be referred to as a coarse movement stage drive system 51A (refer to FIG. 13).

Incidentally, as coarse movement stage drive system 51A, the drive method is not limited to the planar motor using the Lorentz electromagnetic force drive method, and for example, a planar motor by a variable reluctance drive system can also be used. Incidentally, the electromagnetic force in the electromagnetic force drive method is not limited to the Lorentz force. Besides this, coarse movement stage drive system 51A can be configured by a planar motor of a magnetic levitation type. In this case, the air bearings will not have to be arranged on the bottom surface of coarse movement slider section 91.

As shown in FIGS. 5A and 5B, the pair of stator sections 93a and 93b is each made of a member with a tabular outer shape, and in the inside, coil units CUa and Cub are housed consisting of a plurality of coils to drive fine movement stage WFS1 (or WFS2 or WFS3). While fine movement stages WFS1, WFS2, and WFS3 are configured identically, and are supported and driven similarly in a non-contact manner by coarse movement stage WCS1 in this case, in the following description, fine movement stage WFS1 will be taken up and described, representatively.

Stator section 93a has an end on the +X side fixed to the upper surface of side wall section 92a, and stator section 93b has an end on the −X side fixed to the upper surface of side wall section 92b.

As shown in FIGS. 5A and 5B, fine movement stage WFS1 is equipped with a main body section 81 consisting of an octagonal plate shape member whose longitudinal direction is in the X-axis direction in a planar view, and a pair of mover sections 82a and 82b that are each fixed to one end and the other end of main body section 81 in the longitudinal direction.

Main body section 81 is formed of a transparent material through which light can pass, so that a measurement beam (a laser beam) of an encoder system which will be described later can proceed inside the main body section. Further, main body section 81 is formed solid (does not have any space inside) in order to reduce the influence of air fluctuation to the laser beam inside the main body section. Incidentally, it is preferable for the transparent material to have a low thermal expansion, and as an example in the embodiment, synthetic quarts (glass) is used. Incidentally, main body section 81 can be structured all by the transparent material or only the section which the measurement beam of the encoder system passes through can be structured by the transparent material, and only the section which this measurement beam passes through can be formed solid.

In the center of the upper surface of main body section 81 (to be more precise, a cover glass which will be described later) of fine movement stage WFS1, a wafer holder (not shown) is arranged which holds wafer W by vacuum suction or the like. In the embodiment, for example, a wafer holder of a so-called pin chuck method on which a plurality of support sections (pin members) supporting wafer W are formed within a loop shaped projecting section (rim section) is used, and grating RG to be described later is provided on the other surface (rear surface) of the wafer holder whose one surface (surface) is a wafer mounting surface. Incidentally, the wafer holder can be formed integrally with fine movement stage WFS1, or can be fixed to main body section 81, for example, via an electrostatic chuck mechanism, a clamping mechanism, or by adhesion and the like. In the former case, grating RG is to be provided on a back surface side of fine movement stage WFS1.

Furthermore, on the upper surface of main body section 81 on the outer side of the wafer holder (mounting area of wafer W), as shown in FIGS. 5A and 5B, a plate (a liquid repellent plate) 83 is attached that has a circular opening one size larger than wafer W (the wafer holder) formed in the center, and also has an octagonal outer shape (contour) corresponding to main body section 81. A liquid repellent treatment against liquid Lq is applied to the surface of plate 83 (a liquid repellent surface is formed). In other words, on the surface of plate 83, a film of a liquid-repellent material is formed. The liquid-repellent material includes, for example, PFA (Tetra fluoro ethylene-perfluoro alkylvinyl ether copolymer), PTFE (Poly tetra fluoro ethylene), Teflon (a registered trademark) and the like. Incidentally, the material forming the film can be an acrylic-based resin or a silicone-based resin. Further, plate 83 can be formed of at least one of the PFA, PTFE, Teflon (a registered trademark), acrylic-based resin, and silicone-based resin. The contact angle of the surface of plate 83 to liquid Lq is, for example, 90 degrees or more. Plate 83 is fixed to the upper surface of main body section 81, so that its entire surface (or a part of its surface) becomes substantially flush with the surface of wafer W. Further, on the −Y side end of plate 83, as shown in FIG. 5B, a measurement plate 86, which has a narrow rectangular shape in the X-axis direction, is set in a state where its surface is substantially flush with the surface of plate 83, or more specifically, the surface of wafer W. On the surface of measurement plate 86, at least the pair of first fiducial marks previously described, and a second fiducial mark detected by primary alignment system AL1 are formed (both the first and second fiducial marks are omitted in the drawing). Incidentally, instead of attaching plate 83 to main body section 81, for example, the wafer holder can be formed integrally with fine movement stage WFS, and a liquid repellent treatment can be applied to the upper surface of fine movement stage WFS in a periphery area (an area the same as plate 83 (can include the surface of measurement plate 86)) surrounding the wafer holder.

As shown in FIG. 5A, on the upper surface of main body section 81, a two-dimensional grating (hereinafter merely referred to as a grating) RG is placed horizontally (parallel to the wafer W surface). Grating RG is fixed (or formed) on the upper surface of main body section 81 consisting of a transparent material. Grating RG includes a reflection diffraction grating (X diffraction grating) whose periodic direction is in the X-axis direction and a reflection diffraction grating (Y diffraction grating) whose periodic direction is in the Y-axis direction. In the embodiment, the area (hereinafter, forming area) on main body section 81 where the two-dimensional grating is fixed or formed, as an example, is in a circular shape which is one size larger than wafer W.

Grating RG is covered and protected with a protective member, such as, for example, a cover glass 84. In the embodiment, on the upper surface of cover glass 84, the holding mechanism previously described (the electrostatic chuck mechanism and the like) to hold the wafer holder by suction is provided. Incidentally, in the embodiment, while cover glass 84 is provided so as to cover almost the entire surface of the upper surface of main body section 81, cover glass 84 can be arranged so as to cover only a part of the upper surface of main body section 81 which includes grating RG. Further, while the protective member (cover glass 84) can be formed of the same material as main body section 81, besides this, the protective member can be formed of, for example, metal or ceramics. Further, although a plate shaped protective member is desirable because a sufficient thickness is required to protect grating RG, a thin film protective member can also be used depending on the material.

Incidentally, of the forming area of grating RG, on a surface of cover glass 84 corresponding to an area where the forming area spreads to the periphery of the wafer holder, it is desirable, for example, to provide a reflection member (e.g. a thin film and the like) which covers the forming area, so that the measurement beam of the encoder system irradiated on grating RG does not pass through cover glass 84, or more specifically, so that the intensity of the measurement beam does not change greatly in the inside and the outside of the area on the rear surface of the wafer holder.

As it can also be seen from FIG. 5A, main body section 81 consists of an overall octagonal plate shape member that has an extending section which extends outside on one end and the other end in the longitudinal direction, and on its bottom surface, a recessed section is formed at the section facing grating RG. Main body section 81 is formed so that the center area where grating RG is arranged is formed in a plate shape whose thickness is substantially uniform.

On the upper surface of each of the extending sections on the +X side and the −X side of main body section 81, spacers 85a and 85b having a projecting shape when sectioned are provided, with each of the projecting sections 89a and 89b extending outward in the Y-axis direction.

As shown in FIGS. 5A and 5B, mover section 82a includes two plate-like members $82a_1$ and, $82a_2$ having a rectangular shape in a planar view whose size (length) in the Y-axis direction and size (width) in the X-axis direction are both shorter than stator section 93a (around half the size) Plate-like members $82a_1$ and $82a_2$ are both fixed parallel to the XY plane, in a state set apart only by a predetermined distance in the Z-axis direction (vertically), via projecting section 89a of spacer 85a previously described, with respect to the end on the +X side of main body section 81. In this case, the −X side end of plate-like member $82a_2$ is clamped by spacer 85a and the extending section on the +X side of main body section 81. Between the two plate-like members $82a_1$ and $82a_2$, an end on the −X side of stator section 93a of coarse movement stage WCS1 is inserted in a non-contact manner. Inside plate-like members $82a_1$ and $82a_2$, magnet units $MUa_1$ and $MUa_2$ which will be described later are housed.

Mover section 82b includes two plate-like members $82b_1$ and $82b_2$ maintained at a predetermined distance in the Z-axis direction (vertically), and is configured in a similar manner with mover section 82a, although being symmetrical. Between the two plate-like members $82b_1$ and $82b_2$, an end on the +X side of stator section 93b of coarse movement stage WCS1 is inserted in a non-contact manner. Inside plate-like members $82b_1$ and $82b_2$, magnet units $MUb_1$ and $MUb_2$ are housed, which are configured similar to magnet units $MUa_1$ and $MUa_2$.

Now, as is previously described, because the surface on both sides in the Y-axis direction is open in coarse movement stage WCS1, when attaching fine movement stage WFS1 to coarse movement stage WCS1, the position of fine movement stage WFS1 in the 2-axis direction should be positioned so that stator section 93a, 93b are located between plate-like members $82a_1$ and $82a_2$, and $82b_1$ and $82b_2$, respectively, and then fine movement stage WFS1 can be moved (slid) in the Y-axis direction.

Fine movement stage drive system 52A includes the pair of magnet units $MUa_1$ and $MUa_2$ that mover section 82a previously described has, coil unit CUa that stator section 93a has, the pair of magnet units $MUb_1$ and $MUb_2$ that mover section 82b has, and coil unit CUb that stator section 93b has.

This will be explained further in detail. As it can be seen from FIG. 8, at the end on the −X side inside of stator section 93a, two lines of coil rows, which are a plurality of (in this case, twelve) YZ coils 55 and 57 having a rectangular shape in a planar view that are placed equally spaced apart in the Y-axis direction, and one X coil 56, which is narrow and has a rectangular shape in a planar view and whose longitudinal direction is in the Y-axis direction, are placed spaced equally apart in the X-axis direction. YZ coils 55 and 57 have an upper part winding and a lower part winding in a rectangular shape in a planar view that are disposed such that they overlap in the vertical direction (the z-axis direction). Coil unit CUa is configured including the two lines of coil rows and X coil 56.

Figure 8:
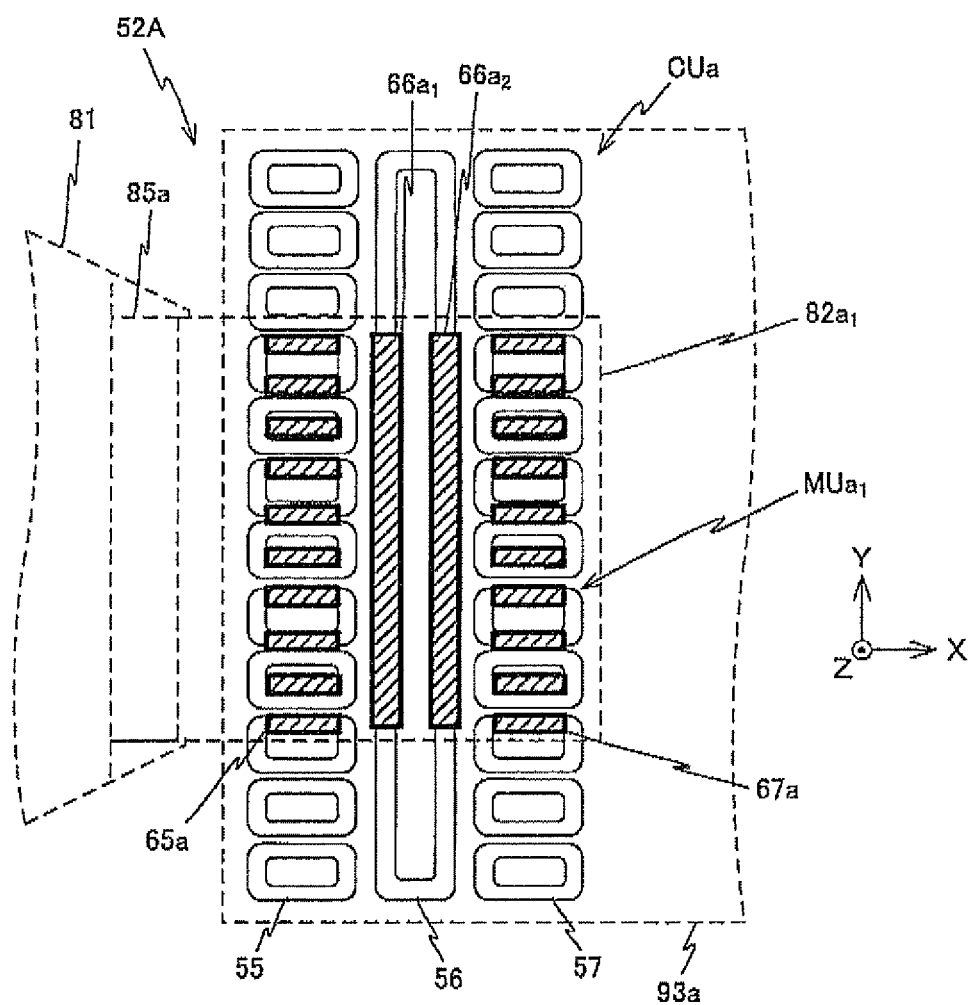
FIG. 8 is a planar view showing a placement of a magnet unit and a coil unit that structure a fine movement stage drive system.

Inside plate-like members $82a_1$ and $82a_2$ configuring a part of mover section 82a of fine movement stage WFS1, as it can be seen referring to FIG. 8, two lines of magnet rows which are a plurality of (in this case, ten) permanent magnets 65a and 67a placed equally spaced in the Y-axis direction, and a pair (two) of permanent magnets $66a_1$ and $66a_2$ whose longitudinal direction is in the Y-axis direction are placed in a placement corresponding to the placement of each of the coils described above.

The plurality of permanent magnets 65a and 67a configuring each magnet row are placed in an arrangement where the magnets have a polarity which is alternately a reverse polarity to each other. Further, the pair of permanent magnets $66a_1$ and $66a_2$ are placed so that the polarity to each other is a reverse polarity. Magnet unit $MUa_1$ and $MUa_2$ are configured by the two lines of magnet rows and the pair of permanent magnets.

Incidentally, inside the other stator section 93b and mover section 82b, coils and permanent magnets are placed in an arrangement similar to coil unit CUa and magnet unit $MUa_1$ and $MUa_2$ inside stator section 93a and mover section 82a, and by these arrangements, coil unit Cub and magnet units $MUb_1$ and $MUb_2$ are configured, respectively.

Because a placement of each of the coils and permanent magnets as in the description above is employed in the embodiment, main controller 20 can drive fine movement stage WFS1 in the Y-axis direction by supplying an electric current alternately to the plurality of YZ coils 55 and 57 that are arranged in the Y-axis direction. Further, along with this, by supplying electric current to coils of YZ coils 55 and 57 that are not used to drive fine movement stage WFS1 in the Y-axis direction, main controller 20 can generate a drive force in the Z-axis direction separately from the drive force in the Y-axis direction and make fine movement stage WFS1 levitate from coarse movement stage WCS1. And, main controller 20 drives fine movement stage WFS1 in the Y-axis direction while maintaining the levitated state of fine movement stage WFS1 with respect to coarse movement stage WCS1, namely a noncontact state, by sequentially switching the coil subject to current supply according to the position of fine movement stage WFS1 in the Y-axis direction. Further, main controller 20 can drive fine movement stage WFS1 in the Y-axis direction in a state where fine movement stage WFS1 is levitated from coarse movement stage WCS1, as well as independently drive the fine movement stage in the X-axis direction.

Figure 9A:
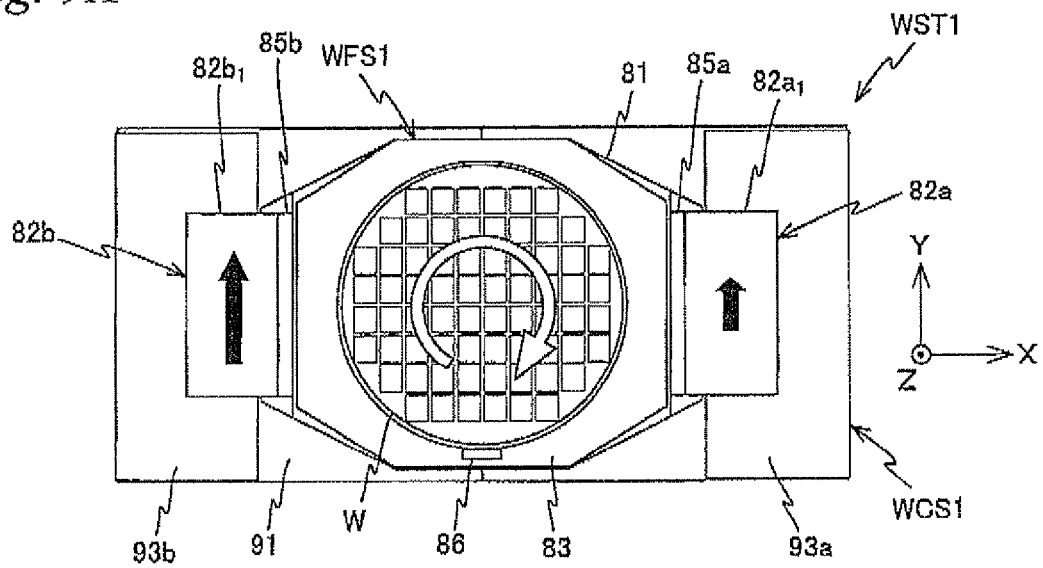
FIG. 9A is a view used to explain an operation when a fine movement stage is rotated around the Z-axis with respect to a coarse movement stage.
Figure 9B:
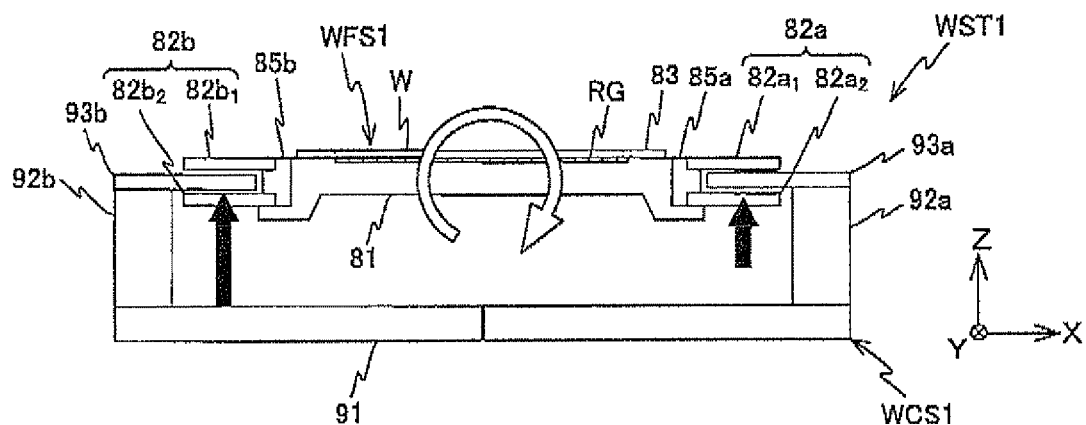
FIG. 9B is a view used to explain an operation when a fine movement stage is rotated around the Y-axis with respect to a coarse movement stage.
Figure 9C:
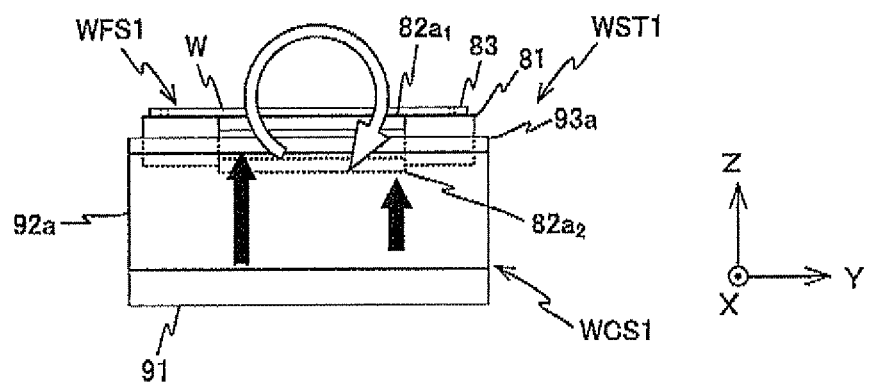
FIG. 9C is a view used to explain an operation when a fine movement stage is rotated around the X-axis with respect to a coarse movement stage.

As it can be seen from the description above, in the embodiment, fine movement stage drive system 52A supports fine movement stage WFS1 by levitation in a non-contact state with respect to coarse movement stage WCS1, and can also drive fine movement stage WFS1 in a non-contact manner in the X-axis direction, the Y-axis direction, and the Z-axis direction with respect to coarse movement stage WCS1. Further, main controller 20 can make fine movement stage WFS1 rotate around the Z-axis (θz rotation) (refer to the outlined arrow in FIG. 9A), by applying a drive force (thrust) in the Y-axis direction having a different magnitude to both mover section 82a and mover section 82b (refer to the black arrow in FIG. 9A). Further, main controller 20 can make fine movement stage WFS1 rotate around the Y-axis (θy drive) (refer to the outlined arrow in FIG. 9B), by applying a different levitation force (refer to the black arrows in FIG. 9B) to both mover section 82a and mover section 82b. Furthermore, as shown in FIG. 9C, for example, math controller 20 can make fine movement stage WFS1 rotate around the X-axis (θx drive) (refer to the outlined arrow in FIG. 9C), by applying a different levitation force to both mover sections 82a and 82b of fine movement stage WFS1 on the + side and the − side in the Y-axis direction (refer to the black arrow in FIG. 9C).

Figure 10:
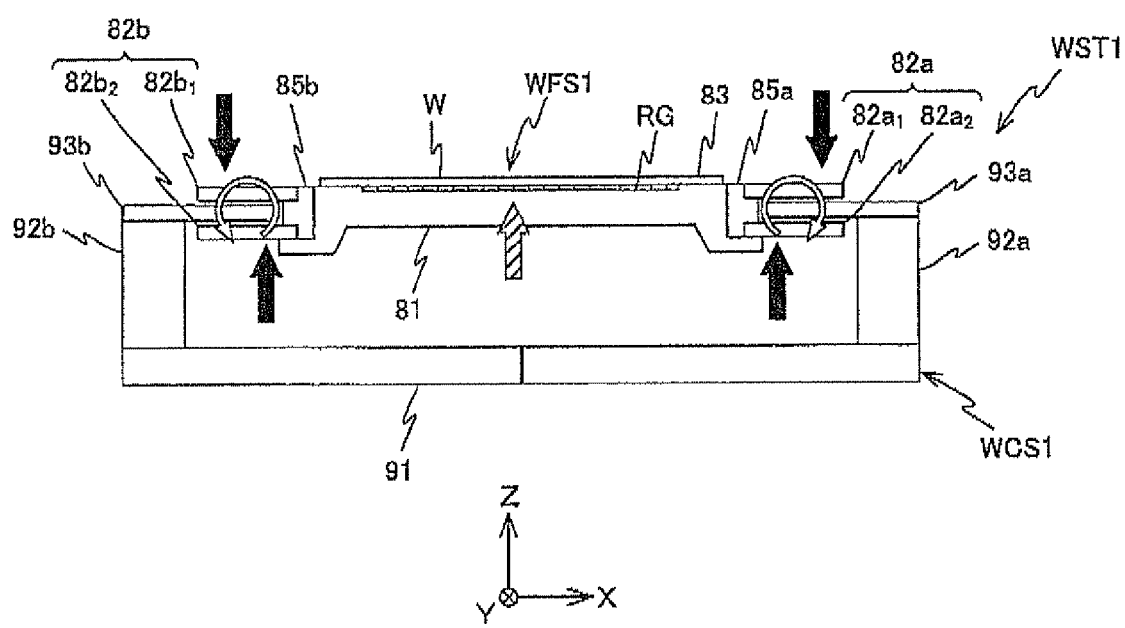
FIG. 10 is a view used to explain an operation when a center section of the fine movement stage is deflected in the direction.

Further, in the embodiment, by supplying electric current to the two lines of coils 55 and 57 (refer to FIG. 8) placed inside stator section 93a in directions opposite to each other when applying the levitation force to fine movement stage WFS1, for example, main controller 20 can apply a rotational force (refer to the outlined arrow in FIG. 10) around the Y-axis simultaneously with the levitation force (refer to the black arrow in FIG. 10) with respect to mover section 82a, as shown in FIG. 10. Similarly, by supplying electric current to the two lines of coils placed inside stator section 93b in directions opposite to each other when applying the levitation force to fine movement stage WFS, for example, main controller 20 can apply a rotational force around the Y-axis simultaneously with the levitation force with respect to mover section 82a.

Further, by applying a rotational force around the Y-axis (a force in the θy direction) to each of the pair of mover sections 82a and 82b in directions opposite to each other, main controller 20 can deflect the center of fine movement stage WFS1 in the +Z direction or the −Z direction (refer to the hatched arrow in FIG. 10). Accordingly, as shown in FIG. 10, by bending the center of fine movement stage WFS1 in the +Z direction (in a convex shape), the deflection in the middle part of fine movement stage WFS1 (main body section 81) in the X-axis direction due to the self-weight of wafer W and main body section 81 can be canceled out, and degree of parallelization of the wafer W surface with respect to the XY plane (horizontal surface) can be secured. This is particularly effective, in the case such as when the diameter of wafer W becomes large and fine movement stage WFS1 also becomes large.

Further, when wafer W is deformed by its own weight and the like, there is a risk that the surface of wafer W mounted on fine movement stage WFS1 will no longer be within the range of the depth of focus of projection optical system PL within the irradiation area (exposure area IA) of illumination light IL. Therefore, similar to the case described above where main controller 20 deflects the center in the X-axis direction of fine movement stage WFS1 to the +Z direction, by applying a rotational force around the Y-axis to each of the pair of mover sections 82a and 82b in directions opposite to each other, wafer W is deformed to be substantially flat, and the surface of wafer W within exposure area IA can fan within the range of the depth of focus of projection optical system PL. Incidentally, while FIG. 10 shows an example where fine movement stage WFS1 is bent in the +Z direction (a convex shape), fine movement stage WFS1 can also be bent in a direction opposite to this (a concave shape) by controlling the direction of the electric current supplied to the coils.

Incidentally, the method of making fine movement stage WFS1 (and wafer W held by this stage) deform in a concave shape or a convex shape within a surface (XZ plane) perpendicular to the Y-axis can be applied, not only in the case of correcting deflection caused by its own weight and/or focus leveling control, but also in the case of employing a super-resolution technology which substantially increases the depth of focus by changing the position in the Z-axis direction at a predetermined point within the range of the depth of focus, while the predetermined point within the shot area of wafer W crosses exposure area IA, as is disclosed in, for example, U.S. Pat. No. RE 37,391 and the like.

In exposure apparatus 100 of the embodiment, at the time of exposure operation by the step-and-scan method to wafer W, positional information (including the positional information in the θz direction) in the XY plane of fine movement stage WFS1 is measured by main controller 20 using an encoder system 73 (refer to FIG. 13) of fine movement stage position measurement system 70A which will be described later on. The positional information of fine movement stage WFS1 is sent to main controller 20, which controls the position of fine movement stage WFS1 based on the positional information.

On the other hand, when wafer stage WST1 (fine movement stage WFS1) is located outside the measurement area of fine movement stage position measurement system 70A, the positional information of wafer stage WST1 (fine movement stage WFS1) is measured by main controller 20 using wafer stage position measurement system 16A (refer to FIGS. 2 and 13). As shown in FIG. 2, wafer stage position measurement system 16A includes a laser interferometer which irradiates a measurement beam on a reflection surface formed on the coarse movement stage WCS1 side surface by mirror polishing and measures positional information of wafer stage WST1 in the XY plane. Incidentally, the positional information of wafer stage WST1 in the XY plane can be measured using other measurement devices, such as fox example, an encoder system, instead of wafer stage position measurement system 16A described above. In this case, for example, a two-dimensional scale can be placed on the upper surface of base board 12, and an encoder head can be attached to the bottom surface of coarse movement stage WCS1.

As is previously described, fine movement stages WFS2 and WFS3 are configured identical to fine movement stage WFS1 described above, and can be supported in a non-contact manner by coarse movement stage WCS1 instead of fine movement stage WFS1. In this case, coarse movement stage WCS1 and fine movement stage WFS2 or WFS3 supported by coarse movement stage WCS1 configure wafer stage WST1, and a pair of mover sections (one pair each of magnet units $MUa_1$ and $MUa_2$, and $MUb_1$ and $MUb_2$) equipped in fine movement stage WFS2 or WFS3 and a pair of stator sections 93a and 93b (coil units CUa and CUb) of coarse movement stage WCS1 configure fine movement stage drive system 52A. And by this fine movement stage drive system 52A, fine movement stage WFS2 or WFS3 is driven in a non-contact manner in directions of six degrees of freedom with respect to coarse movement stage WCS1.

Further, fine movement stage WFS, WFS1, or WFS3 can each make coarse movement stage WCS2 support them in a non-contact manner, and coarse movement stage WCS2 and fine movement stage WFS2, WFS1, or WFS3 supported by coarse movement stage WCS2 configure wafer stage WST2. In this case, a pair of mover sections (one pair each of magnet units $MUa_1$ and $MUa_2$, and $MUb_1$ and $MUb_2$) equipped in fine movement stage WFS2, WFS1, or WFS3, and a pair of stator sections 93a and 93b (coil units CUa and CUb) of coarse movement stage WCS2 configure fine movement stage drive system 52B (refer to FIG. 13). And by this fine movement stage drive system 52S, fine movement stage WFS2, WFS1, or WFS3 is driven in a non-contact manner in directions of six degrees of freedom with respect to coarse movement stage WCS2.

Incidentally, coarse movement stage WCS2 is placed on base board 12 in a direction opposite to coarse movement stage WCS1, or more specifically, in a direction where an opening of notch 95 of coarse movement slider section 91 faces the other side (the −Y side) of the Y-axis direction.

Next, a configuration of fine movement stage position measurement system 70A (refer to FIG. 13) used to measure the positional information of fine movement stage WFS1, WFS2, or WFS3 (configuring wafer stage WST1), which is movably held by coarse movement stage WCS1 in exposure station 200, will be described. In this case, the case will be described where fine movement stage position measurement system 70A measures the positional information of fine movement stage WFS1.

As shown in FIG. 2, fine movement stage position measurement system 70A is equipped with an arm member (a measurement arm 71A) which is inserted in a space inside coarse movement stage WCS1, in a state where wafer stage WST1 is placed below projection optical system PL. Measurement arm 71A is supported cantilevered (supported in the vicinity of one end) from main frame BD via a support member 72A. Incidentally, in the case a configuration is employed where the measurement members do not interfere with the movement of the wafer stage, the configuration is not limited to the cantilever support, and both ends in the longitudinal direction can be supported. Further, the arm member should be located further below (the −Z side) grating RG (the placement plane substantially parallel to the XY plane) previously described, and for example, can be placed lower than the upper surface of base board 12. Furthermore, while the arm member was to be supported by main frame BD, for example, the arm member can be installed on an installation surface (such as a floor surface) via a vibration isolation mechanism. In this case, it is desirable to arrange a measuring device which measures a relative positional relation between main frame BD and the arm member. The arm member can also be referred to as a metrology arm or a measurement member.

Measurement arm 71A is a square column shaped (that is, a rectangular solid shape) member having a longitudinal rectangular cross section whose longitudinal direction is in the Y-axis direction and size in a height direction (the Z-axis direction) is larger than the size in a width direction (the X-axis direction), and is made of a material which is the same that transmits light, such as, for example, a glass member affixed in plurals. Measurement arm 71A is formed solid, except for the portion where the encoder head (an optical system) which will be described later is housed. In the state where wafer stage WST1 is placed below projection optical system PL as previously described, the tip of measurement arm 71A is inserted into the space of coarse movement stage WCS1, and its upper surface faces the lower surface (to be more precise, main body section 81 (not shown in FIG. 2, refer to FIG. 5A) of fine movement stage WFS1 as shown in FIG. 1. The upper surface of measurement arm 71A is placed almost parallel with the lower surface of fine movement stage WFS1, in a state where a predetermined clearance, such as, for example, around several mm, is formed with the lower surface of fine movement stage WFS1. Incidentally, the clearance between the upper surface of measurement arm 71A and the lower surface of fine movement stage WFS1 can be more than or less than several mm.

As shown in FIG. 13, fine movement stage position measurement system 70A is equipped with encoder system 73 and laser interferometer system 75. Encoder system 73 includes an X linear encoder 73x measuring the position of fine movement stage WFS1 in the X-axis direction, and a pair of Y linear encoders 73ya and 73yb measuring the position of fine movement stage WFS1 in the Y-axis direction. In encoder system 73, a head of a diffraction interference type is used that has a configuration similar to an encoder head (hereinafter shortly referred to as a head) disclosed in, for example, U.S. Pat. No. 7,238,931, U.S. Patent Application Publication No. 2007/288121 and the like. However, in the embodiment, a light source and a photodetection system (including a photodetector) of the head are placed external to measurement arm 71A as in the description later on, and only an optical system is placed inside measurement arm 71A, or more specifically, facing grating RG. An optical system placed inside of measurement arm 71A is referred to as a head appropriately as follows.

Figure 11A:
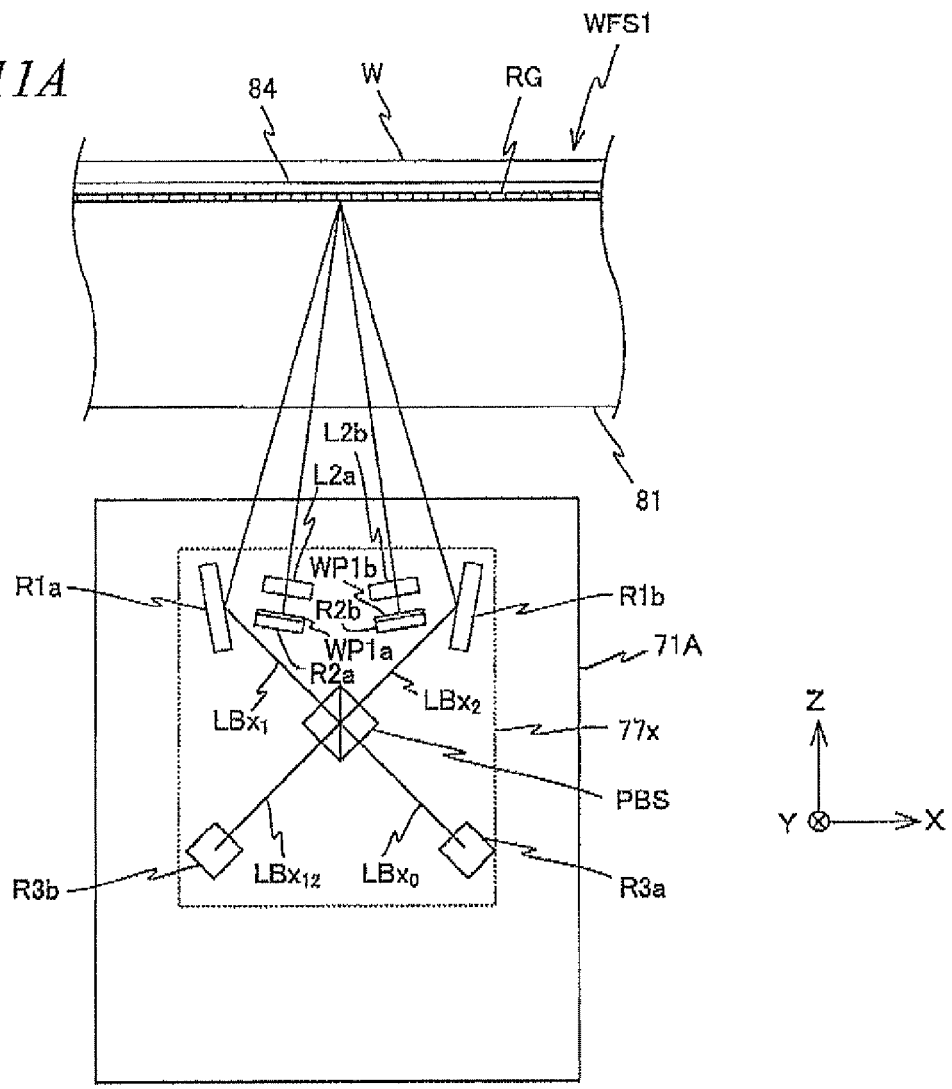
FIG. 11A is a view showing a rough configuration of an X head 77x.
Figure 11B:
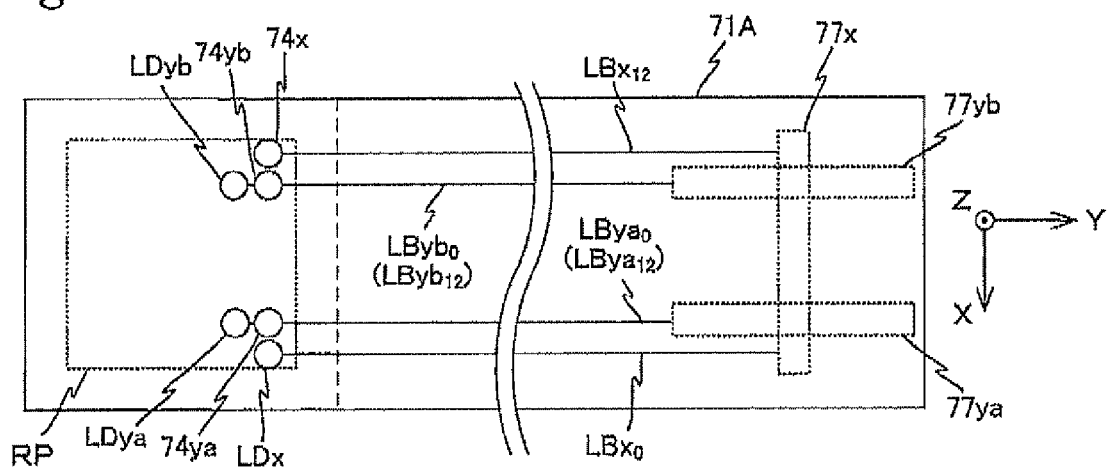
FIG. 11B is a view used to explain a placement of each of the X head 77x, Y heads 77ya and 77yb inside the measurement arm.

Encoder system 73 measures the position of fine movement stage WFS1 in the X-axis direction using one X head 77x (refer to FIGS. 11A and 11B), and the position in the Y-axis direction using a pair of Y heads 77ya and 77yb (refer to FIG. 11B). More specifically, X linear encoder 73x previously described is configured by X head 77x which measures the position of fine movement stage WFS1 in the X-axis direction using an X diffraction grating of grating RG, and the pair of Y linear encoders 73ya and 73yb is configured by the pair of Y heads 77ya and 77yb which measures the position of fine movement stage WFS1 in the Y-axis direction using a Y diffraction grating of grating RG.

A configuration of three heads 77x, 77ya, and 77yb which configure encoder system 73 will now be described. FIG. 11A representatively shows a rough configuration of X head 77x, which represents three heads 77x, 77ya, and 77yb. Further, FIG. 11B shows a placement of each of the X head 77x, and Y heads 77ya and 77yb within measurement arm 71A.

Figure 22A:
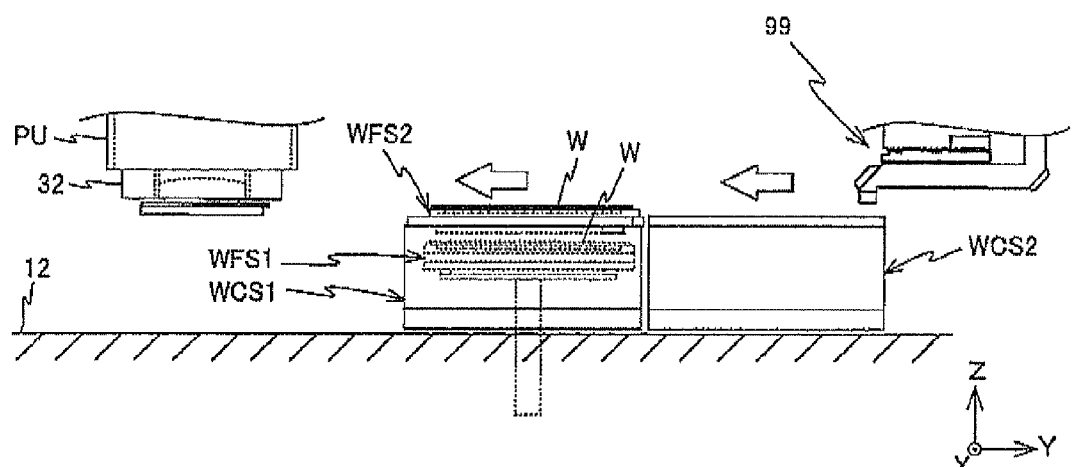
FIGS. 22A and 22B are views used to explain a parallel processing performed using the three fine movement stages WFS1, WFS2, and WFS3 (No. 4) in the exposure apparatus of the first embodiment.

As shown in FIG. 11A, X head 77x is equipped with a polarization beam splitter PBS whose separation plane is parallel to the YZ plane, a pair of reflection mirrors R1a and R1b, lenses L2a and L2b, quarter wavelength plates (hereinafter, described as λ/4 plates) WP1a and WP1b, reflection mirrors R2a and R2b, and reflection mirrors R3a and R3b and the like, and these optical elements are placed in a predetermined positional relation. Y heads 77ya and 77yb also have an optical system with a similar structure. As shown in FIGS. 22A and 12B, X head 77x, Y heads 77ya and 77yb are unitized and each fixed inside of measurement arm 71A.

As shown in FIG. 11B, in X head 77x (X linear encoder 73x), a laser beam $LBx_0$ is emitted in the −Z direction from a light source LDx provided on the upper surface (or above) at the end on the −Y side of measurement arm 71A, and its optical path is bent to become parallel with the y-axis direction via a reflection surface RP which is provided on a part of measurement arm 71A inclined at an angle of 45 degrees with respect to the XY plane. This laser beam $LBx_0$ travels through the solid section inside measurement arm 71A in parallel with the longitudinal direction (the Y-axis direction) of measurement arm 71A, and reaches reflection mirror R3a (refer to FIG. 11A). Then, the optical path of laser beam $LBx_0$ is bent by reflection mirror R3a and is incident on polarization beam splitter PBS. Laser beam $LBx_0$ is split by polarization by polarization beam splitter PBS into two measurement beams $LBx_1$ and $LBx_2$. Measurement beam $LBx_1$ having been transmitted through polarization beam splitter PBS reaches grating RG formed on fine movement stage WFS1, via reflection mirror R1a, and measurement beam $LBx_2$ reflected off polarization beam splitter PBS reaches grating RG via reflection mirror R1b. Incidentally, "split by polarization" in this case means the splitting of an incident beam into a P-polarization component and an S-polarization component.

Predetermined-order diffraction beams that are generated from grating RG due to irradiation of measurement beams $LBx_1$ and $LBx_2$, such as, for example, the first-order diffraction beams are severally converted into a circular polarized light by λ/4 plates WP1a and WP1b via lenses L2a and L2b, and reflected by reflection mirrors R2a and R2b and then the beams pass through λ/4 plates WP1a and WP1b again and reach polarization beam splitter PBS by tracing the same optical path in the reversed direction.

Each of the polarization directions of the two first-order diffraction beams that have reached polarization beam splitter PBS is rotated at an angle of 90 degrees with respect to the original direction. Therefore, the first-order diffraction beam of measurement beam $LBx_1$ having passed through polarization beam splitter PBS first, is reflected off polarization beam splitter PBS. The first-order diffraction beam of measurement beam $LBx_2$ having been reflected off polarization beam splitter PBS first, passes through polarization beam splitter PBS. This coaxially synthesizes the first-order diffraction beams of each of the measurement beams $LBx_1$ and $LBx_2$ as a synthetic beam $LBx_{12}$. Synthetic beam $LBx_{12}$ has its optical path bent by reflection mirror R3b so it becomes parallel to the Y-axis, travels inside measurement arm 71A parallel to the Y-axis, and then is sent to an X photodetection system 74x provided on the upper surface (or above) at the end on the −Y side of measurement arm 71A shown in FIG. 11B via reflection surface RP previously described.

In X photodetection system 74x, the polarization direction of the first-order diffraction beams of beams $LBx_1$ and $LBx_2$ synthesized as synthetic beam $LBx_{12}$ arranged by a polarizer (analyzer) (not shown) and the beams overlay each other so as to form an interference light, which is detected by the photodetector and is converted into an electric signal in accordance with the intensity of the interference light. When fine movement stage WFS1 moves in the measurement direction (in this case, the X-axis direction) here, a phase difference between the two beams changes, which changes the intensity of the interference light. This change of the intensity of the interference light is supplied to main controller 20 (refer to FIG. 13) as positional information related to the X-axis direction of fine movement stage WFS1.

As shown in FIG. 11B, laser beams $LBya_0$ and $LByb_0$, which are emitted from light sources LDya and LDyb, respectively, and whose optical paths are bent by an angle of 90 degrees so as to become parallel to the Y-axis by reflection surface RP previously described, are incident on Y heads 77ya and 77yb, and similar to the previous description, from Y heads 77ya and 77yb, synthetic beams $LBya_{12}$ and $LByb_{12}$ of the first-order diffraction beams by grating RG (Y diffraction grating) of each of the measurement beams split by polarization by the polarization beam splitter are output, respectively, and return to Y photodetection systems 74ya and 74yb. Now, laser beams $LBya_0$ and $LByb_0$ emitted from light sources LDya and LDyb, and synthetic beams $LBya_{12}$ and $LByb_{12}$ returning to Y photodetection systems 74ya and 74yb, each pass an optical path which are overlaid in a direction perpendicular to the page surface of FIG. 11B. Further, as described above, in Y heads 77ya and 77yb, optical paths are appropriately bent (omitted in drawings) inside so that laser beams $LBya_0$ and $LByb_0$ irradiated from the light source and synthetic beams $LBya_{12}$ and $LByb_{12}$ returning to Y photodetection systems 74ya and 74yb pass optical paths which are parallel and distanced apart in the Z-axis direction.

Figure 12A:
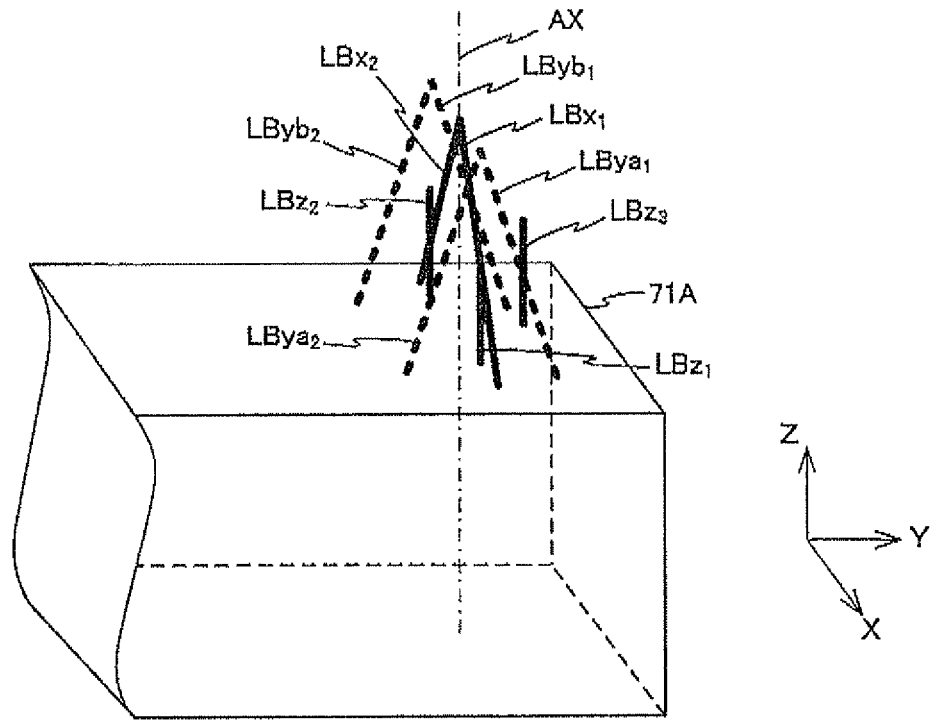
FIG. 12A shows a perspective view of a tip of a measurement arm.
Figure 12B:
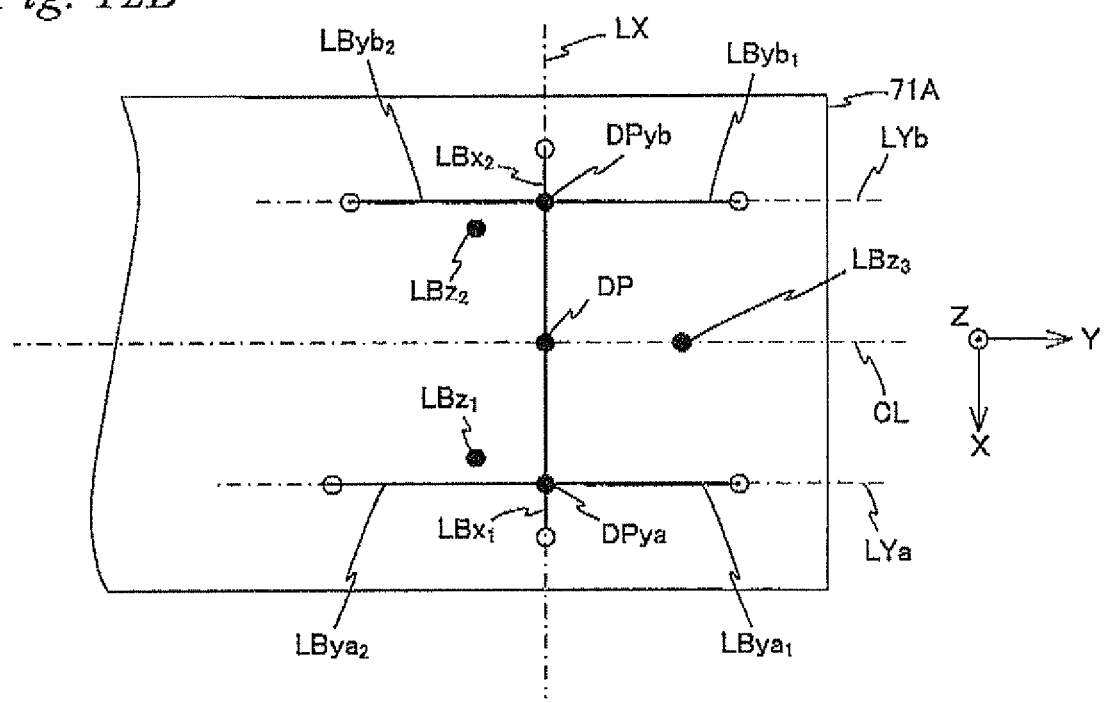
FIG. 12B is a planar view when viewed from the +Z direction of an upper surface of the tip of the measurement arm.

FIG. 12A shows a tip of measurement arm 71A in a perspective view, and FIG. 12B shows an upper surface of the tip of measurement arm 71A in a planar view when viewed from the +Z direction. As shown in FIGS. 12A and 12B, X head 77x irradiates measurement beams $LBx_1$ and $LBx_2$ (indicated by a solid line in FIG. 12A) from two points (refer to the white circles in FIG. 12B) on a straight line LX parallel to the X-axis that are at an equal distance from a center line CL of measurement arm 71, on the same irradiation point on grating RG (refer to FIG. 11A). The irradiation point of measurement beams $LBx_1$ and $LBx_2$, that is, a detection point of X head 77x (refer to reference code DP in FIG. 12B) coincides with an exposure position which is the center of an irradiation area (exposure area) IA of illumination light IL irradiated on wafer W (refer to FIG. 2). Incidentally, while measurement beams $LBx_1$ and $LBx_2$ are actually refracted at a boundary and the like of main body section 81 and an atmospheric layer, it is shown simplified in FIG. 11A and the like.

As shown in FIG. 11, each of the pair of Y heads 77ya and 77yb are placed on the +X side and the −X side of center line CL. As shown in FIGS. 12A and 12B, Y head 77ya irradiates measurement beams $LBya_1$ and $LBya_2$ that are each shown by a broken line in FIG. 12A on a common irradiation point on grating RG from two points (refer to the white circles in FIG. 12B) which are distanced equally from straight line LX on a straight line LYa which is parallel to the Y-axis. The irradiation point of measurement beams $LBya_1$ and $LBya_2$, that is a detection point of Y head 77ya is shown by reference code DPya in FIG. 12B.

Y head 77yb irradiates measurement beams $LByb_1$ and $LByb_2$ from two points (refer to the white circles in FIG. 12B) which are symmetrical to the two outgoing points of measurement beams $LBya_1$ and $LBya_2$ with respect to center line CL, on a common irradiation point DPyb on grating RG. As shown in FIG. 12B, detection points DPya and DPyb of Y heads 77ya and 77yb, respectively, are placed on straight line LX which is parallel to the X-axis.

Now, main controller 20 determines the position of fine movement stage WFS1 in the Y-axis direction, based on an average of the measurement values of the two Y heads 77ya and 77yb. Accordingly, in the embodiment, the position of fine movement stage WFS1 in the Y-axis direction is measured with a midpoint DP of detection points DPya and DPyb serving as a substantial measurement point. Midpoint DP coincides with the irradiation point of measurement beams $LBx_1$ and $LBX_2$ on grating RG.

More specifically, in the embodiment, there is a common detection point regarding measurement of positional information of fine movement stage WFS1 in the X-axis direction and the Y-axis direction, and this detection point coincides with the exposure position, which is the center of irradiation area (exposure area) IA of illumination light IL irradiated on wafer W. Accordingly, in the embodiment, by using encoder system 73, main controller 28 can constantly perform measurement of the positional information of fine movement stage WFS1 in the XY plane, directly under (at the back side of fine movement stage WFS1) the exposure position when transferring a pattern of reticle R on a predetermined shot area of wafer W mounted on fine movement stage WFS1. Further, main controller 20 measures a rotational amount of fine movement stage WFS1 in the θz direction, based on a difference of the measurement values of the pair of Y heads 77ya and 77yb.

As shown in FIG. 12A, laser interferometer system 75 makes three measurement beams $LBz_1$, $LBz_2$, and $LBz_3$ enter the lower surface of fine movement stage WFS1 from the tip of measurement arm 71A. Laser interferometer system 75 is equipped with three laser interferometers 75a to 75c (refer to FIG. 13) that irradiate three measurement beams $LBz_1$, $LBz_2$, and $LBz_3$, respectively.

In laser interferometer system 75, three measurement beams $LBz_1$, $LBz_2$, and $LBz_3$ are emitted in parallel with the Z-axis from each of the three points that are not collinear on the upper surface of measurement arm 71A, as shown in FIGS. 12A and 12B. Now, as shown in FIG. 12B, three measurement beams $LBz_2$, and $LBz_3$ are each irradiated, for example, from three points corresponding to the apexes of an isosceles triangle (or an equilateral triangle) whose centroid coincides with the exposure area which is the center of irradiation area (exposure area) IA. In this case, the outgoing point (irradiation point) of measurement beam $LBz_3$ is located on center line CL, and the outgoing points (irradiation points) of the remaining measurement beams $LBz_1$ and $LBz_2$ are equidistant from center line CL. In the embodiment, main controller 20 measures the position in the Z-axis direction, the rotational amount in the θx direction and the θy direction of fine movement stage WFS1, using laser interferometer system 75. Incidentally, laser interferometers 75a to 75c are provided on the upper surface (or above) at the end on the −Y side of measurement arm 71A. Measurement beams $LBz_1$, $LBz_2$, and $LBz_3$ emitted in the −Z direction from laser interferometers 75a to 75c travel within measurement arm 71A along the Y-axis direction via reflection surface RP1 previously described, and each of their optical paths is bent so that the beams are emitted from the three points described above.

In the embodiment, on the lower surface of fine movement stage WFS1, a wavelength selection filter (omitted in drawings) which transmits each measurement beam from encoder system 73 and blocks the transmission of each measurement beam from laser interferometer system 75 is provided. In this case, the wavelength selection filter also serves as a reflection surface of each of the measurement beams from laser interferometer system 75. As the wavelength selection filter, a thin film and the like having wavelength-selectivity is used, and in the embodiment, the wavelength selection filter is provided, for example, on one surface of the transparent plate (main body section 81), and grating RG is placed on the wafer holder side with respect to the one surface.

As it can be seen from the description so far, main controller 20 can measure the position of fine movement stage WFS1 in directions of six degrees of freedom by using encoder system 73 and laser interferometer system 75 of fine movement stage position measurement system 70A. In this case, since the optical path lengths of the measurement beams are extremely short and also are almost equal to each other in encoder system 73, the influence of air fluctuation can mostly be ignored. Accordingly, by encoder system 73, positional information of fine movement stage WFS1 within the XY plane (including the θz direction) can be measured with high accuracy. Further, because the substantial detection points on the grating in the X-axis direction and the Y-axis direction by encoder system 73 and detection points on the lower surface of fine movement stage WFS1 in the Z-axis direction by laser interferometer system 75 coincide with the center (exposure position) of exposure area IA within the XY plane, respectively, generation of the so-called Abbe error caused by a shift within the XY plane of the detection point and the exposure position is suppressed to a substantially ignorable degree. Accordingly, by using fine movement stage position measurement system 70A, main controller 20 can measure the position of fine movement stage WFS1 in the X-axis direction, the Y-axis direction, and the Z-axis direction with high precision, without any Abbe errors caused by a shift within the XY plane of the detection point and the exposure position. Further, in the case coarse movement stage WCS1 is below projection unit PU and fine movement stage WFS2 or WFS3 is movably supported by coarse movement stage WCS1, by using fine movement stage position measurement system 70A, main controller 20 can measure the position in directions of six degrees of freedom of fine movement stage WFS2 or WFS3 and especially the position of fine movement stage WFS2 or WFS3 in the X-axis direction, the Y-axis direction, and the Z-axis direction can be measured with high precision, without any Abbe errors.

Further, fine movement stage position measurement system 70B which measurement station 300 is equipped with, is configured similar to fine movement stage position measurement system 70A, but in a symmetric manner, as shown in FIG. 2. Accordingly, measurement arm 71B which fine movement stage position measurement system 70B is equipped with has a longitudinal direction in the Y-axis direction, and the vicinity of the end on the +Y side is supported almost cantilevered from main frame BD, via support member 72B.

In the case coarse movement stage WCS2 is below aligner 99 and fine movement stage WFS2, WFS1, or WFS3 is movably supported by coarse movement stage WCS2, by using fine movement stage position measurement system 70B, main controller 20 can measure the position in directions of six degrees of freedom of fine movement stage WFS2, WFS1, or WFS3 and especially the position of fine movement stage WFS2, WFS1, or WFS3 in the X-axis direction, the Y-axis direction, and the Z-axis direction can be measured with high precision, without any Abbe errors.

FIG. 13 shows the main configuration of the control system of exposure apparatus 100. The control system is mainly configured of main controller 20. Main controller 20 includes a workstation for a microcomputer) and the like, and has overall control over each part of exposure apparatus 100, such as local liquid immersion device 8, coarse movement stage drive systems 51A and 518, and fine movement stage drive systems 52A and 528 previously described.

In exposure apparatus 100 of the embodiment, when manufacturing a device, exposure by the step-and-scan method is performed on wafer W held by the fine movement stages (one of WFS1 to WFS3, in this case, WFS1) held by coarse movement stage WCS1 located in exposure station 200, and a pattern of reticle R is transferred on each of a plurality of shot areas an wafer W. The exposure operation by this step- and scan method is performed by main controller 20, by repeating a movement operation between shots in which wafer stage WST1 is moved to a scanning starting position (an acceleration starting position) for exposure of each shot area on wafer W, and a scanning exposure operation in which a pattern formed on reticle R is transferred onto each of the shot areas by the scanning exposure method, based on results of wafer alignment (for example, information on array coordinates of each shot area on wafer W obtained by enhanced global alignment (EGA) that has been converted into a coordinate which uses the second fiducial marks as a reference) that has been performed beforehand, and results of reticle alignment and the like. Incidentally, the exposure operation described above is performed, in a state where liquid Lq is held in a space between tip lens 191 and wafer W, or more specifically, by liquid immersion exposure. Further, exposure is performed in the following order, from the shot area located on the side on wafer W to the shot area located on the −Y side. Incidentally, details on EGA are disclosed in, for example, U.S. Pat. No. 4,780,617 and the like.

In exposure apparatus 100 of the embodiment, during the series of exposure operations described above, main controller 20 measures the position of fine movement stage WFS1 (wafer W) using fine movement stage position measurement system 70A, and the position of wafer W is controlled based on the measurement results.

Figure 14A:
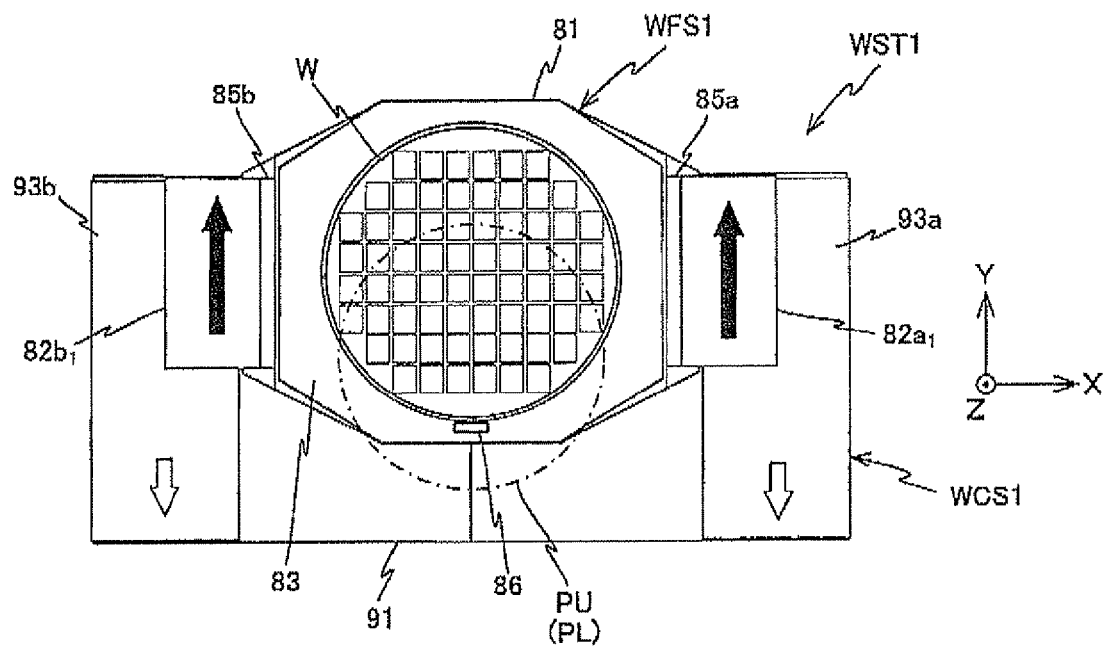
FIG. 14A is a view used to explain a drive method of a wafer at the time of scanning exposure.

Incidentally, while wafer W has to be driven with high acceleration in the Y-axis direction at the time of scanning exposure operation described above, in exposure apparatus 100 of the embodiment, main controller 20 scans wafer W in the Y-axis direction by driving (refer to the black arrow in FIG. 14A) only fine movement stage WFS1 in the Y-axis direction (and in directions of the other five degrees of freedom, if necessary), without driving coarse movement stage WCS1 in principle at the time of scanning exposure operation as shown in FIG. 14A. This is because when moving only fine movement stage WFS1, weight of the drive object is lighter when comparing with the case where coarse movement stage WCS1 is driven, which allows an advantage of being able to drive wafer W with high acceleration. Further, because position measuring accuracy of fine movement stage position measurement system 70A is higher than wafer stage position measurement system 16A as previously described, it is advantageous to drive fine movement stage WFS1 at the time of scanning exposure. Incidentally, at the time of this scanning exposure, coarse movement stage WCS1 is driven to the opposite side of fine movement stage WFS1 by an operation of a reaction force (refer to the outlined arrow in FIG. 14A) by the drive of fine movement stage WFS1. More specifically, because coarse movement stage WCS1 functions as a countermass, momentum of the system consisting of the entire wafer stage WST1 is conserved, and centroid shift does not occur, inconveniences such as unbalanced load acting on base board 12 by the scanning drive of fine movement stage WFS1 do not occur.

Figure 14B:
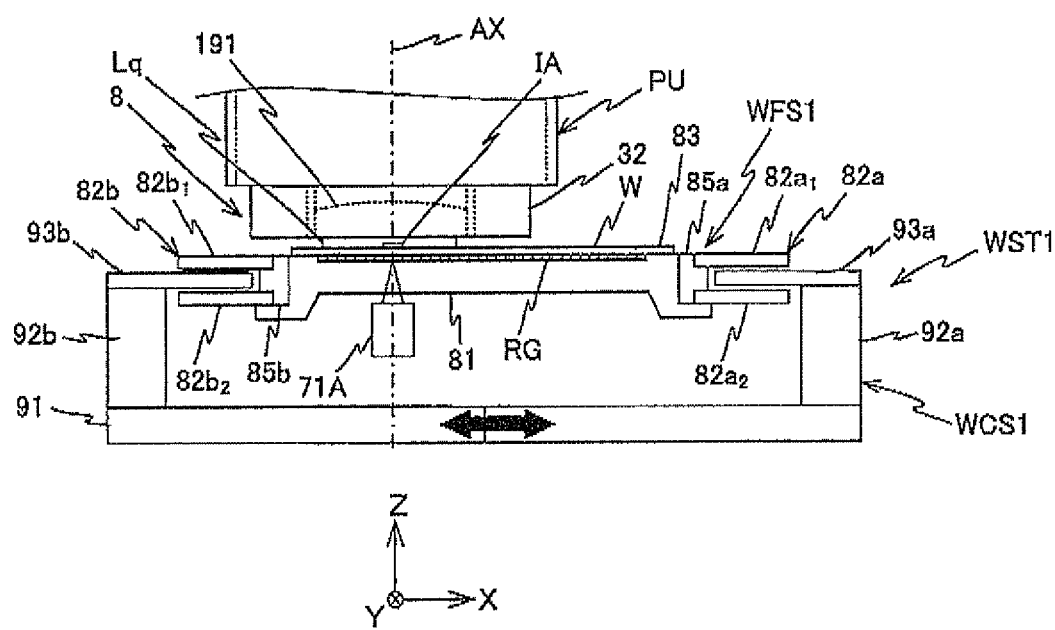
FIG. 14B is a view used to explain a driving method of a wafer at the time of stepping.

Meanwhile, when movement (stepping) operation between shots in the X-axis direction is performed, because movement capacity in the X-axis direction of fine movement stage WFS1 is small, main controller 20 moves wafer W in the X-axis direction by driving coarse movement stage WCS1 in the X-axis direction as shown in FIG. 14B.

In the embodiment, in parallel with exposure to wafer W being performed on one of the fine movement stages, wafer alignment is performed on another fine movement stage, and further in parallel with these operations, wafer exchange is performed on another fine movement stage.

Hereinafter, a parallel processing operation which is performed using the three fine movement stages WFS1, WFS2, and WFS3 in exposure apparatus 100 of the embodiment will be described.

Figure 15:
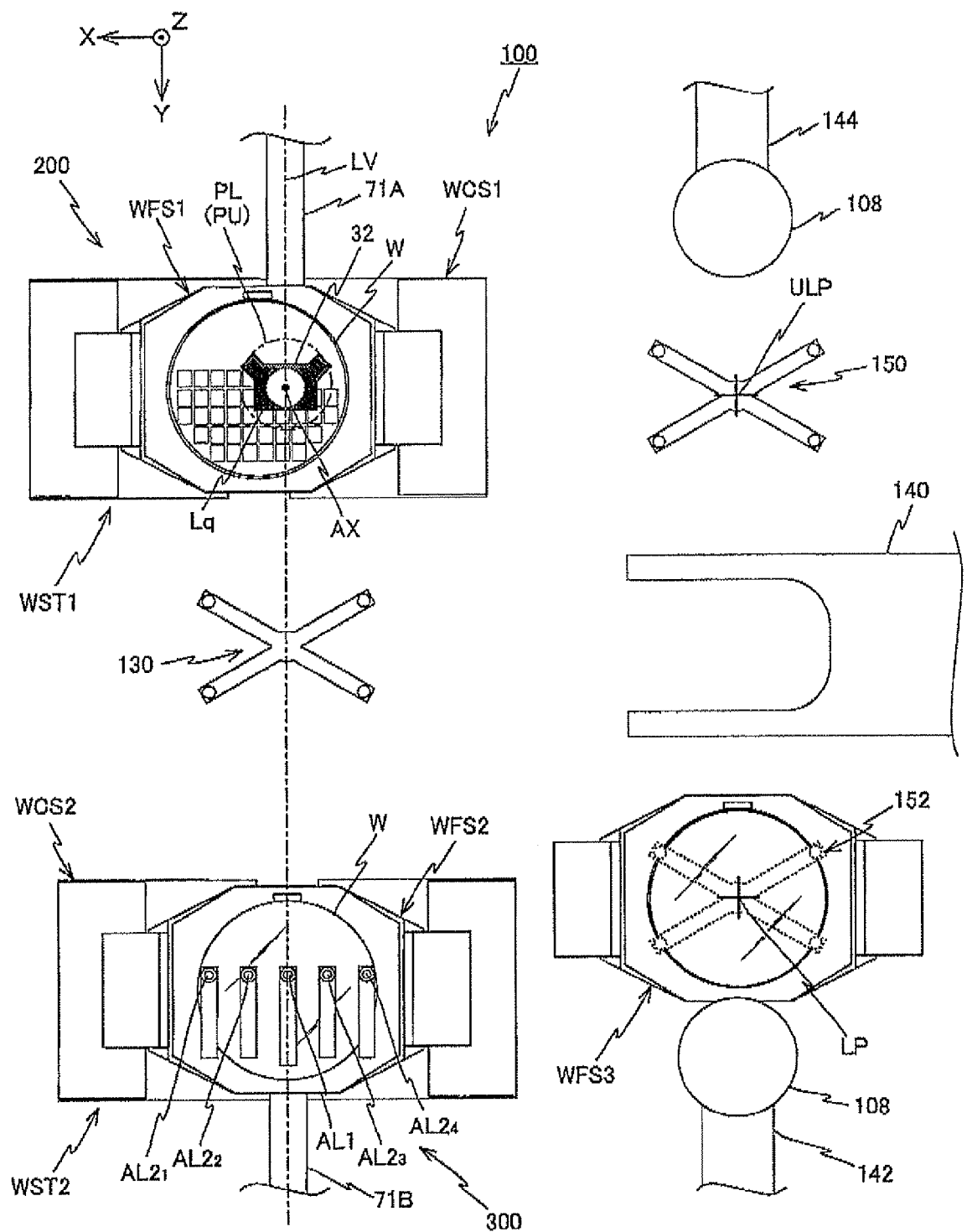
FIG. 15 is a view used to explain a parallel processing performed using three fine movement stages WFS1, WFS2, and WFS3 (No. 1) in the exposure apparatus of the first embodiment.

FIG. 15 shows a state where fine movement stage WFS1 is at exposure station 200 and the exposure described above is being performed on wafer W held by fine movement stage WFS1, while fine movement stage WFS2 is at measurement station 300 and alignment is being performed on wafer W held by fine movement stage WFS2. At this point, fine movement stage WFS3 is waiting, while holding a new wafer W on load table 152. At this point, temperature control of fine movement stage WFS3 and of wafer W held by fine movement stage WFS3 is performed by temperature control device 153 previously described.

The alignment to wafer W held by fine movement stage WFS2 is performed schematically in the following manner. More specifically, on wafer alignment, first of all, main controller 20 drives fine movement stage WFS2 so as to position measurement plate 86 on fine movement stage WFS2 right under primary alignment system AL1, and detects the second fiducial mark using primary alignment system AL1. Then, as disclosed in, for example, U.S. Patent Application Publication. No. 2008/0088843 and the like, for example, main controller 20 can move wafer stage WST2 (coarse movement stage WCS2 and fine movement stage WFS2) in the −Y direction and position wafer stage WST at a plurality of points on the movement path, and each time the position is set, detects positional information of the alignment marks in the alignment shot area (sample shot area), using at least one of alignment systems AL1, $AL2_2$ to $AL2_4$. For example, in the case of considering a case where positioning is performed four times, main controller 20, for example, uses primary alignment system AL1 and secondary alignment systems $AL2_2$ and $AL2_3$ at the time of the first positioning to detect alignment marks (hereinafter also referred to as sample marks) in three sample shot areas, uses alignment systems AL1, and $AL2_1$ to $AL2_4$ at the time of the second positioning to detect five sample marks on wafer W, uses alignment systems AL1, and $AL2_1$ to $AL2_4$ at the time of the third positioning to detect five sample marks, and uses primary alignment system AL1, and secondary alignment systems AL2₂ and AL2₃ at the time of the fourth positioning to detect three sample marks, respectively. Accordingly, positional information of alignment marks in a total of 16 alignment shot areas can be obtained in a remarkably shorter period of time, compared with the case where the 16 alignment marks are sequentially detected with a single alignment system. In this case, each of alignment systems AL1, AL2₂ and AL2₃ detects a plurality of alignment marks (sample marks) arrayed along the Y-axis direction that are sequentially placed within the detection area (e.g. corresponding to the irradiation area of the detection light), corresponding with the movement operation of wafer stage WST2 described above. Therefore, on the measurement of the alignment marks described above, it is not necessary to move wafer stage WST2 in the X-axis direction.

In the embodiment, main controller 20 performs position measurement including the detection of the second fiducial marks, and in the case of the wafer alignment, performs position measurement of fine movement stage WFS2 in the XY plane supported by coarse movement stage WCS2 at the time of the wafer alignment, using fine movement stage position measurement system 70B including measurement arm 71B. However, besides this, wafer alignment can be performed while measuring the position of wafer W via wafer stage position measurement system 16B previously described, in the case of performing the movement of fine movement stage WFS2 at the time of wafer alignment integrally with coarse movement stage WCS2. Further, because measurement station 300 and exposure station 200 are arranged apart, the position of fine movement stage WFS2 is controlled on different coordinate systems at the time of wafer alignment and at the time of exposure. Therefore, main controller 20 converts array coordinates of each shot area on wafer W acquired from the wafer alignment into array coordinates which are based on the second fiducial marks.

In the manner described, wafer alignment to wafer W held by fine movement stage WFS2 is completed. FIG. 1 shows a state of when the wafer alignment has been completed. As it can be seen from FIG. 1, at this point, in exposure station 200, exposure to wafer W held by fine movement stage WFS1 is nearly completed.

Figure 20A:
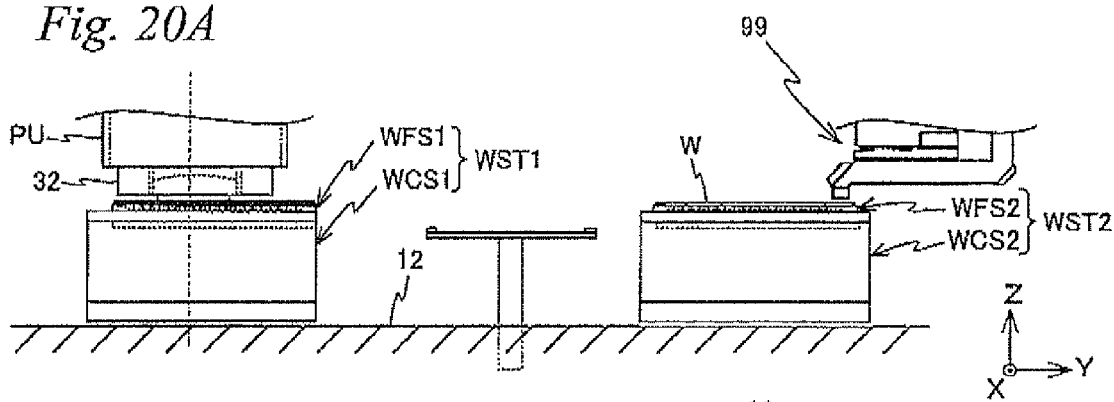
FIGS. 20A to 20D are views used to explain a parallel processing operation performed using the three fine movement stages WFS1, WFS2, and WFS3 (No. 1)in the exposure apparatus of the first embodiment.

FIG. 20A shows a positional relation of coarse movement stages WCS1 and WCS2 at the stage when wafer alignment to wafer W has been completed.

Main controller 20 waits for the exposure to wafer W on fine movement stage WFS1 to be completed, in a state where wafer stage WST2 is made to wait at a position shown in FIG. 20A.

Figure 17:
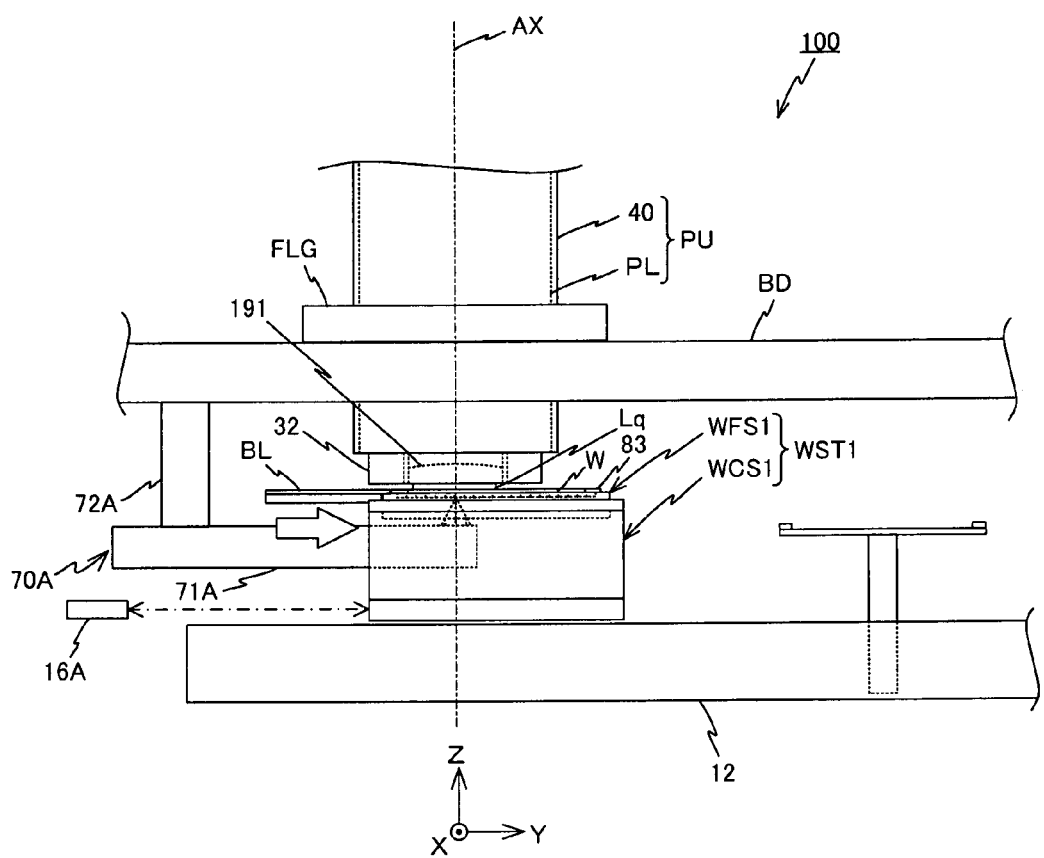
FIG. 17 is a view used to explain a delivery of a liquid immersion space (liquid Lq) performed between a fine movement stage and a movable blade (No. 2)

FIG. 17 shows a state of wafer stage WST1 immediately after completing the exposure.

Figure 16:
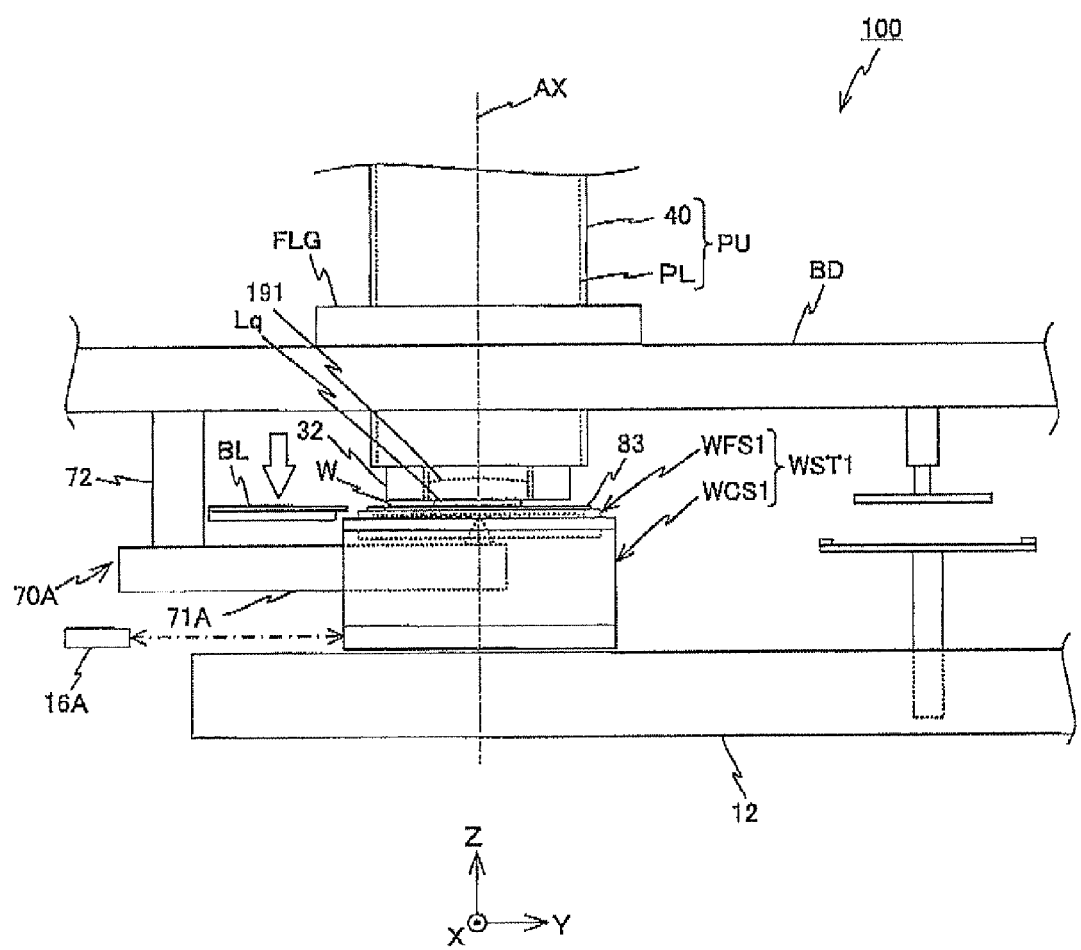
FIG. 16 is a view used to explain a delivery of a liquid immersion space (liquid Lq) performed between a fine movement stage and a movable blade (No. 1)

Prior to the completion of exposure, main controller 20 drives movable blade BL downward by a predetermined amount from a state shown in FIG. 4 via blade drive system 58 as is shown by an outlined arrow in FIG. 16. By this drive, the upper surface of movable blade BL is positioned to be flush with the upper surface of fine movement stage WFS1 (and wafer W) located below projection optical system PL, as shown in FIG. 16. Then, main controller 20 waits for the exposure to be completed in this state.

Then, when exposure has been completed, main controller 20 drives movable blade BL in the +Y direction by a predetermined amount (refer to the outlined arrow in FIG. 17) via blade drive system 58, so as to make movable blade BL be in contact or in proximity by a clearance of around 300 μm to fine movement stage WFS1. More specifically, main controller 20 sets movable blade BL and fine movement stage WFS1 to a scrum state.

Figure 18:
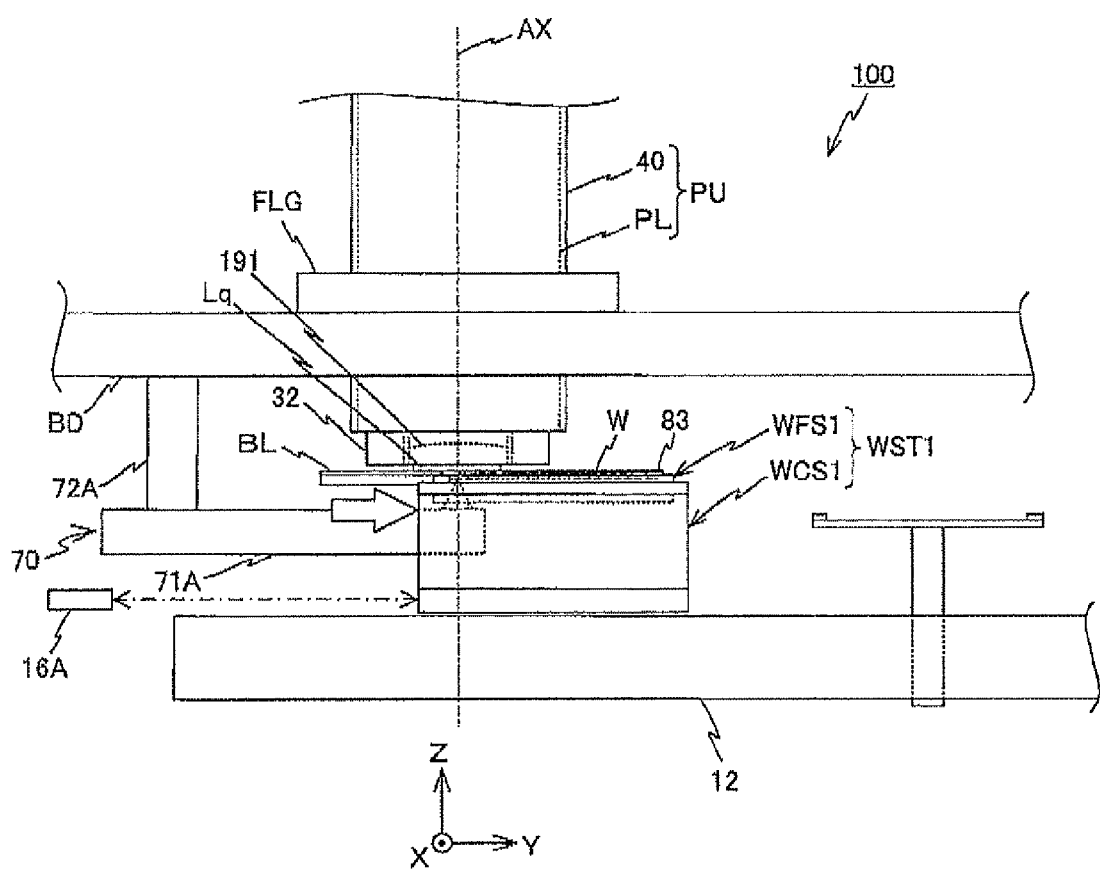
FIG. 18 is a view used to explain a delivery of a liquid immersion space (liquid Lq) performed between a fine movement stage and a movable blade (No. 3)

Next, as shown in FIG. 18, main controller 20 drives movable blade BL in the +Y direction (refer to the outlined arrow in FIG. 18) integrally with wafer stage WST1, while maintaining a scrum state between movable blade BL and fine movement stage WFS1. By this operation, the liquid immersion space area (liquid Lq), which is formed by liquid Lq held between tip lens 191 and fine movement stage WFS1, is passed from fine movement stage WFS1 to movable blade BL. FIG. 18 shows a state just before the liquid immersion space area formed by liquid Lq is passed from fine movement stage WFS1 to movable blade BL. In the state shown in FIG. 18, liquid Lq is held between tip lens 191, and fine movement stage WFS1 and movable blade BL. Incidentally, in the case of driving movable blade BL and fine movement stage WFS1 in proximity, it is desirable to set a gap (clearance) between movable blade BL and fine movement stage WFS1 so as to prevent or to suppress leakage of liquid Lq.

Figure 19:
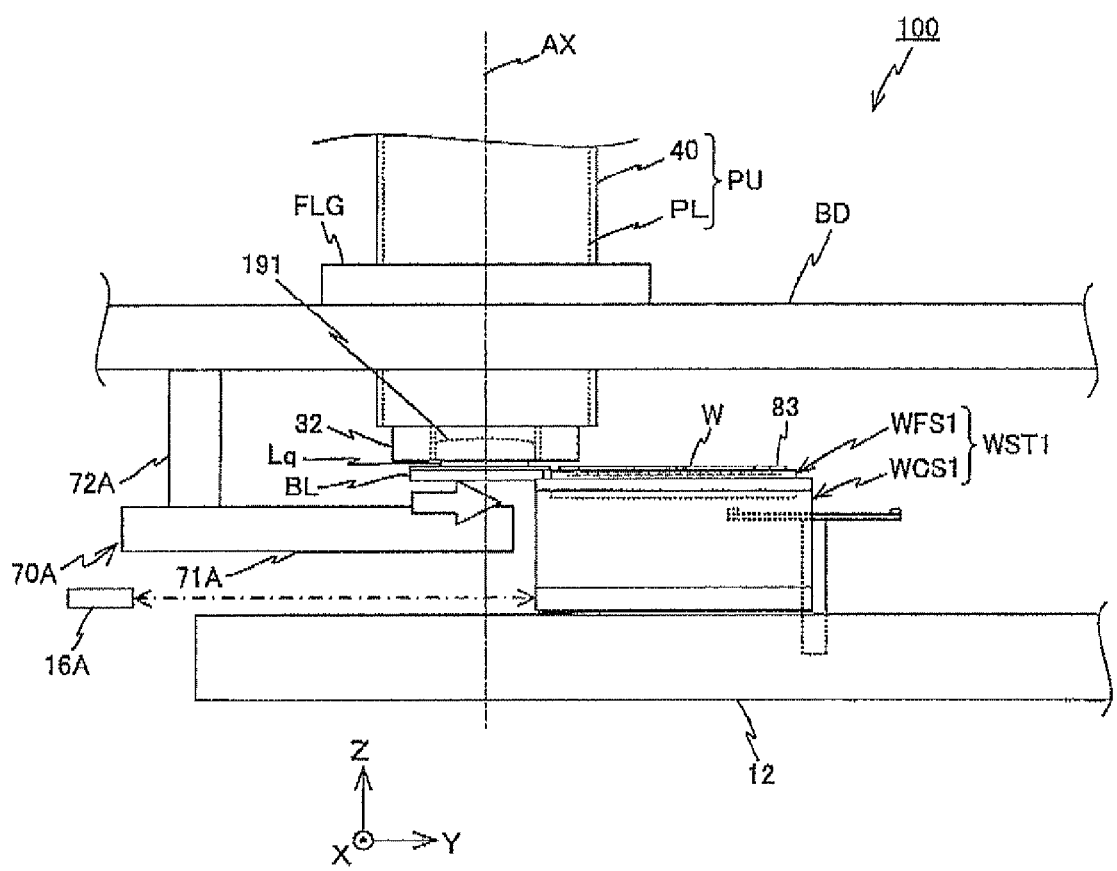
FIG. 19 is a view used to explain a delivery of a liquid immersion space (liquid Lq) performed between a fine movement stage and a movable blade (No. 4)
Figure 20B:
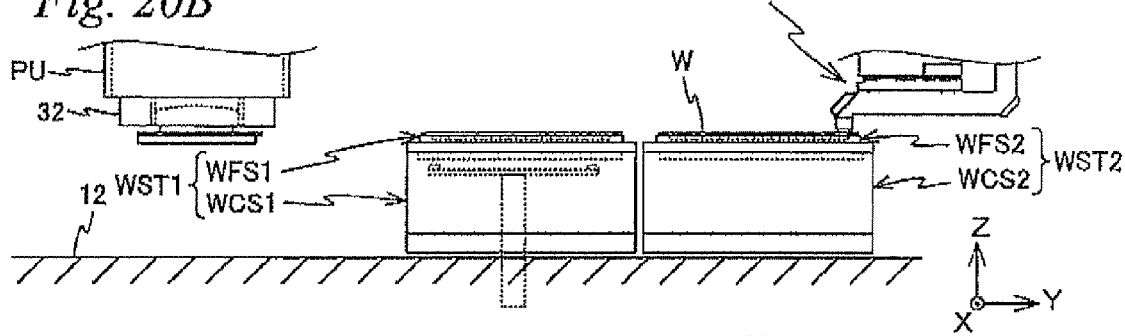
Figure 20C:
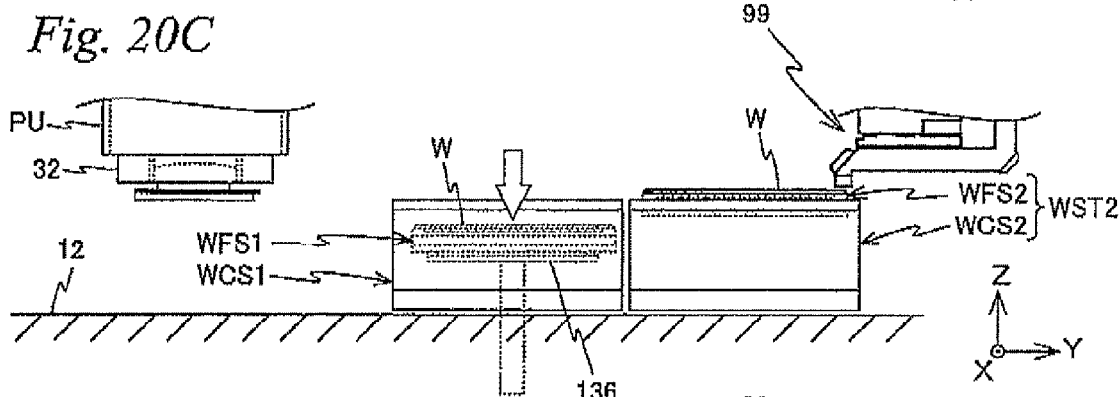
Figure 21:
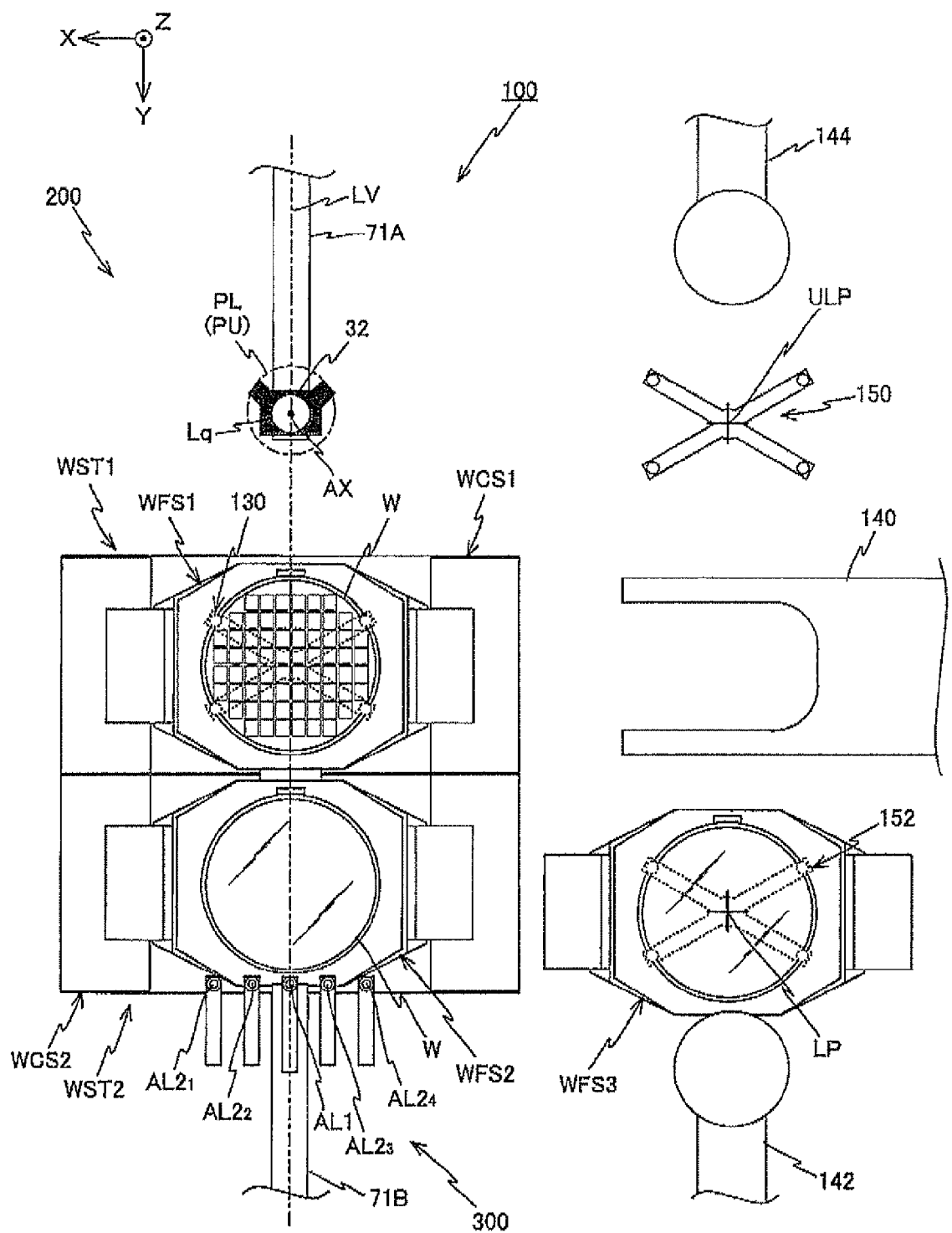
FIG. 21 is a view used to explain a parallel processing performed using the three fine movement stages WFS1, WFS2, and WFS3 (No. 3) in the exposure apparatus of the first embodiment.

Then, when the delivery of the liquid immersion space area from fine movement stage WFS1 to movable blade BL is completed as shown in FIG. 19, main controller 20 drives coarse movement stage WCS1 holding fine movement stage WFS1 further in the +Y direction, and moves coarse movement stage WCS1 near coarse movement stage WCS2, which is waiting at the waiting position previously described while holding fine movement stage WFS2. By this movement, a state occurs where coarse movement stage WCS1 houses center table 130 in its internal space, and also supports fine movement stage WFS1 right above center table 130, as shown in FIG. 20B. More specifically, fine movement stage WFS1 is carried right above center table 130 by coarse movement stage WCS1. FIG. 21 shows a state of exposure apparatus 100 at this point in a planar view.

Then, main controller 20 drives table main body 136 upward via driver 132 of center table 130, and supports fine movement stage WFS1 from below.

Then, main controller 20 drives table main body 136 upward via driver 132 of center table 130, and supports fine movement stage WFS1 from below.

And, in this state, main controller 20 releases the lock mechanism (not shown), and separates coarse movement stage WCS1 into the first section WCS1a and the second section WCS1b. By this operation, fine movement stage WFS1 is detachable from coarse movement stage WCS1. Therefore, main controller 20 drives table main body 136 supporting fine movement stage WFS1 downward, as is shown by the outlined arrow in FIG. 20C.

And then, main controller 20 locks the lock mechanism (not shown) after the first section WCS1a and the second section WCS1b are joined together.

Figure 20D:
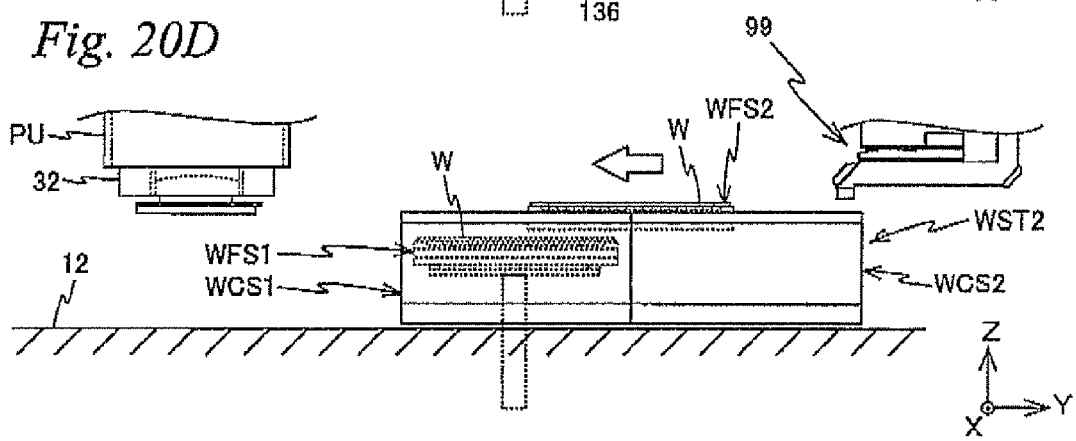

Next, main controller 20 makes coarse movement stage WCS2 almost come into contact with coarse movement stage WCS1, and also controls the current flowing in the YZ coils of fine movement stage drive systems 52A and 52B so that fine movement stage WFS2 is driven in the −Y direction by a Lorentz force, as is shown by the outlined arrow in FIG. 20D, and moves and mounts (a slide movement) fine movement stage WFS2 from coarse movement stage WCS2 onto coarse movement stage WCS1.

Next, main controller 20 makes coarse movement stage WCS1 which supports fine movement stage WFS2 move in the −Y direction as is shown by the outlined arrow in FIG. 22A, and delivers the liquid immersion space area held with tip lens 191 from movable blade BL to fine movement stage WFS2. The delivery of this liquid immersion space area (liquid Lq) is performed by reversing the procedure of the delivery of the liquid immersion space area from fine movement stage WFS1 to movable blade BL previously described.

Figure 22B:
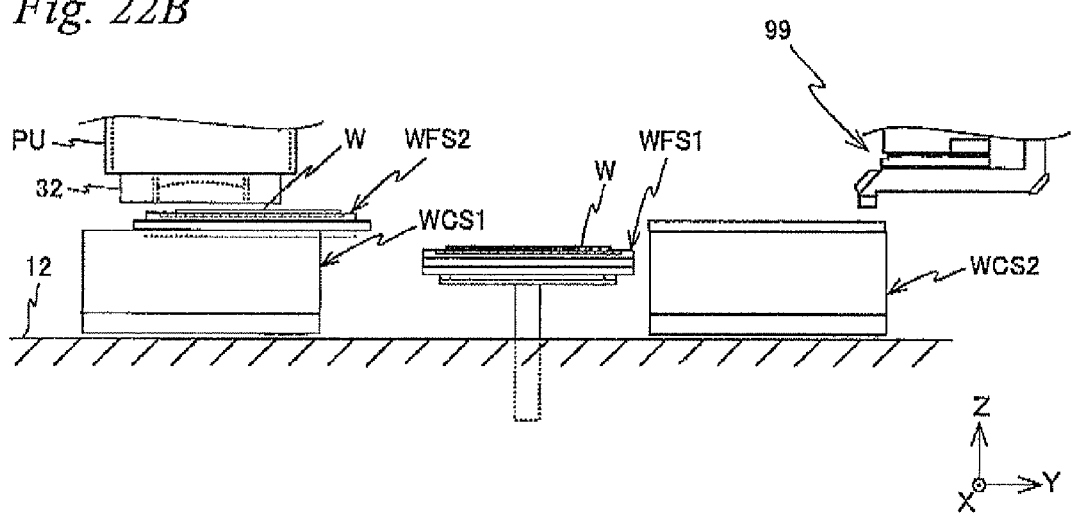
Figure 23:
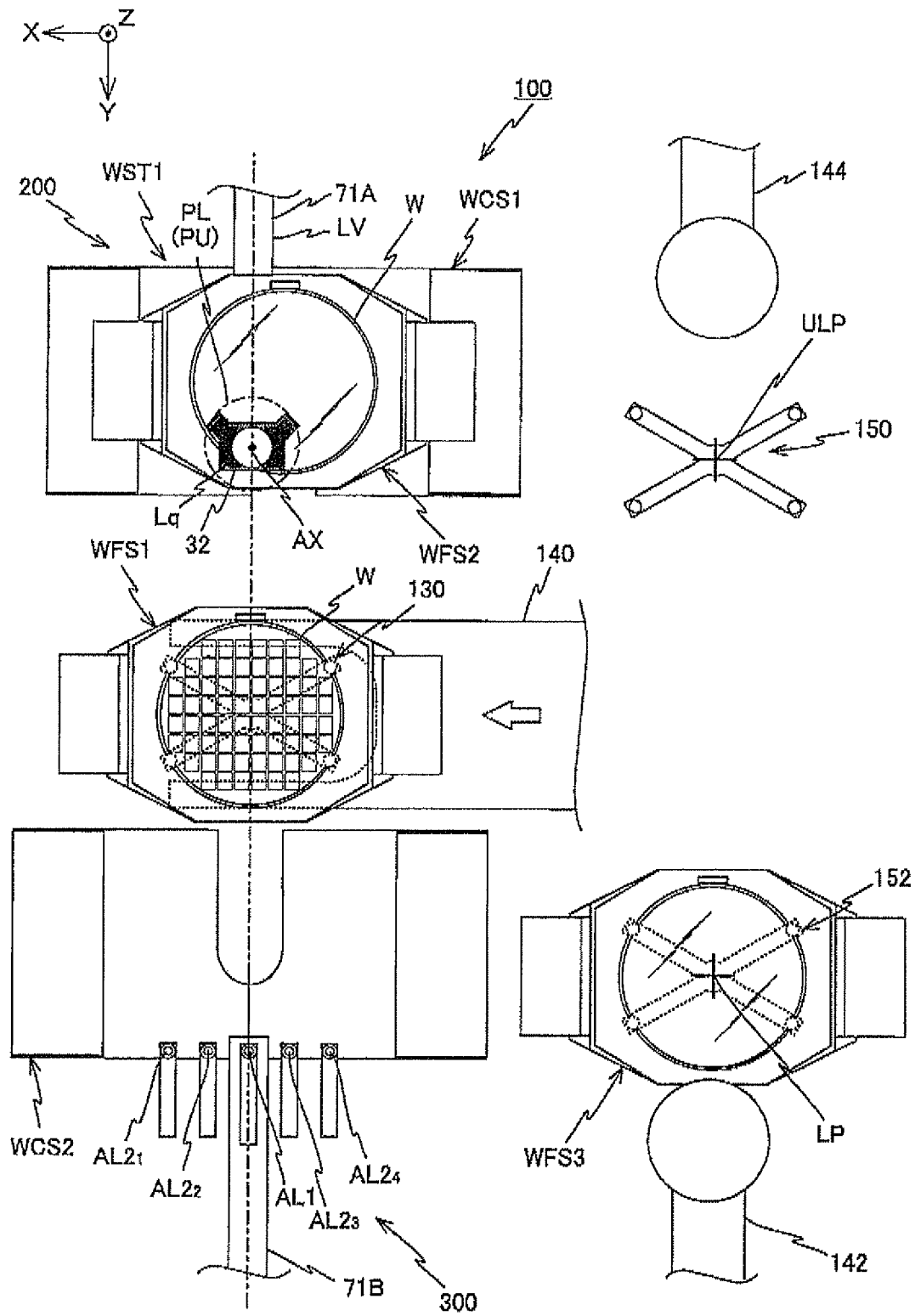
FIG. 23 is a view used to explain a parallel processing performed using the three fine movement stages WFS1, WFS2, and WFS3 (No. 5) in the exposure apparatus of the first embodiment.

Then, prior to the beginning of exposure, main controller 20 performs reticle alignment in a procedure (a procedure disclosed in, for example, U.S. Pat. No. 5,646,413 and the like) similar to a normal scanning stepper, using the pair of reticle alignment systems $RA_L$ and $RA_2$ previously described, and the pair of first fiducial marks on measurement plate 86 of fine movement stage WFS2 and the like. FIG. 22B shows fine movement stage WFS2 during reticle alignment, along with coarse movement stage WCS1 holding the fine movement stage. Then, main controller 20 performs exposure operation by the step-and-scan method, based on results of the reticle alignment and the results of the wafer alignment (array coordinates which uses the second fiducial marks of each of the shot areas on wafer W), and transfers the pattern of reticle R on each of the plurality of shot areas on wafer W. In this exposure, fine movement stage WFS2 is returned to the −Y side once after the reticle alignment, and then exposure is performed in the order from shot areas on the +Y side on wafer W to the shot areas on the −Y side.

Figure 24:
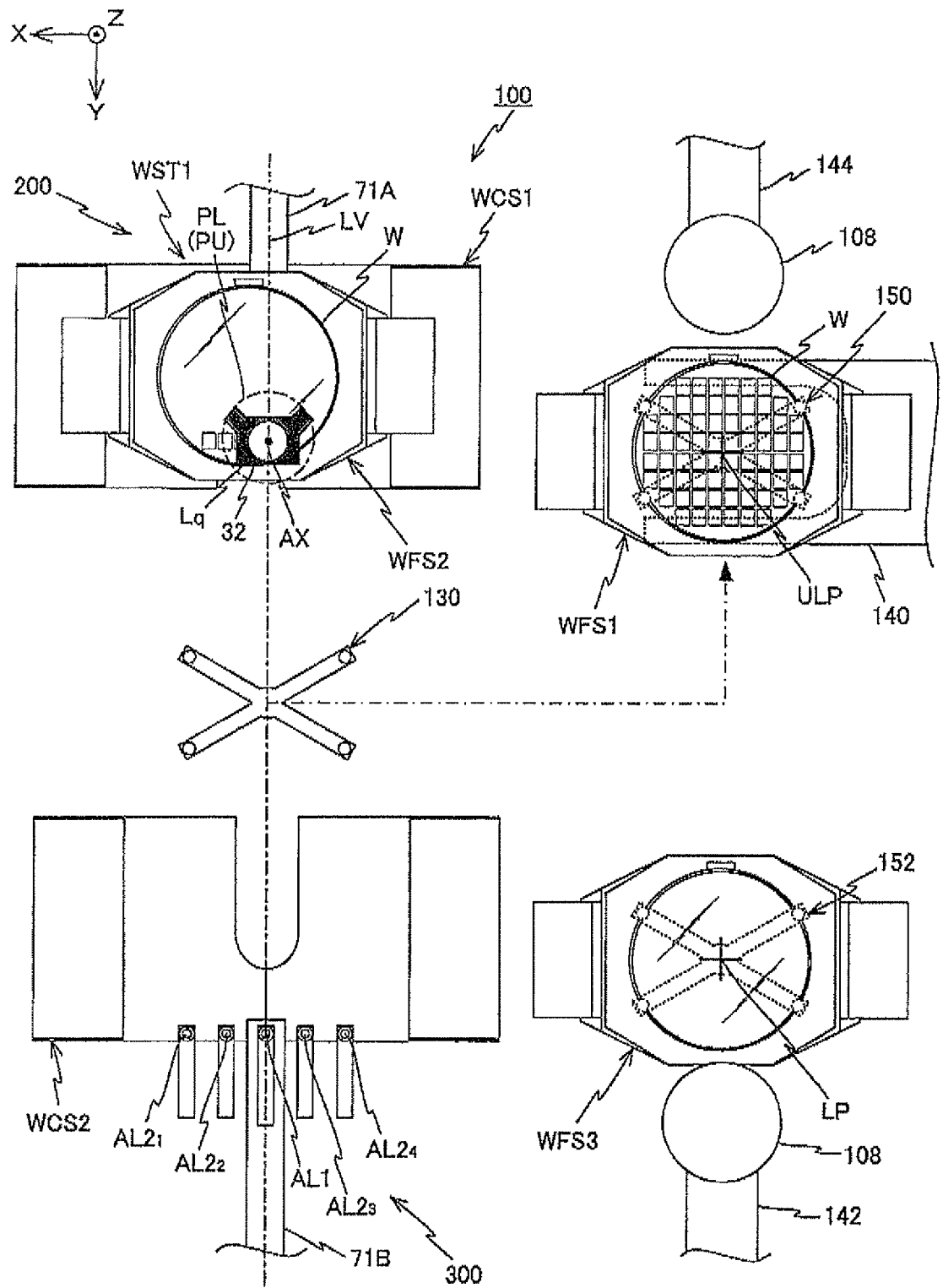
FIG. 24 is a view used to explain a parallel processing performed using the three fine movement stages WFS1, WFS2, and WFS3 (No. 6) in the exposure apparatus of the first embodiment.

Concurrently with the delivery of the liquid immersion space area, reticle alignment, and exposure described above, operations such as a. to g. described below are performed.

a. More specifically, robot arms 140 is driven in the X-axis direction, the Y-axis direction, and the Z-axis direction in a predetermined procedure (refer to the outlined arrows in FIG. 23) by main controller 20, and fine movement stage WFS1 holding wafer W on which exposure has been performed mounted on table main body 136 of center table 130 is carried onto unload table 150 by robot arms 140. FIG. 24 shows a state where fine movement stage WFS1 has been carried onto unload table 150. At this point, wafer W on fine movement stage WFS2 is being exposed, and fine movement stage WFS3 is waiting while holding a new wafer W on load table 152.

b. Then, based on instructions from main controller 20, wafer W which has undergone exposure is unloaded from fine movement stage WFS1 on unload table 150 by unload arm 144.

In this unloading, unload arm 144 is driven downward until Bernoulli chuck 108 at the tip of unload arm 144 approaches wafer W (plate 83 of fine movement stage WFS1) to around several μm. Then, to maintain the gap of around several μm, the flow rate of the air blowing out from Bernoulli chuck 108 is adjusted. This allows wafer W to be held by suction in a non-contact manner from above by Bernoulli chuck 108, via a clearance of around several μm. Now, in the case fine movement stage WFS1 (or WFS2 or WFS3) is located on unload table 150, a decompression chamber (decompression space) formed by a wafer holder (drawing omitted) of fine movement stage WFS1 and the back surface of wafer W is connected to a pump, which is connected to a supply source of a pressurized gas via a gas supply line and piping (not shown), and by main controller 20 operating this pump, main controller 20 releases the suction of wafer W by the wafer holder and assists a suction holding operation of wafer W by Bernoulli chuck 108 by blowing out the pressurized gas from below. Incidentally, in a state where the pump is in an idle state (non-operating state) including the case where a wafer is suctioned, the gas supply is closed by an action of a check valve (not shown).

Figure 25:
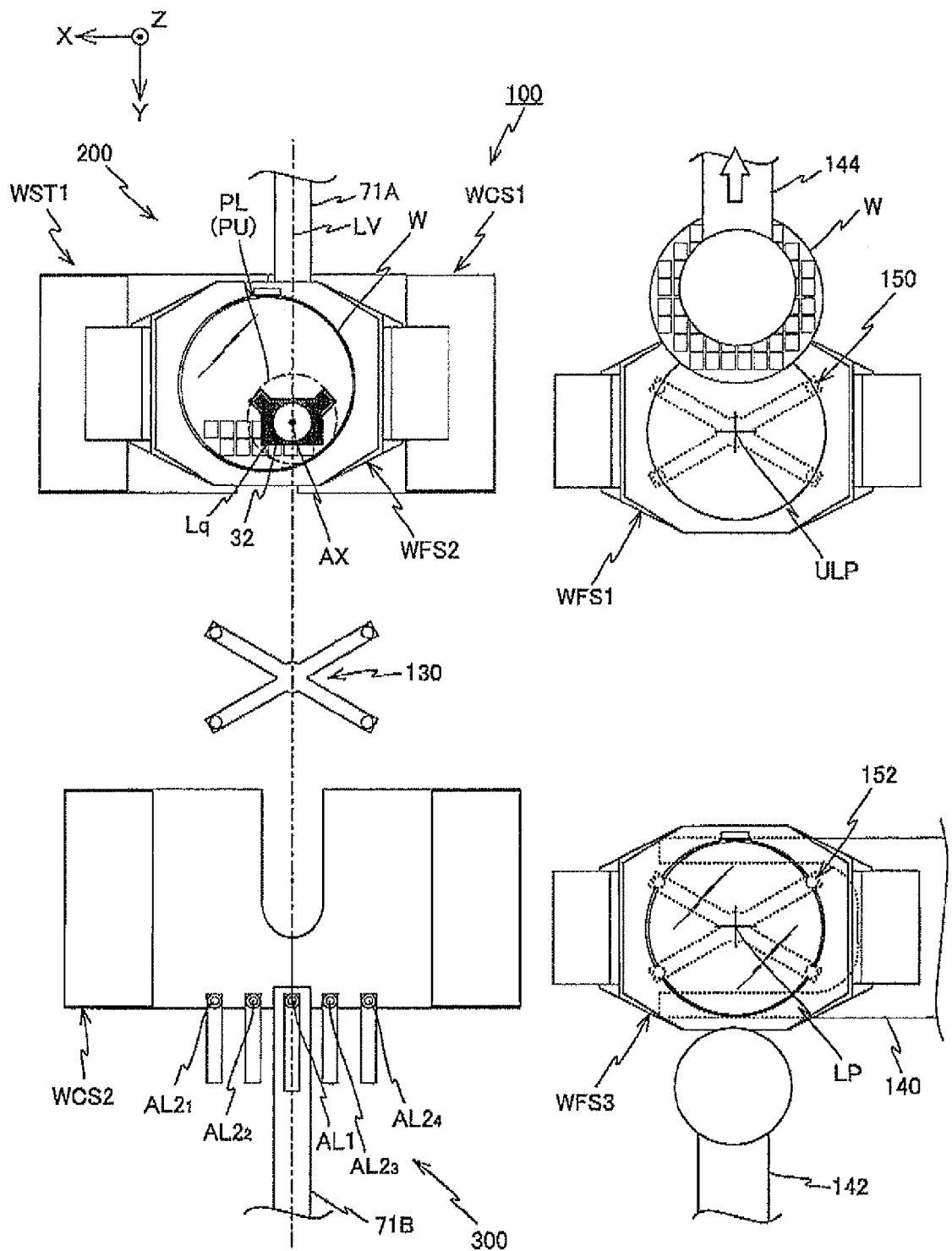
FIG. 25 is a view used to explain a parallel processing performed using the three fine movement stages WFS1, WFS2, and WFS3 (No. 7) in the exposure apparatus of the first embodiment.
Figure 26:
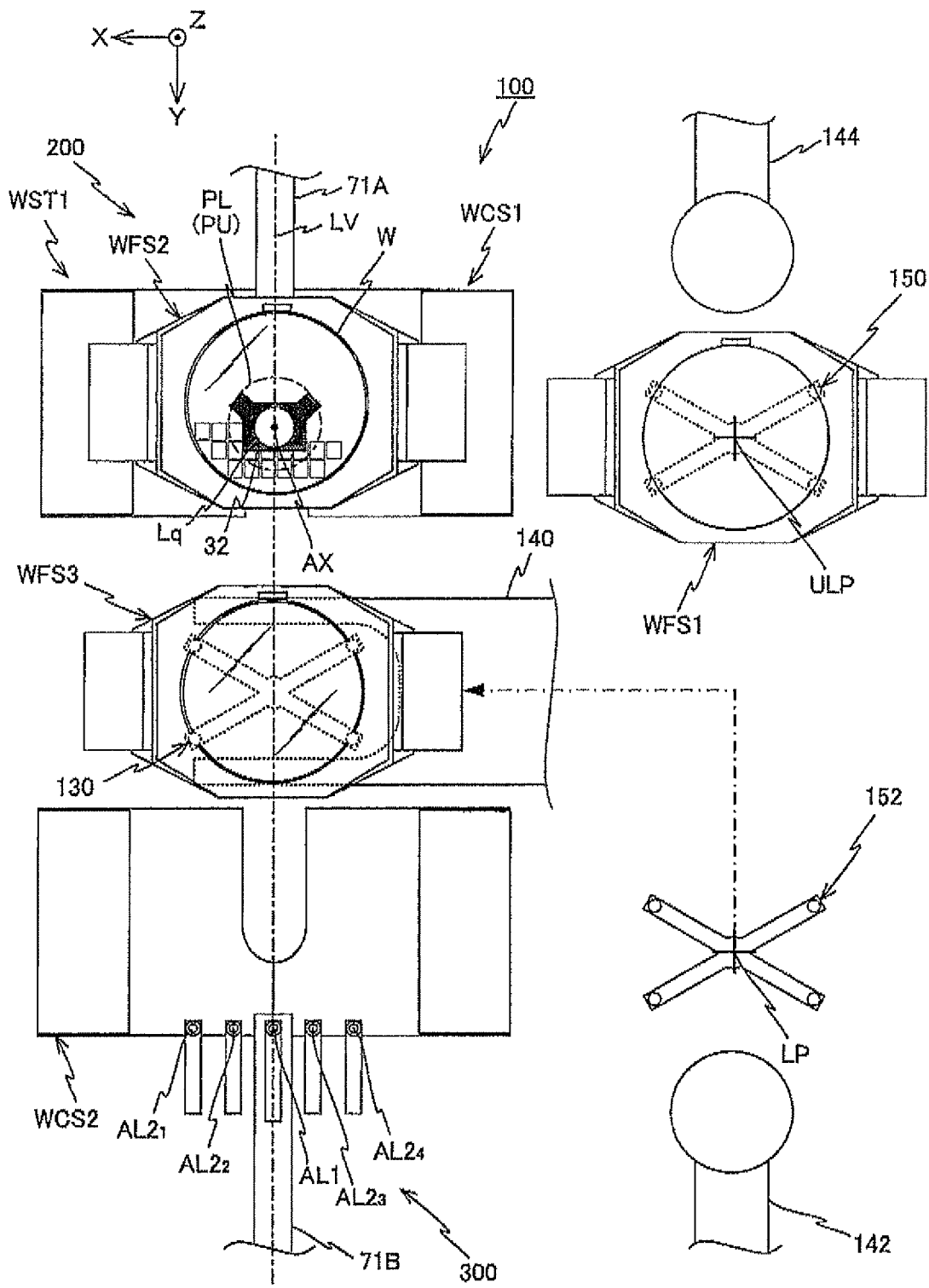
FIG. 26 is a view used to explain a parallel processing performed using the three fine movement stages WFS1, WFS2, and WFS3 (No. 8) in the exposure apparatus of the first embodiment.
Figure 27:
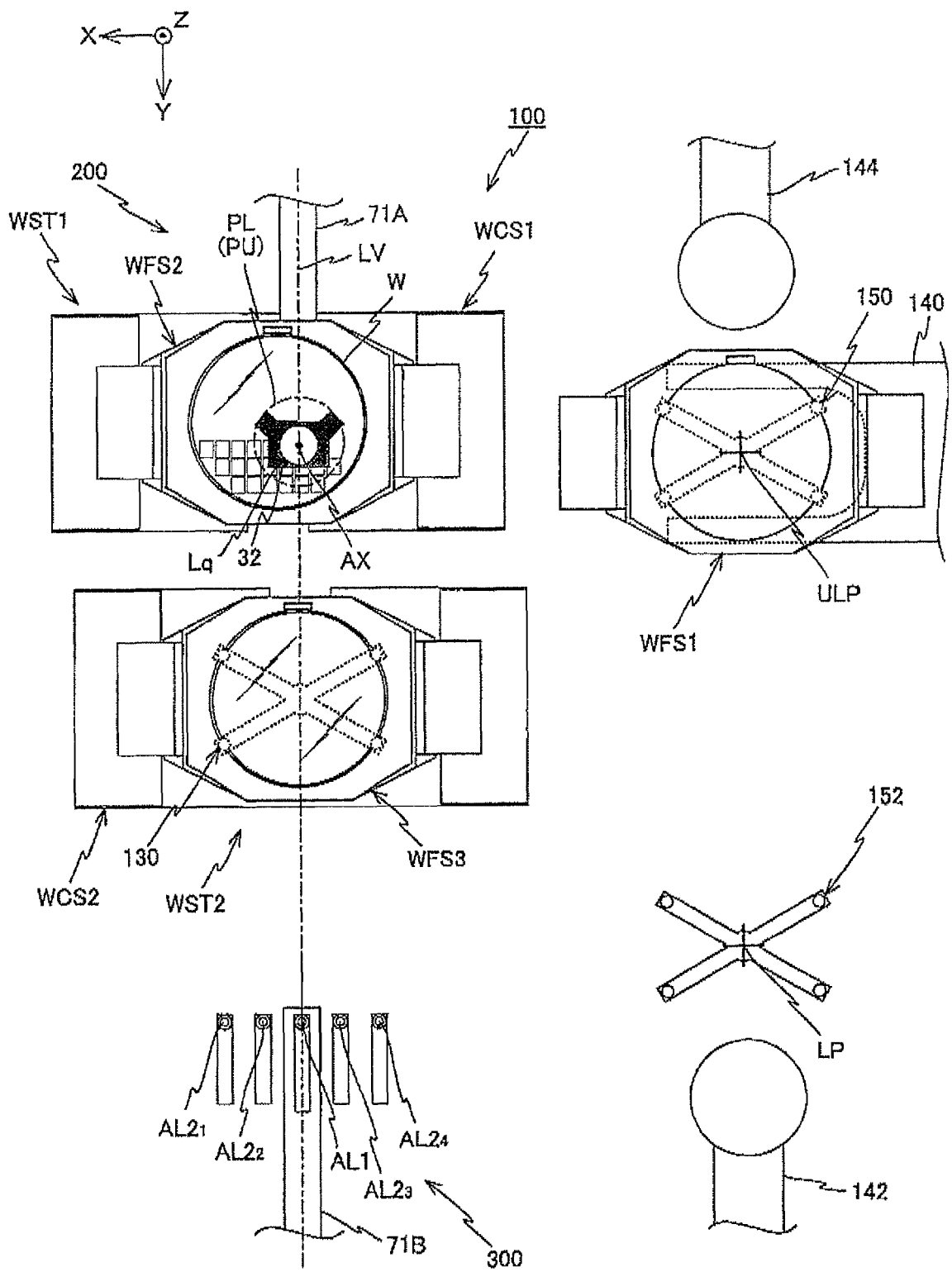
FIG. 27 is a view used to explain a parallel processing performed using the three fine movement stages WFS1, WFS2, and WFS3 (No. 9) in the exposure apparatus of the first embodiment.

And then, after unload arm 144 is driven upward, unload arm 144 is driven within the XY plane. This allows unload arm 144 to carry wafer W to a wafer unload position (for example, a delivery position (unloading side) of the wafer between a coater developer which is connected in-line to exposure apparatus 100), and then is put on the wafer unload position. FIG. 25 shows a state where unload arm 144 moves away from unload table 150.

c. In parallel with unloading wafer W which has been exposed described above, robot arms 140 is driven in the X-axis direction, the Y axis-direction, and the Z-axis direction in a predetermined procedure by main controller 20, and fine movement stage WFS3 holding the new wafer W mounted on load table 152 is carried to center table 130 onto table main body 136, by robot arms 140. FIG. 26 shows a state where carriage of fine movement stage WFS3 onto center table 130 has been completed. After the carriage, table main body 136 of center table 130 is driven upward by a predetermined amount via driver 132 by main controller 20. At this point in time, on fine movement stage WFS2, the exposure of wafer W is being continued.

d. Subsequently, coarse movement stage WCS2 which has been waiting in the vicinity of an alignment completing position is driven in the −Y direction by main controller 20, and fine movement stage WFS3 supported on table main body 136 is mounted on coarse movement stage WCS2, as shown in FIG. 27. Then, table main body 136 is driven downward by a predetermined amount. By the operation, fine movement stage WFS3 becomes supported by coarse movement stage WCS2.

e. Then, coarse movement stage WCS2 is driven in the +Y direction by main controller 20, and is moved to measurement station 300.

f. Thereafter, detection of the second fiducial marks on fine movement stage WFS3 supported by coarse movement stage WCS2, alignment of wafer W on fine movement stage WFS3 and the like are performed in procedures similar to the ones previously described. Then, by main controller 20, array coordinates of each shot area on wafer W acquired from the wafer alignment are converted into array coordinates which are based on the second fiducial marks. In this case as well, position measurement of fine movement stage WFS3 on alignment is performed, using fine movement stage position measurement system 7013.

g. In parallel with operations such as attaching fine movement stage WFS3 to coarse movement stage WCS2, moving to measurement station 300, and alignment of wafer W on fine movement stage WFS3 described above, robot arm 140 is driven in the Z-axis direction and the Y-axis direction (and the X-axis direction) in a predetermined procedure by main controller 20, so that fine movement stage WFS1 mounted on unload table 150 is carried to load table 152 by robot arm 140, and following this operation, a new (not yet exposed) wafer W is loaded on fine movement stage WFS1 roughly in a reversed procedure of the unloading previously described by main controller 20.

Figure 28:
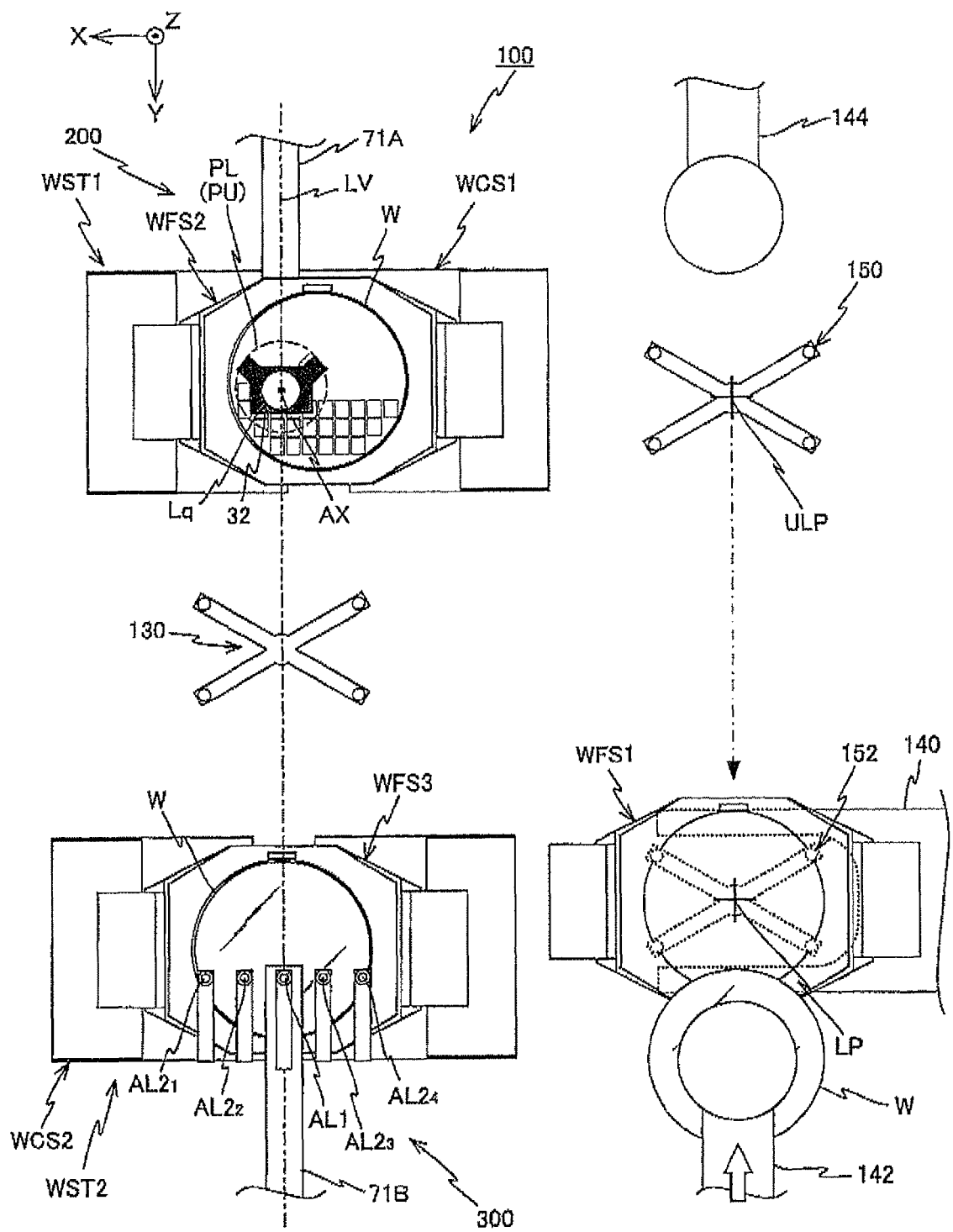
FIG. 28 is a view used to explain a parallel processing performed using the three fine movement stages WFS1, WFS2, and WFS3 (No. 10) in the exposure apparatus of the first embodiment.

More specifically, main controller 20 controls load arm 142 and makes load arm 142 receive (makes Bernoulli chuck 108 hold the wafer by suction) wafer W which is at a wafer loading position (for example, a delivery position (loading side) of the wafer between the coater developer), and makes load arm 142 carry wafer W to an area above fine movement stage WFS1 mounted on load table 152. FIG. 28 shows a state in which wafer W is being carried. At this point in time, exposure to wafer W held by fine movement stage WFS2 is being continued, as well as the alignment of wafer W held by fine movement stage WFS3.

Then, main controller 20 drives load arm 142 holding wafer W downward to a position until the back surface of wafer W comes in contact with the wafer holder of fine movement stage WFS1. Then, main controller 20 releases the suction of wafer W by Bernoulli chuck 108, and makes load arm 142 withdraw to a predetermined waiting position. This allows a new wafer W to be loaded on fine movement stage WFS1 mounted on load table 152. In this case, when fine movement stage WFS1 (or WFS2 or WFS3) is on load table 152, a decompression chamber (decompressed space) formed by the wafer holder (omitted in drawings) of fine movement stage WFS1 and the back surface of wafer W is connected to a vacuum pump via an exhaust pipe line (not shown) and piping, and by main controller 20 making the vacuum pump operate, gas inside the decompression chamber is exhausted outside via the exhaust pipe line and the piping, which creates a negative pressure within the decompression chamber and starts the suction of wafer W by the wafer holder. And when the inside of the decompression chamber reaches a predetermined pressure (negative pressure), main controller 20 suspends the vacuum pump. When the vacuum pump is suspended, the exhaust pipe line is closed by an action of a check valve (not shown). Accordingly, the decompressed state of the decompression chamber is maintained, and wafer W is held by the wafer holder even if tubes and the like used to suction the gas in the decompression chamber by vacuum are not connected to fine movement stage WFS1. This allows fine movement stage WFS1 to be separated from the coarse movement stage and to be carried without any problems.

After wafer W has been loaded on fine movement stage WFS1, a state similar to the case in FIG. 15 occurs, or more specifically, a state occurs in which the exposure described above is performed on wafer W held by fine movement stage WFS2 at exposure station 200, alignment is being performed on wafer W held by fine movement stage WFS3 which is at measurement station 300, and fine movement stage WFS1 is waiting while holding a new wafer W on load table 152.

Hereinafter, a parallel processing as is previously described is repeatedly performed by main controller 20, sequentially using fine movement stages WFS1, WFS2, and WFS3, and an exposure processing to a plurality of wafer Ws is continuously performed.

As is described in detail above, according to exposure apparatus 100 of the embodiment, in the case the fine movement stage (one of WFS1, WFS2, and WFS3) holding wafer W is at a place besides the area above coarse movement stages WCS1 and WCS2, or to be more concrete, on center table 130, unload table 150, or load table 152, exchange of wafer W is performed by an exchange system which includes robot arm 140, unload arm 144, load arm 142, center table 130, and main controller 20 which controls these arms 140, 144, and 142, and center table 130. In other words, the exchange wafer W is performed, regardless of the operation of coarse movement stages WCS1 and WCS2. Therefore, while exposure of wafer W held by one fine movement stage (e.g., WFS1) in exposure station 200 is performed, it becomes possible to concurrently perform at least a part of the alignment (measurement) of wafer W held by another fine movement stage (e.g., WFS2) in measurement station 300 and the exchange of wafer W held by another fine movement stage (e.g., WFS3). That is, because the three operations which are exposure, alignment, and wafer exchange can be performed concurrently, it becomes possible to improve the throughput remarkably. Accordingly, it is possible to achieve wafer processing with a higher throughput than before, for example, even in the case when a 450 mm wafer is subject to processing.

Further, in exposure apparatus 100 of the embodiment, because the three operations which are exposure, alignment, and wafer exchange can be performed concurrently, there is no risk, especially of the throughput decreasing, even if, for example, the same amount of time as the exposure time is taken for alignment. Accordingly, alignment shot areas which are subject to wafer alignment can be increased, and for example, all the shot areas can become an alignment shot area. This allows wafer alignment to be performed with high precision, which in turn can improve the overlay accuracy.

In parallel with the exposure of wafer W held by one of the fine movement stages (e.g., WFS1) and the alignment of wafer W held by another fine movement stage (e.g., WFS2), temperature control of a fine movement stage (e.g. WFS3) and wafer W held by this stage is performed on load table 152.

Further, according to exposure apparatus 100 of the embodiment, when fine movement stage WFS1, WFS2, or WFS3 holding wafer W is supported by unload table 150 at unloading position ULP, wafer W can be held in a non-contact manner from above by Bernoulli chuck 108 of unload arm 144, and can be carried from fine movement stage WFS2 (or WFS1). Further, wafer W can be held in a non-contact manner from above by Bernoulli chuck 108 of load arm 142, and can be loaded onto WFS1, WFS2, or WFS3. Therefore, a notch to house arms used to unload wafer W from fine movement stage WFS1, WFS2, or WFS3 and a notch to house arms used to load wafer W onto fine movement stage WFS1, WFS2, or WFS3 do not have to be formed in the fine movement stage (wafer holder). Further, according to exposure apparatus 100 of the embodiment, a vertical movement member (also called a center-up or a center table) for delivering the wafer does not have to be arranged in the fine movement stage. Accordingly, it becomes possible for the fine movement stage (wafer holder) to hold wafer W by suction in a uniform manner across the entire surface including the shot areas in the periphery, which makes it possible to favorably maintain the degree of flatness of wafer W across the entire surface.

Further, according to exposure apparatus 100 of the present embodiment, on a plane substantially parallel to the XY plane of fine movement stages WFS1, WFS2, and WFS3, a measurement plane on which grating RG is formed is arranged, respectively. Fine movement stage WFS1 (or WFS2 or WFS3) is held relatively movable along the XY plane by coarse movement stage WCS1 (or WCS2). And, fine movement stage position measurement system 70A (or 70B) has X head 77$x$, and Y heads 77$ya$ and 77$yb$ that are placed inside the space of coarse movement stage WCS1 facing the measurement plane on which grating RG is formed and irradiate a pair of measurement beams $LBx_1$ and $LBx_2$, $LBya_1$ and $LBya_2$, and $LByb_1$ and $LByb_2$, respectively, on the measurement plane, and receive lights from the measurement plane of the measurement beams (e.g., synthetic beams $LBx_{12}$, $LBya_{12}$, $LByb_{12}$ of the first-order diffraction beams made by grating RG of each of the measurement beams). Then, by fine movement stage position measurement system 70A (or 70B), positional information (including rotation information in the θz direction) at least within an XY plane of fine movement stage WFS1 (WFS2 or WFS3) is measured, based on an output of the heads, X head 77$x$, Y head 77$y$1, and 77$y$2. This allows the positional information in the XY plane of fine movement stage WFS1 (WFS2 or WFS3) to be measured with good precision by the so-called back surface measurement by irradiating the pair of measurement beams $LBx_1$ and $LBx_2$, $LBya_1$ and $LBya_2$, and $LByb_1$ and $LByb_2$ from X head 77$x$, Y heads 77$y$1 and 77$y$2, respectively, on the measurement plane of fine movement stage WFS1 (WFS2 or WFS3) on which grating RG is formed. Then, main controller 20 drives fine movement stage WFS1 (WFS2 or WFS3) alone, or integrally with WCS1 (or WCS2), based on the positional information measured by fine movement stage position measurement system 70A (or 70B) via fine movement stage drive system 52A, or (fine movement stage drive system 52A and coarse movement stage drive system 51A), (or via fine movement stage drive system 52B (or fine movement stage drive system 52B and coarse movement stage drive system 51B)) Further, because a vertical movement member does not have to be provided on fine movement stage as is described above, no problems occur in particular even when the back surface measurement described above is employed.

Further, in exposure apparatus 100 of the embodiment, in exposure station 200, wafer W mounted on fine movement stage WFS1 (WFS2 or WFS3) held relatively movable by coarse movement stage WCS1 is exposed with exposure light IL, via reticle R and projection optical system PL. In doing so, positional information in the XY plane of fine movement stage WFS1 (WFS2 or WFS3) held movable by coarse movement stage WCS1 is measured by main controller 20, using encoder system 73 of fine movement stage position measurement system 70A which has measurement arm 71A which faces grating RG placed at fine movement stage WFS1 (WFS2 or WFS3). In this case, because space is formed inside coarse movement stage WCS1 and each of the heads of fine movement stage position measurement system 70A are placed in this space, there is only space between fine movement stage WFS1 (WFS2 or WFS3) and each of the heads of fine movement stage position measurement system 70A. Accordingly, each of the heads can be arranged in proximity to fine movement stage WFS1 (WFS2 or WFS3) (grating RG), which allows a highly precise measurement of the positional information of the fine movement stage (WFS2 or WFS3) by fine movement stage position measurement system 70A. Further, as a consequence, a highly precise drive of fine movement stage WFS1 (WFS2 or WFS3) via coarse movement stage drive system 51A and/or fine movement stage drive system 52A by main controller 20 becomes possible.

Further, in this case, irradiation points of the measurement beams of each of the heads of encoder system 73 and laser interferometer system 75 configuring fine movement stage position measurement system 70A emitted from measurement an 71A on grating RG coincide with the center (exposure position) of irradiation area (exposure area) IA of exposure light IL irradiated on wafer W. While the irradiation point of all the measurement beams does not always coincide with the exposure center here, the extent of the influence of the Abbe error is suppressible, or negligible. Accordingly, main controller 20 can measure the positional information of fine movement stage WFS1 (WFS2 or WFS3) with high accuracy, without being affected by so-called Abbe error. Further, because optical path lengths in the atmosphere of the measurement beams of each of the heads of encoder system 73 can be made extremely short by placing measurement arm 71A right under grating RG, the influence of air fluctuation is reduced, and also in this point, the positional information of fine movement stage WFS1 (WFS2 or WFS3) can be measured with high accuracy.

Further, in the embodiment, fine movement stage position measurement system 70B configured symmetric to fine movement stage position measurement system 70A is provided in measurement station 300. And in measurement station 300, when wafer alignment to wafer W on fine movement stage WFS2 (WFS3 or WFS1) held by coarse movement stage WCS2 is performed by alignment systems AL1, and AL2$_1$ to AL2$_4$ and the like, positional information in the X plane of fine movement stage WFS2 (WFS3 or WFS1) supported movable on coarse movement stage WCS2 is measured by fine movement stage position measurement system 70B with high precision. As a consequence, a highly precise drive of fine movement stage WFS2 (WFS3 or WFS1) via coarse movement stage drive system 51B and/or fine movement stage drive system 52B by main controller 20 becomes possible.

Accordingly, it becomes possible to form a pattern with good accuracy on the entire surface of wafer W, for example, by exposing such wafer W using illumination light IL.

Further, according to exposure apparatus 100 of the embodiment, because fine movement stage WFS1 (WFS2 or WFS3) can be driven with good precision, it becomes possible to drive wafer W mounted on this fine movement stage WFS1 (WFS2 or WFS3) in synchronization with reticle stage RST (reticle R) with good precision, and to transfer a pattern of reticle R onto wafer W by scanning exposure.

Incidentally, in the embodiment above, three fine movement stages WFS1, WFS2, and WFS3 were provided, and when a fine movement stage was put on center table 130 which is placed on a movement path of fine movement stages WFS1 and WFS2 between measurement station 300 and exposure station 200, wafer exchange was performed by moving the fine movement stage from the position on center table 130 to another position. However, the wafer exchange method is not limited to this.

Incidentally, in the embodiment above, while the case has been described where coarse movement stages WCS1 and WCS2 were separable into the first section and the second section as well as the first section and the second section being engageable, besides this, the first section and the second section may have any type of arrangement, even when the first section and the second section are physically constantly apart, as long as they are reciprocally approachable and dividable, and on separation, a holding member (the fine movement stage in the embodiment above) is detachable, whereas when the distance is closed, the holding member is supportable. Or, on the contrary, the coarse movement stage does not necessarily have to be separated into two sections, as in the second and third embodiments below. In this case, the notch on the bottom surface of coarse movement stages WCS1 and WCS2 where the shaft of the center table can enter does not necessarily have to be provided.

Incidentally, when focusing attention on carriage of the fine movement stage off of, or on center table 130 in the embodiment above, the fine movement stage holding wafer W which has been exposed is carried off from center table 130 by robot arm 140 under the control of main controller 20, and another fine movement stage holding a new wafer W is carried onto center table 130 by robot arms 140. Accordingly, it can also be said that wafer W is exchanged integrally with the fine movement stage by robot arm 140.

Further, in the embodiment above, while the fine movement stage held by center table 130 was carried to unload table 150 by robot arm 140 for wafer exchange, as well as this, for example, a wafer exchange position can be set within measurement station 300, and in this case, robot arm 140 used to carry the fine movement stage does not have to be provided.

Further, in the case grating RG is provided on the back surface of fine movement stages WFS1, WFS2, and WFS3, center table 130 needs to hold fine movement stages WFS1, WFS2, and WFS3 so that the stages do not come into contact with grating RG. Further, in a coarse movement stage which is separable into a first section and a second section as in coarse movement stages WCS1 and WCS2 in the embodiment above, the lock mechanism to lock both sections does not necessarily have to be provided.

Further, in the embodiment above, on delivering fine movement stages WFS1, WFS2, and WFS3 between two coarse movement stages WCS1 and WCS2 reciprocally, stages WCS1 and WCS2 do not have to be extremely close together.

Coarse movement stages WCS1 and WCS2 can be distanced within a range where the fine movement stage is not tilted greatly (that is, the stator and the mover of the linear motor do not come into contact) when the fine movement stage is moved between coarse movement stages WCS1 and WCS2.

A Second Embodiment

Next, a second embodiment of the present invention will be described, with reference to FIGS. 29 to 40. Here, the same or similar reference numerals will be used for the same or similar sections as in the first embodiment previously described, and a detailed description thereabout will be omitted.

Figure 29:
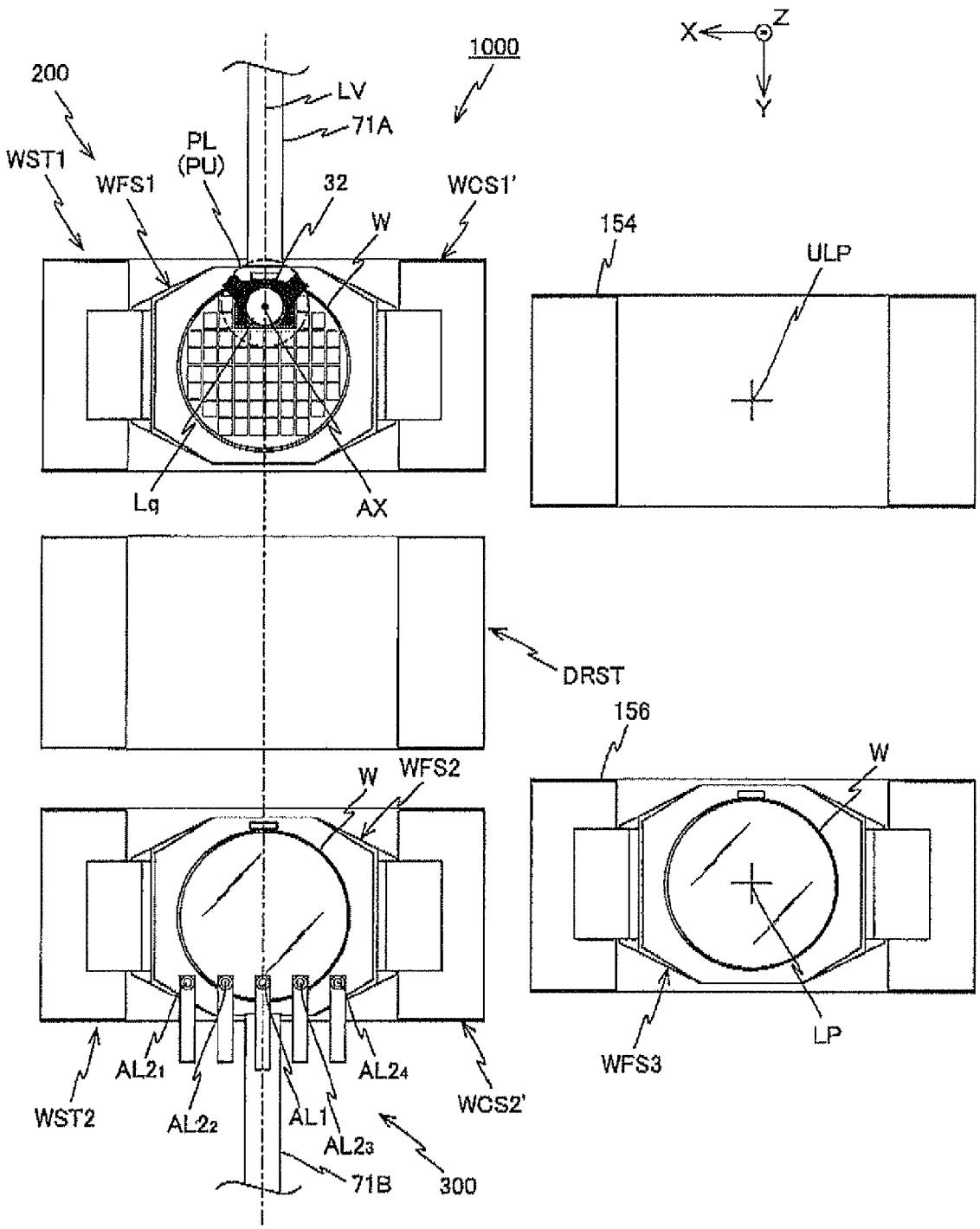
FIG. 29 is a planar view showing a schematic configuration of the exposure apparatus of the second embodiment.
Figure 30:
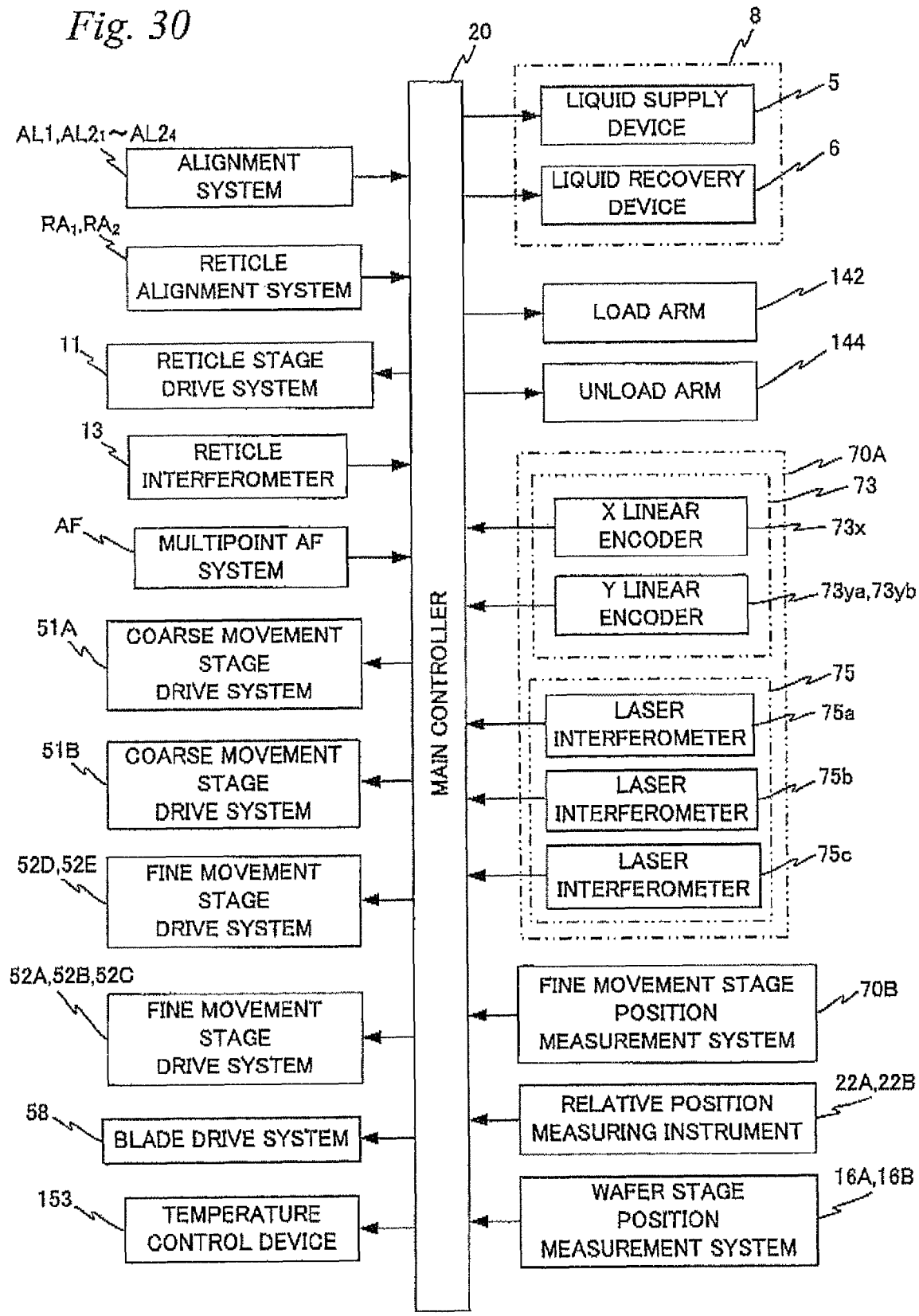
FIG. 30 is a block diagram showing a configuration of a control system of the exposure apparatus in FIG. 29.

FIG. 29 shows a schematic configuration of an exposure apparatus 1000 in the second embodiment in a planar view. Further, FIG. 30 is a block diagram showing an arrangement of a control system in exposure apparatus 1000. Exposure apparatus 1000 is a projection exposure apparatus by the step-and-scan method, or a so-called scanner. In this embodiment, the description will be made by determining the X-axis, the Y-axis, and the Z-axis directions, and the θx, the θy and the θz directions in the same manner as in the first embodiment.

As it can be seen when comparing FIG. 29 and FIG. 1, in exposure apparatus 1000 of the second embodiment, a relay stage DRST is placed in between measurement station 300 and exposure station 200, instead of center table 130 previously described. Further, in the second embodiment, corresponding to the point that center table 130 is not provided, the notch previously described is not formed in coarse movement slider section 91 of coarse movement stages WCS1' and WCS2'. Further, in the second embodiment, because delivery of the fine movement stage is not performed between coarse movement stages WCS1' WCS2' and center table 130, coarse movement stages WCS1' and WCS2' do not have to be separated into two sections. Therefore, coarse movement stages WCS1' and WCS2' employ an inseparable configuration. More specifically, coarse movement stages WCS1' and WCS2' are configured in a similar manner as in coarse movement stages WCS1 and WCS2 of the first embodiment previously described, except for the presence of the notch and whether or not the stages are separable.

In exposure apparatus 1000 of the second embodiment, a load stage 156 and an unload stage 154 are installed at unloading position ULP and loading position LP, instead of unload table 150 and load table 152. Load stage 156 and unload stage 154 are basically configured in a similar manner as in coarse movement stages WCS1' and WCS2', however, in the bottom plate section corresponding to coarse movement slider section 91, a plurality of permanent magnets 18 and air bearing 94 are not provided. In load stage 156, a temperature control device 153 (refer to FIG. 30) is provided.

Temperature control device 153 performs the temperature control of the fine movement stage (one of WFS1 to WFS3) mounted on load stage 156 and wafer W held by the fine movement stage.

Incidentally, instead of load stage 156 and unload stage 154, a member in which a pair of stator sections 93a and 93b is integrated in a positional relation similar to the one previously described can be used.

Relay stage DRST is configured similar to coarse movement stages WCS1' and WCS2' Further, in the second embodiment, although it is not shown, base board 12 is provided extending in an area between load stage 156 and unload stage 154, and relay stage DRST is driven along base board 12 by a drive system consisting of a planar motor so that the stage moves in between a position shown in FIG. 29 and a position between load stage 156 and unload stage 154. In the second embodiment, robot arm 140 is not provided.

Relay stage DRST can support (hold) fine movement stages WFS1, WFS2, or WFS3 in a non-contact manner as in coarse movement stages WCS1' and WCS2', and the fine movement stage supported by relay stage DRST can be driven in directions of six degrees of freedom (X, Y, Z, θx, θy, and θz) by fine movement stage drive system 52C (refer to FIG. 30) with respect to relay stage DRST. However, the fine movement stage should be slidable at least in the Y-axis direction with respect to relay stage DRST.

Similarly, load stage 156 and unload stage 154 previously described can also support (hold) fine movement stages WFS1, WFS2, or WFS3 in a non-contact manner, and the fine movement stage supported by load stage 156 and unload stage 154 can be driven at least in the Y-axis direction by fine movement stage drive systems 52D and 52E (refer to FIG. 30).

Positional information (also including rotation information in the θz direction) in the XY plane of relay stage DRST is measured by a position measurement system (not shown) including, for example, an interferometer and/or an encoder and the like. The measurement results of the position measurement system is supplied to main controller 20 (refer to FIG. 30) for position control of relay stage DRST.

Further, in exposure apparatus 1000, the control content of main controller 20 differs from the first embodiment to some extent, according to the difference described above. However, except for such differences, exposure apparatus 1000 is configured similar to exposure apparatus 100.

Next, a parallel processing operation which is performed using the three fine movement stages WFS1, WFS2, and WFS3 in exposure apparatus 1000 of the second embodiment will be described.

Figure 31:
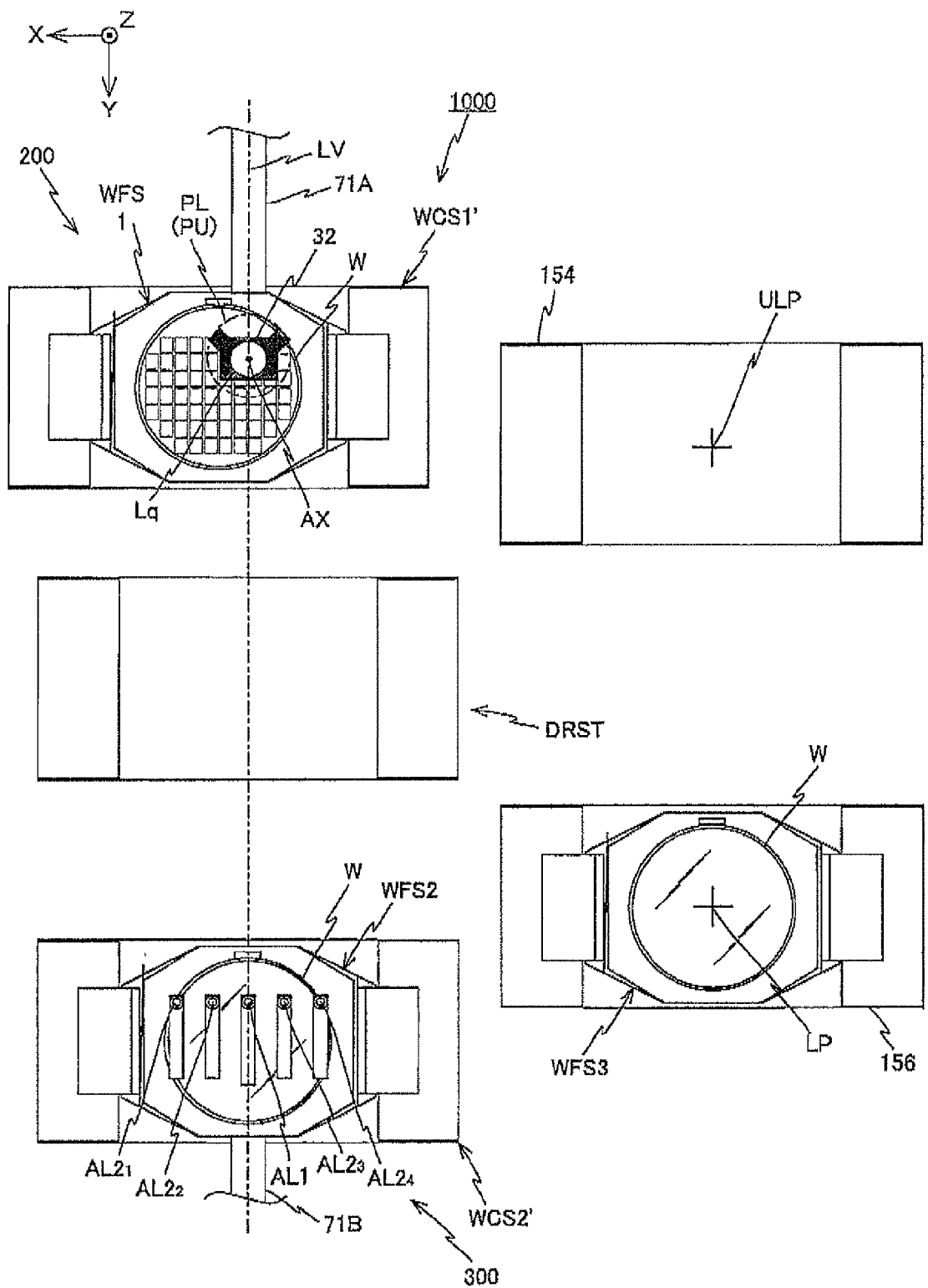
FIG. 31 is a view used to explain a parallel processing performed using three fine movement stages WFS1, WFS2, and WFS3 (No. 1) in the exposure apparatus of the second embodiment.

FIG. 31 shows a state where fine movement stage WFS1 is at exposure station 200 and the exposure previously described is being performed on wafer W held by fine movement stage WFS1, while fine movement stage WFS2 is at measurement station 300 and the alignment previously described is being performed on wafer W held by fine movement stage WFS2. At this point, fine movement stage WFS3 is waiting, while holding a new wafer W on load table 156. At this point, temperature control of fine movement stage WFS3 and of wafer W held by fine movement stage WFS3 is performed by temperature control device 153 previously described.

Then, wafer alignment to wafer W held by fine movement stage WFS2 is completed. FIG. 29 shows a state of when the wafer alignment has been completed. As it can be seen from FIG. 29, a state is shown where exposure to wafer W held by fine movement stage WFS1 in exposure station 200 is nearly completed.

Main controller 20 waits for the exposure to wafer W on fine movement stage WFS1 to be completed, in a state where wafer stage WST2 and relay stage DRST are waiting at a position shown in FIG. 29.

Figure 32:
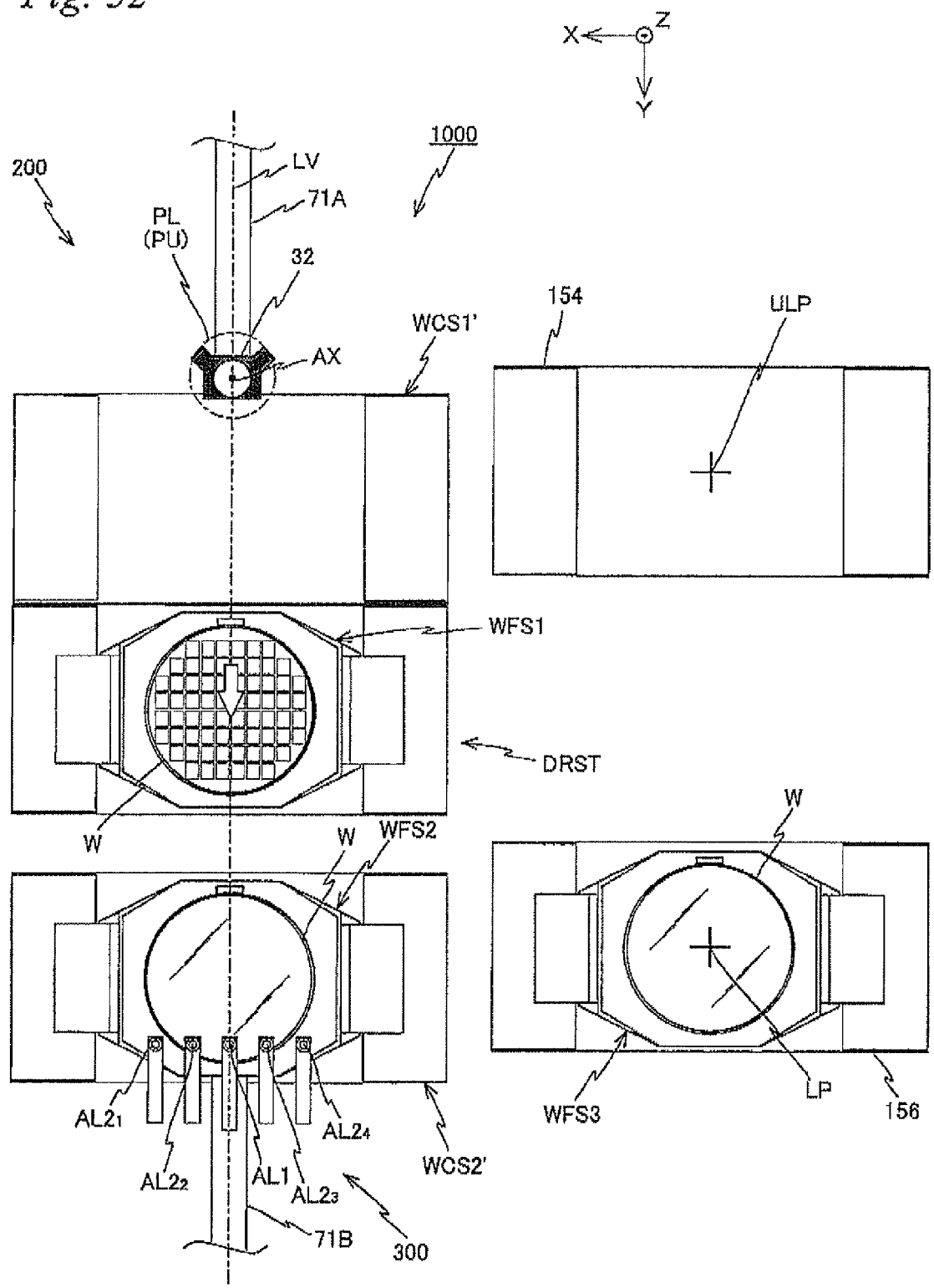
FIG. 32 is a view used to explain a parallel processing performed using the three fine movement stages WFS1, WFS2, and Tarn (No. 2) in the exposure apparatus of the second embodiment.

And, when exposure has been completed, main controller 20 performs the delivery of the liquid immersion space area from fine movement stage WFS1 to movable blade BL and drives coarse movement stage WCS1' holding fine movement stage WFS1 further in the +Y direction so that coarse movement stage WCS1' comes almost into contact with relay stage DRST waiting at the waiting position previously described, as well as control the current flowing in the YZ coils of fine movement stage drive systems 52B and 52C so as to drive fine movement stage WFS1 in the +Y direction by an electromagnetic force (a Lorentz force) as is shown in by the outlined arrow in FIG. 32, and moves and mounts to slide movement) fine movement stage WFS1 from coarse movement stage WCS1' to relay stage DRST.

Figure 33:
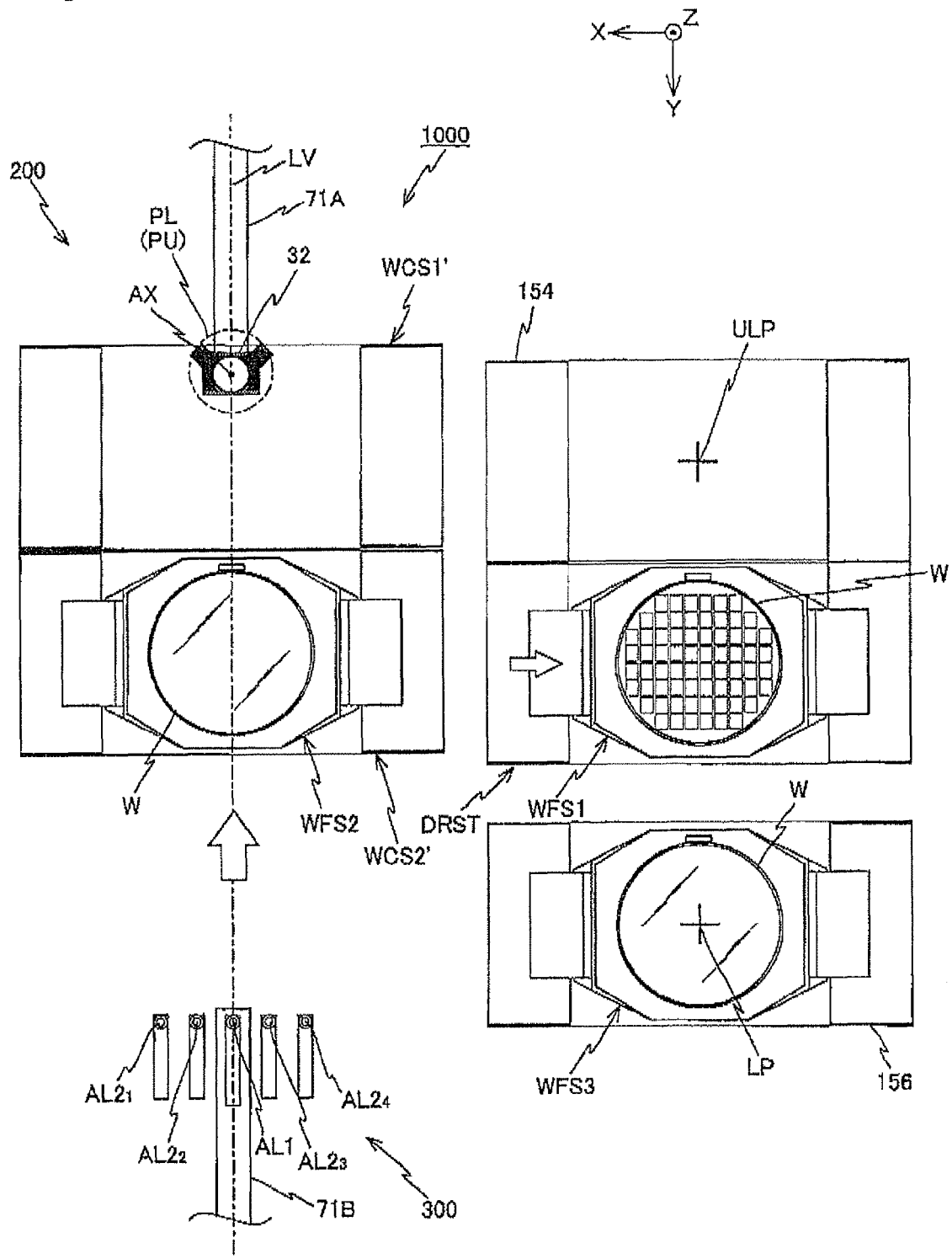
FIG. 33 is a view used to explain a parallel processing performed using the three fine movement stages WFS1, WFS2, and WFS3 (No. 3) in the exposure apparatus of the second embodiment.

Next, main controller 20 drives relay stage DST which supports fine movement stage WFS1 in the −X direction as is shown by the outlined arrow in FIG. 33 in a state where relay stage DST is almost in contact with unload stage 154. Further, immediately after this, main controller 20 drives coarse movement stage WCS2' supporting fine movement stage WFS2 in the −Y direction as is shown by the outlined arrow in FIG. 33, and makes coarse movement stage WCS2' come almost into contact with coarse movement stage WCS1'.

Figure 34:
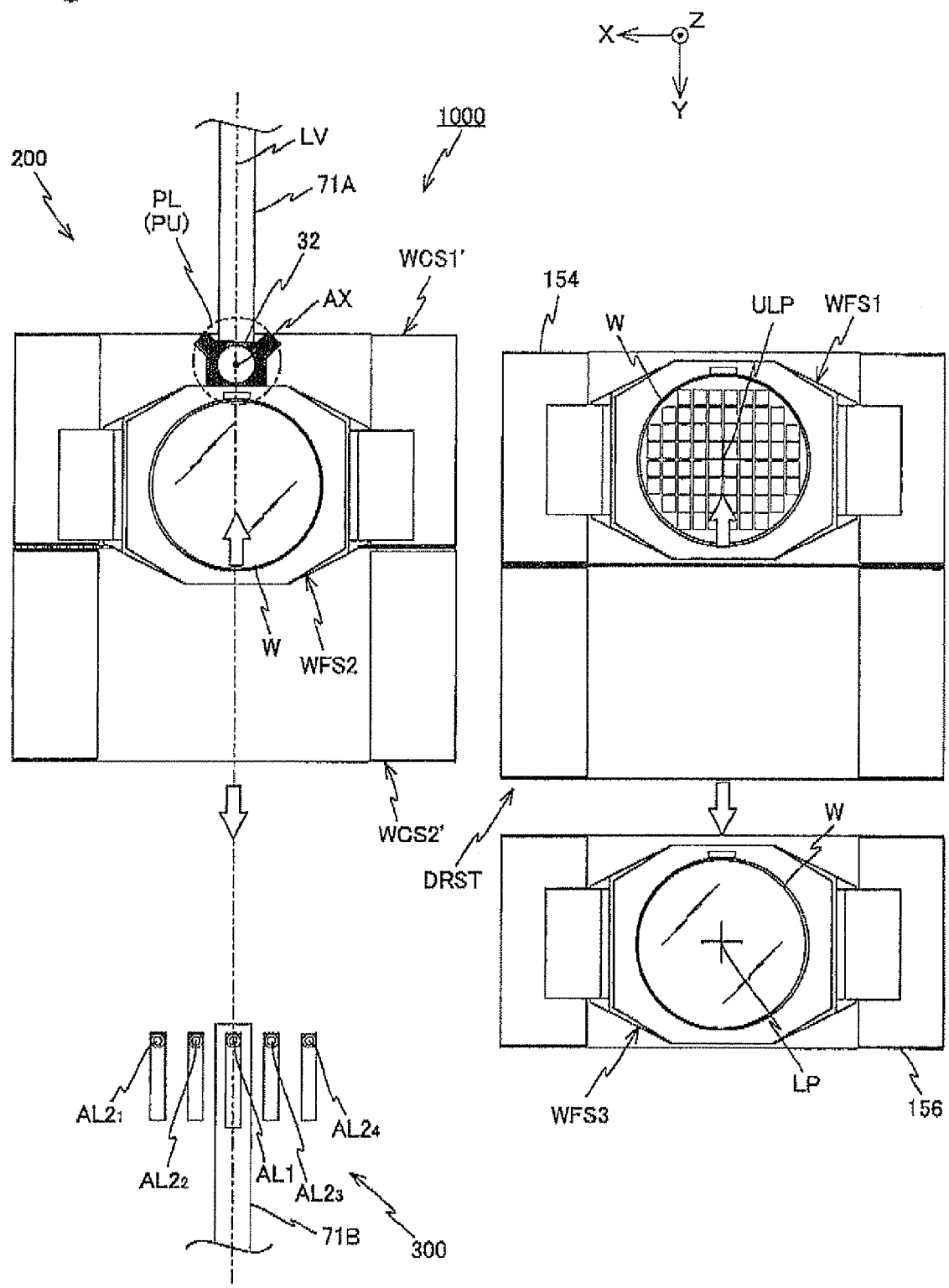
FIG. 34 is a view used to explain a parallel processing performed using the three fine movement stages WFS1, WFS2, and WFS3 (No. 4) in the exposure apparatus of the second embodiment.

Next, main controller 20 controls the current flowing in the YZ coils of fine movement stage drive systems 52A and 528 so that fine movement stage WFS2 is driven in the −Y direction by an electromagnetic force (a Lorentz force), as is shown by the outlined arrow in FIG. 34, and moves and mounts (a slide movement) fine movement stage WFS2 from coarse movement stage WCS2' onto coarse movement stage WCS1'. In parallel with this, main controller 20 controls the current flowing in the YZ coils of fine movement stage drive systems 52C and 52E so that fine movement stage WFS1 holding wafer W on which exposure has been performed is driven in the −Y direction by an electromagnetic force (a Lorentz force), as is shown by the outlined arrow in FIG. 34, and moves and mounts (a slide movement) fine movement stage WFS1 from relay stage DRST onto unload stage 154.

Figure 35:
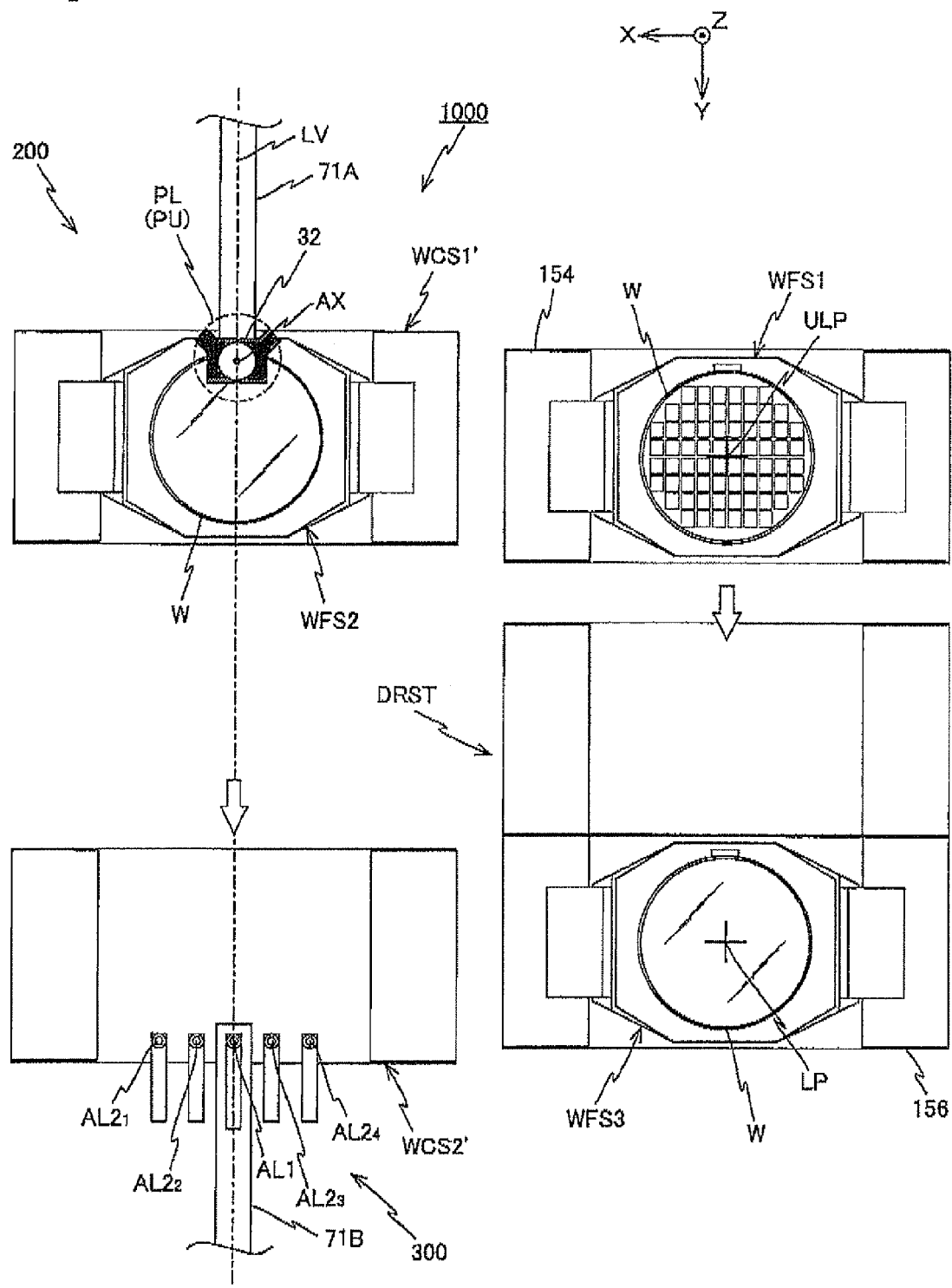
FIG. 35 is a view used to explain a parallel processing performed using the three fine movement stages WFS1, WFS2, and WFS3 (No. 5) in the exposure apparatus of the second embodiment.

Following the moving and mounting of fine movement stage WFS2 from coarse movement stage WCS2' to coarse movement stage WCS1', main controller 20 moves coarse movement stage WCS1' supporting fine movement stage WFS2 in the −Y direction, and delivers the liquid immersion space area held with tip lens 191 from movable blade BL to fine movement stage WFS2. The delivery of this liquid immersion space area (liquid Lq) is performed by reversing the procedure of the delivery of the liquid immersion space area from fine movement stage WFS1 to movable blade SL previously described. FIG. 35 shows a state immediately after this delivery of the liquid immersion area.

Then, as is shown by the outlined arrow in FIG. 35, main controller 20 drives relay stage DRST in the +Y direction and makes relay stage DRST face load stage 156, almost in a contact state. In parallel with this, main controller 20 drives coarse movement stage WCS2' in the +Y direction as is shown by the outlined arrow in FIG. 35, and moves coarse movement stage WCS2' to measurement station 300. At this point, fine movement stage WFS3 is still waiting, while holding a new wafer W on load table 156 (refer to FIG. 35).

Then, prior to the beginning of exposure, main controller 20 positions fine movement stage WFS2 at the position shown in FIG. 35, and then performs reticle alignment in a procedure (a procedure disclosed in, for example, U.S. Pat. No. 5,646, 413 and the like) similar to a normal scanning stepper, using the pair of reticle alignment systems RA$_1$ and RA$_2$ previously described, and the pair of first fiducial marks on measurement plate 86 of fine movement stage WFS2 and the like. Then, main controller 20 performs exposure operation by the step-and-scan method, based on results of the reticle alignment and the results of the wafer alignment (array coordinates which uses the second fiducial marks of each of the shot areas on wafer W), and transfers the pattern of reticle R on each of the plurality of shot areas on wafer W. In this exposure, fine movement stage WFS2 is returned to the −Y side once after the reticle alignment, and then exposure is performed in the order from shot areas on the +Y side on wafer W to the shot areas on the −Y side.

Figure 36:
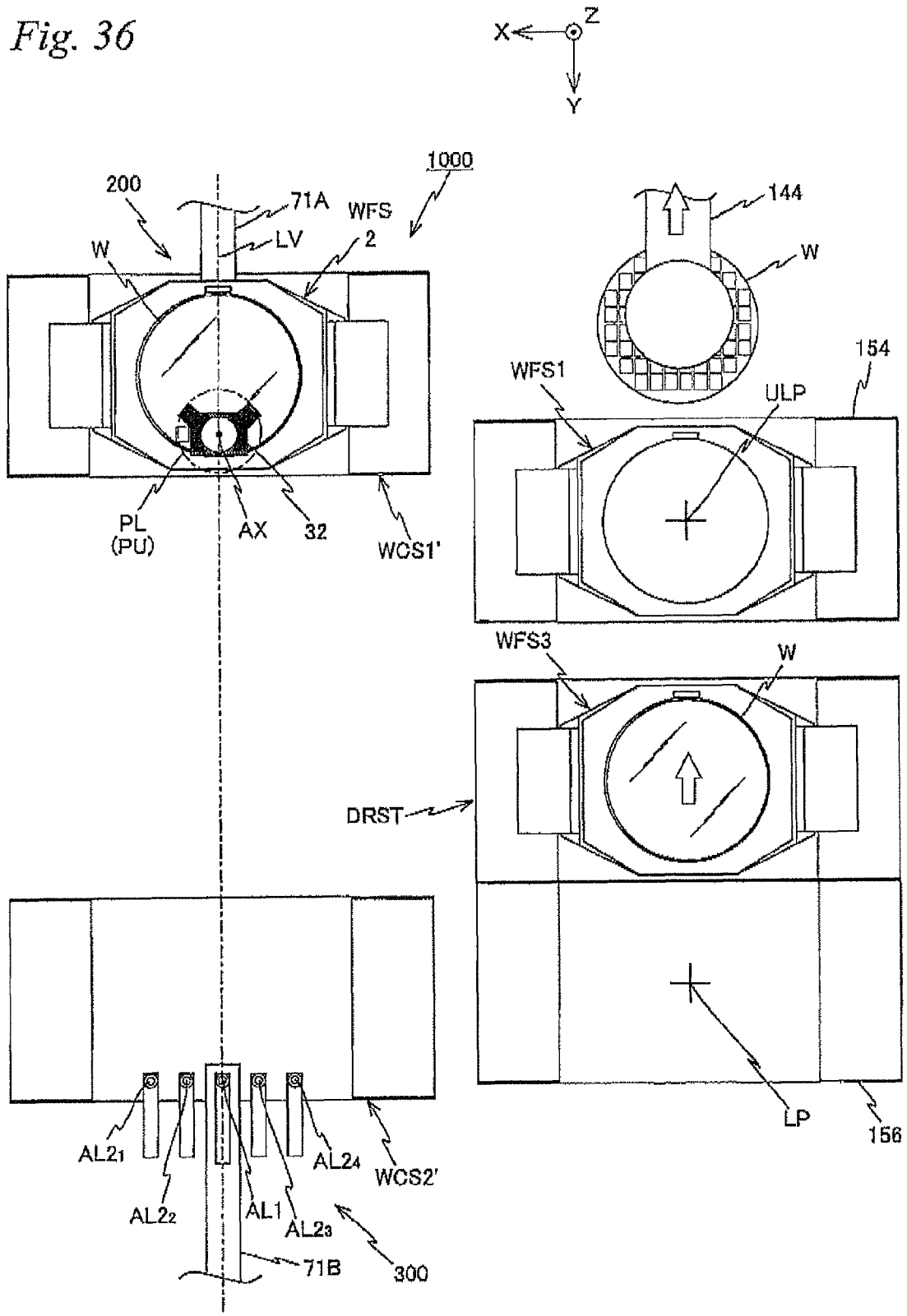
FIG. 36 is a view used to explain a parallel processing performed using the three fine movement stages WFS1, WFS2, and WFS3 (No. 6) in the exposure apparatus of the second embodiment.
Figure 37:
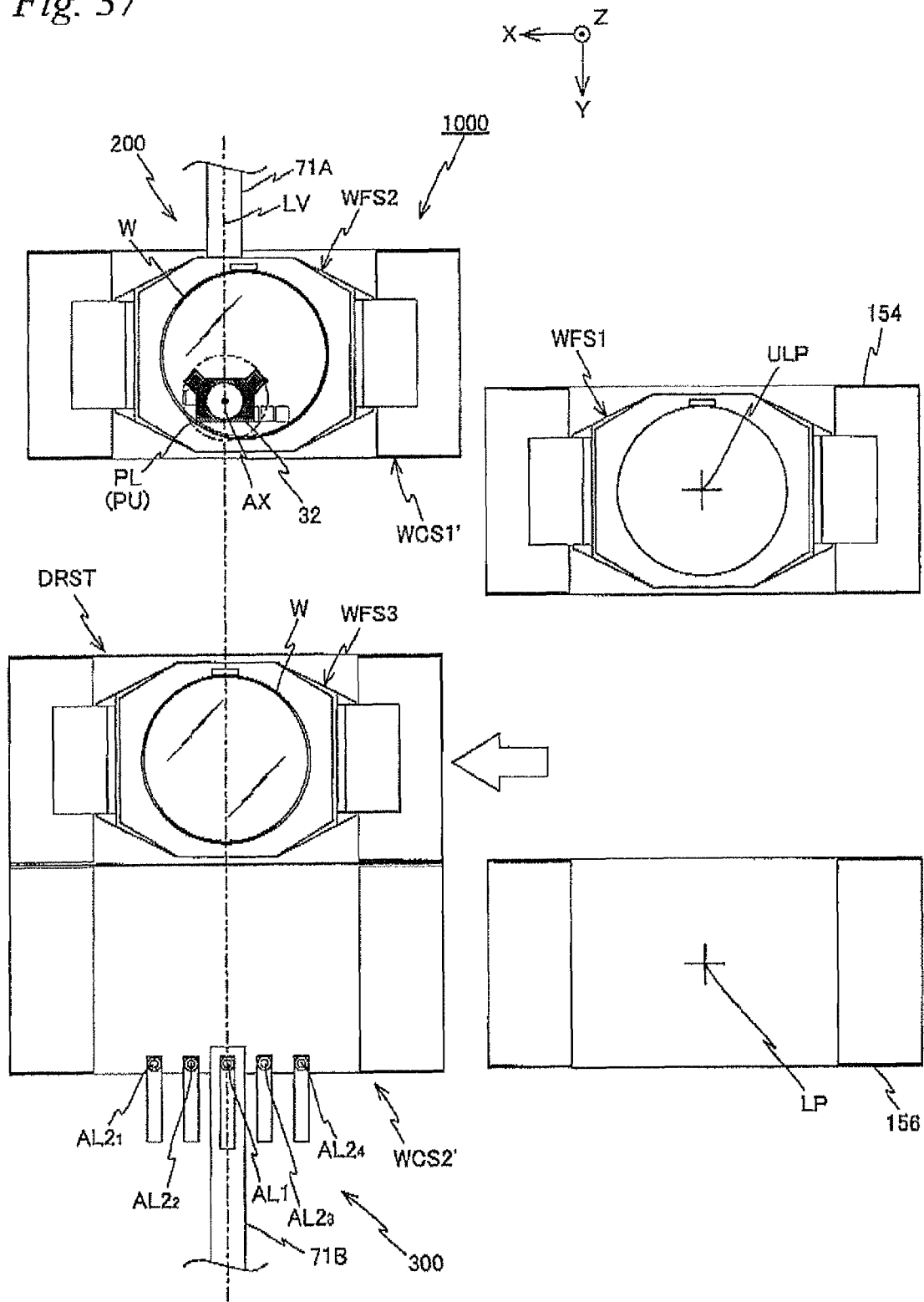
FIG. 37 is a view used to explain a parallel processing performed using the three fine movement stages WFS1, WFS2, and WFS3 (No. 7) in the exposure apparatus of the second embodiment.
Figure 38:
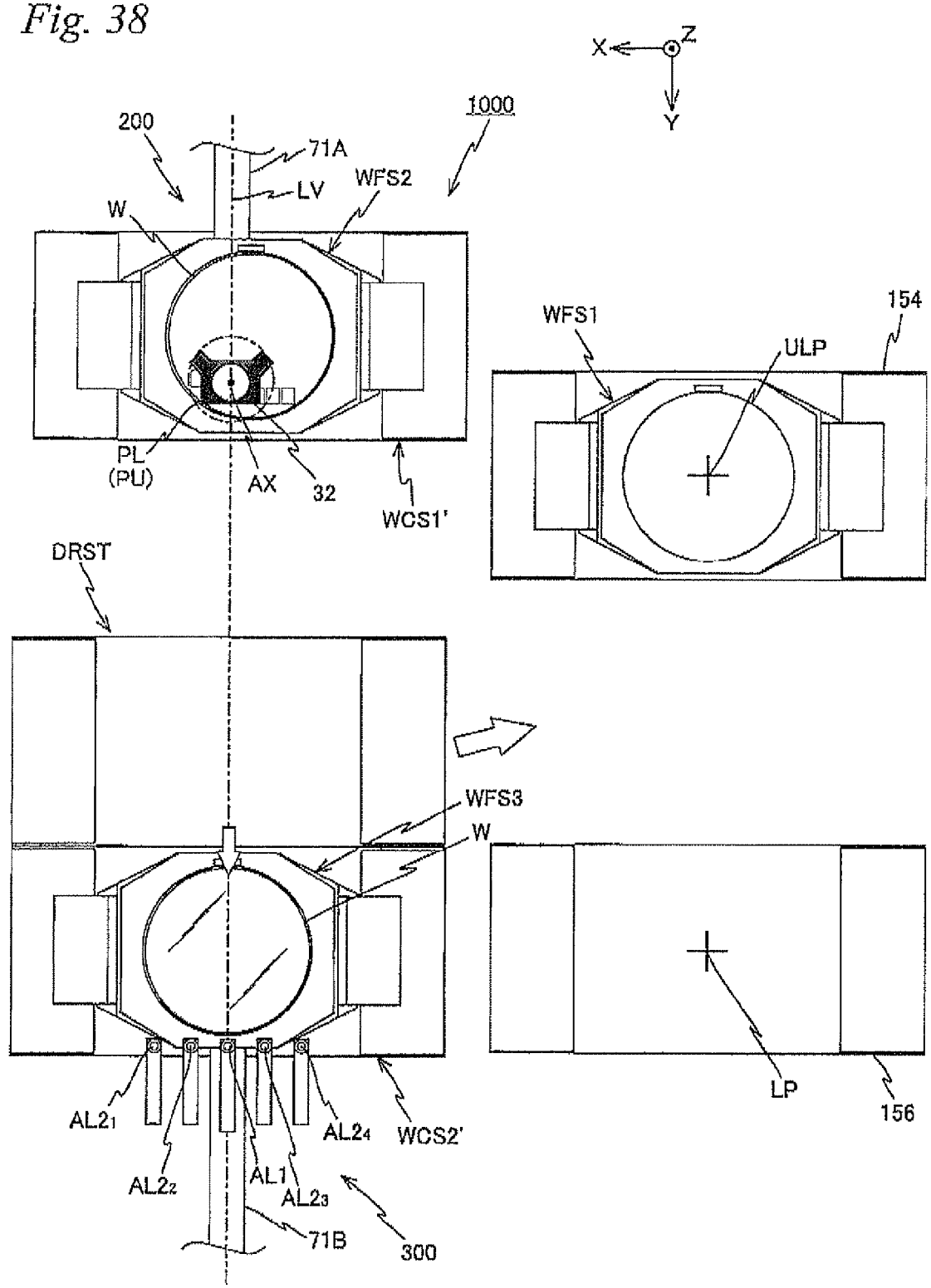
FIG. 38 is a view used to explain a parallel processing performed using the three fine movement stages WFS1, WFS2, and WFS3 (No. 8) in the exposure apparatus of the second embodiment.
Figure 39:
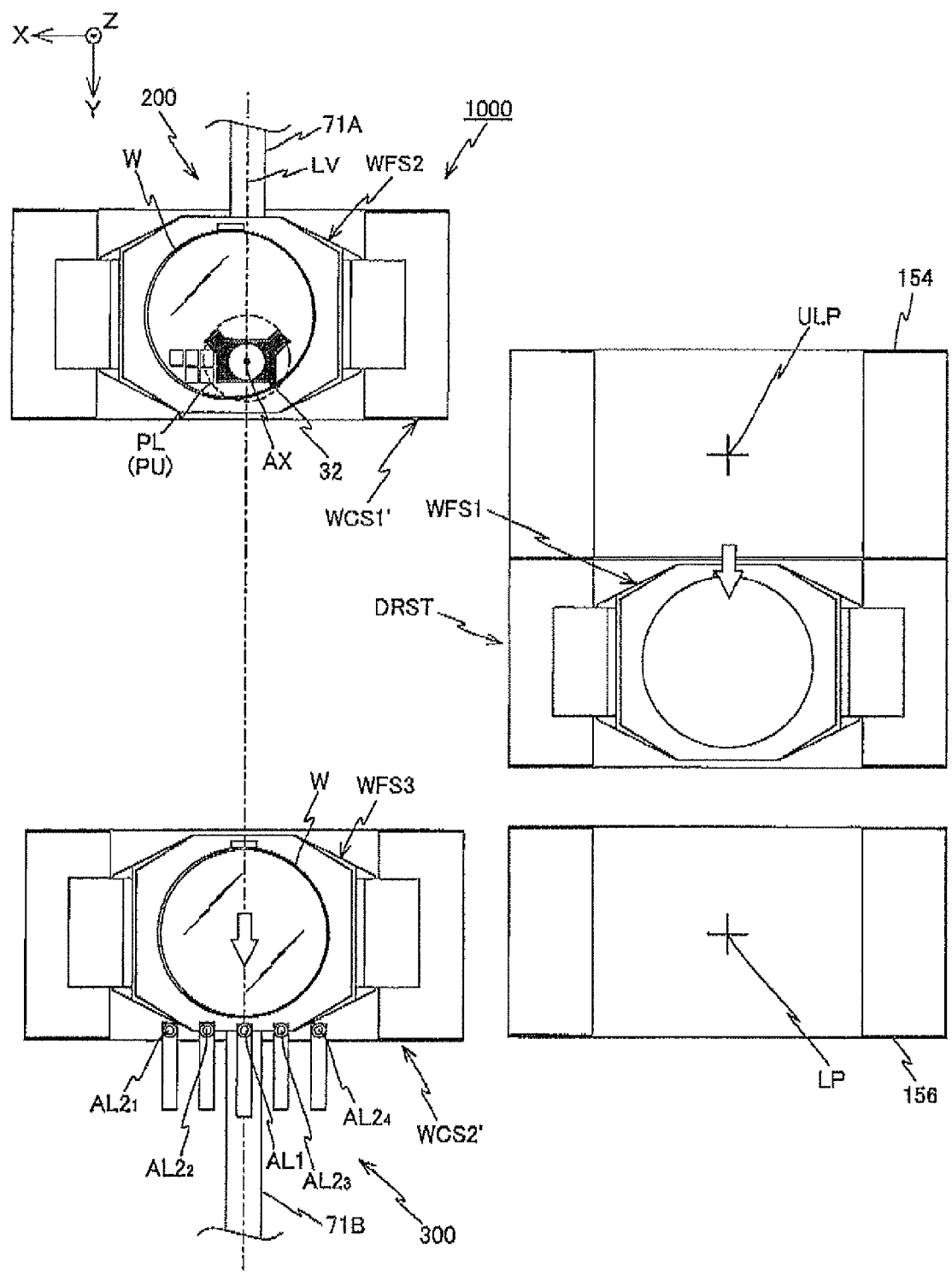
FIG. 39 is a view used to explain a parallel processing performed using the three fine movement stages WFS1, WFS2, and WFS3 (No. 9) in the exposure apparatus of the second embodiment.
Figure 40:
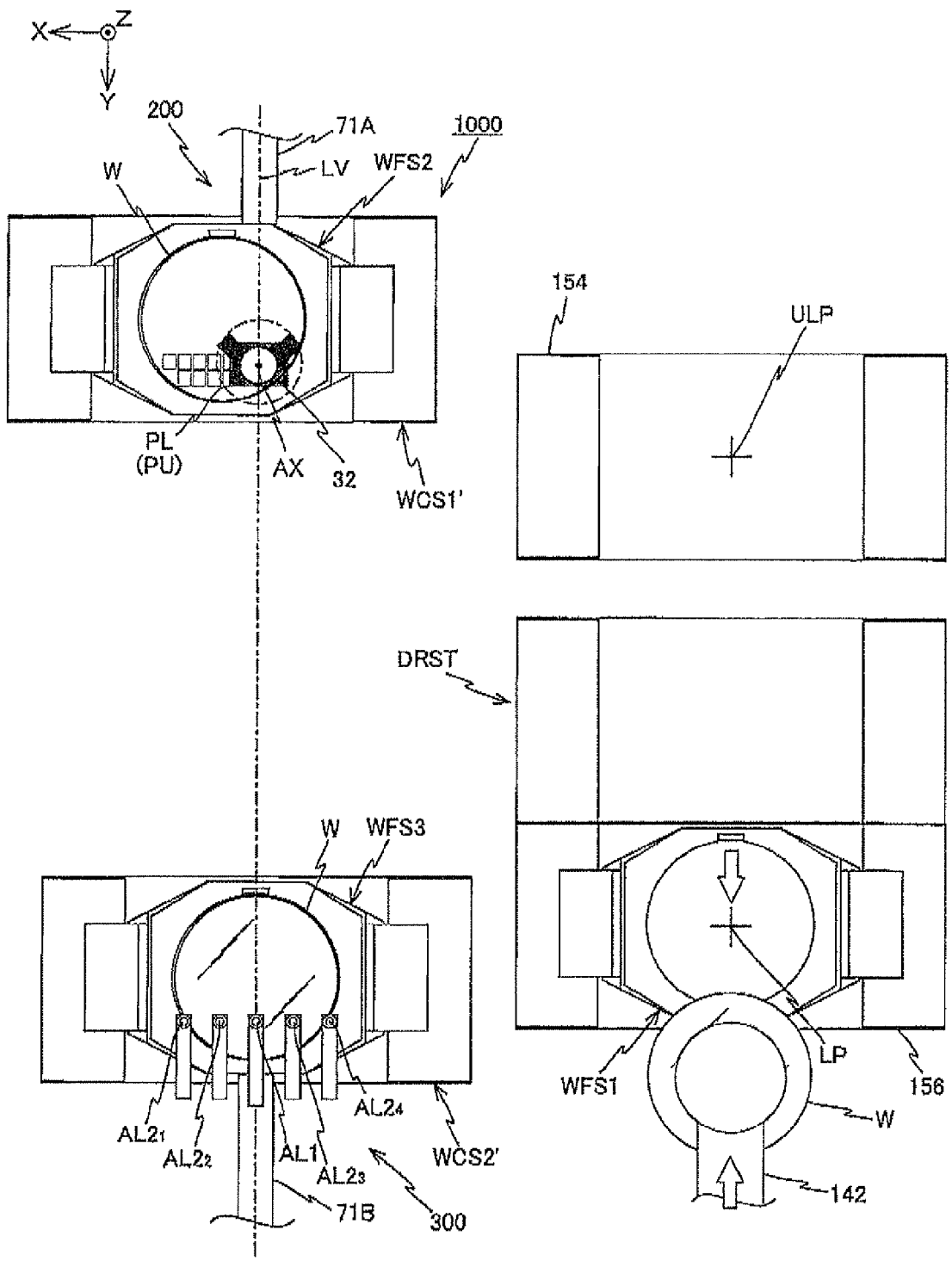
FIG. 40 is a view used to explain a parallel processing performed using the three fine movement stages WFS1, WFS2, and WFS3 (No. 10) in the exposure apparatus of the second embodiment.

Concurrently with the reticle alignment and exposure described above, operations such as h. to m. described below are performed.

h. That is, based on instructions from main controller 20, wafer W which has undergone exposure is unloaded from fine movement stage WFS1 on unload stage 154 by unload arm 144 in the procedure previously described. FIG. 36 shows a state where unload arm 144 moves away from unload stage 154.

i. In parallel with unloading wafer W which has been exposed described above, main controller 20 moves and mounts fine movement stage WFS3 holding the new wafer W from load stage 156 onto relay stage DRST, as is shown in FIG. 36. Then, main controller 20 drives relay stage DRST supporting fine movement stage WFS3 in the +X direction, as is shown by the outlined arrow in FIG. 37. This allows relay stage DRST to face coarse movement stage WCS2' in a state almost in contact, as is shown in FIG. 37. At this point in time, on fine movement stage WFS2, the exposure of wafer W is being continued.

j. Fine movement stage WFS3 holding a new wafer W is then driven and slid in the +Y direction by main controller 20, as is shown by the outlined arrow in FIG. 38, and than is moved and mounted from relay stage DRST to coarse movement stage WCS2'. Then, main controller 20 drives relay stage DRST in the direction of unload stage 154, as is shown by the outlined arrow in FIG. 38. This allows relay stage DRST to face unload stage 154 in a state almost in contact, as is shown in FIG. 39.

k. Thereafter, detection of the second fiducial marks on fine movement stage WFS3 supported by coarse movement stage WCS2', alignment of wafer W on fine movement stage WFS3 and the like are performed in procedures similar to the ones previously described. Then, by main controller 20, array coordinates of each shot area on wafer W acquired from the wafer alignment are converted into array coordinates which are based on the second fiducial marks. In this case as well, position measurement of fine movement stage WFS3 on alignment is performed, using fine movement stage position measurement system 70B.

l. In parallel with operations such as the detection of the second fiducial marks on fine movement stage WFS3, alignment of wafer W on fine movement stage WFS3 and the like described above, main controller 20 moves and mounts fine movement stage WFS1 from unload stage 154 onto relay stage DRST as is shown in FIG. 39, and then from relay stage DRST to load stage 156, as is shown in FIG. 40.

m. Following this operation, a new (not yet exposed) wafer W is loaded onto fine movement stage WFS1 in the procedure previously described by main controller 20. At this point in time, exposure to wafer W held by fine movement stage WFS2 is being continued, as well as the alignment of wafer W held by fine movement stage WFS3.

After wafer W has been loaded on fine movement stage WFS1, a state similar to the case in FIG. 31 occurs, or more specifically, a state occurs in which the exposure described above is performed on wafer W held by fine movement stage WFS2 at exposure station 200, alignment is being performed on wafer W held by fine movement stage WFS3 which is at measurement station 300, and fine movement stage WFS1 is waiting while holding a new wafer W on load stage 156.

Hereinafter, a parallel processing as is previously described is repeatedly performed by main controller 20, sequentially using fine movement stages WFS1, WFS2, and WFS3, and an exposure processing to a plurality of wafer Ws is continuously performed.

As is described so far, according to exposure apparatus 1000 of the second embodiment, an equivalent effect can be obtained as in the first embodiment previously described. In this case, the delivery (moving and mounting) of the fine movement stage between coarse movement stage WCS1", coarse movement stage WCS2', and carrier stage CST can be performed only by a slide movement of the fine movement stage in the Y-axis direction. Therefore, according to exposure apparatus 1000, the moving and mounting operation of the fine movement stage between the three stages described above is performed within a short time, which allows the next operation to be started swiftly, which as a consequence, allows the throughput to be improved.

Incidentally, in the second embodiment, the fine movement stage holding wafer W which has undergone exposure is delivered to unload stage 154 by relay stage DRST which operates under the control of main controller 20, and another fine movement stage holding a new wafer W is received by relay stage DRST from load stage 156. Accordingly, when focusing attention on the in and out of the fine movement stage with respect to relay stage DRST, it can also be said that wafer W is exchanged integrally with the fine movement stage.

Incidentally, in the second embodiment described above, the fine movement stage (WFS1) holding wafer W which has been exposed was moved and mounted (a slide movement along the Y-axis) from coarse movement stage WCS1' to relay stage DRST, and then relay stage DRST supporting fine movement stage WFS1 was carried to unload stage 154 which is the wafer exchange position by being driven (drawn out sideways) in the −X direction, and wafer exchange was performed. However, as well as this, relay stage DRST which holds fine movement stage holding wafer W which is finished with exposure can be made to wait at a position deviating from the movement path of coarse movement stage WCS2' from measurement station 300 to exposure station 200, and the other fine movement stage holding wafer W which has been aligned is moved and mounted (a slide movement along the Y-axis) from coarse movement stage WCS2' to coarse movement stage WCS1'. And then, when coarse movement stage WCS1' and coarse movement stage WCS2' are separated in the Y-axis direction, relay stage DRST which is made to wait can be moved (slid sideways) in the +X direction and can be made to be in contact or in proximity with coarse movement stage WCS2', and the fine movement stage held by relay stage DRST can be delivered to coarse movement stage WCS2' In this case, the wafer exchange position is set within measurement station 300.

Further, in the second embodiment described above, instead of relay stage DSRT, a carriage stage which will be described below can be used.

Further, also in the second embodiment, in the case relay stage DRST and coarse movement stage WCS1' (or WCS2') are made to be in proximity to replace fine movement stages WFS1, WFS2, and WFS3 between the two coarse movement stages WCS1' and WCS2', relay stage DRST and coarse movement stage WCS1' (or WCS2') do not have to be extremely close, as in the first embodiment. Relay stage DRST and coarse movement stage WCS1' (or WCS2') can be distanced within a range where the fine movement stage is not tilted greatly (that is, the stator and the mover of the linear motor do not come into contact) at the time of movement of the fine movement stage between relay stage DRST and coarse movement stage WCS1' (or WCS2').

A Third Embodiment

A third embodiment of the present invention will be described below, with reference to FIGS. 41 to 58. Here, the same or similar reference numerals will be used for the same or similar sections as in the first and second embodiments previously described, and a detailed description thereabout will be omitted (or simplified).

Figure 41:
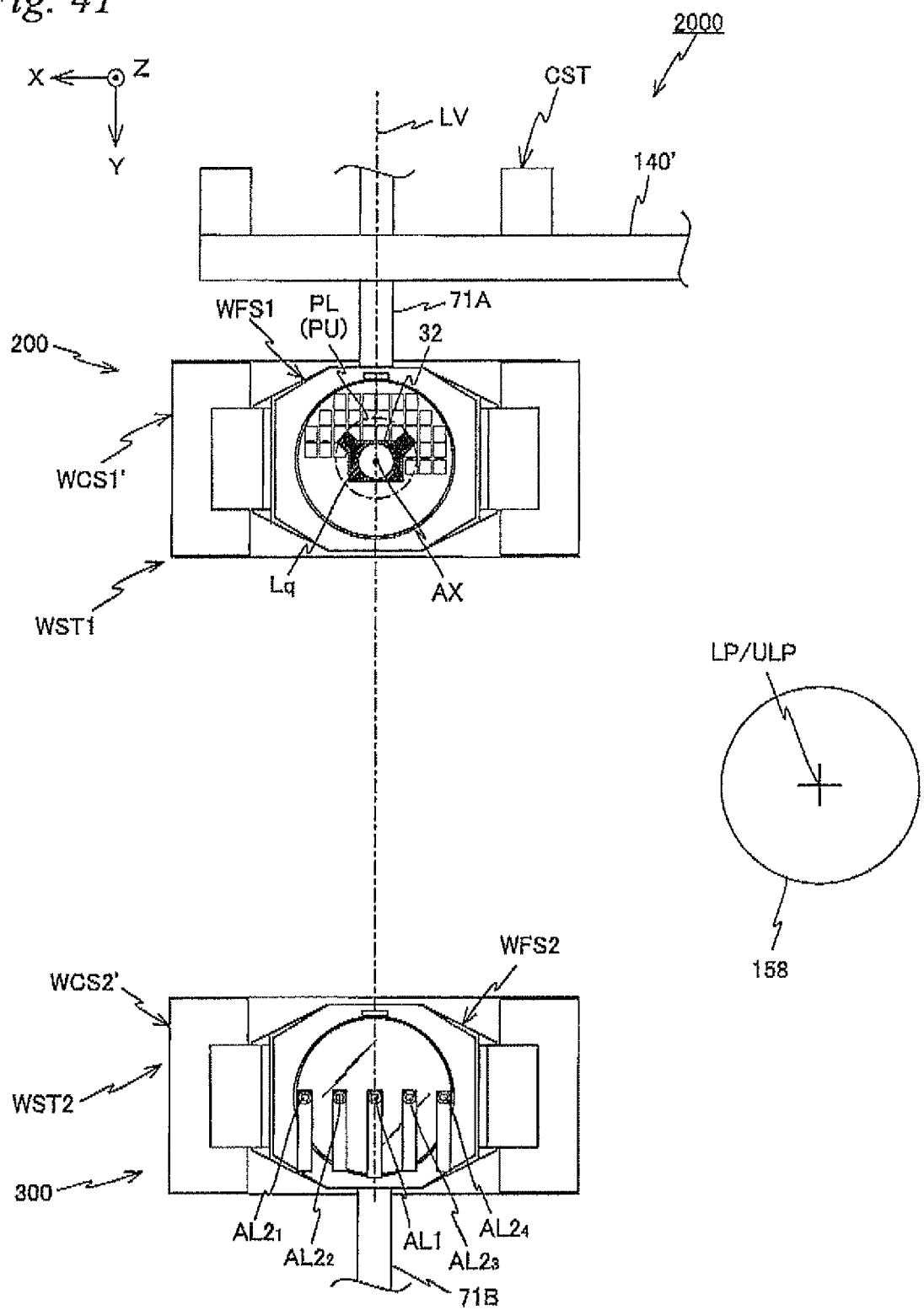
FIG. 41 is a planar view showing a schematic configuration of an exposure apparatus of a third embodiment.
Figure 42:
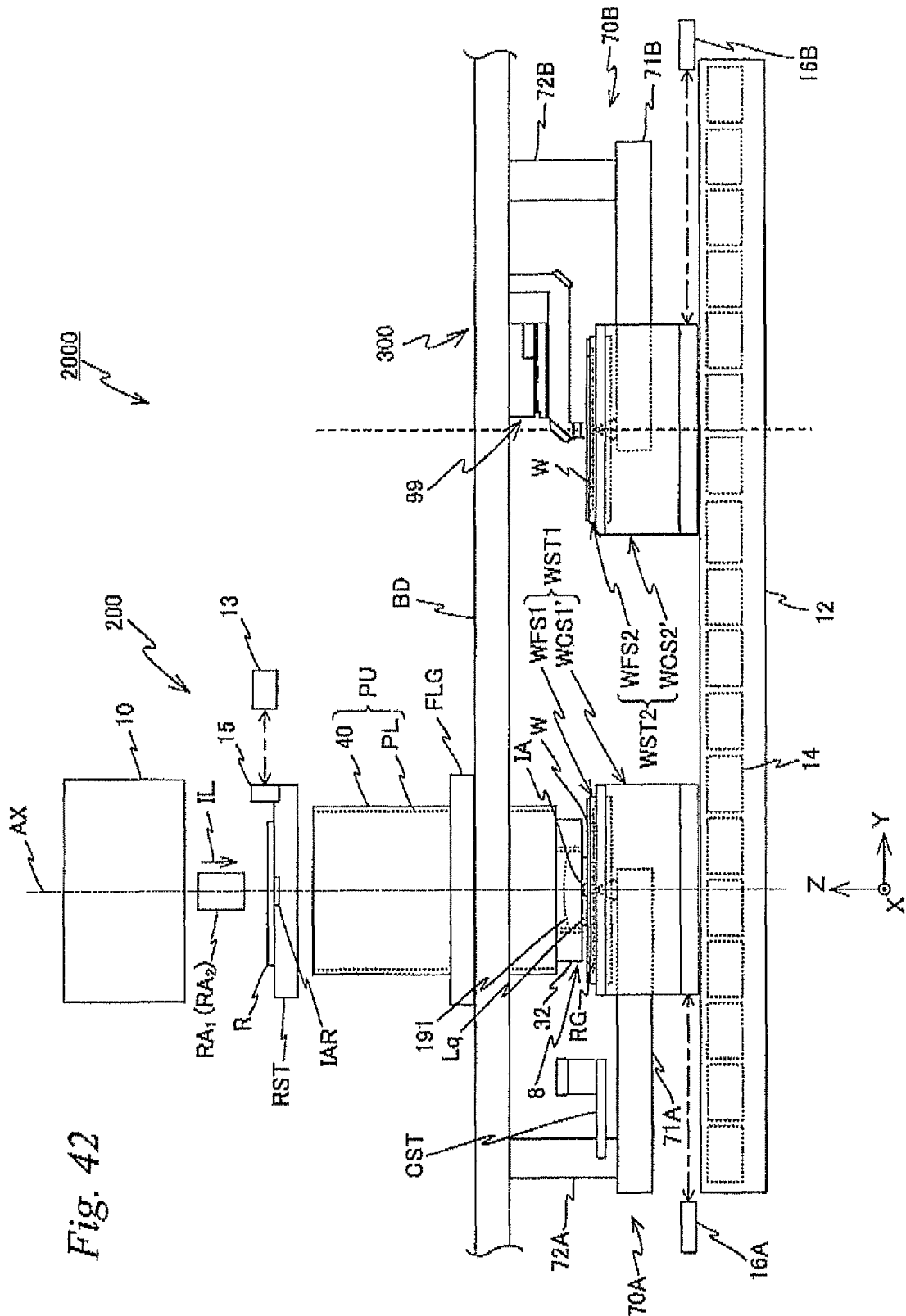
FIG. 42 is a view schematically showing a configuration of an exposure station, a measurement station and the like of the exposure apparatus in FIG. 41.

FIG. 41 shows a schematic configuration of an exposure apparatus 2000 in the third embodiment in a planar view. FIG. 42 schematically shows a configuration of exposure station 200, measurement station 300 and the like of exposure apparatus 2000. Exposure apparatus 2000 is a projection exposure apparatus by the step-and-scan method, or a so-called scanner. In this embodiment, the description will be made by determining the X-axis, the Y-axis, and the Z-axis directions, and the ex, the θy and the θz directions in the same manner as in the first and second embodiments.

Exposure apparatus 2000 of the third embodiment is equipped with a carrier stage CST instead of center table 130, robot arm 140 and the like, as it can be seen when comparing FIG. 41 and FIG. 1. In correspondence with this, coarse movement stages WCS1' and WCS2' in the third embodiment are configured similar to coarse movement stages WCS1' and WCS2' in the second embodiment. Further, in the third embodiment, two fine movement stages WFS1 and WFS2 are used.

As shown in FIGS. 41 and 42, carrier stage CST is installed at the tip of a robot arm 140'. Robot arm 140' is movable at least in the XY plane. Carrier stage CST reciprocally moves according to the movement of robot arm 140', between a position shown in FIG. 42, or more specifically, between a position in the vicinity on the −Y side of exposure station 200, a wafer exchange position indicated by reference code LP/ULP, and a position on the −Y side of measurement station 300 (refer to the broken line arrow in FIG. 57). Robot arm 140' is controlled by main controller 20 (refer to FIG. 44) similar to robot arm 140 previously described.

Figure 43A:
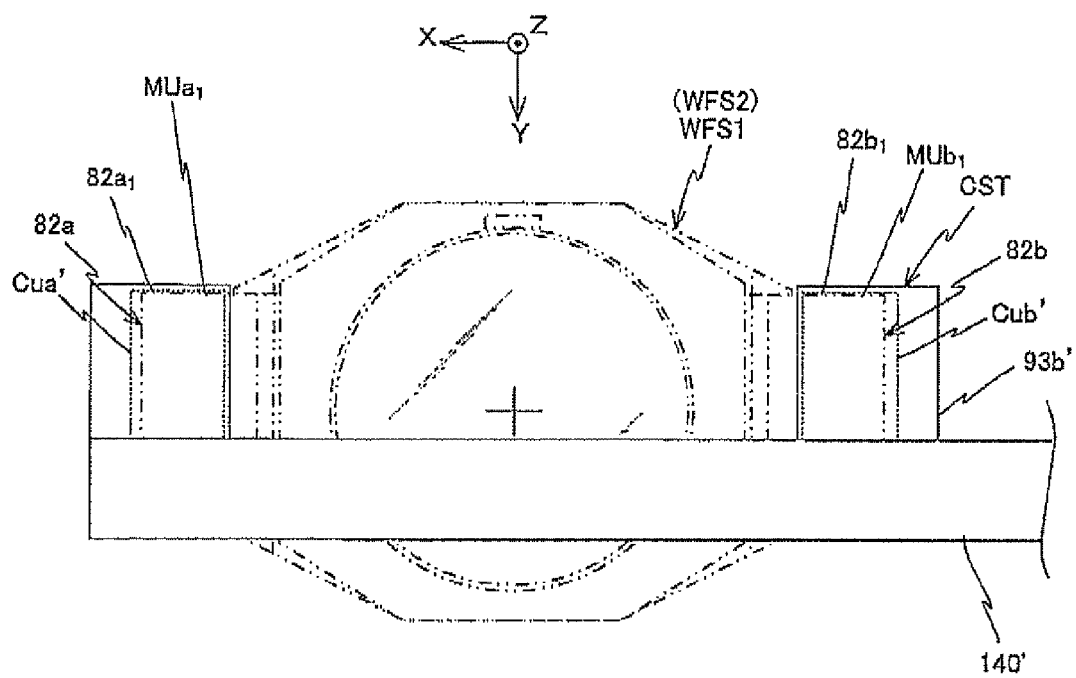
FIG. 43A is a planar view showing a carrier stage, along with a fine movement stage indicated by a double-dotted chain line.
Figure 43B:
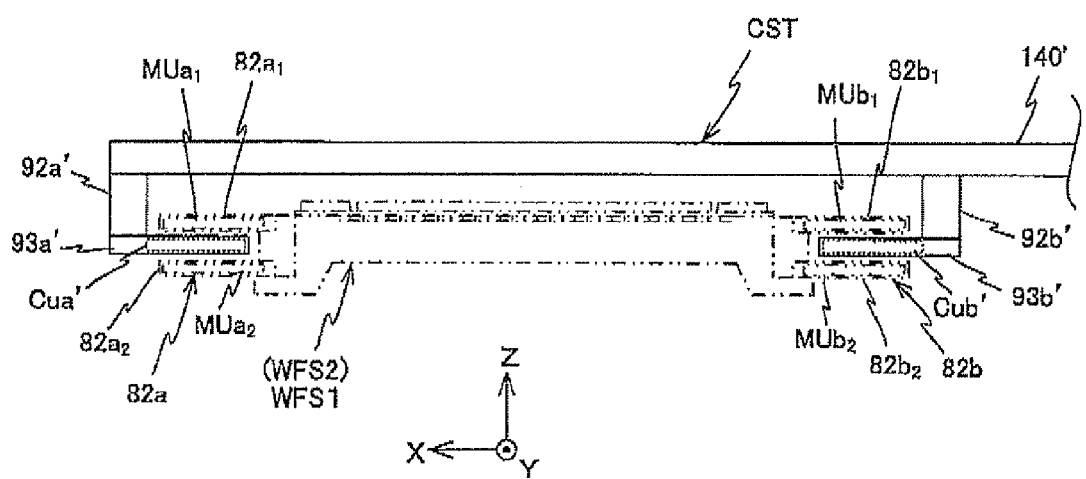
FIG. 43B is a side view showing the carrier stage when viewed from the +Y direction, along with the fine movement stage indicated by a double-dotted chain line.

A configuration of carrier stage CST will now be described. FIG. 43A shows a planar view of carrier stage CST, and FIG. 43B shows a side view of carrier stage CST when viewed from the +Y direction. In FIGS. 43A and 43B, fine movement stage WFS1 (WFS2) are illustrated together, by a phantom line (double-dotted chain line).

As it can be seen from FIGS. 43A and 43B, carrier stage CST is equipped with a pair of support members $92a'$ and $92b'$ made of rectangular plate members which are fixed apart in the X-axis direction by a distance the same as the pair of side wall sections $92a$ and $92b$ on the lower surface at the tip of robot arm 140', and a pair of stator sections $93a'$ and $93b'$ fixed to the lower surface of $92a'$ and $92b'$, respectively. As shown in FIG. 43B, the tip of robot arm 140' also serves as a joint of the pair of support members $92a'$ and $92b'$. Thus, in the description below, the configuration of carrier stage CST will be described including these joints $92a'$ and $92b'$ Each of the pair of stator sections $93a'$ and $93b'$ is configured somewhat shorter than or similar to stator sections $93a$ and $93b$ previously described. In other words, each of the stator sections $93a'$ and $93b'$ are made of a member with a tabular outer shape, and in the inside, coil units CUa' and CUb' are housed.

Now, because carrier stage CST has a configuration as is described above, as it can also be seen from FIG. 43B, carrier stage CST can support fine movement stage WFS1 (or WFS2) by moving (sliding) fine movement stage WFS1 (or WFS2) in the Y-axis direction, after a position of carrier stage CST is set with respect to fine movement stage WFS1 (or WFS2) so that stator sections $93a'$ and $93b'$ are located between plate-like members $82a_1$ and $82a_2$, and $82b_1$ and $82b_2$ of fine movement stage WFS1 (or WFS2), respectively. In this embodiment, carrier stage CST is usually maintained to a height where the position setting of carrier stage CST with respect to fine movement stage WFS1 (or WFS2) described above can be performed.

Coil unit CUa' which stator section 93*a*' has and the pair of magnet units MUa$_1$ and MUa$_2$ which mover section 82*a* has constitute a linear motor which drives mover section 82*a* at least in the Y-axis direction, and coil unit CUb' which stator section 93B' has and the pair of magnet units MUb$_1$ and MUb$_2$ which mover section 82*b* has constitute a linear motor which drives mover section 82*b* at least in the Y-axis direction. And, the two (the pair of) linear motors constitute fine movement stage drive system 52C' (refer to FIG. 44), which drives and slides fine movement stage WFS1 (or WFS2) at least in the Y-axis direction with respect to carrier stage CST.

At wafer exchange position LP/ULP, a table 158 which is vertically movable is installed as shown in FIG. 41. Table 158 is controlled by main controller 20 (refer to FIG. 44). Roles and the like of table 158 will be described, later on.

Figure 44:
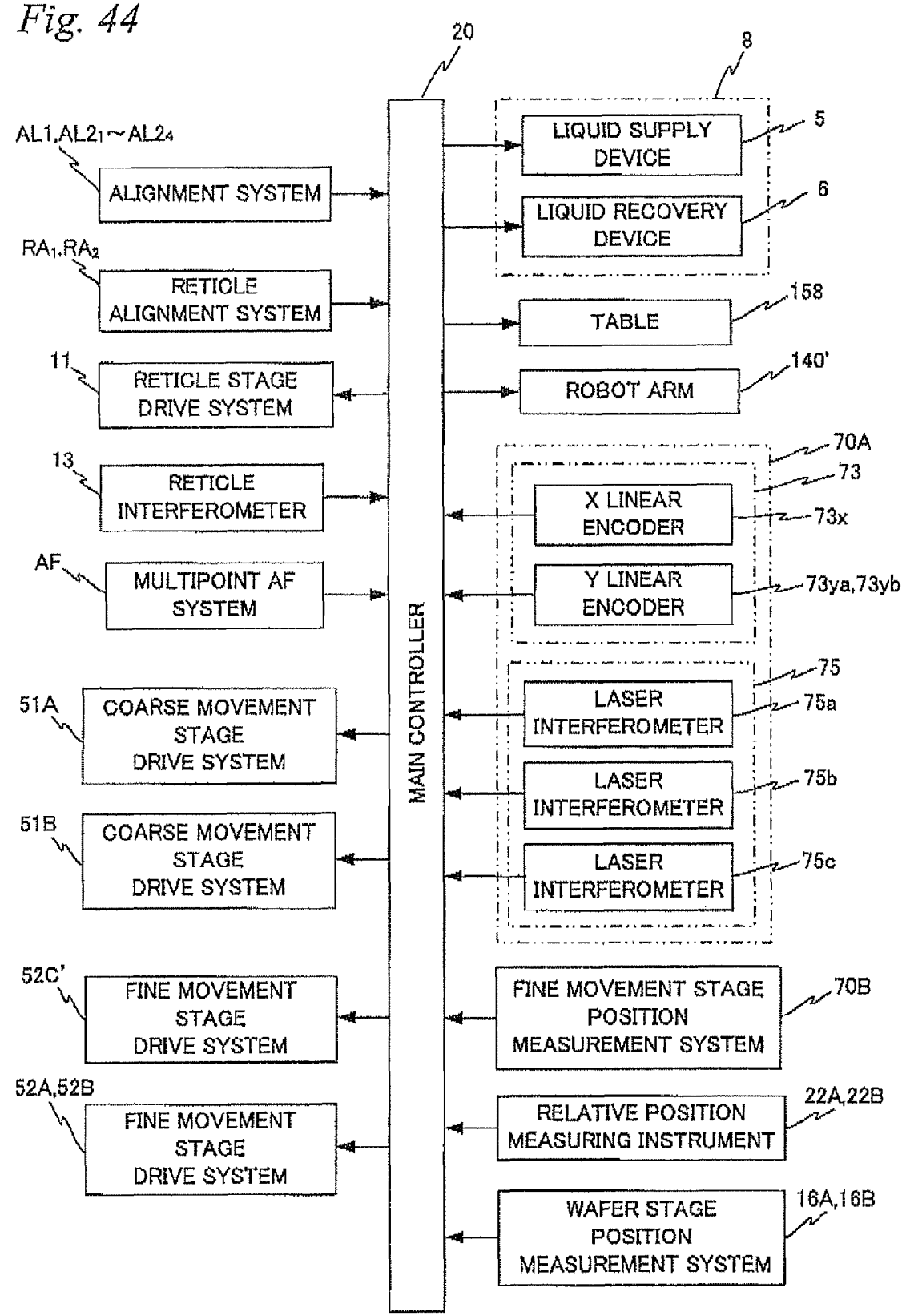
FIG. 44 is a block diagram showing a configuration of a control system of the exposure apparatus in FIG. 41.

FIG. 44 shows the main configuration of the control system of exposure apparatus 2000. The control system is mainly configured of main controller 20. Main controller 20 includes a workstation (or a microcomputer) and the like, and has overall control over each part of exposure apparatus 2000, such as local liquid immersion device 8, coarse movement stage drive systems 51A and 51B, and fine movement stage drive systems 52A, 52B, 52C' and the like.

Hereinafter, a parallel processing operation which is performed using two fine movement stages WFS1 and WFS2 in exposure apparatus 2000 of the third embodiment will be described.

FIG. 41 shows a state where fine movement stage WFS1 is at exposure station 200 and the exposure described above is performed on wafer W held by fine movement stage WFS1, while fine movement stage WFS2 is at measurement station 300 and alignment is being performed on wafer W held by fine movement stage WFS2. At this point, carrier stage CST is waiting at a waiting position in the vicinity of (above measurement arm 71A) support member 72A.

Alignment to wafer W held by fine movement stage WFS2 is performed in the manner similar to the first and second embodiments described above by main controller 20.

Figure 45A:
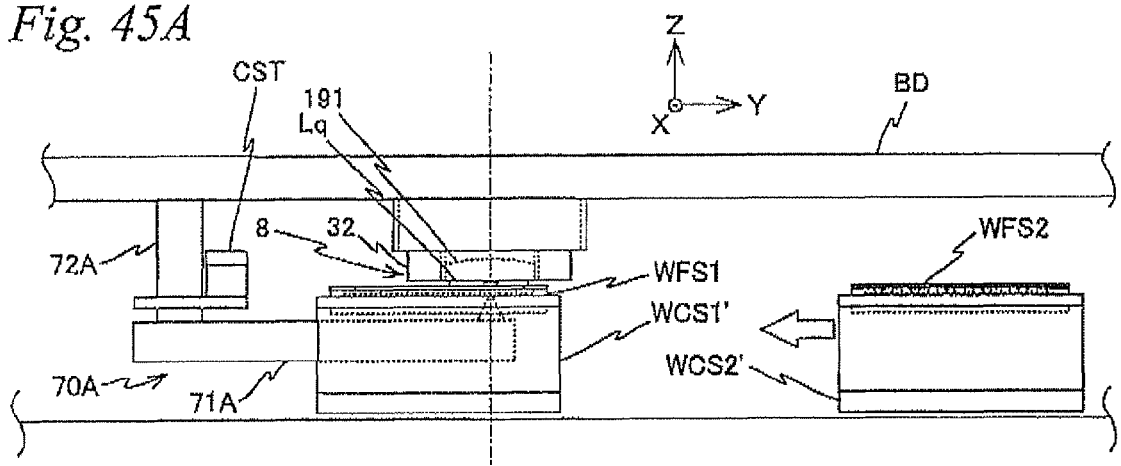
FIGS. 45A to 45C are views used to explain a parallel processing performed using fine movement stages WFS1 and WFS2 (No. 1) in the exposure apparatus of the third embodiment.
Figure 46:
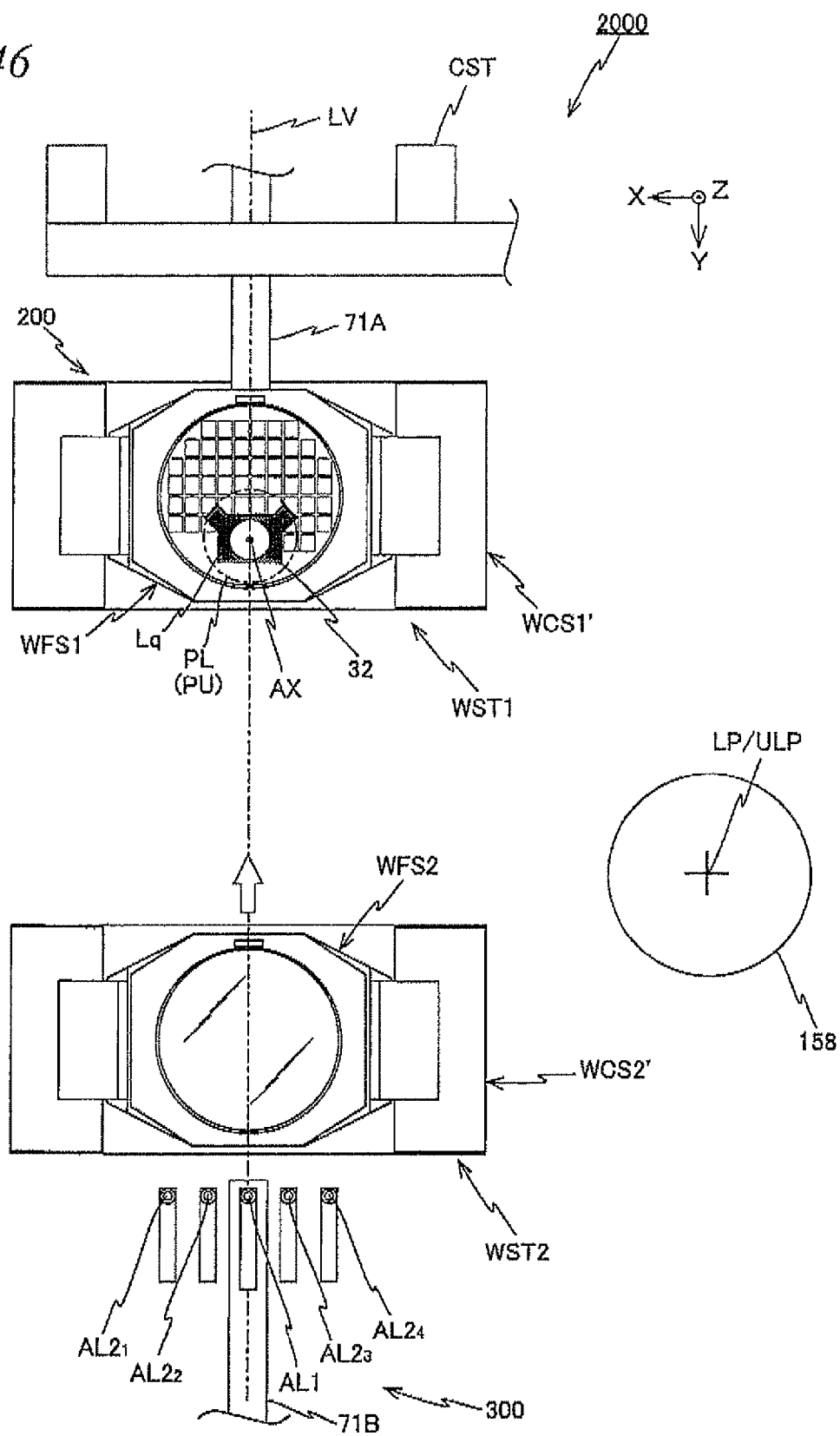
FIG. 46 is a planar view of an exposure apparatus corresponding to a state shown in FIG. 45A.

When the alignment has been completed, main controller 20 drives wafer stage WST2, that is, coarse movement stage WCS2' supporting fine movement stage WFS2 toward exposure station 200. FIGS. 45A and 46 show a state in which coarse movement stage WCS2' supporting fine movement stage WFS2 is moving from measurement station 300 toward exposure station 200. At this point, carrier stage CST is still waiting at the waiting position previously described.

When coarse movement stage WCS2' supporting fine movement stage WFS2 arrives at a position in the vicinity of exposure station 200 in the −Y direction by a predetermined distance from the position shown in FIG. 45A, main controller 20 waits for the exposure performed on wafer W on fine movement stage WFS1 to be completed in a state where coarse movement stage WCS2' (wafer stage WST2) is made to wait at the position.

Figure 45B:
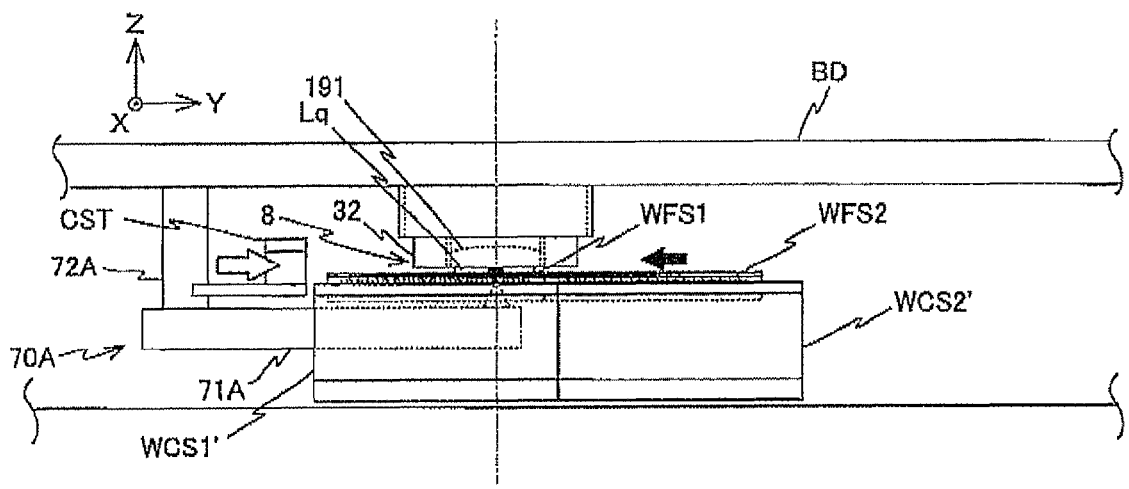
Figure 47:
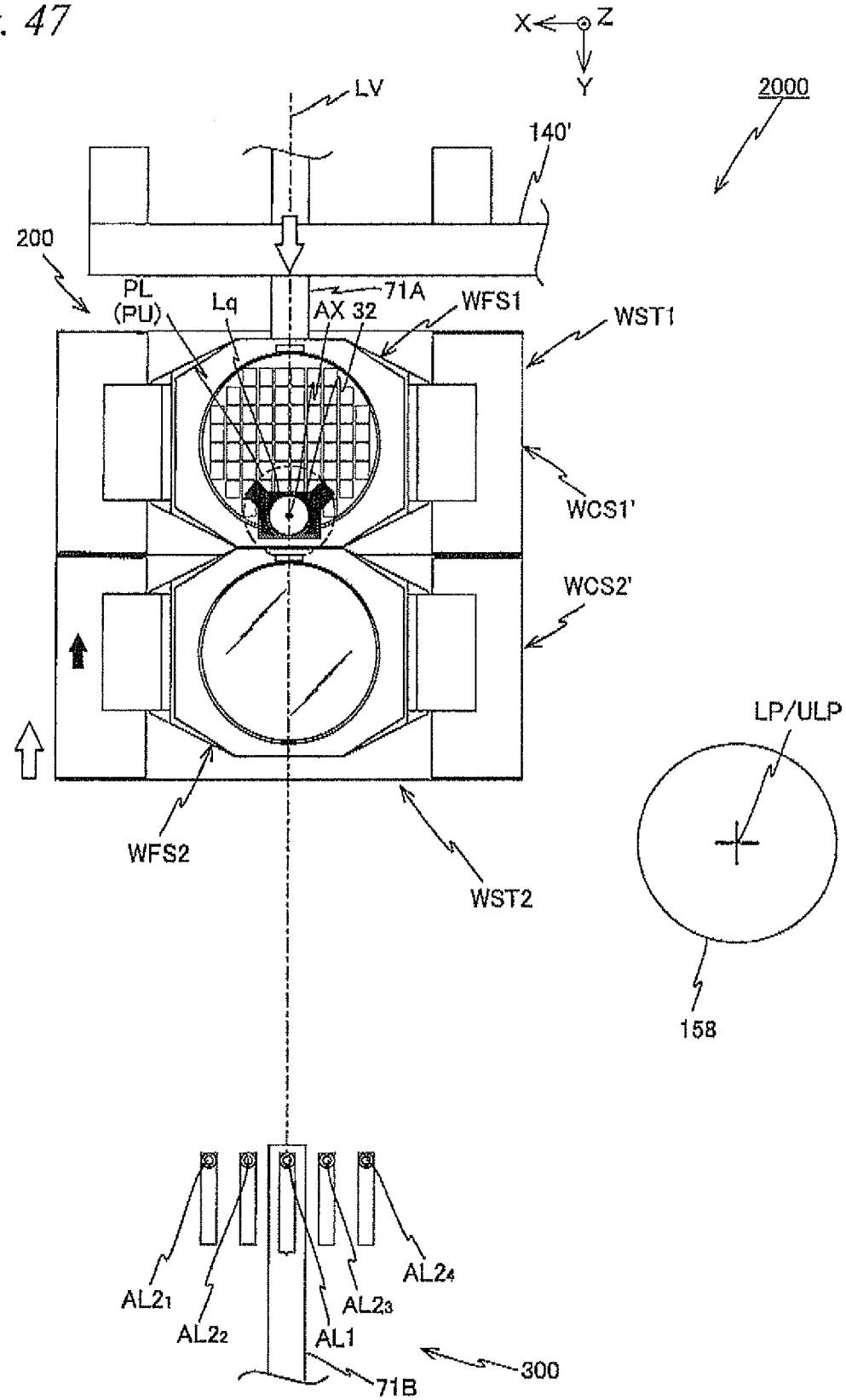
FIG. 47 is a planar view of an exposure apparatus corresponding to a state shown in FIG. 45B.

Then, when the exposure has been completed, main controller 20 makes coarse movement stage WCS2' and coarse movement stage WCS1' face each other almost in a contact state, as well as drive fine movement stage WFS2 via fine movement stage drive system 52B in the −Y direction as is shown by the black arrow in FIG. 45B, and makes fine movement stage WFS2 come into contact or in proximity via a clearance of around 300 μm in the Y-axis direction, as shown in FIGS. 45B and 47. More specifically, main controller 20 sets fine movement stage WFS2 and fine movement stage WFS1 to a scrum state. Incidentally, preparations for setting this scrum state of fine movement stage WFS2 and fine movement stage WFS1 can be performed just before the exposure is completed.

Further, just after (or just before) the exposure to wafer W on fine movement stage WFS1 has been completed, main controller 20 drives carrier stage CST integrally with robot arm 140' in the +Y direction, and makes carrier stage CST and coarse movement stage WCS1' face each other in a proximity state in a proximity state as shown in FIGS. 45B and 47.

Figure 45C:
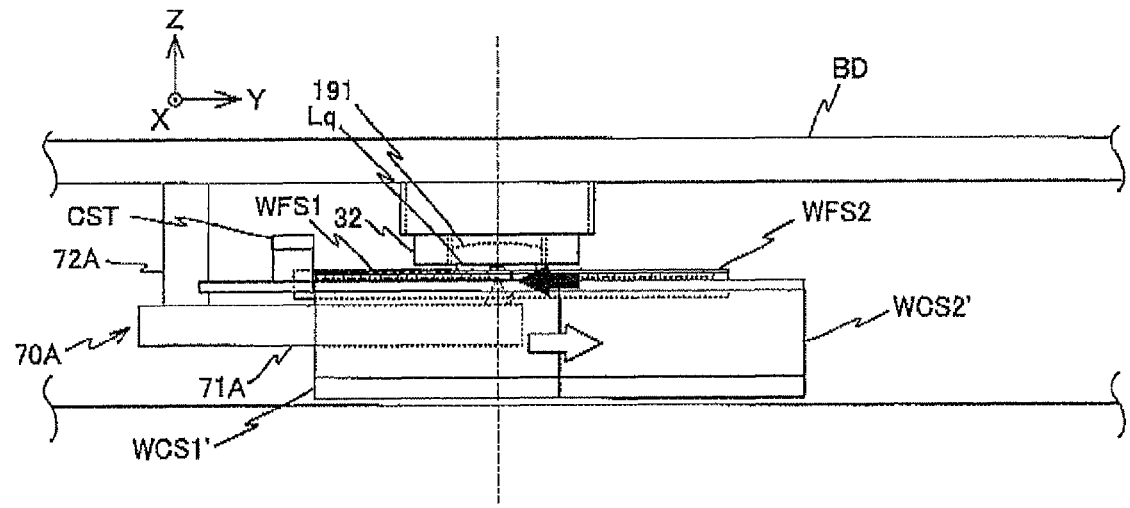
Figure 48:
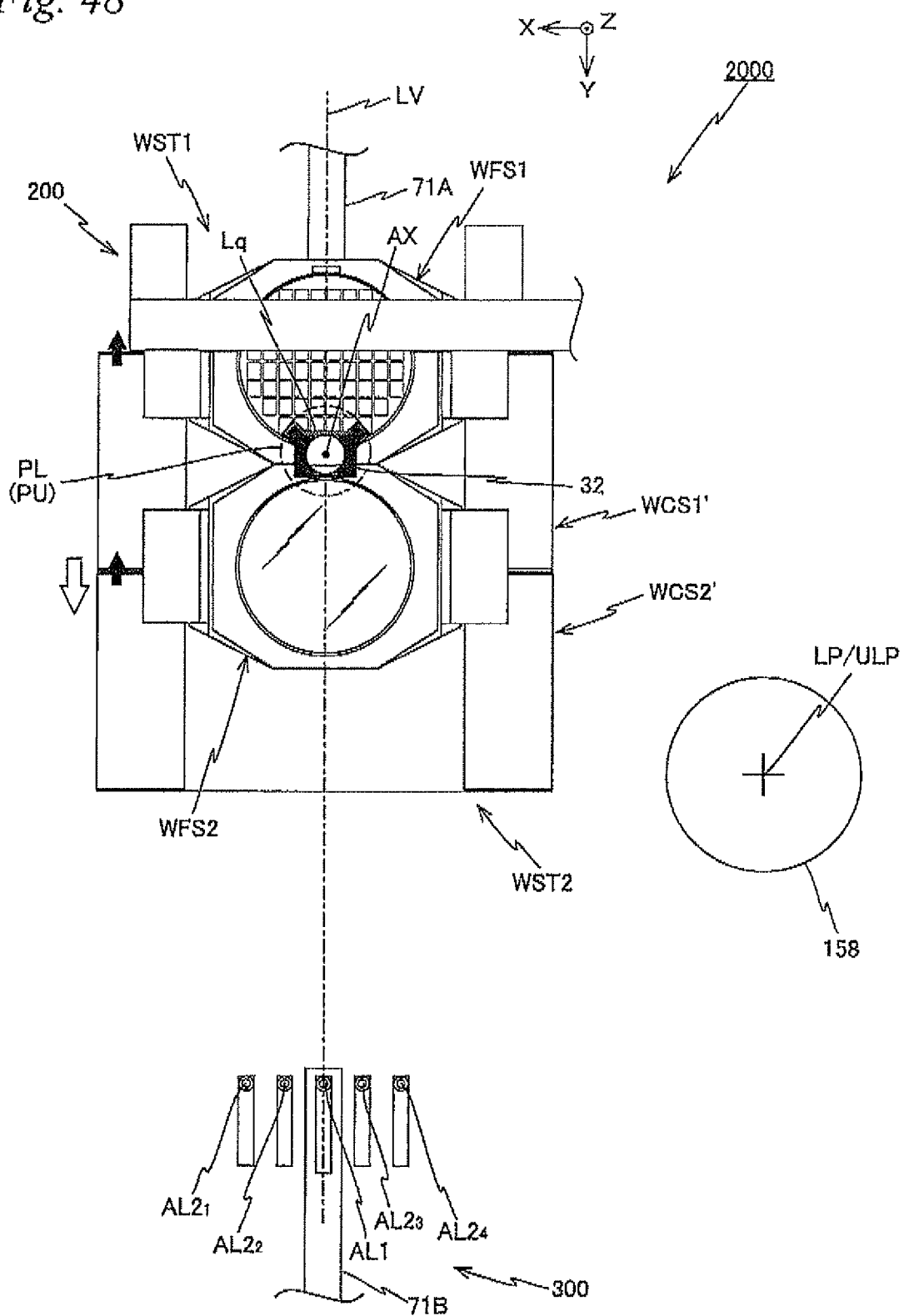
FIG. 48 is a planar view of an exposure apparatus corresponding to the state shown in FIG. 45C.

Next, main controller 20 drives fine movement stages WFS2 and WFS1 at the same time (keeping the scrum state) in the −Y direction via fine movement stage drive systems 526 and 52A, as is shown by the black arrows in FIGS. 45C and 48. By this operation, the liquid immersion space area which is formed by liquid Lq held between tip lens 191 and fine movement stage WFS1 is passed from fine movement stage WFS1 to fine movement stage WFS2. FIGS. 45C and 48 show a state just before the liquid immersion space area formed by liquid Lq is passed from fine movement stage WFS1 to fine movement stage WFS2. In this state, liquid Lq is held between tip lens 191, and fine movement stage WFS1 and fine movement stage WFS2.

Further, concurrently with driving fine movement stages WFS2 and WFS1 in the −Y direction, main controller 20 simultaneously drives coarse movement stages WCS1' and WCS2' in the +Y direction, as is shown by the outlined arrow in FIG. 45C.

Further, at the point when the delivery of the liquid immersion space area begins and the tip of fine movement stage WFS1 begins to be exposed outside of coarse movement stage WCS1', main controller 20 also drives fine movement stage drive system 52C' in parallel with each of the operations above and begins the delivery to slide movement) of fine movement stage WFS1 from coarse movement stage WCS1' to carrier stage CST, as is shown in FIGS. 45C and 48.

Figure 49A:
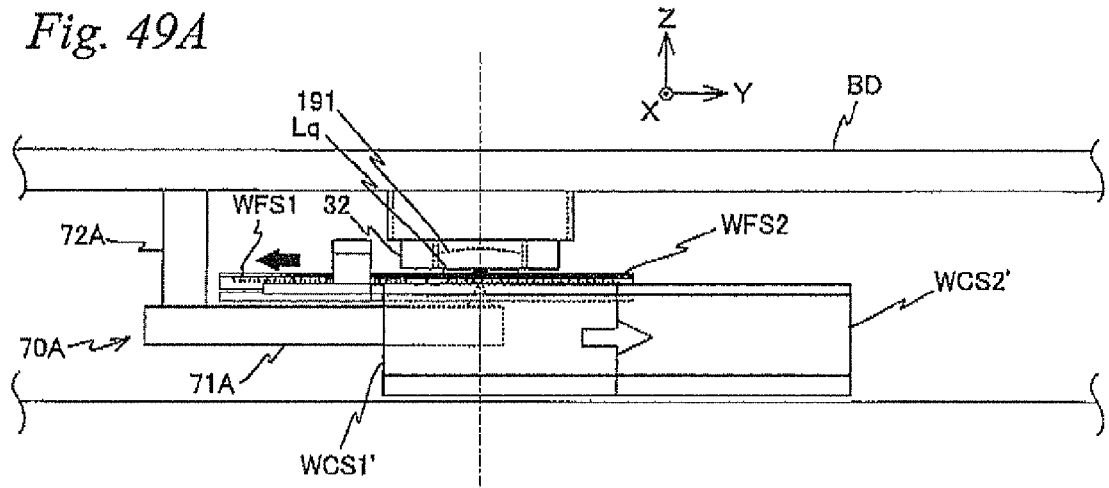
FIGS. 49A to 49C are views used to explain a parallel processing performed using fine movement stages WFS1 and WFS2 (No. 2) in the exposure apparatus of the third embodiment.
Figure 50:
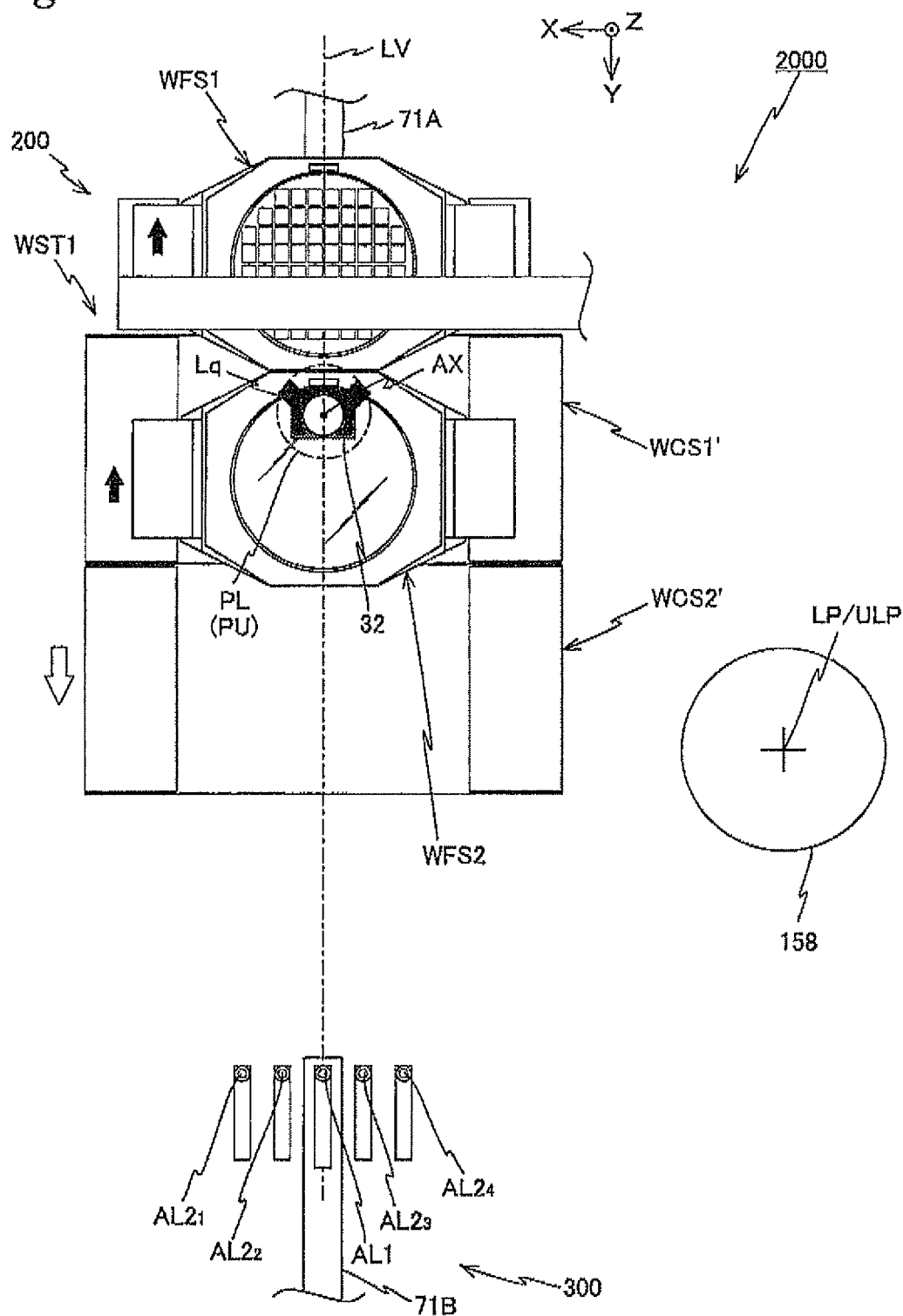
FIG. 50 is a planar view of an exposure apparatus corresponding to a state shown in FIG. 49A.

FIGS. 49A and 50 show a state in which the delivery of the liquid immersion space area described above has been completed, and delivery of fine movement stage WFS1 from coarse movement stage WCS1' to carrier stage CST is almost complete.

Figure 49B:
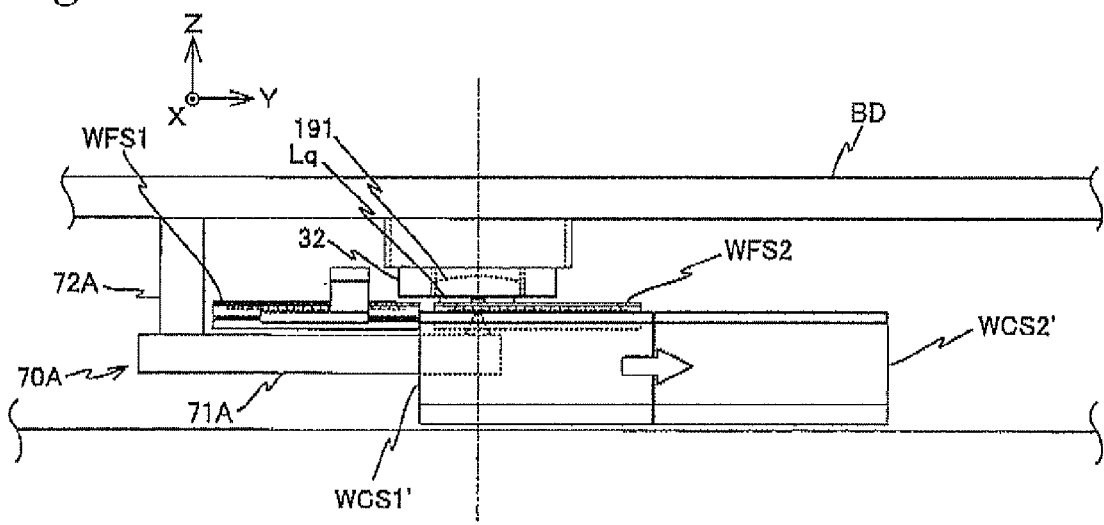
Figure 51:
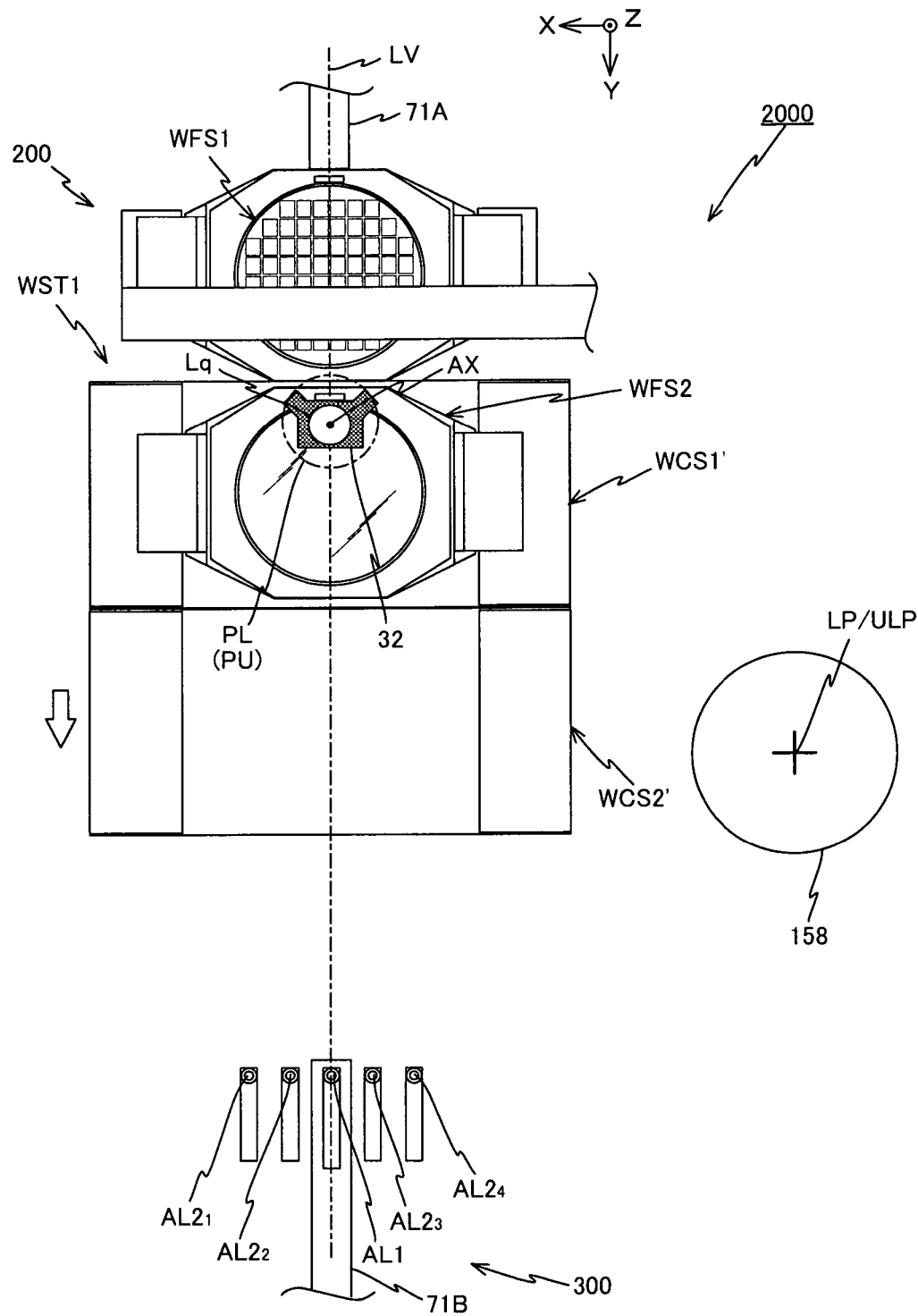
FIG. 51 is a planar view of an exposure apparatus corresponding to a state shown in FIG. 49B.

FIGS. 49B and 51 show a state in which a predetermined amount of time has passed from the state shown in FIGS. 49A and 50, and the delivery of fine movement stage WFS1 from coarse movement stage WCS1' to carrier stage CST has been completed. At this point, fine movement stage WFS2 is supported by coarse movement stage WCS1'. In other words, in the embodiment, concurrently with the delivery of the liquid immersion space area between fine movement stages WFS1 and WF2 and the delivery of fine movement stage WFS1 from coarse movement stage WCS1' to carrier stage CST, delivery of the fine movement stage (in this case WFS2) holding wafer W on which alignment has been completed from coarse movement stage WCS2' to coarse movement stage WCS1' has also been completed.

Figure 49C:
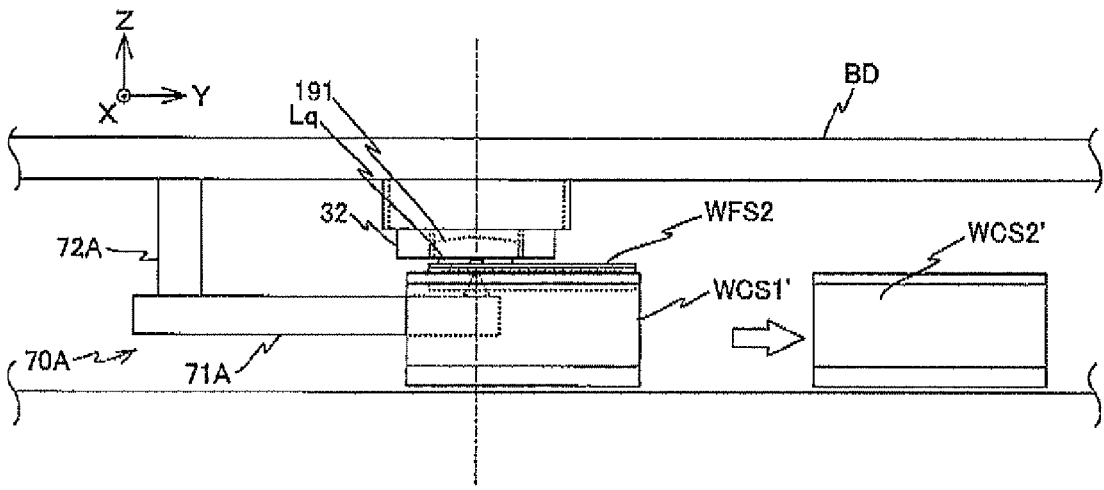
Figure 52:
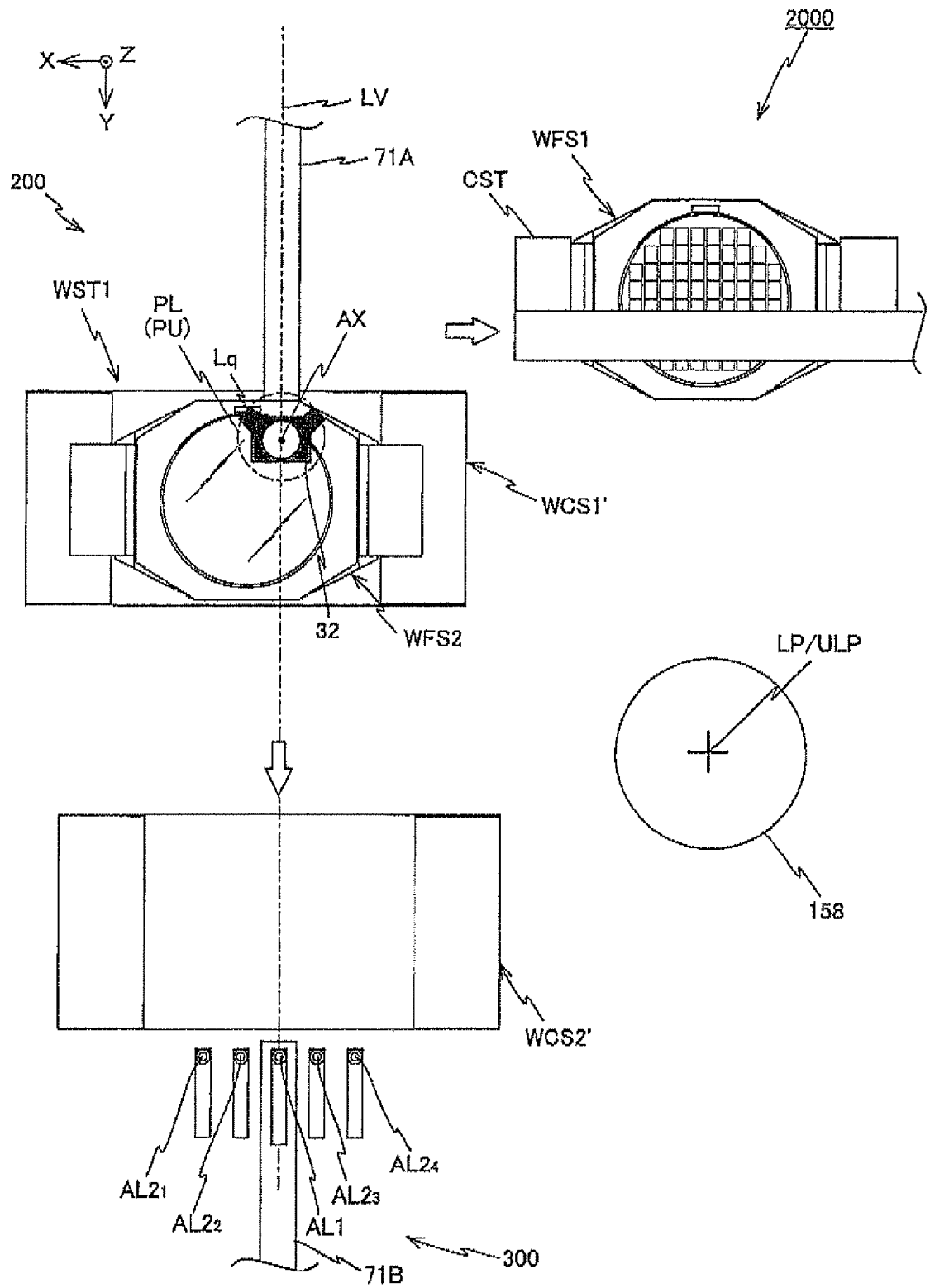
FIG. 52 is a planar view of an exposure apparatus corresponding to a state shown in FIG. 49C.

Subsequently, as is shown in FIGS. 49C and 52, exposure of wafer W on fine movement stage WFS2 begins. Prior to the beginning of exposure, main controller 20 performs reticle alignment in a procedure (a procedure disclosed in, for example, U.S. Pat. No. 5,646,413 and the like) similar to a normal scanning stepper, using the pair of reticle alignment systems RA$_S$, and RA$_2$ previously described, and the pair of first fiducial marks on measurement plate 86 of fine movement stage WFS2 and the like. Then, main controller 20 performs exposure operation by the step-and-scan method, based on results of the reticle alignment and the results of the wafer alignment (array coordinates which uses the second fiducial marks of each of the shot areas on wafer W), and transfers the pattern of reticle R on each of the plurality of shot areas on wafer W. This exposure is performed in the order from the shot area located on the −Y side on wafer W to the shot area located on the +Y side.

Figure 53:
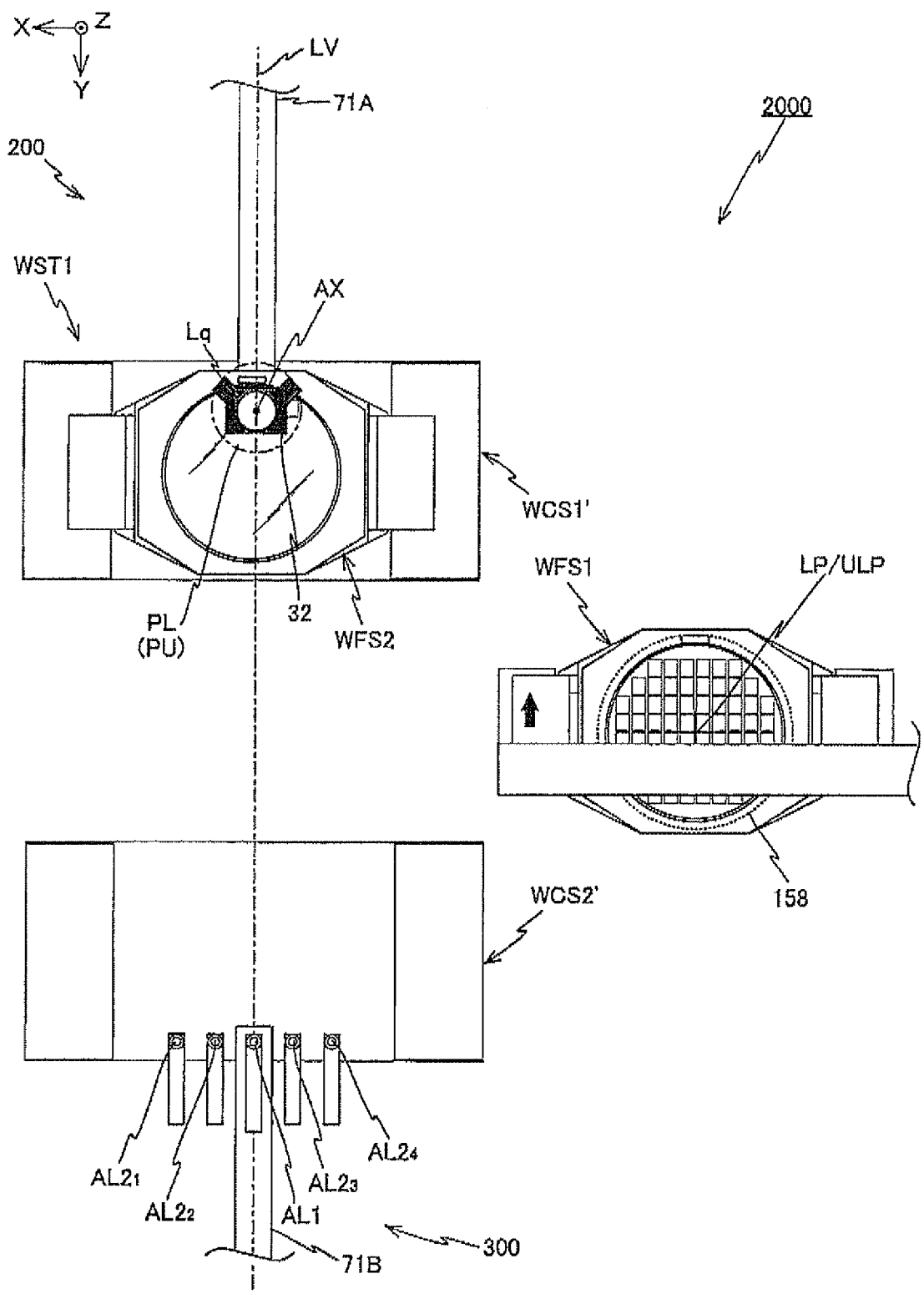
FIG. 53 is a view used to explain the parallel processing performed using fine movement stages WFS1 and WFS2 (No. 3) in the exposure apparatus of the third embodiment.

Concurrently with the reticle alignment and exposure described above, operations such as n. to r. described below are performed.

n. In other words, from the state shown in FIGS. 49B and 51 previously described, carrier stage CST which supports fine movement stage WFS1 is driven in the −X direction as is shown by the outlined arrow in FIG. 52 by main controller 20, and is moved outside of base board 12. A state corresponding to FIG. 52 is shown in FIG. 49C.

o. In parallel with the movement of carrier stage CST described above, main controller 20 drives coarse movement stage WCS2' in the +Y direction towards measurement station 300, as is shown by the outlined arrows in FIGS. 49C and 52. FIG. 53 shows a state where coarse movement stage WCS2' has been moved to measurement station 300. At this point, carrier stage CST supporting fine movement stage WFS1 carried to wafer exchange position LP/ULP by main controller 20.

Figure 54:
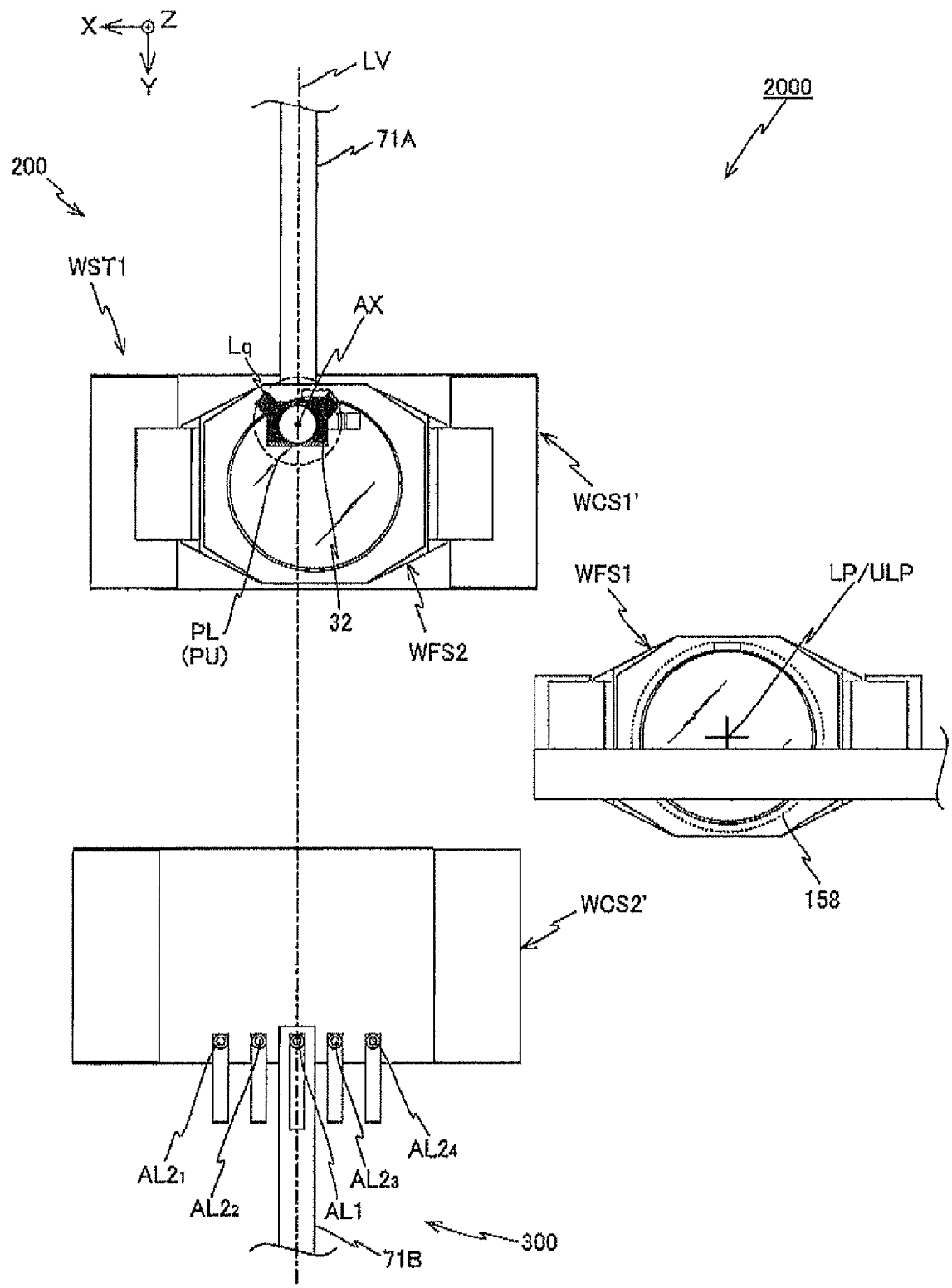
FIG. 54 is a view used to explain the parallel processing performed using fine movement stages WFS1 and WFS2 (No. 4) in the exposure apparatus of the third embodiment.

Then, at wafer exchange position LP/ULP, wafer W which has undergone exposure on fine movement stage WFS1 is exchanged to a (new) wafer W which has not been exposed yet by an unload arm and a load arm (both of which are not shown), as is shown in FIGS. 53 and 54. In this case, as the unload arm and the load arm, for example, unload arm 144 and load arm 142 previously described that each have a so-called Bernoulli chuck can be used.

Wafer exchange is performed in a state where fine movement stage WFS1 supported by carrier stage CST is mounted on table 158 set at wafer exchange position LP/ULP. Fine movement stage WFS1 and table 158 are then connected via two kinds of pipe lines which are used for supply and exhaust of gases. And when wafer W which has undergone exposure is unloaded from a wafer holder by the unload arm, main controller 20 drives a pump for supplying pressurized gas which is connected to the pipe line used for gas supply, and blows the pressurized gas inside a decompression chamber (decompression space) formed by the wafer holder (drawing omitted) of fine movement stage WFS1 and the back surface of wafer W via the gas supply pipe line, which releases the negative pressure state inside the decompression chamber and also lifts wafer W. When unload of wafer W is completed, main controller 20 stops the pump for supplying the pressurized gas, and the gas supply pipe line within fine movement stage WFS1 is closed by a check valve (not shown) in the inside.

Meanwhile, when new wafer W before exposure is loaded on the wafer holder, main controller 20 drives a vacuum pump connected to a pipe line for exhausting gases, and the decompression chamber (decompression space) formed by the wafer holder of fine movement stage WFS1 and the back surface of wafer W moves into a negative pressure state and wafer W is suctioned by the wafer holder.

Figure 56:
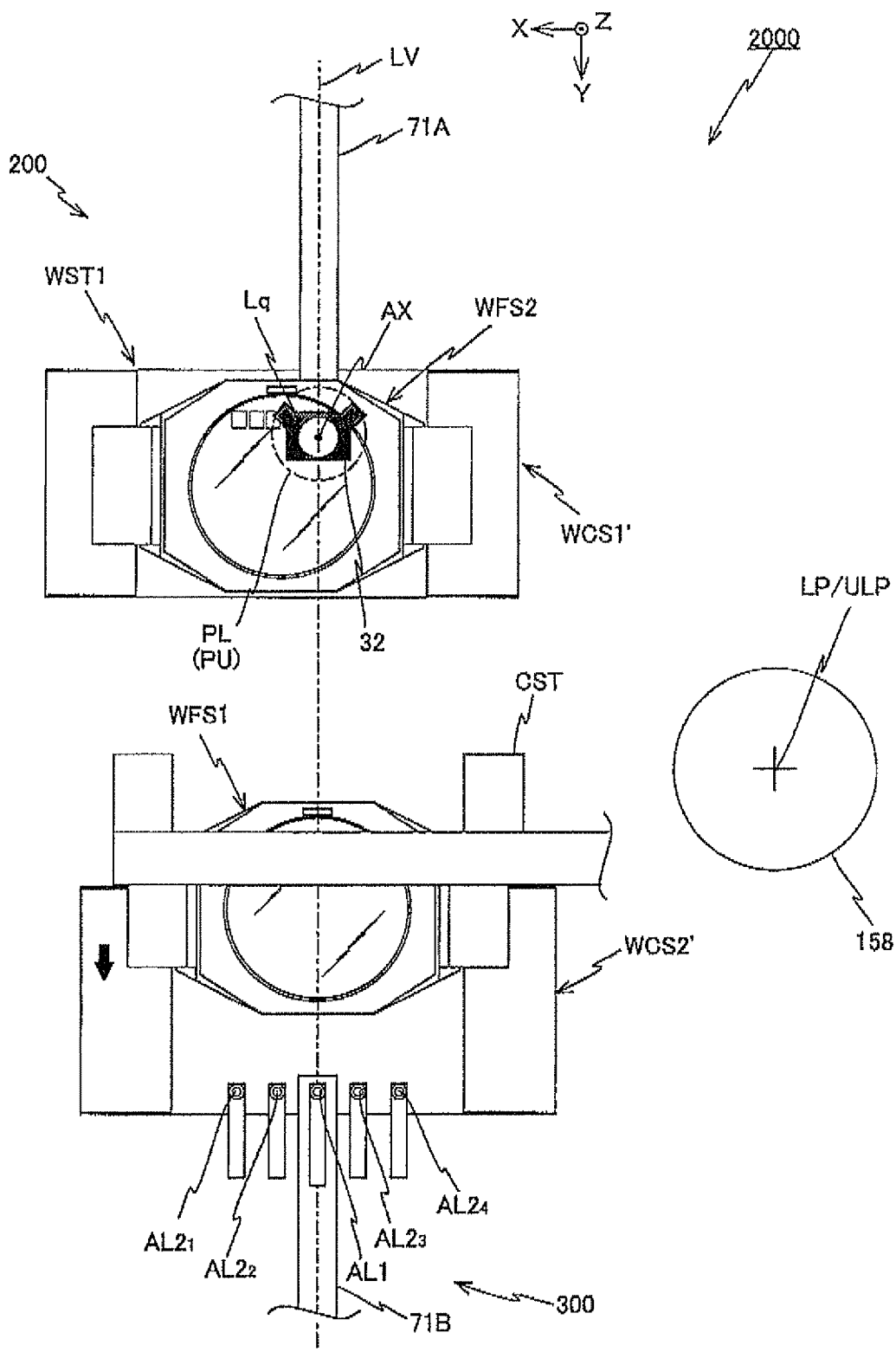
FIG. 56 is a view used to explain the parallel processing performed using fine movement stages WFS1 and WFS2 (No. 6) in the exposure apparatus of the third embodiment.
Figure 57:
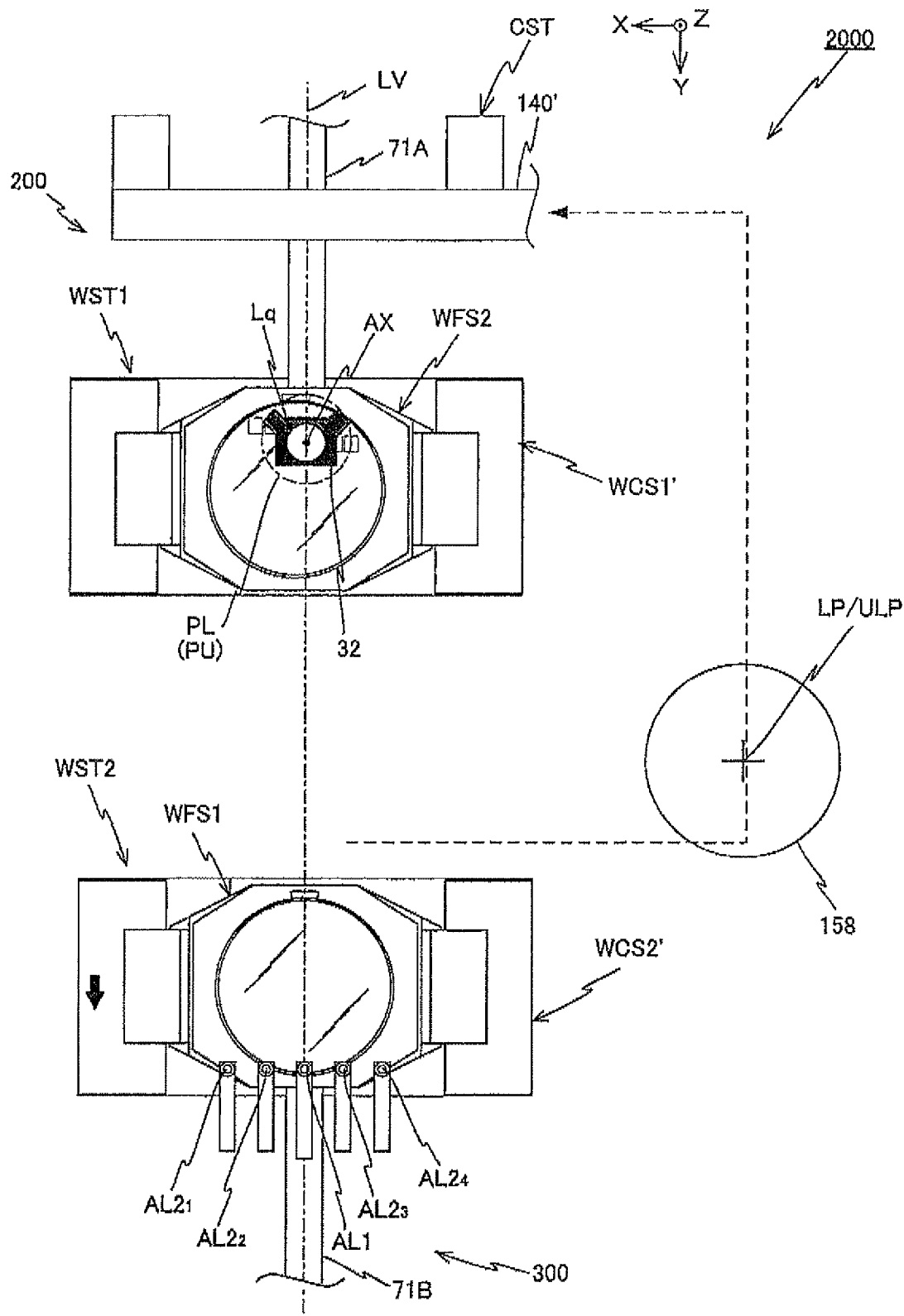
FIG. 57 is a view used to explain the parallel processing performed using fine movement stages WFS1 and WFS2 (No. 7) in the exposure apparatus of the third embodiment.
Figure 58:
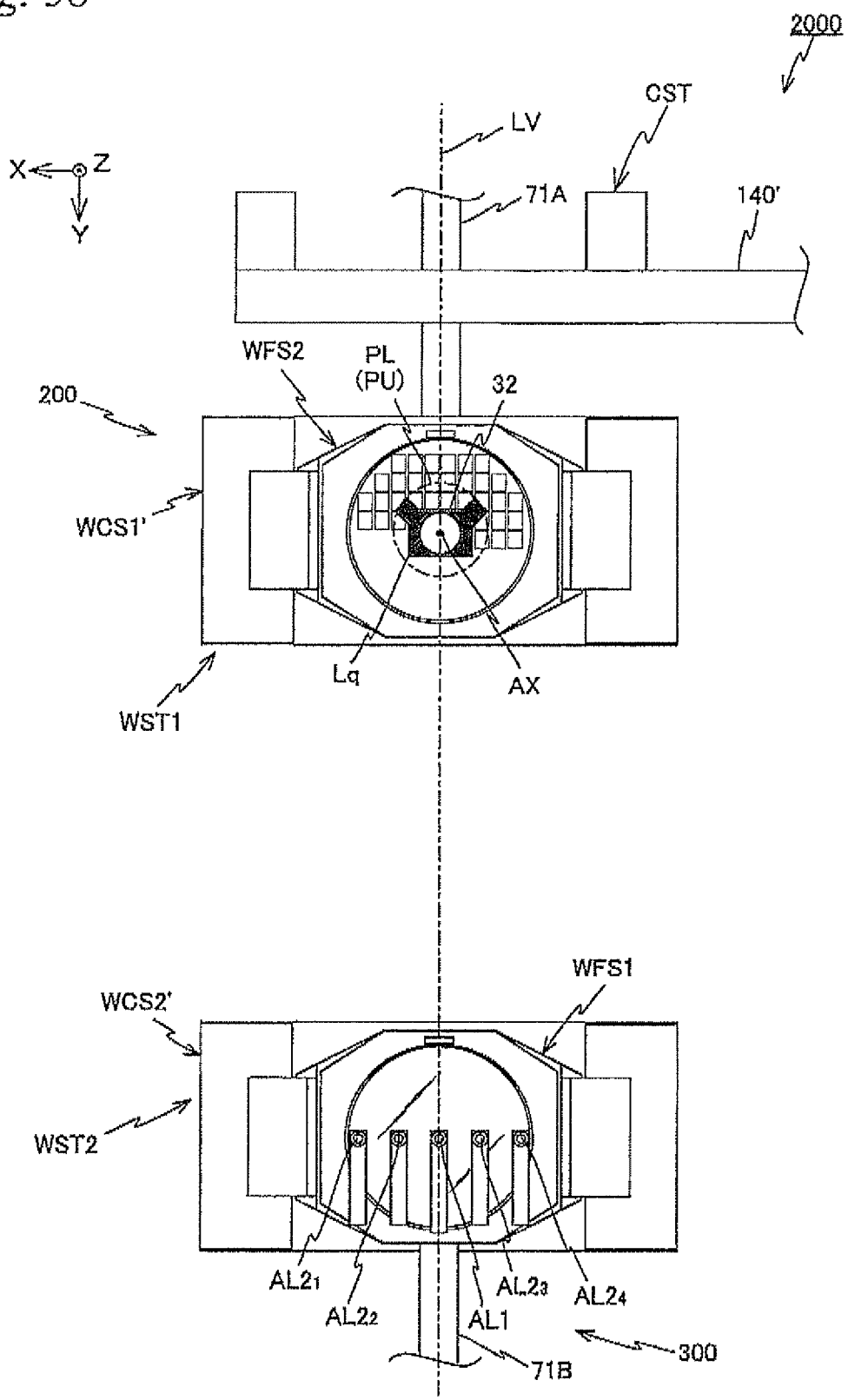
FIG. 58 is a view used to explain the parallel processing performed using fine movement stages WFS1 and WFS2 (No. 8) in the exposure apparatus of the third embodiment.

When wafer exchange is completed, main controller 20 stops the vacuum pump, and the exhaust pipe line within fine movement stage WFS1 is closed by a check valve (not shown) in the inside. And, while the connection of fine movement stage WFS1 and table 158 via the pipe lines is released when with table 158 moves downward, the negative pressure state is maintained by the check valves and the suctioned state of the wafer by the wafer holder is maintained.

p. After the wafer exchange, robot arm 140' is driven in the +X direction as is shown by the outlined arrow in FIG. 55 by main controller 20, and fine movement stage WFS1 holding (a new wafer) W is driven in the +X direction integrally with carrier stage CST. Thus, carrier stage CST faces coarse movement stage WCS2' (refer to FIG. 55). At this point in time, on fine movement stage WFS2, the exposure of wafer W is being continued.

q. Then, main controller 20 drives robot arm 140' in the +Y direction, and carrier stage CST which supports fine movement stage WFS1 holding wafer W before exposure moves in the +Y direction, and faces coarse movement stage WCS2' almost in a contact state. And, fine movement stage WFS1 is driven in the +Y direction by main controller 20, as is shown by the outlined arrow in FIG. 56, and then is moved and mounted from carrier stage CST to coarse movement stage WCS2'. FIG. 56 shows a state where fine movement stage WFS1 is being moved and mounted on coarse movement stage WCS2'.

r. Thereafter, for detection of the second fiducial marks on fine movement stage WFS1 supported by coarse movement stage WCS2', main controller 20 drives fine movement stage WFS1 in the +Y direction. Then, by main controller 20, detection of the second fiducial marks on fine movement stage WFS1, alignment of wafer W on fine movement stage WFS1 and the like are performed, in procedures similar to the ones previously described. Then, by main controller 20, array coordinates of each shot area on wafer W acquired from the wafer alignment are converted into array coordinates which are based on the second fiducial marks. In this case as well, position measurement of fine movement stage WFS1 on alignment is performed, using fine movement stage position measurement system 70B. FIG. 58 shows a state where alignment of wafer W is being performed on fine movement stage WFS1. Prior to this, carrier stage CST moves to the vicinity of the waiting position in the vicinity of (above measurement arm 71A) of support member 72A, as is shown in FIG. 57.

The state shown in FIG. 58 is a state similar to FIG. 42 previously described, or more specifically, a state where exposure is being performed on wafer W held by fine movement stage WFS2 at exposure station 200, and alignment is being performed on wafer W held by fine movement stage WFS1 at measurement station 300.

Hereinafter, a parallel processing as is previously described is repeatedly performed by main controller 20, sequentially using fine movement stages WFS1 and WFS2, and an exposure processing to a plurality of wafer Ws is continuously performed.

As discussed in detail so far, according to exposure apparatus 2000 of the third embodiment, because the exposure apparatus is equipped with fine movement stage position measurement systems 70A, 70B and the like that have a configuration similar to the first and second embodiments previously described, an equivalent effect can be obtained as in the first and second embodiments. Furthermore, in the third embodiment, on transition from a state in which liquid Lq is held between wafer W on fine movement stage WFS1 (or WFS2) and projection optical system PL (tip lens 191) to a state in which liquid Lq is held between wafer W on fine movement stage WFS2 (or WFS1) and projection optical system PL (tip lens 191) ((transition from a first state in which wafer W on fine movement stage WFS1 (or WFS2) is located at a position directly under projection optical system PL to a second state in which wafer W on fine movement stage WFS2 (or WFS1) is located at a position directly under projection optical system PL), main controller 20 moves fine movement stages WFS1 and WFS2 in the Y-axis direction while maintaining a proximity or a contact state (a scrum state) in the Y-axis direction, along with moving coarse movement stages WCS1' and WCS2' in the opposite direction. This allows the liquid immersion space area to be constantly maintained between at least one of fine movement stages WFS1 and WFS2 and projection optical system PL (tip lens 191), which can increase the throughput to the maximum. As well as this, according to exposure apparatus 2000, concurrently with the operation of state transition (in the embodiment, delivery operation of the liquid immersion space area is performed simultaneously), it becomes possible to perform an operation to switch fine movement stage WFS2 (or WFS1) holding wafer W on which alignment has been performed from coarse movement stage WCS2' to be mounted on coarse movement stage WCS1'. Accordingly, it becomes possible to start the exposure operation at once. Incidentally, concurrently with the operation of state transition (delivery of the liquid immersion space area), only a part of the operation to switch fine movement stage WFS2 (or WFS1) holding wafer W on which alignment has been performed from coarse movement stage WCS2' to be mounted on coarse movement stage WCS1' can be performed.

Further, because the delivery (moving and mounting) of the fine movement stage between coarse movement stage WCS1' (or WCS2') and carrier stage CST can be performed only by a slide movement of the fine movement stage, without operations such as separation of the coarse movement stage, a quick delivery becomes possible. Accordingly, it is possible to achieve wafer processing with an extremely high throughput, even in the case when a 450 mm wafer is subject to processing.

Incidentally, in the embodiment above, while the case has been described where exposure apparatus 2000 is equipped with two fine movement stages WFS3 and WFS2, as well as this, the exposure apparatus can be equipped with three or more fine movement stages as in the first and second embodiments previously described and in the following first and second modified examples.

A FIRST MODIFIED EXAMPLE

Figure 59:
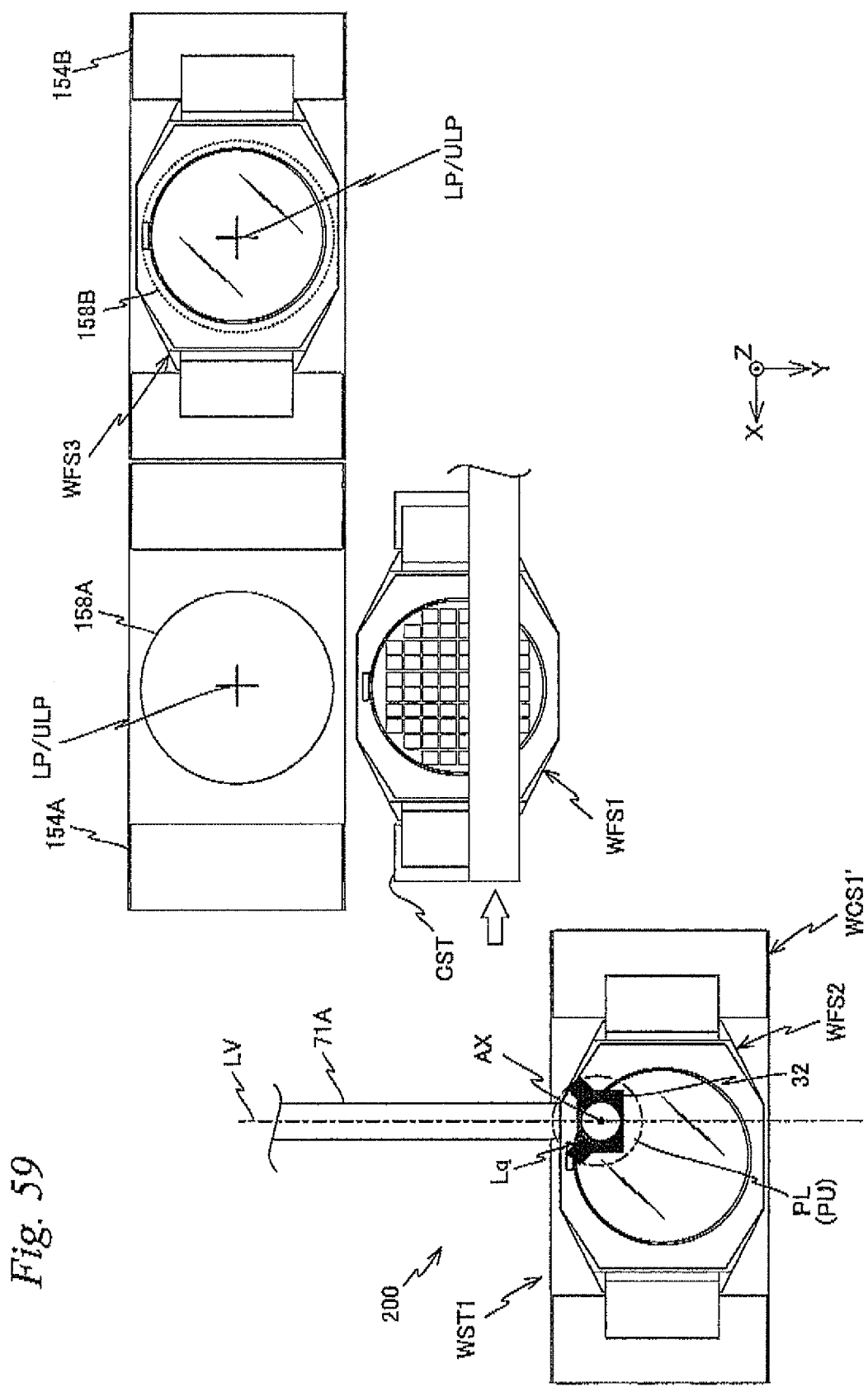
FIG. 59 is a planar view showing an exposure apparatus related to a first modified example of the third embodiment, and also is a view used to explain a parallel processing performed using the three fine movement stages (No. 1)

Next, an exposure apparatus related to a first modified example of the third embodiment will be described, with reference to FIGS. 59 to 62. As is shown in FIG. 59, the exposure apparatus related to the first modified example comprises three fine movement stages WFS1, WFS2, and WFS3. Further, in the exposure apparatus related to the first modified example, wafer exchange position LP/ULP is placed at two places by a predetermined distance in the X-axis direction, on the −X side and the −Y side of exposure station 200 at positions external to the base board. In each of the two wafer exchange positions LP/ULP, replacement stages 154A and 154B configured similar to coarse movement stages WCS2' and WCS2' are installed. However, magnets and the like are not placed on the bottom surface of replacement stages 154A and 154B. Further, on the upper part of plate-like member which forms the bottom wall of replacement stages 154A and 154B, circular tables 158A and 158B which are vertically movable and are configured similar to table 158 previously described are placed, respectively.

Figure 60:
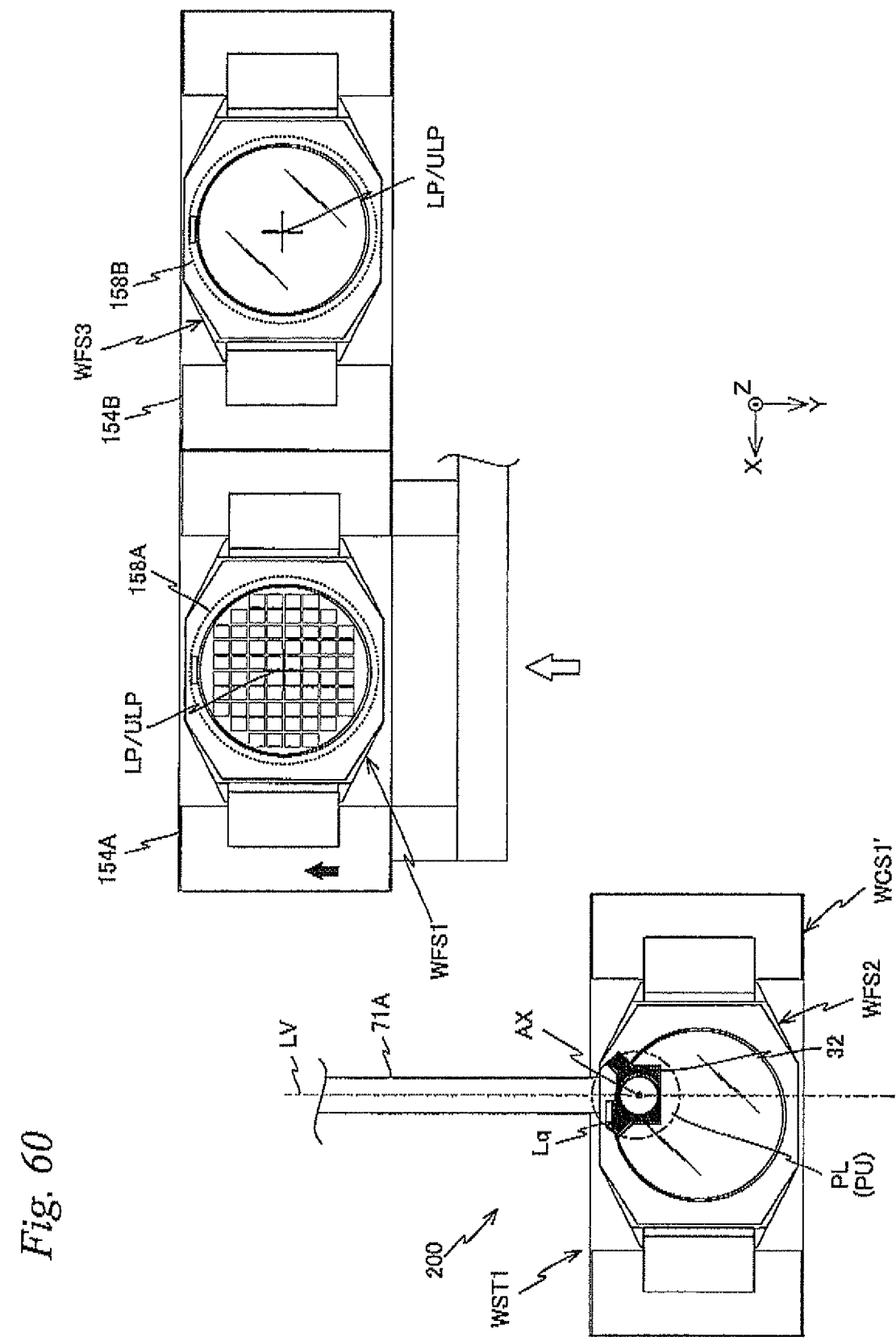
FIG. 60 is a view used to explain a parallel processing performed using the three fine movement stages (No. 2) in the exposure apparatus related to the first modified example.

In the exposure apparatus related to the first modified example configured in the manner described above, carrier stage CST supporting fine movement stage WFS1 is driven in the −X direction as is shown by the outlined arrow in FIG. 59 from the state shown in FIGS. 49B and 51 previously described by main controller 20, and is moved to a position facing replacement stage 154A. Then, in a procedure similar to the delivery of the fine movement stage from coarse movement stage WCS1' to carrier stage CST previously described by main controller 20, delivery (slide movement) of fine movement stage WFS1 from carrier stage CST to replacement stage 154A is performed. FIG. 60 shows a state after the delivery has been completed. Then, main controller 20 drives table 158A upward, and fine movement stage WFS1 and table 158A are connected via two kinds of pipe lines which are used for supply and exhaust of gases. And then, the unload arm begins to unload wafer W which has been exposed from the wafer holder. At this point, main controller 20 drives a pump for supplying pressurized gas, which releases the negative pressure state inside the decompression chamber and also lifts wafer W.

Further, at this point, on replacement stage 154B, fine movement stage WFS3 holding a new wafer W is mounted on table 158B, and is connected to table 158B via the pipe lines used for supply and exhaust of gases. At this point, loading of wafer W onto fine movement stage WFS3 has already been completed, and both of the check valves are closed, which maintains the vacuum suction of wafer W by the wafer holder.

Figure 61:
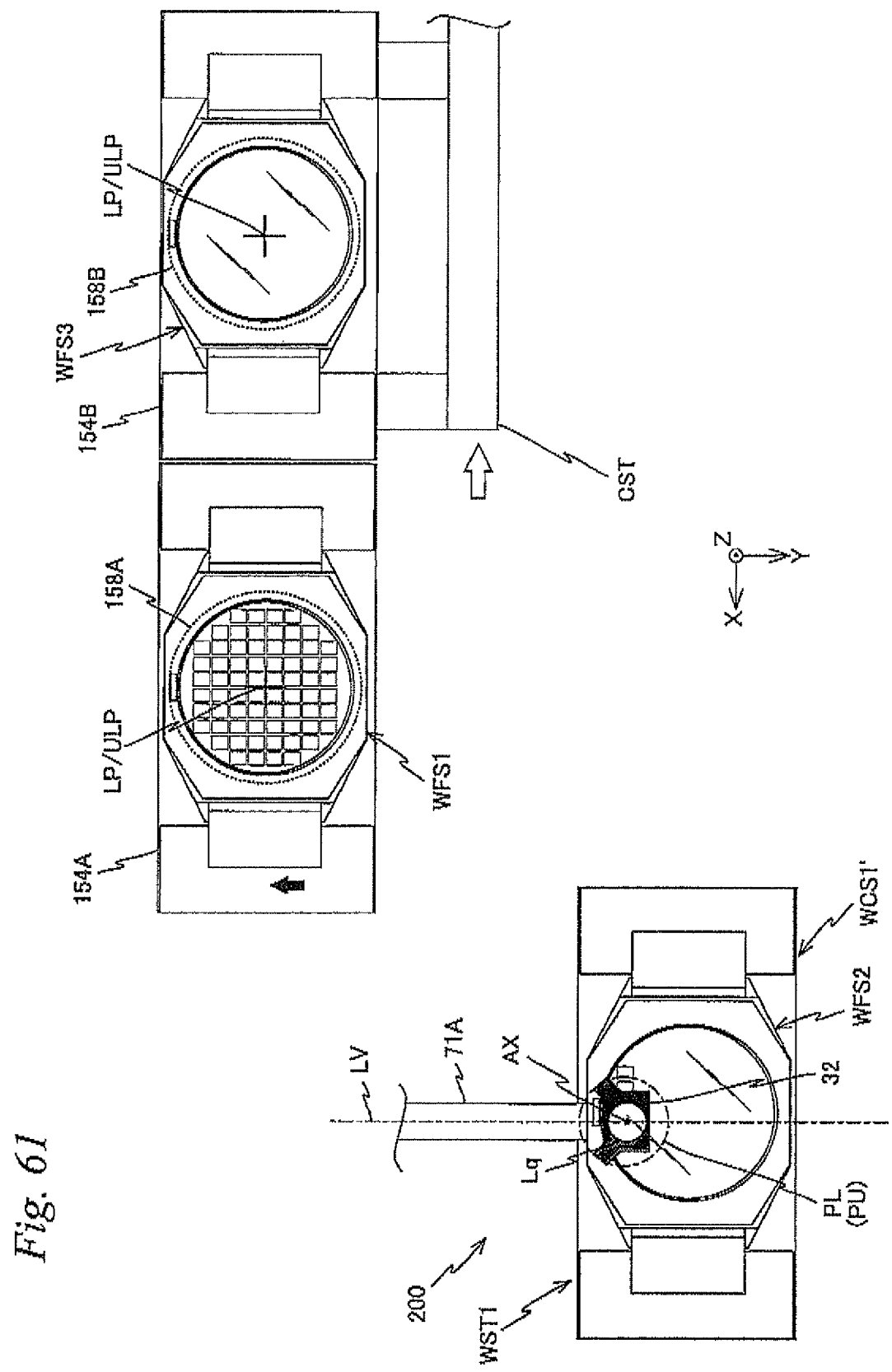
FIG. 61 is a view used to explain a parallel processing performed using the three fine movement stages (No. 3) in the exposure apparatus related to the first modified example.
Figure 62:
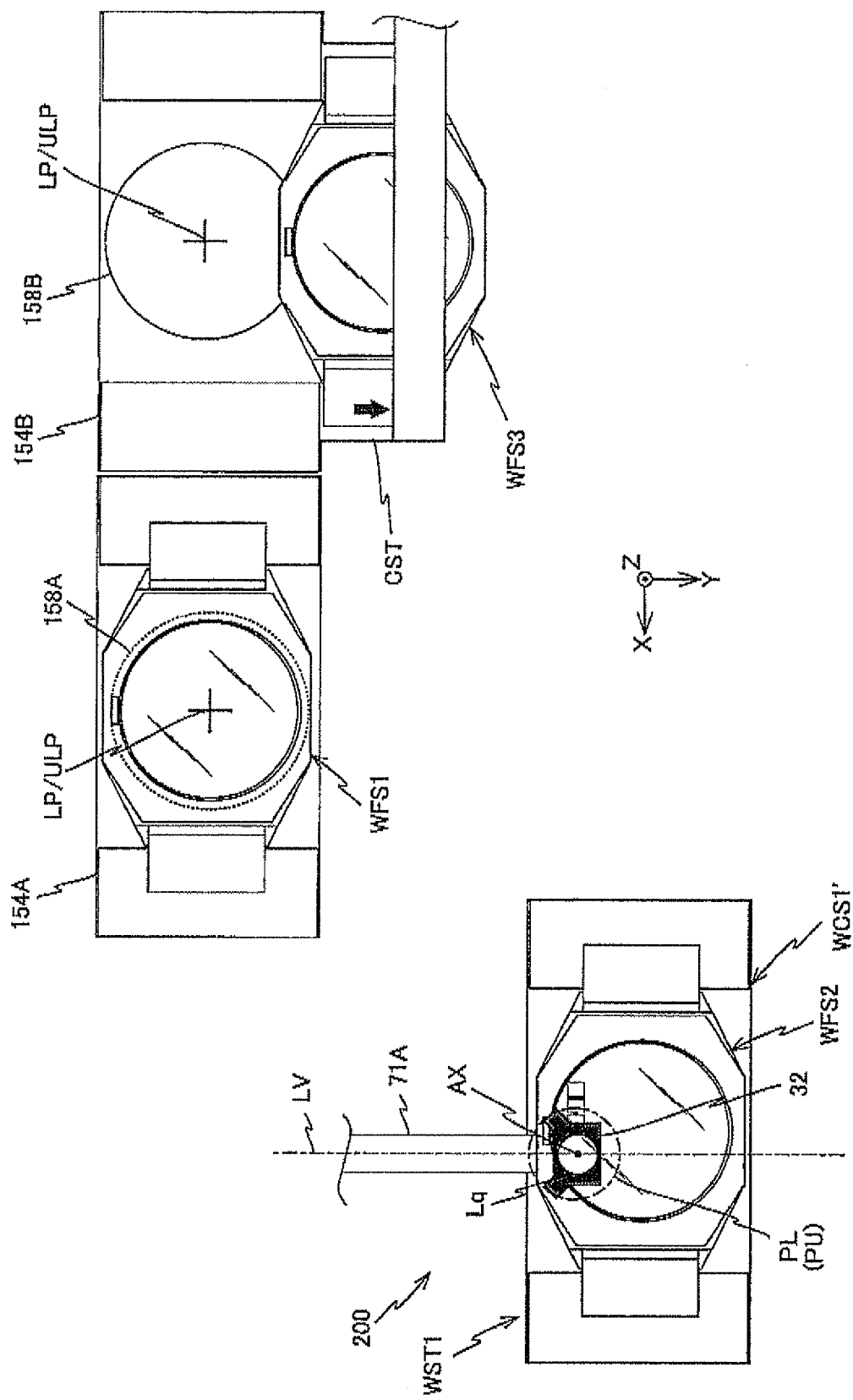
FIG. 62 is a view used to explain a parallel processing performed using the three fine movement stages (No. 4) in the exposure apparatus related to the first modified example.

Next, carrier stage CST is moved to a position facing replacement stage 154B and table 158B is also driven downward by main controller 20, as is shown by the outlined arrow in FIG. 61. This releases the connection between fine movement stage WFS3 and table 156E via the two types of pipe lines. Then, in a procedure similar to the one previously described, delivery (slide movement) of fine movement stage WFS1 from replacement stage 154B to carrier stage CST is performed by main controller 20. FIG. 62 shows a state after the delivery has been completed.

Figure 55:
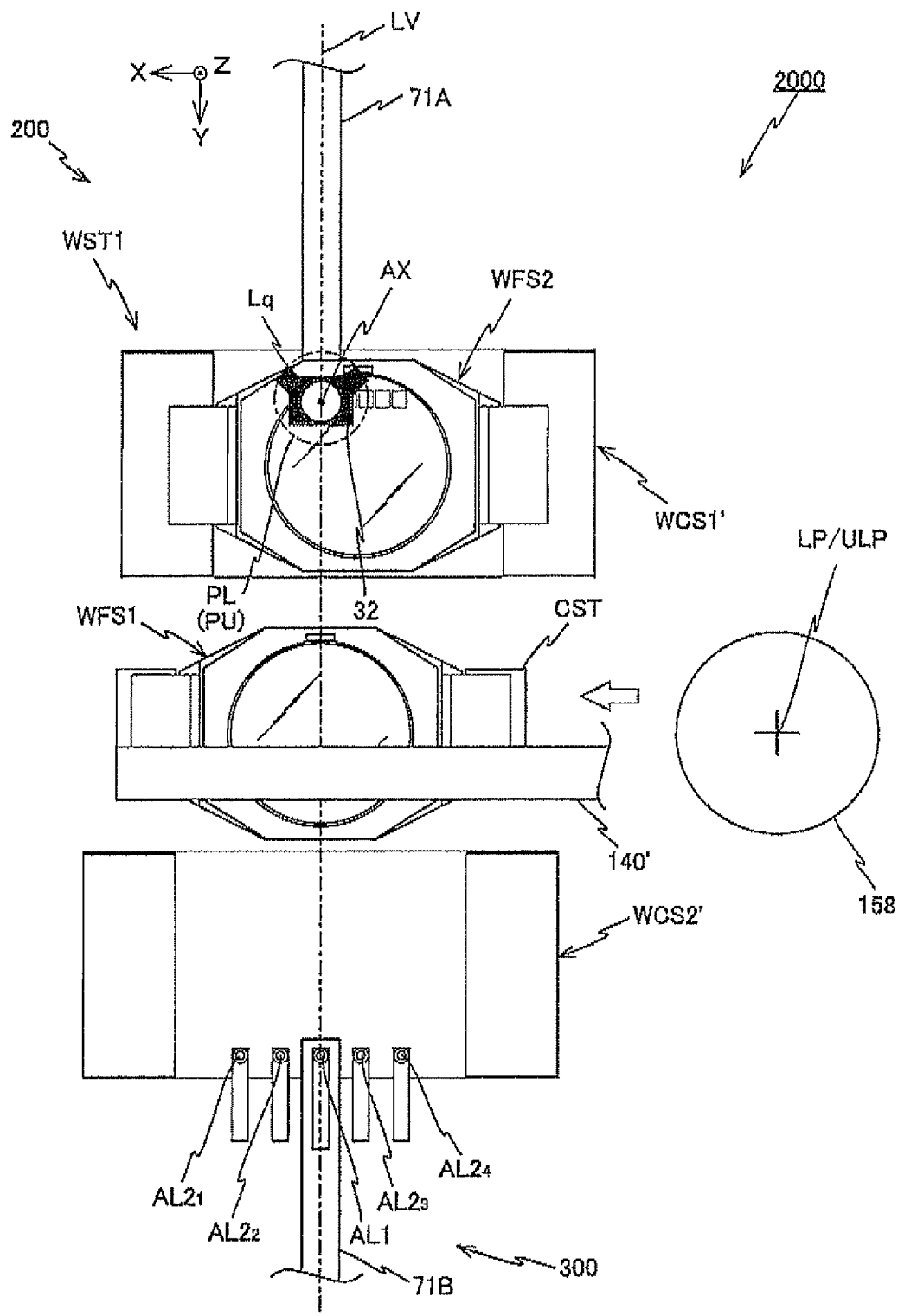
FIG. 55 is a view used to explain the parallel processing performed using fine movement stages WFS1 and WFS2 (No. 5) in the exposure apparatus of the third embodiment.

Thereafter, main controller 20 drives robot arm 140', and fine movement stage WFS3 holding wafer (a new wafer) W before exposure is carried integrally with carrier stage CST to a position facing coarse movement stage WCS2' (refer to FIG. 55).

And then, in a procedure similar to the embodiment described above, processing using fine movement stage WFS3 performed concurrently with exposure to wafer W on fine movement stage WFS2 and wafer exchange performed on fine movement stage WFS1 on replacement stage 154A.

In the manner described above, in the exposure apparatus related to the first modified example, parallel processing using the three fine movement stages WFS1 to WFS3 is repeatedly performed by main controller 20.

According to the exposure apparatus related to the first modified example described so far, besides being able to obtain an equal effect as in the third embodiment previously described, in parallel with exposure to wafer W on one of the fine movement stages, wafer alignment can be performed to wafer W on another fine movement stage, and wafer exchange can also be performed on another fine movement stage with at least a part of the operation being performed in parallel with the two operations above. Further, at the exchange position, for wafer exchange, fine movement stage WFS1 supported by carrier stage CST is replaced to another fine movement stage WFS3 holding a new wafer. Accordingly, wafer exchange can be performed in a shorter period of time when compared with the case when there are two fine movement stages. Accordingly, throughput can be improved when compared with the case when there are two fine movement stages.

A SECOND MODIFIED EXAMPLE

Figure 63:
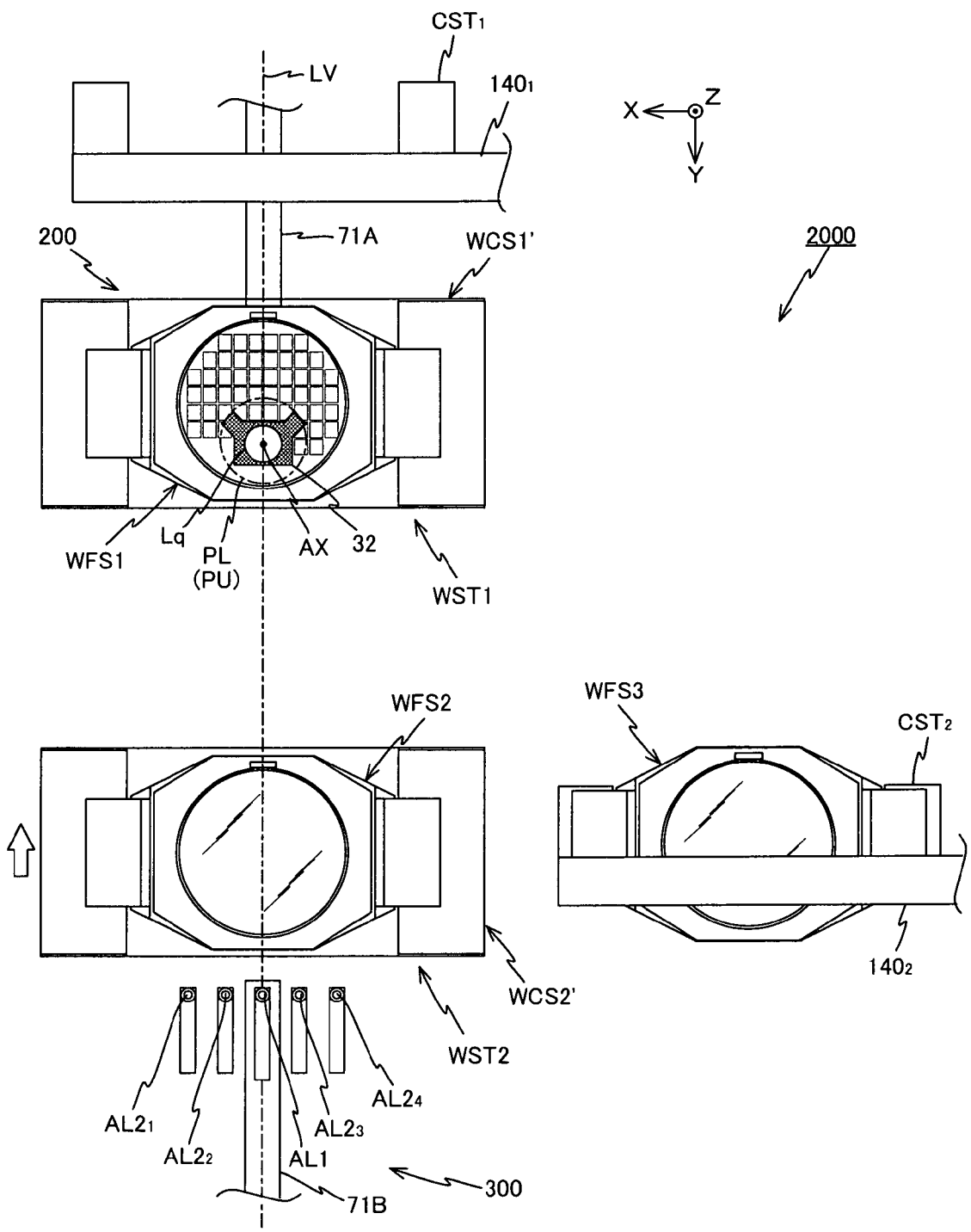
FIG. 63 is a planar view showing an exposure apparatus related to a second modified example of the third embodiment, and also is a view used to explain a parallel processing performed using the three fine movement stages (No. 1)

Next, an exposure apparatus related to a second modified example of the third embodiment will be described, with reference to FIGS. 63 to 67. As is shown in FIG. 63, the exposure apparatus related to the second modified example comprises three fine movement stages WFS1, WFS2, and WFS3. Further, the exposure apparatus related to the second modified example is equipped with two each of a carrier stage CST and a robot arm. Hereinafter, carrier stages CST and the robot arms will be described as carrier stages $CST_1$ and $CST_2$ and robot arms $140_1$ and $140_2$ for identification.

FIG. 63 shows a state where in the exposure apparatus related to the second modified example, fine movement stage WFS1 is at exposure station 200 and the exposure previously described has been performed on wafer W held by fine movement stage WFS1, and coarse movement stage WCS2' supporting fine movement stage WFS2 is in the midst of moving toward exposure station 200 from measurement station 300. At this point, carrier stage $CST_1$ is waiting at a waiting position, and fine movement stage WFS3, which holds a new wafer W, is waiting at a waiting position which is on the −X side and also slightly to the +Y side of measurement station 300 while being supported by carrier stage $CST_2$.

When coarse movement stage WCS2' supporting fine movement stage WFS2 arrives at a position in the vicinity of exposure station 200 which is a predetermined distance in the −Y direction from the position shown in FIG. 63, main controller 20 makes coarse movement stage WCS2' wait at the position until exposure has been completed. Then, when exposure has been completed, fine movement stage WFS2 and fine movement stage WFS1 are set to a scrum state after coarse movement stage WCS2' and coarse movement stage WCS1" are made to face each other almost in a contact state by main controller 20, and then fine movement stage WFS2 and fine movement stage WFS1 are driven in the −Y direction while the scrum state is maintained as is shown by the black arrows in FIG. 64. By this operation, delivery begins of the liquid immersion space area formed by liquid Lq held between tip lens 191 and fine movement stage WFS1, from fine movement stage WFS1 to fine movement stage WFS2.

Figure 64:
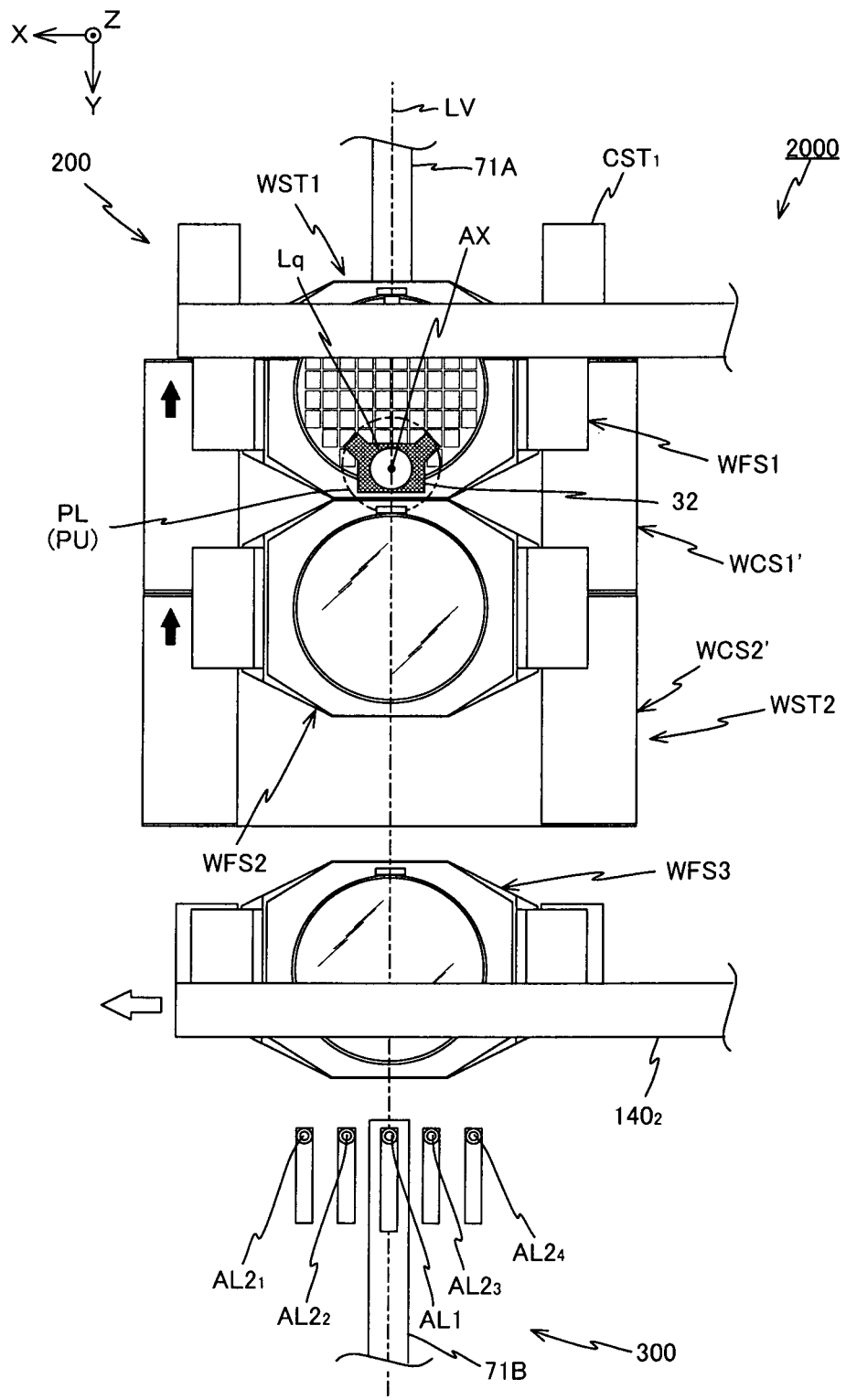
FIG. 64 is a view used to explain a parallel processing performed using the three fine movement stages (No. 2) in the exposure apparatus related to the second modified example.

Further, at the point when the delivery of the liquid immersion space area begins and the tip of fine movement stage WFS1 begins to be exposed outside of coarse movement stage WCS1', main controller 20 begins the delivery (slide movement) of fine movement stage WFS1 from coarse movement stage WCS1' to carrier stage $CST_1$, as is shown in FIG. 64. At this point, coarse movement stages WCS1' and WCS2' are driven in the +Y direction by main controller 20 as is previously described.

Meanwhile, to set the scrum state of fine movement stages WFS2 and WFS1 described above, prior to this, when coarse movement stage WCS2' approaches coarse movement stage WCS1', main controller 20 drives robot arm $140_2$ in the +X direction as is shown by the outlined arrow in FIG. 64, and carrier stage $CST_2$ is moved to a position on the +Y side of coarse movement stage WCS2'.

Then, as is shown by the outlined arrows in FIG. 65, main controller 20 drives robot arm $140_2$ in the +Y direction and carrier stage $CST_2$ is made to face coarse movement stage WCS2' almost in a contact state, and fine movement stage WFS3 is also set further to a scrum state with fine movement stage WFS2, which is in a scrum state with fine movement stage WFS1. And by main controller 20, the three fine movement stages WFS1, WF2, and WFS3 are driven in the −Y direction while the scrum state is maintained, as is shown by the black arrows in FIG. 65. At this point, coarse movement stages WCS1' and WCS2' continue to be driven (refer to the outlined arrows) in the direction opposite to fine movement stages WFS1 and WFS2 by main controller 20, and carrier stage $CST_2$ is also driven by main controller 20 at the same speed as coarse movement stages WCS1' and WCS2'

Figure 66:
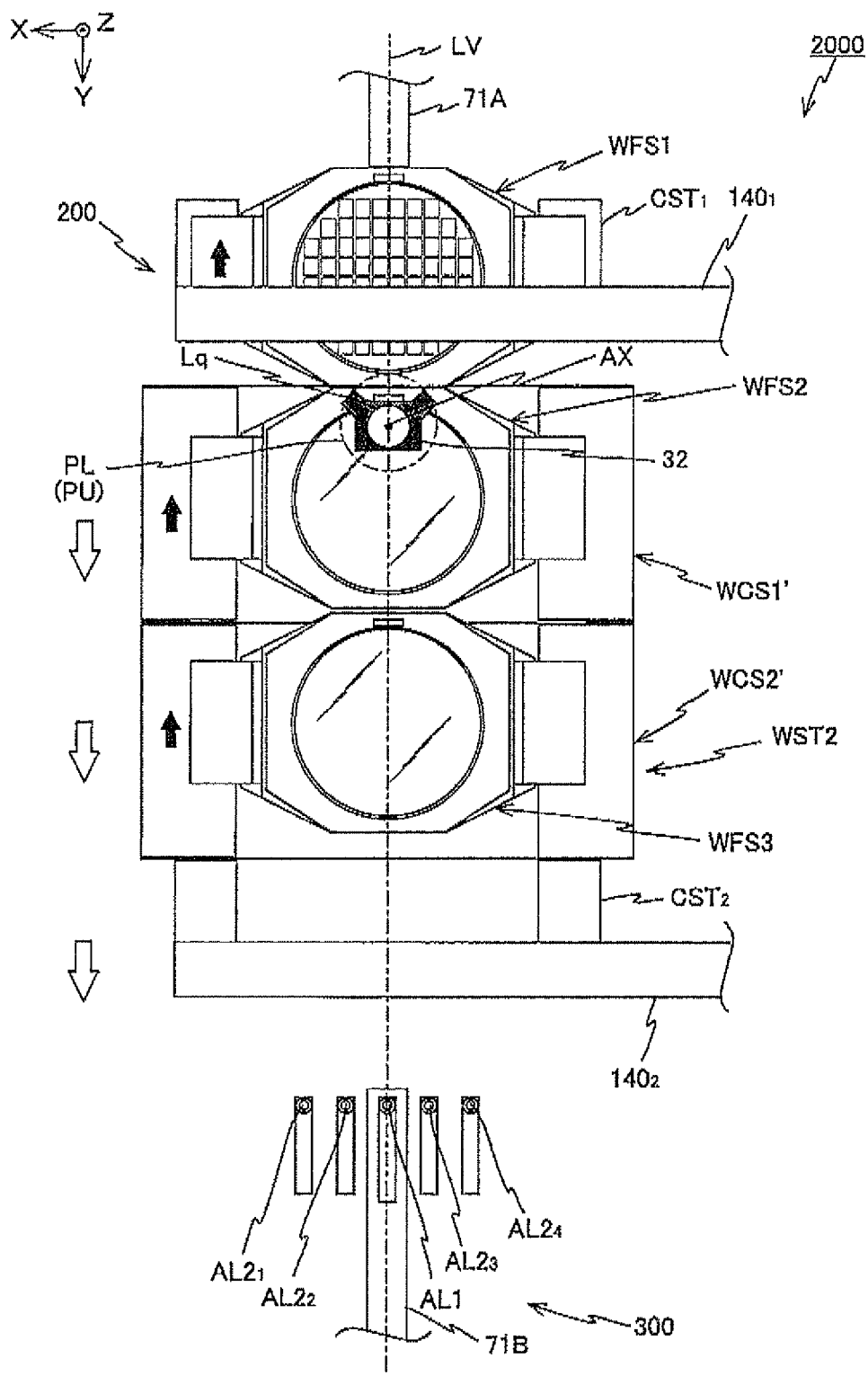
FIG. 66 is a view used to explain a parallel processing performed using the three fine movement stages (No. 4) in the exposure apparatus related to the second modified example.

And, when a predetermined time passes from the state shown in FIG. 65, following the delivery of the liquid immersion space area, delivery of a fine movement stage (in this case, WFS3) holding a new wafer W from carrier stage $CST_2$ to coarse movement stage WCS2' is also completed, in addition to delivery of fine movement stage WFS1 from coarse movement stage WCS1' to carrier stage $CST_1$ and delivery of fine movement stage WFS2 from coarse movement stage WCS2" to coarse movement stage WCS1' as is shown in FIG. 66.

Figure 67:
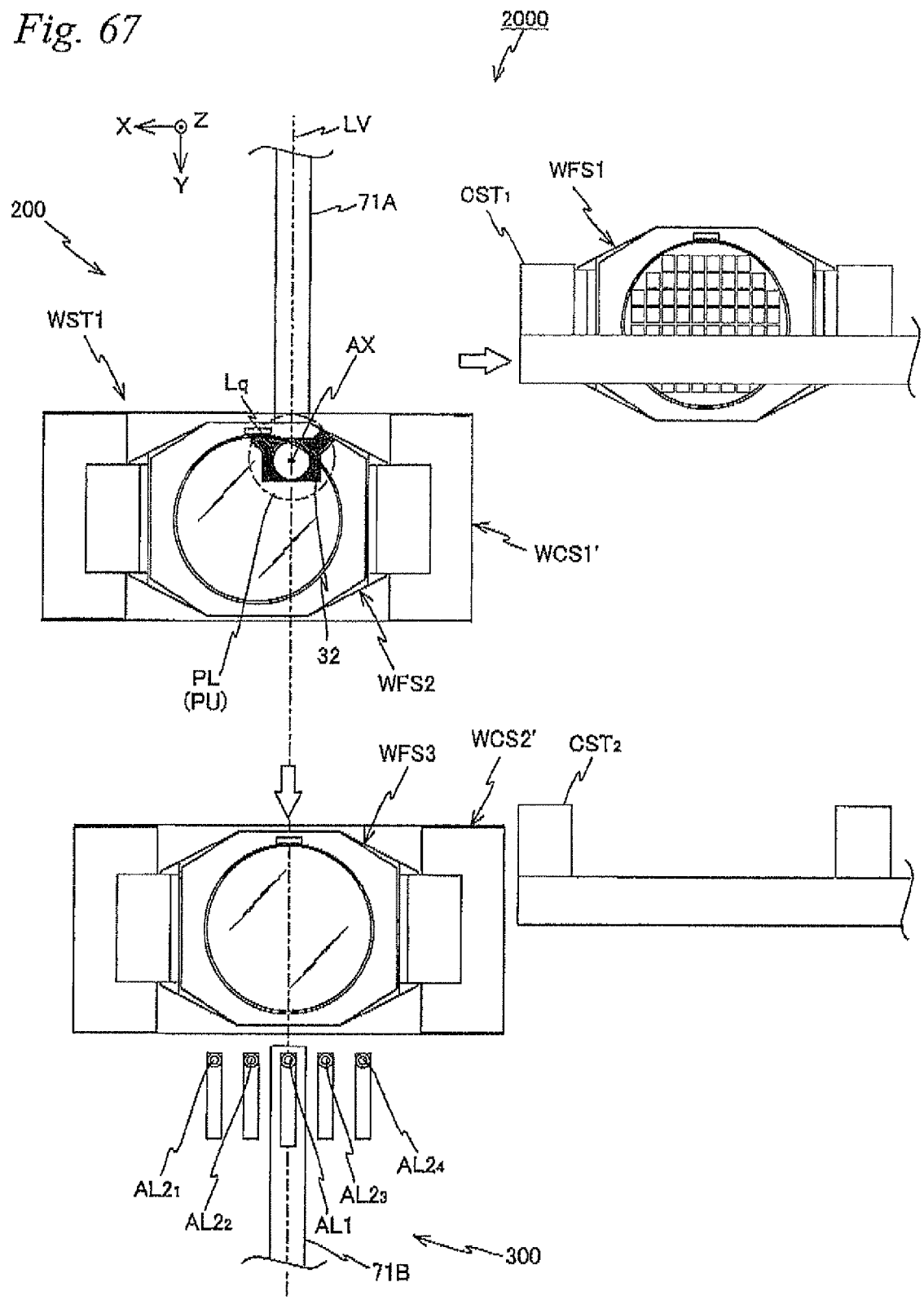
FIG. 67 is a view used to explain a parallel processing performed using the three fine movement stages (No. 5) in the exposure apparatus related to the second modified example.

Next, carrier stage $CST_1$ supporting fine movement stage WFS1 is driven toward the wafer exchange position as is shown by the outlined arrow in FIG. 67 by main controller 20, and carrier stage $CST_2$ is also moved in the −X direction. When carrier stage $CST_2$ moves in the −X direction to a position where carrier stage $CST_2$ no longer faces coarse movement stage WCS2', main controller 20 drives coarse movement stage WCS2' in the +Y direction toward measurement station 300, as is shown by the outlined arrow in FIG. 67.

Hereinafter, main controller 20 performs a parallel processing operation of exposure of wafer W held by fine movement stage WFS2 and alignment of wafer W held by fine movement stage WFS3, in a procedure similar to the third embodiment previously described. Further, concurrently with these operations, wafer exchange on fine movement stage WFS1 is performed in a procedure similar to the third embodiment previously described by main controller 20. Then, after the wafer exchange, fine movement stage WFS1 which holds a new wafer is delivered from carrier stage $CST_1$ to carrier stage $CST_2$. This will allow carrier stage $CST_2$ to wait at the position shown in FIG. 63, in a state supporting fine movement stage WFS1 which holds a new wafer.

In the manner described above, in the exposure apparatus related to the second modified example, parallel processing using the three fine movement stages WFS1 to WFS3 is repeatedly performed by main controller 20.

According to the exposure apparatus related to the second modified example described so far, besides being able to obtain an equal effect as in the third embodiment previously described, on the delivery of the liquid immersion space area, a fine movement stage (for example, WFS3) holding a new wafer W is delivered from carrier stage $CST_2$ to coarse movement stage WCS2', in addition to the delivery of fine movement stage WFS1 from coarse movement stage WCS1' to carrier stage $CST_1$ and the delivery of fine movement stage WFS2 from coarse movement stage WCS2' to coarse movement stage WCS1' Accordingly, it becomes possible to start both the exposure operation to the wafer on fine movement stage WFS2 and the alignment operation on fine movement stage WFS3 at once. Further, according to the exposure apparatus related to the second modified example, fine movement stages WFS1 to WFS3 are circulated.

Further, also in the third embodiment and in the modified examples, in the case the carrier stage and coarse movement stage WCS1' (or WCS2') are made to be in proximity to deliver the fine movement stage between the two coarse movement stages WCS1' and WCS2', carrier stage CST and coarse movement stage WCS1' (or WCS2') do not have to be extremely close. The carrier stage and the coarse movement stage can be distanced within a range where the fine movement stage is not tilted greatly (that is, the stator and the mover of the linear motor do not come into contact) at the time of movement of the fine movement stage between carrier stage CST and coarse movement stage WCS1' (or WCS2').

Incidentally, in each of the first to third embodiments above (hereinafter shortly referred to as each of the embodiments), while the case has been described where fine movement stage position measurement systems 70A and 706 are made entirely of, for example, glass, and are equipped with measurement arms 71A and 71B in which light can proceed inside, the present invention is not limited to this. For example, at least only the part where each of the laser beams previously described proceed in the measurement arm has to be made of a solid member which can pass through light, and the other sections, for example, can be a member that does not transmit light, and can have a hollow structure. Further, as a measurement arm, for example, a light source or a photodetector can be built in the tip of the measurement arm, as long as a measurement beam can be irradiated from the section facing the grating. In this case, the measurement beam of the encoder does not have to proceed inside the measurement arm. Or, in the case of employing a grating interference type encoder system as the encoder system, the optical member on which the diffraction grating is formed only has to be provided on an arm that has low thermal expansion, such as for example, ceramics, Invar and the like. This is because especially in an encoder system, the space where the beam separates is extremely narrow (short) so that the system is not affected by air fluctuation as much as possible. Furthermore, in this case, the temperature can be stabilized by supplying gas whose temperature has been controlled to the space between fine movement stage (wafer holder) and the arm (and beam optical path). Furthermore, the measurement arm need not have any particular shape.

Incidentally, in the embodiment, because measurement arms 71A and 71B are fixed to main frame BD integrally, torsion and the like may occur due to internal stress (including thermal stress) in measurement arms 71A and 71B, which may change the relative position between measurement arms 71A and 71B, and main frame BD. Therefore, as countermeasures against such cases, the position of measurement arms 71A and 71B (a change in relative position with respect to main frame BD, or a change of position with respect to a reference position) can be measured, and the position of measurement arms 71A and 71B can be finely adjusted, or the measurement results corrected, with actuators and the like.

Further, in each of the embodiments above, while the case has been described where measurement arms 71A and 71B are integral with main frame BD, as well as this, measurement arms 71A and 71B and mainframe BD may be separated. In this case, a measurement device (for example, an encoder and/or an interferometer) which measures a position (or displacement) of measurement arms 71A and 71B with respect to main frame BD (or a reference position), and an actuator and the like to adjust a position of measurement arms 71A and 71B can be provided, and main controller 20 as well as other controllers can maintain a positional relation between main frame BD (and projection optical system PL) and measurement arms 71A and 71B at a predetermined relation (for example, constant), based on measurement results of the measurement device.

Further, a measurement system (sensor) to measure a variation in measurement arms 71A and 71B by an optical technique, a temperature sensor, a pressure sensor, an acceleration sensor for vibration measurement and the like can be provided in measurement arms 71A and 71B. Or, a distortion sensor (strain gauge) or a displacement sensor can be provided, so as to measure a variation in measurement arms 71A and 71B. And, by using the values obtained by these sensors, positional information obtained by fine movement stage position measurement system 70A and/or wafer stage position measurement system 68A, or fine movement stage position measurement system 70B and/or wafer stage position measurement system 68B can be corrected.

Further, in each of the embodiments above, while the case has been described where measurement arm 71A (or 71B) is supported in a cantilevered state via one support member 72A (or 72B) from mainframe BD, as well as this, for example, measurement arm 71A (or 71B) can be supported by suspension from main frame BD via a U-shaped suspension section, including two suspension members which are arranged apart in the X-axis direction. In this case, it is desirable to set the distance between the two suspension members so that the fine movement stage can move in between the two suspension members.

Further, fine movement stage position measurement systems 70A and 70B do not always have to be equipped with a measurement arm, and will suffice as long as the systems have a head which is placed facing grating RG inside the space of coarse movement stages WCS1 and WCS2 (WCS1' and WCS2') and receives a diffraction light from grating RG of at least one measurement beam irradiated on grating RG, and can measure the positional information of the fine movement stage (one of WFS1, WFS2, and WFS3) at least within the XY plane, based on the output of the head.

Further, in each of the embodiments described above, while an example has been shown where encoder system 73 is equipped with an X head and a pair of Y heads, besides this, for example, one or two two-dimensional heads (2D heads) whose measurement directions are in two directions, which are the X-axis direction and the I-axis direction, can be provided. In the case two 2D heads are provided, detection points of the two heads can be arranged to be two points which are spaced equally apart in the X-axis direction on the grating, with the exposure position serving as the center.

Incidentally, fine movement stage position measurement systems 70A and 70B can measure positional information in directions of six degrees of freedom of the fine movement stage only by using encoder system 73, without being equipped with laser interferometer system 75. In this case, for example, an encoder which can measure positional information in at least one of the X-axis direction and the Y-axis direction, and the Z-axis direction can be used. As the encoder used in this case, a sensor head system for measuring variation disclosed in, for example, U.S. Pat. No. 7,561,280, can be used. And, for example, by irradiating measurement beams from a total of three encoders including an encoder (such as the sensor head system for measuring variation described above) which can measure positional information in the X-axis direction and the Z-axis direction and an encoder (such as the sensor head system for measuring variation described above) which can measure positional information in the Y-axis direction and the Z-axis direction, on three measurement points that are noncollinear, and receiving each of the return lights from grating RG, positional information of the movable body on which grating RG is provided can be measured in directions of six degrees of freedom. Further, the configuration of encoder system 73 is not limited to the embodiment described above, and is arbitrary. For example, a 3D head which can measure positional information in each of the X-axis, the Y-axis, and the Z-axis directions can be used.

Incidentally, in each of the embodiments described above, while the grating was placed on the upper surface of the fine movement stage, that is, a surface that faces the wafer, as well as this, the grating can be formed on a wafer holder holding the wafer. In this case, even when a wafer holder expands or an installing position to the fine movement stage shifts during exposure, this can be followed up when measuring the position of the wafer holder (wafer). Further, the grating can be placed on the lower surface of the fine movement stage, and in such a case, grating RG can be fixed to or formed on an opaque member such as ceramics. Further, in this case, the fine movement stage does not have to be a solid member through which light can pass because the measurement beam irradiated from the encoder head does not proceed inside the fine movement stage, and fine movement stage can have a hollow structure with the piping, wiring and like placed inside, which allows the weight of the fine movement stage to be reduced. In this case, a protective member (a cover glass) can be provided on the surface of grating RG. Or, the hold wafer holder and grating RG can simply be held by a conventional fine movement stage. Further, the wafer holder can be made of a solid glass member, and grating RG can be placed on the upper surface (a wafer mounting surface) of the glass member.

Further, the drive mechanism of driving the fine movement stage with respect to the coarse movement stage is not limited to the mechanism described in each of the embodiments above. For example, in each of the embodiments above, while the coil which drives the fine movement stage in the Y-axis direction also functioned as a coil which drives fine movement stage in the Z-axis direction, besides this, an actuator (linear motor) which drives the fine movement stage in the Y-axis direction and an actuator which drives the fine movement stage in the Z-axis direction, or more specifically, levitates the fine movement stage, can each be provided independently. In this case, because it is possible to make a constant levitation force act on the fine movement stage, the position of the fine movement stage in the Z-axis direction becomes stable.

Incidentally, in each of the embodiments described above, while fine movement stages WFS1, WFS2, and WFS3 are supported in a noncontact manner by coarse movement stages WCS1 and WCS2 (WCS1' and WCS2') by the action of the Lorentz force (electromagnetic force), besides this, for example, a vacuum preload type hydrostatic air bearings and the like can be arranged on fine movement stages WFS1, WFS2, and WFS3 so that the stages are supported by levitation with respect to coarse movement stages WCS1 and WCS2 (WCS1' and WCS2') or relay stage DRST. Further, in each of the embodiments described above, while fine movement stages WFS1, WFS2, and WFS3 could be driven in directions of all 6 degrees of freedom, the present invention is not limited to this, and fine movement stages WFS1, WFS2, and WFS3 only needs to be able to move at least within a two-dimensional plane which is parallel to the XY plane. Further, fine movement stage drive systems 52A, 52B, 52C (52C') and the like are not limited to the magnet moving type described above, and can also be a moving coil type as well. Furthermore, fine movement stages WFS1, WFS2, and WFS3 can also be supported in contact by coarse movement stages WCS1 and WCS2 (WCS1' and WCS2'), or by relay stage DRST. Accordingly, the fine movement stage drive system which drives the fine movement stage with respect to the coarse movement stage, for example, can be a combination of a rotary motor and a ball screw (or a feed screw).

Incidentally, in each of the embodiments described above, while the case has been described where an alignment mark measurement (wafer alignment) was performed as an example of measurement to wafer W in measurement station 300, as well as this (or instead of this), a surface position measurement to measure a position the wafer W surface in an optical axis direction AX of projection optical system PL can be performed. In this case, a surface position measurement of the upper surface of fine movement stage holding a wafer can be performed simultaneously with the surface position measurement as is disclosed in, for example, U.S. Patent Application Publication No. 2008/0088843 specification, and focus leveling control of wafer W at the time of exposure can be performed, using the results.

Incidentally, in the exposure apparatus in each of the embodiments described above, when fine movement stages WFS1, WFS2, or WFS3 holding a newly loaded wafer W is delivered to coarse movement stage WCS2 (WCS2') from center table 130 or relay stage DRST after the wafer exchange, in order to adjust positional shift and rotational error of the wafer, for example, three imaging devices to pick up an image of three places in the periphery of wafer W including a notch (a V-shaped notch, not shown), or a detection system to detect a mark (or a pattern) on the wafer, such as, for example, a plurality of microscopes equipped with a CCD and the like, can be provided.

Further, in each of the embodiments and the like described above, the wafer does not have to be held only by the Bernoulli chuck after the wafer has been detached from the wafer holder using the Bernoulli chuck, and together with the Bernoulli chuck, or instead of the Bernoulli chuck, the wafer can be held by a mechanical mechanism and the like. The point is, holding the wafer using the Bernoulli chuck only has to be just before delivering the wafer to the to the wafer holder, and immediately after the delivery from the wafer holder. Further, while the carrier apparatus which has the Bernoulli chuck was to have a robot arm, as well as this, a slider is also preferable. Further, instead of the Bernoulli chuck, for example, a chuck member and the like using a differential evacuation as in a vacuum preload type static gas bearing can be used, which can hold wafer W from above in a non-contact manner.

Further, in each of the embodiments above, while the Bernoulli chuck assisted the suction holding operation of the wafer by blowing out pressurized gas from below when unloading the wafer from the wafer holder using the Bernoulli chuck, it is a matter of course that such an assistance is not a mandatory.

Further, the exposure apparatus in each of the embodiments above, especially the stage device, is not limited to the configuration described above, and other configurations can also be employed.

The point is, any configuration can be employed as long as the position of the wafer holder can be measured by the so-called back surface measurement.

Incidentally, in each of the embodiments above, in the case of making the Bernoulli chuck and wafer W approach or move away from each other, at least one of a member in which the Bernoulli chuck is provided and a fine movement stage holding wafer W should be driven in a vertical direction. Further, also in the case of making the Bernoulli chuck and wafer W approach or move away from each other in a horizontal direction, at least one of the Bernoulli chuck and the fine movement stage should be driven.

Incidentally, the wafer used in the exposure apparatus of each of the embodiments above is not limited to the 450 mm wafer, and can be a wafer of a smaller size (such as a 300 mm wafer).

Incidentally, in each of the embodiments described above, the case has been described where the exposure apparatus is a liquid immersion type exposure apparatus. However, the present invention is not limited to this, but can also be applied suitably in a dry type exposure apparatus that performs exposure of wafer W without liquid (water).

Incidentally, in each of the embodiments described above, the case has been described where the present invention is applied to a scanning stepper; however, the present invention is not limited to this, and can also be applied to a static exposure apparatus such as a stepper. Even in the case of a stepper, by measuring the position of a stage on which the object subject to exposure is mounted using an encoder, position measurement error caused by air fluctuation can substantially be nulled, which is different from when measuring the position of this stage using en interferometer, and it becomes possible to position the stage with high precision based on the measurement values of the encoder, which in turn makes it possible to transfer a reticle pattern on the wafer with high precision. Further, the present invention can also be applied to a reduction projection exposure apparatus by a step-and-stitch method that synthesizes a shot area and a shot area.

Further, the magnification of the projection optical system in the exposure apparatus in each of the embodiments described above is not only a reduction system, but also may be either an equal magnifying or a magnifying system, and projection optical system PL is not only a dioptric system, but also may be either a catoptric system or a catadioptric system, and in addition, the projected image may be either an inverted image or an upright image.

In addition, the illumination light IL is not limited, to ArF excimer laser light (with a wavelength of 193 nm), but may be ultraviolet light, such as KrF excimer laser light (with a wavelength of 248 nm), or vacuum ultraviolet light, such as $F_2$ laser light (with a wavelength of 157 nm). As disclosed in, for example, U.S. Pat. No. 7,023,610, a harmonic wave, which is obtained by amplifying a single-wavelength laser beam in the infrared or visible range emitted by a DFB semiconductor laser or fiber laser, with a fiber amplifier doped with, for example, erbium (or both erbium and ytterbium), and by converting the wavelength into ultraviolet light using a non-linear optical crystal, can also be used as vacuum ultraviolet light.

Further, in the exposure apparatus in each of the embodiments above, illumination light IL is not limited to the light having a wavelength equal to or more than 100 nm, and it is needless to say that the light having a wavelength less than 100 nm can be used. For example, each of the embodiments above can be applied to an EUV exposure apparatus that uses an EUV (Extreme Ultraviolet) light in a soft X-ray range (e.g., a wavelength range from 5 to 15 nm). In addition, each of the embodiments above can also be applied to an exposure apparatus that uses charged particle beams such as an electron beam or an ion beam.

Further, in each of the embodiments above, a transmissive type mask (reticle) is used, which is a transmissive substrate on which a predetermined light shielding pattern (or a phase pattern or a light attenuation pattern) is formed. Instead of this reticle, however, as is disclosed in, for example, U.S. Pat. No. 6,778,257 description, an electron mask (which is also called a variable shaped mask, an active mask or an image generator, and includes, for example, a DMD (Digital Micromirror Device) that is a type of a non-emission type image display device (spatial light modulator) or the like) on which a light-transmitting pattern, a reflection pattern, or an emission pattern is formed according to electronic data of the pattern that is to be exposed can also be used. In the case of using such a variable shaped mask, because the stage where a wafer, a glass plate or the like is mounted is scanned with respect to the variable shaped mask, an equivalent effect as each of the embodiments described above can be obtained by measuring the position of this stage using an encoder system and a laser interferometer system.

Further, as is disclosed in, for example, PCT International Publication No. 2001/035168, each of the embodiments above can also be applied to an exposure apparatus (lithography system) that forms line-and-space patterns on a wafer W by forming interference fringes on wafer W.

Moreover, as disclosed in, for example, U.S. Pat. No. 6,611,316, each of the embodiments above can also be applied to an exposure apparatus that synthesizes two reticle patterns via a projection optical system and almost simultaneously performs double exposure of one shot area by one scanning exposure.

Incidentally, an object on which a pattern is to be formed (an object subject to exposure to which an energy beam is irradiated) in each of the embodiments described above is not limited to a wafer, but may be other objects such as a glass plate, a ceramic substrate, a film member, or a mask blank.

The application of the exposure apparatus is not limited to an exposure apparatus for fabricating semiconductor devices, but can be widely adapted to, for example, an exposure apparatus for fabricating liquid crystal devices, wherein a liquid crystal display device pattern is transferred to a rectangular glass plate, as well as to exposure apparatuses for fabricating organic electroluminescent displays, thin film magnetic heads, image capturing devices (e.g., CCDs), micromachines, and DNA chips. In addition to fabricating microdevices like semiconductor devices, the present invention can also be adapted to an exposure apparatus that transfers a circuit pattern to a glass substrate, a silicon wafer, or the like in order to fabricate a reticle or a mask used by a visible light exposure apparatus, an EUV exposure apparatus, an X-ray exposure apparatus, an electron beam exposure apparatus, and the like.

Incidentally, the disclosures of all publications, the PCT International Publications, the U.S. patent applications and the U.S. patents that are cited in the description so far related to exposure apparatuses and the like are each incorporated herein by reference.

Electronic devices such as semiconductor devices are manufactured through the steps of; a step where the function/performance design of the device is performed, a step where a reticle based on the design step is manufactured, a step where a wafer is manufactured from silicon materials, a lithography step where the pattern of a mask (the reticle) is transferred onto the wafer by the exposure apparatus (pattern formation apparatus) and the exposure method in each of the embodiments previously described, a development step where the wafer that has been exposed is developed, an etching step where an exposed member of an area other than the area where the resist remains is removed by etching, a resist removing step where the resist that is no longer necessary when etching has been completed is removed, a device assembly step (including a dicing process, a bonding process, the package process), inspection steps and the like. In this case, in the lithography step, because the device pattern is formed on the wafer by executing the exposure method previously described using the exposure apparatus in each of the embodiments described above, a highly integrated device can be produced with good productivity.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:
1. An exposure apparatus that exposes an object with an energy beam, the apparatus comprising:
an exposure station where an exposure processing to irradiate an energy beam on an object is performed;
a measurement station which is placed at a position a predetermined distance away from the exposure station on one side of a direction parallel to a first axis, and where a measurement processing with respect to the object is performed;

a first movable body which is movable within a first range including the exposure station within a two-dimensional plane including the first axis and a second axis orthogonal to the first axis;

a second movable body which is movable within a second range including the measurement station within the two-dimensional plane;

at least three holding members, each holding member being configured to hold the object, each holding member being supported by the first movable body or the second movable body so that each holding member is relatively movable against the first movable body and the second movable body within a plane parallel to the two-dimensional plane, a measurement plane being provided on each of the holding members;

a support device which can support the holding members;

a first measurement system which irradiates at least one first measurement beam from below on the measurement plane of the holding member, receives a return light of the first measurement beam and measures positional information of the holding member within the two-dimensional plane, when the first movable body supporting the holding member is at the exposure station; and a second measurement system which irradiates at least one second measurement beam from below on the measurement plane of the holding member, receives a return light of the second measurement beam and measures positional information of the holding member within the two-dimensional plane, when the second movable body supporting the holding member is at the measurement station, whereby while the exposure processing with respect to an object held by the holding member supported by the first movable body in the exposure station is performed, at least a part of the measurement processing with respect to an object held by the holding member supported by the second movable body in the measurement station and at least a part of a carriage of the holding member supported on the support device for an exchange of an object held by the holding member are concurrently performed.

2. The exposure apparatus according to claim 1 wherein the support device supports the holding member at a position different from the first and the second movable bodies.

3. The exposure apparatus according to claim 1 wherein the support device supports the holding member in an area outside a movable range of the first and the second movable bodies in the exposure processing and the measurement processing.

4. The exposure apparatus according to claim 3 wherein the support device supports the holding member at a position other than the exposure station and the measurement station.

5. The exposure apparatus according to claim 1 wherein object held by the holding member is detached in a non-contact manner from the holding member.

6. The exposure apparatus according to claim 5 wherein detachment of the object from the holding member is assisted.

7. The exposure apparatus according to claim 1 wherein the support device is movable within the two-dimensional plane supporting the holding member.

8. The exposure apparatus according to claim 7 wherein the support device moves to a predetermined exchange position supporting the holding member to exchange the object.

9. The exposure apparatus according to claim 1 wherein the support device performs delivery and receipt of the holding member to/from the first movable body or the second movable body, or to/from the first and the second movable bodies at a predetermined height position.

10. The exposure apparatus according to claim 1 wherein the support device is placed between the exposure station and the measurement station, with a position within the two-dimensional plane fixed, and the apparatus further comprises:

a carrier member which carries a holding member supported by the support device to exchange the object, to an exchange position where exchange of the object is performed.

11. The exposure apparatus according to claim 10 wherein the first movable body is separable into a first section and a second section in a direction parallel to the second axis, and when the first movable body is separated into the first section and the second section, the support device can receive the holding member from the first movable body.

12. The exposure apparatus according to claim 10 wherein on a bottom surface of one of the first movable body and the second movable body or bottom surfaces of both of the first movable body and the second movable body, one of an aperture and a notch is provided, which allows the first and the second movable bodies to be proximity to each other without being disturbed by the support device.

13. The exposure apparatus according to claim 12 wherein the support device is configured including a support member which is vertically movable.

14. The exposure apparatus according to claim 13 wherein when the support member supports the holding member at a predetermined height position, the first movable body and the second movable body are in proximity to each other and can reciprocally deliver the holding member.

15. The exposure apparatus according to claim 1 wherein after the exposure processing with respect to an object held by the holding member supported by the first movable body in the exposure station has been completed, the holding member holding the object which has been exposed is delivered from the first movable body to the support device, and just after this, the holding member holding the object on which measurement has been completed is moved from the second movable body and mounted onto the first movable body, and the holding member holding a new object after the exchange is moved from the exchange position and mounted onto the second movable body.

16. The exposure apparatus according to claim 1 wherein an exchange of the object is performed, integrally with the holding member.

17. The exposure apparatus according to claim 1 wherein the first and the second movable bodies each have a space inside, the first measurement system has a first measurement member which is made up of a member extending in a direction parallel to the first axis that can be inserted at least from one side into the space of the first movable body, and irradiates the first measurement beam on the measurement plane and receives a return light of the first measurement beam, and the second measurement system has a second measurement member which is made up of a member extending in a direction parallel to the first axis that can be inserted at least from one side into the space of the second movable body, and irradiates the second measurement beam on the measurement plane and receives a return light of the second measurement beam.

18. The exposure apparatus according to claim 17 wherein the first and the second measurement members are each a cantilevered member whose one end in the direction parallel to the first axis is a fixed end, and the other end is a free end.

19. The exposure apparatus according to claim 17 wherein on the measurement plane, a grating whose periodic direction is in a direction parallel to the first axis or the second axis, or directions parallel to the first axis and the second axis is placed,
the first and the second measurement members respectively have a head which irradiates the first measurement beam on the grating and receives a diffraction light from the grating, and a head which irradiates the second measurement beam on the grating and receives a diffraction light from the grating, and
the first and the second measurement systems measure positional information of the holding member in the periodic direction of the grating, based on an output of the head.

20. The exposure apparatus according to claim 19 wherein the grating includes a first diffraction grating and a second diffraction grating whose periodic directions are in a direction parallel to the first axis and a direction parallel to a second axis, which is perpendicular to the first axis within the two dimensional plane, respectively, whereby the head irradiates the first and the second diffraction gratings with a first axis direction measurement beam and a second axis direction measurement beam respectively corresponding to the first and the second diffraction gratings, as the measurement beam, and receives a diffraction light of the first axis direction measurement beam and a diffraction light of the second axis direction measurement beam, from the gratings, and the first and the second measurement systems measure positional information of the holding member in a direction parallel to the first axis and a direction parallel to the second axis, based on an output of the head.

21. The exposure apparatus according to claim 20 wherein the head irradiates the first diffraction grating with at least two measurement beams whose irradiation points on the grating are different from each other in the direction parallel to the second axis, as the first axis direction measurement beam.

22. The exposure apparatus according to claim 21 wherein the at least two measurement beams and the second axis direction measurement beam are respectively irradiated on irradiation points on a same straight line parallel to the second axis on the grating.

23. The exposure apparatus according to claim 19 wherein a measurement center which is a center of an irradiation point of the first axis direction measurement beam irradiated on the grating from the head of the first measurement member coincides with an exposure position which is a center of an irradiation area of the energy beam irradiated on the object.

24. The exposure apparatus according to claim 1 wherein the holding member has a solid section where a light can travel inside, in at least a part of the holding member, and the measurement plane is placed on a mounting surface side of the object of the holding member, facing the solid section.

25. The exposure apparatus according to claim 1 wherein the measurement station includes at least one mark detection system which detects a mark on the object.

26. The exposure apparatus according to claim 25 wherein the measurement station includes a plurality of mark detection systems which has detection areas placed apart in a direction parallel to the second axis, and which detects different marks, respectively, on the object.

27. The exposure apparatus according to claim 1, further comprising:
an optical member which has an outgoing plane that emits the energy beam; and
a liquid immersion device which has a liquid immersion member that supplies liquid to between the optical member and the holding member held by the first movable body.

28. The exposure apparatus according to claim 27, further comprising:
a shutter which holds the liquid with the optical member.

29. A device manufacturing method, including
exposing an object using the exposure apparatus according to claim 1; and
developing the object which has been exposed.

30. An exposure method in which an object is exposed with an energy beam, the method comprising:
preparing at least three holding members, each holding member being configured to hold an object and being provided with a measurement plane; and
concurrently performing, at least partially, an exposure processing with respect to an object held by a first holding member of the at least three holding members in an exposure station, a measurement processing with respect to an object held by a second holding member of the at least three holding members in a measurement station placed at a position a predetermined distance away from the exposure station on one side of a direction parallel to a first axis, and a carriage of a third holding member, of the at least three holding members, for an object exchange using the third holding member,
wherein:
the holding member holding the object on which the exposure processing is performed is supported by a first movable body so that the holding member is relatively movable against the first movable body within a plane parallel to a two-dimensional plane including the first axis and a second axis orthogonal to the first axis at the exposure station, and positional information of the holding member within the two-dimensional plane is measured by a first measurement system which irradiates at least one first measurement beam from below on the measurement plane,
the holding member holding the object on which the measurement processing is performed is supported by a second movable body so that the holding member is relatively movable against the second movable body within the plane parallel to the two-dimensional plane at the measurement station, and positional information of the holding member within the two-dimensional plane is measured by a second measurement system which irradiates at least one second measurement beam from below on the measurement plane.

31. The exposure method according to claim 30 wherein the object exchange using the third holding member is performed at a position different from the first and the second movable bodies.

32. The exposure method according to claim 30 wherein the object exchange using the third holding member is performed in an area outside a movable range of the first and the second movable bodies in the exposure processing and the measurement processing.

33. The exposure method according to claim 32 wherein the object exchange using the third holding member is performed at a position other than the exposure station and the measurement station.

34. The exposure method according to claim 30 wherein on the object exchange, the object held by the third holding member is detached in a non-contact manner from the third holding member.

35. The exposure method according to claim 34 wherein detachment of the object from the third holding member is assisted.

36. The exposure method according to claim 30 wherein after the exposure processing with respect to the object held by the first holding member supported by the first movable body in the exposure station has been completed, the first holding member holding the object which has been exposed is delivered from the first movable body to a support device positioned between the exposure station and the measurement station, and immediately after the delivery, the second holding member holding the object which has been measured is moved from the second movable body and mounted onto the first movable body.

37. The exposure method according to claim 36 wherein after the second holding member is moved from the second movable body and mounted onto the first movable body, the first holding member holding the object which has been exposed is moved from the support device to an exchange position where object exchange is performed, and the third holding member holding a new object after an exchange is performed is moved and mounted onto the second movable body via the support device.

38. The exposure method according to claim 36 wherein the support device is movable within the two-dimensional plane, and on an exchange of the object, the support device supporting the holding member is moved to a predetermined exchange position.

39. The exposure method according to claim 30, further comprising:

concurrently with an exposure processing with respect to an object held by one holding member of the at least three holding members supported by the first movable body and a measurement processing with respect to an object held by another holding member of the at least three holding members supported by the second movable body, performing a temperature control of a new object which is subject to a processing which follows.

40. A device manufacturing method, including exposing an object using the exposure method according to claim 30; and developing the object which has been exposed.

* * * * *